US011378659B2

(12) United States Patent
Isogai et al.

(10) Patent No.: US 11,378,659 B2
(45) Date of Patent: Jul. 5, 2022

(54) LIGHT RECEPTION DEVICE AND DISTANCE MEASUREMENT MODULE

(71) Applicant: SONY SEMICONDUCTOR SOLUTIONS CORPORATION, Kanagawa (JP)

(72) Inventors: Yuji Isogai, Kanagawa (JP); Tsutomu Imoto, Kanagawa (JP); Takuya Maruyama, Kanagawa (JP); Takuro Murase, Kanagawa (JP); Ryota Watanabe, Kanagawa (JP); Toshifumi Wakano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/633,724

(22) PCT Filed: Jul. 4, 2019

(86) PCT No.: PCT/JP2019/026591
§ 371 (c)(1),
(2) Date: Jan. 24, 2020

(87) PCT Pub. No.: WO2020/017343
PCT Pub. Date: Jan. 23, 2020

(65) Prior Publication Data

US 2021/0364604 A1 Nov. 25, 2021

(30) Foreign Application Priority Data

Jul. 18, 2018 (JP) ............................ JP2018-135397

(51) Int. Cl.
*G01S 7/481* (2006.01)
*G01S 17/08* (2006.01)
(Continued)

(52) U.S. Cl.
CPC ............ *G01S 7/4816* (2013.01); *G01S 17/08* (2013.01); *G01S 17/89* (2013.01);
(Continued)

(58) Field of Classification Search
CPC ... G01S 7/4816; G01S 17/08; H01L 27/1463; H01L 27/14636
See application file for complete search history.

(56) References Cited

U.S. PATENT DOCUMENTS

2007/0158770 A1 7/2007 Kawahito
2014/0239155 A1* 8/2014 Ohkubo ............ H01L 27/14603
250/208.1

(Continued)

FOREIGN PATENT DOCUMENTS

ER 2793264 10/2014
ER 2960952 12/2015

(Continued)

OTHER PUBLICATIONS

International Search Report and Written Opinion prepared by the Japanese Patent Office dated Sep. 10, 2019, for International Application No. PCT/JP2019/026591.

*Primary Examiner* — Thanh Luu
(74) *Attorney, Agent, or Firm* — Sheridan Ross P.C.

(57) ABSTRACT

The present technology relates to a light reception device and a distance measurement module. The light reception device includes an on-chip lens, a wiring layer, and a semiconductor layer between the on-chip lens and the wiring layer. The semiconductor layer includes a first tap to which a first voltage is applied and a first charge detection portion, and a second tap to which a second voltage different from the first voltage is applied and a second charge detection portion. The position of the on-chip lens differs depending upon an in-plane position of a pixel array section, so that an optical path length or a DC contrast of a chief ray from an
(Continued)

object is uniform at in-plane pixels of the pixel array section. The present technology can be applied, for example, to a light reception device that generates distance information, for example, by a ToF method, and so forth.

20 Claims, 93 Drawing Sheets

(51) Int. Cl.

| | |
|---|---|
| ***H01L 27/146*** | (2006.01) |
| ***G01S 17/89*** | (2020.01) |
| *G01S 17/931* | (2020.01) |

(52) U.S. Cl.

CPC .... *H01L 27/1463* (2013.01); *H01L 27/14623* (2013.01); *H01L 27/14627* (2013.01); *H01L 27/14629* (2013.01); *H01L 27/14636* (2013.01); *G01S 17/931* (2020.01)

(56) References Cited

U.S. PATENT DOCUMENTS

| | | | | |
|---|---|---|---|---|
| 2015/0028405 | A1 | 1/2015 | Minami | |
| 2015/0319357 | A1* | 11/2015 | Oigawa | G02B 7/34 348/352 |
| 2017/0194367 | A1* | 7/2017 | Fotopoulou | G01S 7/4863 |
| 2018/0047775 | A1 | 2/2018 | Murase et al. | |
| 2018/0083057 | A1* | 3/2018 | Crocherie | H01L 27/14636 |
| 2018/0211990 | A1 | 7/2018 | Yorikado et al. | |

FOREIGN PATENT DOCUMENTS

| | | | | |
|---|---|---|---|---|
| ER | 3193190 | | | 7/2017 |
| JP | 2005-235893 | | | 9/2005 |
| JP | 2011-086904 | | | 4/2011 |
| JP | 2012-169530 | | | 9/2012 |
| JP | 2015-026708 | | | 2/2015 |
| JP | 2017107132 | A | * | 6/2017 |
| JP | 2017-522727 | | | 8/2017 |
| JP | 2018-088488 | | | 6/2018 |
| WO | WO 2017/094362 | | | 6/2017 |

* cited by examiner

F I G . 1
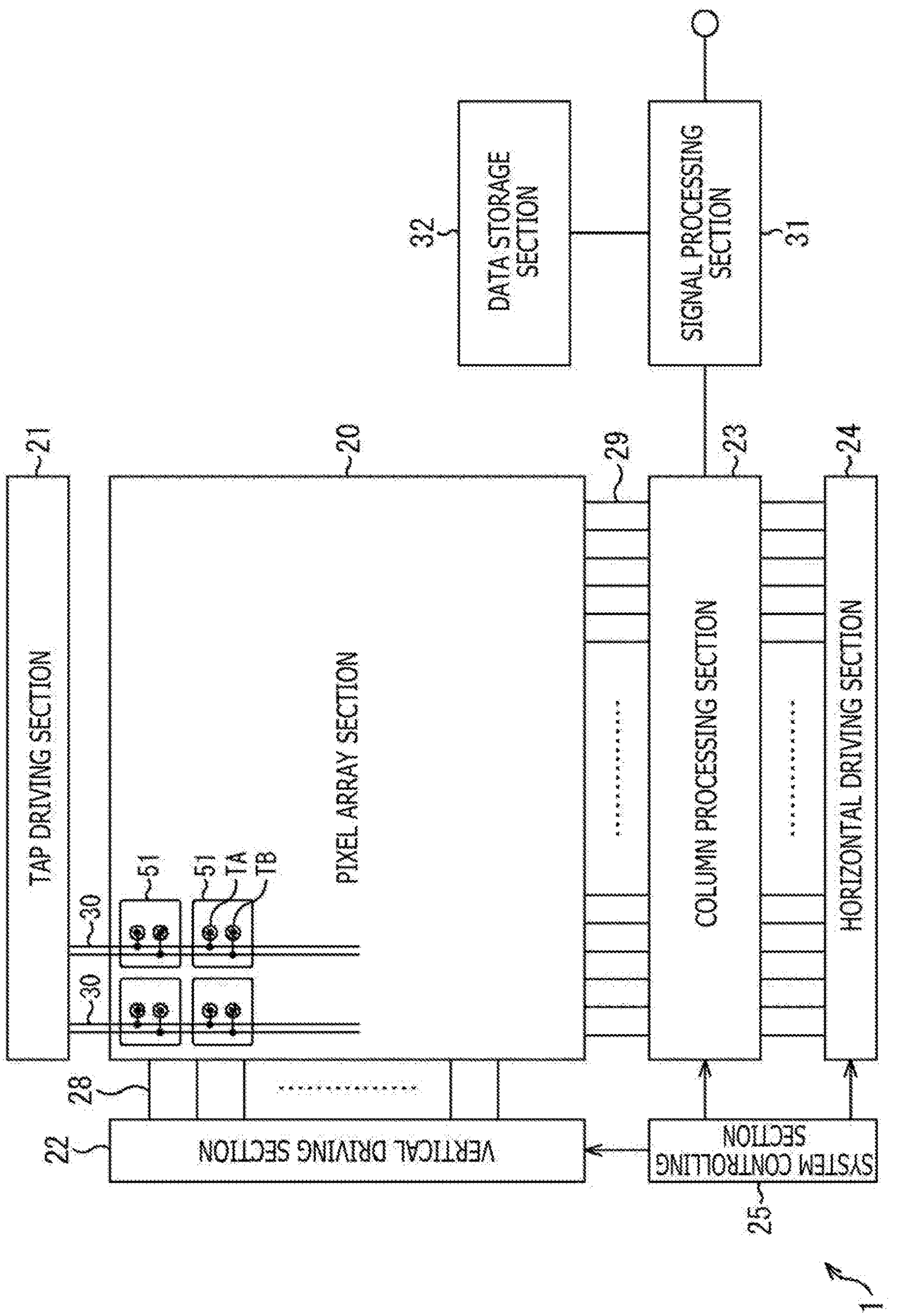

| APPLICATION VOLTAGE | mode1 | | mode2 | mode3 | mode4 | mode5 |
|---|---|---|---|---|---|---|
| Tap TA | H | 0 | H | H (IMAGE HEIGHT WEIGHTING) | H | H (IMAGE HEIGHT WEIGHTING) |
| Tap TB | 0 | H | H | H (IMAGE HEIGHT WEIGHTING) | H | H (IMAGE HEIGHT WEIGHTING) |
| PIXEL Tr | VSS | VSS | VSS | VSS | L | L |

H (High): 1.5V, VSS: 0V, L (Low) = −1.5V

LIGHT RECEPTION DEVICE AND DISTANCE MEASUREMENT MODULE

CROSS REFERENCE TO RELATED APPLICATIONS

This application is a national stage application under 35 U.S.C. 371 and claims the benefit of PCT Application No. PCT/JP2019/026591 having an international filing date of Jul. 4, 2019, which designated the United States, which PCT application claimed the benefit of Japanese Patent Application No. 2018-135397 filed Jul. 18, 2018, the entire disclosures of each of which are incorporated herein by reference.

TECHNICAL FIELD

The present technology relates to a light reception device and a distance measurement module, and particularly to a light reception device and a distance measurement module whose characteristic can be improved.

BACKGROUND ART

In the past, a distance measurement system for which an indirect ToF (Time of Flight) method is utilized is known. In such a distance measurement system as just described, a sensor capable of distributing signal charge obtained by receiving light after active light illuminated using an LED (Light Emitting Diode) or a laser with a certain phase is reflected from an object to different regions at a high speed is essentially required.

Therefore, for example, a technology is proposed which can modulate a wide-range region in a substrate of a sensor at a high speed by applying a voltage directly to the substrate to generate current in the substrate (for example, refer to PTL 1). Such a sensor as just described is also called CAPD (Current Assisted Photonic Demodulator) sensor.

CITATION LIST

Patent Literature

[PTL 1]
Japanese Patent Laid-Open No. 2011-86904

SUMMARY

Technical Problems

However, it is difficult for the technology described above to achieve a CAPD sensor having a sufficient characteristic.

For example, the CAPD sensor described above is a sensor of a front-illuminated type in which wires and so forth are arranged on a face on a side of a substrate at which light from an outside is received.

In order to secure a photoelectric conversion region, it is desirable for the light reception face side of a PD (Photodiode), more specifically, of a photoelectric conversion portion, to have thereon anything that blocks an optical path of incident light such as a wire. However, in the CAPD sensor of the front-illuminated type, depending upon a structure, it is inevitable to arrange wires for extraction of charge, various control lines and signal lines on the light reception face side of the PD, and the photoelectric conversion region is restricted. In short, a sufficient photoelectric conversion region may not be securable and a characteristic such as a pixel sensitivity sometimes degrades.

Furthermore, in the case where it is considered to use a CAPD sensor at a place at which outside light exists, outside light components make noise components to an indirect ToF method by which distance measurement is performed using active light. Therefore, in order to secure a sufficient SN ratio (Signal to Noise ratio) to obtain distance information, it is necessary to secure a sufficient saturation signal amount (Qs). However, in the CAPD sensor of the front-illuminated type, since there is a restriction in the wiring layout, in order to secure a capacity, a contrivance of using a method other than a wire capacity is required such as provision of an additional transistor.

Furthermore, in the CAPD sensor of the front-illuminated type, a signal extraction portion called Tap is arranged in the substrate on the side on which light is incident. On the other hand, in the case where photoelectric conversion in an Si substrate is taken into consideration, although there is a difference in the attenuation rate depending upon the wavelength of light, the ratio at which photoelectric conversion occurs on the light inputting face side is high. Therefore, in a surface type CAPD sensor, a CAPD sensor of the front-illuminated type has the possibility that the probability may become high that photoelectric conversion is performed in an Inactive Tap region that is a Tap region to which signal charge is not to be distributed from among Tap regions in which the signal extraction portion is provided. In the inactive ToF sensor, since distance measurement information is obtained using a signal distributed to charge accumulation regions in response to the phase of active light, components after photoelectric conversion is performed directly in the Inactive Tap region become noise, resulting in the possibility that distance measurement accuracy may degrade. More specifically, there is the possibility that a characteristic of the CAPD sensor may degrade.

The present technology has been made in view of such a situation as described above and makes it possible to improve a characteristic.

Solution to Problems

A light reception device according to a first aspect of the present technology includes:

an on-chip lens;

a wiring layer; and a semiconductor layer arranged between the on-chip lens and the wiring layer, in which the semiconductor layer includes a first tap having a first voltage application portion and a first charge detection portion arranged around the first voltage application portion, and a second tap having a second voltage application portion to which a second voltage different from the first voltage is applied and a second charge detection portion arranged around the second voltage application portion, and the on-chip lens is configured such that a position thereof differs depending upon an in-plane position of a pixel array section, so that an optical path length or a DC contrast of a chief ray from an object is uniform at in-plane pixels of the pixel array section.

In the first aspect of the present technology, an on-chip lens, a wiring layer and a semiconductor layer arranged between the on-chip lens and the wiring layer are provided. Furthermore, a first tap having a first voltage application portion to which a first voltage is applied and a first charge detection portion arranged around the first voltage application portion, and a second tap having a second voltage application portion to which a second voltage different from the first voltage is applied and a second charge detection portion arranged around the second voltage application portion are provided in the semiconductor layer. The on-chip lens is configured such that the position thereof differs depending upon an in-plane position of a pixel array section, so that an optical path length or a DC contrast of a chief ray from an object is uniform at in-plane pixels of the pixel array section.

A distance measurement module according to a second aspect of the present technology includes:

a light reception device including an on-chip lens, a wiring layer, and a semiconductor layer arranged between the on-chip lens and the wiring layer, in which the semiconductor layer includes a first tap having a first voltage application portion to which a first voltage is applied and a first charge detection portion arranged around the first voltage application portion, and a second tap having a second voltage application portion to which a second voltage different from the first voltage is applied and a second charge detection portion arranged around the second voltage application portion, and in the light reception device, the on-chip lens is configured such that the position thereof differs depending upon an in-plane position of the pixel array section such that an optical path length or a DC contrast of a chief ray from an object is uniform at in-plane pixels of the pixel array section;

a light source configured to illuminate illumination light having a brightness that varies periodically; and a light emission controlling section configured to control an illumination timing of the illumination light.

In the second aspect of the present technology, an on-chip lens, a wiring layer, a semiconductor layer arranged between the on-chip lens and the wiring layer are provided. A first tap having a first voltage application portion to which a first voltage is applied and a first charge detection portion arranged around the first voltage application portion, and a second tap having a second voltage application portion to which a second voltage different from the first voltage is applied and a second charge detection portion arranged around the second voltage application portion are provided in the semiconductor layer. Furthermore, a light reception device in which the on-chip lens is configured such that the position thereof differs depending upon an in-plane position of the pixel array section such that an optical path length or a DC contrast of a chief ray from an object is uniform at in-plane pixels of the pixel array section, a light source configured to illuminate illumination light having a brightness that varies periodically, and a light emission controlling section configured to control an illumination timing of the illumination light are provided.

Advantage Effect of Invention

With the first and second aspects of the present technology, a characteristic can be improved.

Note that the advantageous effect described here is not necessarily restricted and may be any of advantageous effects described in the present disclosure.

BRIEF DESCRIPTION OF DRAWINGS

FIG. 1 is a block diagram depicting an example of a configuration of a light reception device.

FIG. 88 is a view illustrating a driving mode for the first and second taps.

DESCRIPTION OF EMBODIMENTS

Figure 2:
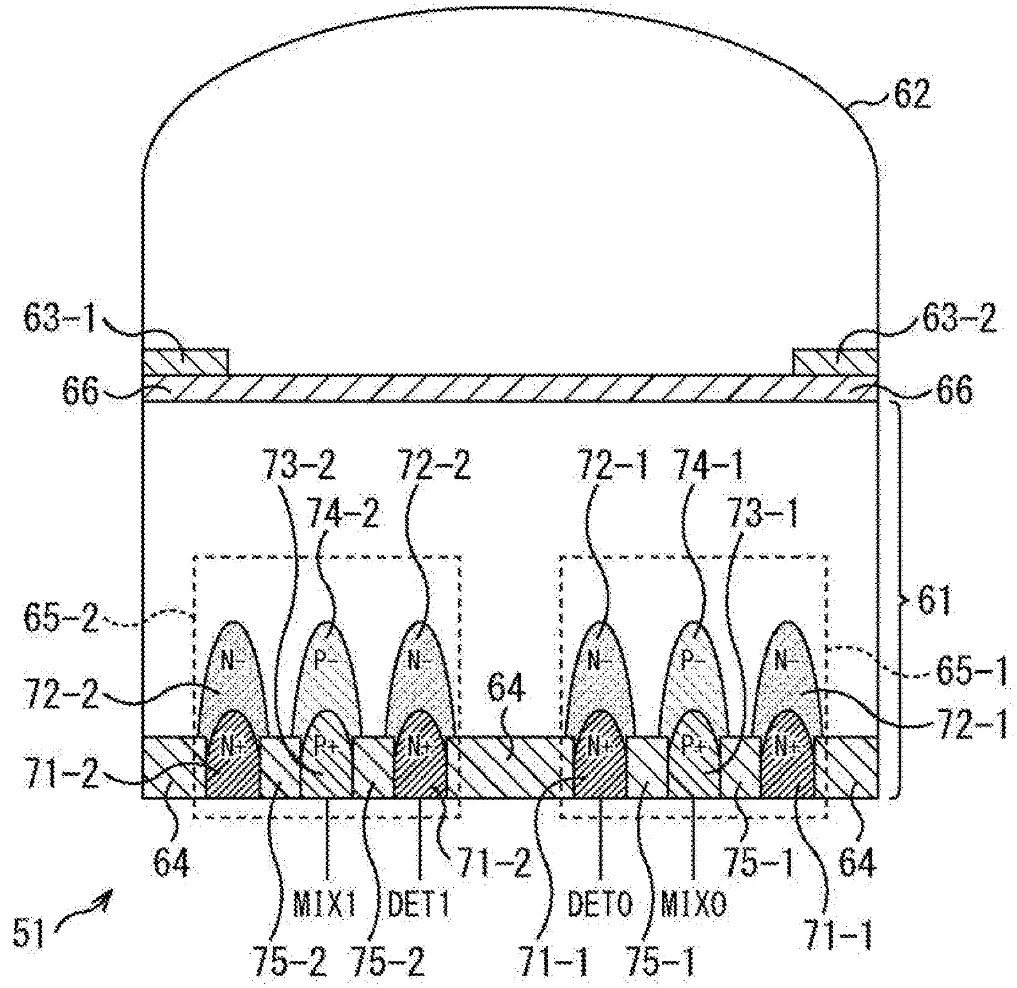
FIG. 2 is a view depicting an example of a configuration of a pixel.

In the following, embodiments to which the present technology is applied are described.

First Embodiment

<Example of Configuration of Light Reception Device>

The present technology makes it possible to improve a characteristic such as a pixel sensitivity by configuring a CAPD sensor as that of the back-illuminated type.

The present technology can be applied to a light reception device that configures a distance measurement system that performs distance measurement, for example, by an indirect ToF method, an imaging apparatus having such a light reception device as just described and so forth.

For example, the distance measurement system is incorporated in a vehicle, and can be applied to an on-vehicle system for measuring the distance to an object existing outside a vehicle, a gesture recognition system in which the distance to an object such as a hand of a user is measured and a gesture of the user is recognized on the basis of a result of the measurement or the like. In this case, a result of the gesture recognition can be used, for example, for operation of a car navigation system or the like.

FIG. 1 is a block diagram depicting an example of a configuration of an embodiment of the light reception device to which the present technology is applied.

The light reception device 1 depicted in FIG. 1 is a CAPD sensor of the back-illuminated type and is provided, for example, on an imaging apparatus having a distance measurement function.

The light reception device 1 is configured such that it includes a pixel array section 20 formed on a semiconductor substrate not depicted and a peripheral circuit section integrated on the semiconductor substrate on which the pixel array section 20 is provided. For example, the peripheral circuit section is configured from a tap driving section 21, a vertical driving section 22, a column processing section 23, a horizontal driving section 24 and a system controlling section 25.

Also, a signal processing section 31 and a data storage section 32 are provided in the light reception device 1. Note that the signal processing section 31 and the data storage section 32 may be provided on a substrate on which the light reception device 1 is provided or may be arranged on a substrate different from the substrate in the imaging apparatus on which the light reception device 1 is provided.

The pixel array section 20 is configured such that pixels 51 that generate charge according to the amount of received light and individually output a signal corresponding to the charge are two-dimensionally arranged in a matrix in a row direction and a column direction. More specifically, the pixel array section 20 includes a plurality of pixels 51 that perform photoelectric conversion for incident light and individually output a signal corresponding to the charge obtained by a result of the photoelectric conversion. Here, the row direction signifies an array direction of the pixels 51 in the horizontal direction and the column direction signifies an array direction of the pixels 51 in the vertical direction. In FIG. 1, the row direction is a transverse direction and the column direction is a vertical direction.

The pixel 51 receives light incident from the outside, especially, infrared light, and performs photoelectric conversion for the received light and outputs a pixel signal corresponding to charge obtained as a result of the photoelectric conversion. The pixel 51 has a first tap TA to which a predetermined voltage MIX0 (first voltage) is applied to detect the charge obtained by the photoelectric conversion and a second tap TB to which a predetermined voltage MIX1 (second voltage) is applied to detect charge obtained by the photoelectric conversion.

The tap driving section 21 supplies the predetermined voltage MIX0 to the first tap TA of the pixels 51 of the pixel array section 20 through a predetermined voltage supply line 30 and supplies the predetermined voltage MIX1 to the second tap TB through the predetermined voltage supply line 30. Therefore, two voltage supply lines 30 including a voltage supply line 30 for transmitting the voltage MIX0 and another voltage supply line 30 for transmitting the voltage MIX1 are wired for one pixel column of the pixel array section 20.

In the pixel array section 20, a pixel driving line 28 is wired, on the pixel array in a matrix, along a row direction for each pixel row and two vertical signal lines 29 are wired along a column direction for each pixel column. For example, the pixel driving line 28 transmits a driving signal for performing driving when a signal is to be read out from a pixel. Note that, although, in FIG. 1, the pixel driving line 28 is depicted as one wire, the number of pixel driving lines 28 is not limited to one. An end of the pixel driving line 28 is connected to an output end corresponding to each row of the vertical driving section 22.

The vertical driving section 22 is configured from a shift register, an address decoder or the like and drives the pixels of the pixel array section 20 at the same time or in a unit of a row or the like. More specifically, the vertical driving section 22 configures a driving section that controls operation of the pixels of the pixel array section 20 together with the system controlling section 25 for controlling the vertical driving section 22.

A signal outputted from each pixel 51 of the pixel row in response to driving control by the vertical driving section 22 is inputted to the column processing section 23 through the vertical signal line 29. The column processing section 23 performs predetermined signal processing for the pixel signal outputted from each pixel 51 through the vertical signal line 29 and temporarily retains the pixel signal after the signal processing.

More specifically, the column processing section 23 performs a noise removing process, an AD (Analog to Digital) conversion process and so forth as the signal processing.

The horizontal driving section 24 is configured from a shift register, an address decoder or the like and selects a unit circuit corresponding to the pixel column of the column processing section 23 in order. By the selection scanning by the horizontal driving section 24, the pixel signal after the signal processing for each unit circuit by the column processing section 23 is outputted in order.

The system controlling section 25 is configured from a timing generator that generates various timing signals and performs driving control of the tap driving section 21, the vertical driving section 22, the column processing section 23 and the horizontal driving section 24 on the basis of the various timing signals generated by the timing generator.

The signal processing section 31 at least includes an arithmetic operation processing function and performs various signal processes such as an arithmetic operation process on the basis of the pixel signal outputted from the column processing section 23. When the signal processing in the signal processing section 31 is to be performed, the data storage section 32 temporarily stores data necessary for the processing.

<Example of Configuration of Pixel>

Now, an example of a configuration of a pixel provided in the pixel array section 20 is described. Each pixel provided in the pixel array section 20 is configured, for example, in such a manner as depicted in FIG. 2.

FIG. 2 depicts a cross section of one pixel 51 provided in the pixel array section 20, and this pixel 51 receives and photoelectrically converts light incident from the outside, especially, infrared light and outputs a signal according to charge obtained as a result of the photoelectric conversion.

The pixel 51 includes a substrate 61 including a P-type semiconductor layer such as, for example, a silicon substrate, and an on-chip lens 62 formed on the substrate 61.

For example, the substrate 61 is formed such that the thickness thereof in the vertical direction in FIG. 2, more specifically, the thickness in a direction perpendicular to a plane of the substrate 61, is equal to or smaller than 20μ. Note that naturally the thickness of the substrate 61 may be equal to or greater than 20 μm and it is sufficient if the thickness is determined in response to a target feature or the like of the light reception device 1.

Furthermore, the substrate 61 is a P-Epi substrate of a high resistance or the like having a substrate concentration equal to or lower than, for example, 1 E+13 order, and the resistance (resistivity) of the substrate 61 is, for example, equal to or higher than 500 [Ωcm].

Here, the relationship between the substrate concentration and the resistance of the substrate 61 is such that, for example, when the substrate concentration is 6.48 E+12 [$cm^3$], the resistance is 2000 [Ωcm], when the substrate concentration is 1.30 E+13 [$cm^3$], the resistance is 1000 [Ωcm], when the substrate concentration is 2.59 E+13 [$cm^3$], the resistance is 500 [Ωcm], and when the substrate concentration is 1.30 E+14 [$cm^3$], the resistance is 100 [Ωcm].

In FIG. 2, the upper side face of the substrate 61 is the rear face of the substrate 61 and is a light incident face through which light from the outside is incident on the substrate 61. On the other hand, the lower side face of the substrate 61 is the front face of the substrate 61 and has a multilayer wiring layer not depicted formed thereon. On the light incident face of the substrate 61, a fixed charge film 66 configured from a single layer film or a stacked layer film having positive fixed charge is formed, and the on-chip lens 62 for condensing and introducing light incident from the outside into the substrate 61 is formed on the upper face of the fixed charge film 66. The fixed charge film 66 places the light incident face side of the substrate 61 into a hole accumulation state to suppress generation of dark current.

Furthermore, in the pixel 51, an inter-pixel shading film 63-1 and another inter-pixel shading film 63-2 for preventing crosstalk between adjacent pixels are formed at end portions of the pixel 51 on the fixed charge film 66. In the following description, in the case where there is no necessity to specifically distinguish the inter-pixel shading film 63-1 and the inter-pixel shading film 63-2 from each other, they are sometimes referred to simply as inter-pixel shading films 63.

Although, in this example, light from the outside enters the substrate 61 through the on-chip lens 62, the inter-pixel shading films 63 are formed in order to suppress light incident from the outside from entering a region of a different pixel neighboring with the pixel 51 on the substrate 61. More specifically, light incident on the on-chip lens 62 from the outside and directed toward the different pixel adjacent the pixel 51 is blocked by the inter-pixel shading film 63-1 or the inter-pixel shading film 63-2 from entering the adjacent different pixel.

Since the light reception device 1 is a CAPD sensor of the back-illuminated type, the light incident face of the substrate 61 is the so-called rear face, and a wiring layer configured from wirings and so forth is not formed on the rear face. Furthermore, at a portion of the face on the opposite side to the light incident face of the substrate 61, a wiring layer in which wirings for driving transistors and so forth formed in the substrate 61, wirings for reading out a signal from the pixel 51 and so forth are formed is formed by stacking.

At a portion of the face side on the opposite side to the light incident face in the substrate 61, more specifically, at a portion on the inner side of the lower side face, an oxide film 64, a signal extraction portion 65-1 and another signal extraction portion 65-2 are formed. The signal extraction portion 65-1 corresponds to the first tap TA described hereinabove with reference to FIG. 1, and the signal extraction portion 65-2 corresponds to the second tap TB described hereinabove with reference to FIG. 1.

In this example, the oxide film 64 is formed at a central portion of the pixel 51 in the proximity of the face on the opposite side to the light incident face of the substrate 61, and the signal extraction portion 65-1 and the signal extraction portion 65-2 are formed at the opposite ends of the oxide film 64.

Here, the signal extraction portion 65-1 has an N+ semiconductor region 71-1 that is an N type semiconductor region and another N− semiconductor region 72-1 having a concentration of donor impurities lower than that of the N+ semiconductor region 71-1, and a P+ semiconductor region 73-1 that is a P type semiconductor region and another P− semiconductor region 74-1 having a concentration of acceptor impurities lower than that of the P+ semiconductor region 73-1. Here, as the donor impurities, for example, elements of the group 5 in the periodic table of elements such as phosphorus (P) or arsenic (As) with respect to Si are applicable, and as the acceptor impurities, for example, elements of the group 3 in the periodic table of elements such as boron (B) with respect to Si are applicable. Elements that become donor impurities are called donor elements, and elements that become acceptor impurities are called acceptor elements.

Referring to FIG. 2, the N+ semiconductor region 71-1 is formed at a position neighboring with the right side to the oxide film 64 at a surface inner side portion of the face on the opposite side to the light incident face of the substrate 61. Furthermore, the N− semiconductor region 72-1 is formed on the upper side in FIG. 2 of the N+ semiconductor region 71-1 such that it covers (surrounds) the N+ semiconductor region 71-1.

Furthermore, the P+ semiconductor region 73-1 is formed on the right side of the N+ semiconductor region 71-1. Furthermore, the P− semiconductor region 74-1 is formed on the upper side in FIG. 2 of the P+ semiconductor region 73-1 such that it covers (surrounds) the P+ semiconductor region 73-1.

Furthermore, the N+ semiconductor region 71-1 is formed on the right side of the P+ semiconductor region 73-1. Furthermore, the N− semiconductor region 72-1 is formed on the upper side in FIG. 2 of the N+ semiconductor region 71-1 such that it covers (surrounds) the N+ semiconductor region 71-1.

Similarly, the signal extraction portion 65-2 has an N+ semiconductor region 71-2 that is an N time semiconductor region and an N− semiconductor region 72-2 having a concentration of donor impurities lower than that of the N+ semiconductor region 71-2, and a P+ semiconductor region 73-2 that is a P type semiconductor region and a P− semiconductor region 74-2 having a concentration of acceptor impurities lower than that of the P+ semiconductor region 73-2.

In FIG. 2, the N+ semiconductor region 71-2 is formed at a position neighboring on the left side with the oxide film 64 at a surface inner side portion of the face on the opposite side to the light incident face of the substrate 61. Furthermore, the N− semiconductor region 72-2 is formed on the upper side in FIG. 2 of the N+ semiconductor region 71-2 such that it covers (surrounds) the N+ semiconductor region 71-2.

Furthermore, the P+ semiconductor region 73-2 is formed on the left side of the N+ semiconductor region 71-2. Furthermore, the P− semiconductor region 74-2 is formed on the upper side in FIG. 2 of the P+ semiconductor region 73-2 such that it covers (surrounds) the P+ semiconductor region 73-2.

Furthermore, the N+ semiconductor region 71-2 is formed on the left side of the P+ semiconductor region 73-2. Furthermore, the N− semiconductor region 72-2 is formed on the upper side in FIG. 2 of the N+ semiconductor region 71-2 such that it covers (surrounds) the N+ semiconductor region 71-2.

At end portions of the pixel 51 in a surface inner side portion of the face on the opposite side to the light incident face of the substrate 61, oxide films 64 similar to that at the central portion of the pixel 51 are formed.

In the following description, in the case where there is no necessity to specifically distinguish the signal extraction portion 65-1 and the signal extraction portion 65-2 from each other, each of them is sometimes referred to simply as signal extraction portion 65.

Furthermore, in the following description, in the case where there is no necessity to specifically distinguish the N+ semiconductor region 71-1 and the N+ semiconductor region 71-2 from each other, each of them is referred to merely as N+ semiconductor region 71, and in the case where there is no necessity to specifically distinguish the N− semiconductor region 72-1 and the N− semiconductor region 72-2 from each other, each of them is referred to merely as N− semiconductor region 72.

Furthermore, in the following description, in the case where there is no necessity to specifically distinguish the P+ semiconductor region 73-1 and the P+ semiconductor region 73-2 from each other, each of them is referred to merely as P+ semiconductor region 73, and in the case where there is no necessity to specifically distinguish the P− semiconductor region 74-1 and the P− semiconductor region 74-2 from each other, each of them is referred to merely as P− semiconductor region 74.

Furthermore, in the substrate 61, between the N+ semiconductor region 71-1 and the P+ semiconductor region 73-1, a separation portion 75-1 for separating the regions from each other includes an oxide film or the like. Similarly, also between the N+ semiconductor region 71-2 and the P+ semiconductor region 73-2, a separation portion 75-2 for separating the regions from each other includes an oxide film or the like. In the following description, in the case where there is no necessity to specifically distinguish the separation portion 75-1 and the separation portion 75-2 from each other, each of them is referred to merely as separation portion 75.

The N+ semiconductor region 71 provided in the substrate 61 functions as a charge detection section for detecting the light amount of incident light from the outside to the pixel 51, more specifically, the amount of signal carriers generated by photoelectric conversion by the substrate 61. Note that a region including not only the N+ semiconductor region 71 but also the N− semiconductor region 72 can be grasped as the charge detection section. Furthermore, the P+ semiconductor region 73 functions as a charge application portion for injecting majority carrier current into the substrate 61, more specifically, for directly applying a voltage to the substrate 61, to generate an electric field in the substrate 61. Note that a region including not only the P+ semiconductor region 73 but also the P− semiconductor region 74 in which the acceptor impurity concentration is low can be grasped as a voltage application portion.

In the pixel 51, an FD (Floating Diffusion) portion (hereinafter referred to especially also as FD portion A) that is a floating diffusion region not depicted is connected directly to the N+ semiconductor region 71-1, and the FD portion A is connected to a vertical signal line 29 through an amplification transistor not depicted or the like.

Similarly, to the N+ semiconductor region 71-2, a different FD portion (hereinafter referred to specifically also as FD portion B) that is a floating diffusion region is connected directly, and furthermore, the FD portion B is connected to a vertical signal line 29 through an amplification transistor not depicted or the like. Here the FD portion A and the FD portion B are connected to the vertical signal lines 29 different from each other.

For example, in the case where it is tried to measure the distance to a target by the indirect ToF method, infrared light is emitted from an imaging apparatus in which the light reception device 1 is provided toward the target. Then, if the infrared light is reflected by the target and returns as reflection light to the imaging apparatus, then the substrate 61 of the light reception device 1 receives and photoelectrically converts the reflection light (infrared light) incident thereto. The tap driving section 21 drives the first tap TA and the second tap TB of the pixel 51 and distributes a signal according to charge DET obtained by the photoelectric conversion to the FD portion A and the FD portion B.

For example, at a certain timing, the tap driving section 21 applies a voltage to each of the two P+ semiconductor regions 73 through a contact or the like. Specifically, for example, the tap driving section 21 applies a voltage of MIX0=1.5 V to the P+ semiconductor region 73-1 that is the first tap TA and applies another voltage of MIX0=0 V to the P+ semiconductor region 73-2 that is the second tap TB.

Consequently, an electric field is generated between the two P+ semiconductor regions 73 in the substrate 61, and current flows from the P+ semiconductor region 73-1 to the P+ semiconductor region 73-2. In this case, positive holes (holes) in the substrate 61 move in a direction toward the P+ semiconductor region 73-2 while electrons move in a direction toward the P+ semiconductor region 73-1.

Therefore, if, in such a state as just described, infrared light (reflection light) from the outside is introduced into the substrate 61 through the on-chip lens 62 and is photoelectrically converted in the substrate 61 into an electron and a hole in pair, then the obtained electrode is introduced in a direction toward the P+ semiconductor region 73-1 by the electric field between the P+ semiconductor regions 73 and moves into the N+ semiconductor region 71-1.

In this case, electrons generated by the photoelectric conversion are used as a signal carrier for detecting a signal according to an amount of infrared light incident to the pixel 51, more specifically, according to the reception light amount of the infrared light.

As a consequence, into the N+ semiconductor region 71-1, charge according to electrons moved into the N+ semiconductor region 71-1 is accumulated, and this charge is detected by the column processing section 23 through the FD portion A, amplification transistor, vertical signal line 29 and so forth.

More specifically, accumulation charge DET0 in the N+ semiconductor region 71-1 is transferred to the FD portion A directly connected to the N+ semiconductor region 71-1, and a signal according to the accumulation charge DET0 transferred to the FD portion A is read out by the column processing section 23 through the amplification transistor and the vertical signal line 29. Then, the read out signal is subjected to such a process as an AD conversion process by the column processing section 23, and a pixel signal obtained as a result of the process is supplied to the signal processing section 31.

This pixel signal is a signal indicative of the charge amount according to the electrons detected by the N+ semiconductor region 71-1, more specifically, indicative of the amount of charge DET0 accumulated in the FD portion A. In other words, it can be considered that the pixel signal is a signal indicative of a light amount of infrared light received by the pixel 51.

Note that, at this time, a pixel signal according to electrons detected by the N+ semiconductor region 71-2 similarly as in the case of the N+ semiconductor region 71-1 may also be used suitably for distance measurement.

Furthermore, at the next timing, voltages are applied to the two P+ semiconductor regions 73 through contacts and so forth by the tap driving section 21 such that an electric field of a direction opposite to that of the electric field having been generated in the substrate 61 till then. Specifically, for example, a voltage of MIX0=0 V is applied to the P+ semiconductor region 73-1 that is the first tap TA and another voltage of MIX1=1.5 V is applied to the P+ semiconductor region 73-2 that is the second tap TB.

As a consequence, an electric field is generated between the two P+ semiconductor regions 73 in the substrate 61 and current flows from the P+ semiconductor region 73-2 to the P+ semiconductor region 73-1.

If, in such a state as just described, infrared light (reflection light) from the outside is introduced into the substrate 61 through the on-chip lens 62 and the infrared light is converted into pairs of an electron and a hole by photoelectric conversion in the substrate 61, then the obtained electrons are introduced in a direction toward the P+ semiconductor region 73-2 by the electric field between the P+ semiconductor regions 73 and moves into the N+ semiconductor region 71-2.

As a consequence, in the N+ semiconductor region 71-2, charge according to electrons having been moved into the N+ semiconductor region 71-2 is accumulated, and this charge is detected by the column processing section 23 through the FD portion B, amplification transistor, vertical signal line 29 and so forth.

More specifically, accumulation charge DET1 in the N+ semiconductor region 71-2 is transferred to the FD portion B directly connected to the N+ semiconductor region 71-2, and a signal according to the charge DET1 transferred to the FD portion B is read out by the column processing section 23 through the amplification transistor and the vertical signal line 29. Then, processes such as an AD conversion process and so forth are performed for the read out signal by the column processing section 23, and a signal obtained as a result of the processes is supplied to the signal processing section 31.

Note that also a pixel signal according to electrons detected by the N+ semiconductor region 71-1 in a similarly manner as in the case of the N+ semiconductor region 71-2 may be suitably used for distance measurement.

If pixel signals generated by photoelectric conversion during periods different from each other are obtained by the same pixel 51 in this manner, the signal processing section 31 calculates distance information indicative of the distance to the target on the basis of the pixel signals and outputs the distance information to the succeeding stage.

The method of distributing signal carriers to the N+ semiconductor regions 71 different from each other and calculating distance information associated with the basis of signals according to the signal carriers in this manner is called indirect ToF method.

If a portion of the signal extraction portion 65 of the pixel 51 is viewed in a direction from above to below in FIG. 2, more specifically, in a direction perpendicular to the plane of the substrate 61, then this is structured such that each P+ semiconductor region 73 is surrounded by an N+ semiconductor region 71 as depicted, for example, in FIG. 3. Note that portions corresponding to those in the case of FIG. 2 are denoted by like reference signs and description of them is suitably omitted.

Figure 3:
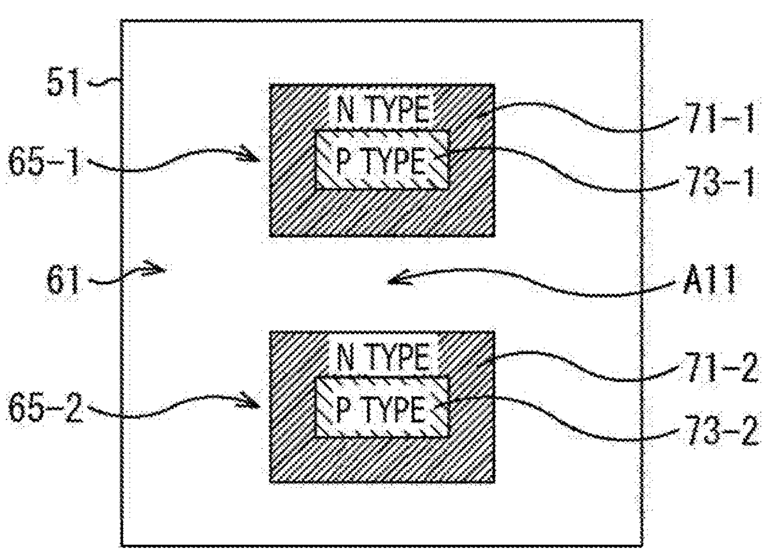
FIG. 3 is a view depicting an example of a configuration of a portion of a signal extraction portion of the pixel.

In the example depicted in FIG. 3, an oxide film 64 not depicted is formed at a central portion of the pixel 51, and a signal extraction portion 65 is formed at a rather end side portion from the center of the pixel 51. Especially here, in the pixel 51, two signal extraction portions 65 are formed.

In addition, at each signal extraction portion 65, a P+ semiconductor region 73 is formed in a rectangular shape at a central position of the signal extraction portion 65, and centered at the P+ semiconductor region 73, the P+ semiconductor region 73 is surrounded by an N+ semiconductor region 71 of a rectangular shape, more particularly, of a rectangular frame shape. More specifically, the N+ semiconductor region 71 is formed in such a manner as to surround the P+ semiconductor region 73.

Furthermore, in the pixel 51, an on-chip lens 62 is formed such that infrared light incident from the outside is condensed to a central portion of the pixel 51, more specifically, to a portion indicated by an arrow mark A11. In other words, infrared light incident to the on-chip lens 62 from the outside is condensed to a position indicated by the arrow mark A11, more specifically, to a position on the upper side in FIG. 2 of the oxide film 64 in FIG. 2, by the on-chip lens 62.

Therefore, infrared light is condensed to a position between the signal extraction portion 65-1 and the signal extraction portion 65-2. As a consequence, such a situation that infrared light enters a pixel neighboring with the pixel 51 to cause crosstalk can be suppressed, and also it can be suppressed that infrared light directly enters the signal extraction portion 65.

For example, if infrared light directly enters the signal extraction portion 65, then the charge separation efficiency, more specifically, Cmod (Contrast between active and inactive tap) or Modulation contrast, degrades.

Here, that one of the signal extraction portions 65 from which reading out of a signal according to the charge DET obtained by photoelectric conversion is to be performed, more specifically, the signal extraction portion 65 from which the charge DET obtained by photoelectric conversion is to be detected, is referred to also as active tap (active tap).

On the contrary, the signal extraction portion 65 from which reading out of a signal according to the charge DET obtained by photoelectric conversion is not to be performed basically, more specifically, the signal extraction portion 65 that is not an active tap, is referred to also as inactive tap (inactive tap).

In the example described above, that one of the signal extraction portions 65 in which the voltage of 1.5 V is applied to the P+ semiconductor region 73 is the active tap, and the signal extraction portion 65 in which the voltage of 0 V is applied to the P+ semiconductor region 73 is the inactive tap.

The Cmod is an index that is calculated by an expression (1) given below and represents what % of charge from within the charge generated by photoelectric conversion of incident infrared light can be detected by the N+ semiconductor region 71 of the signal extraction portion 65 that is the active tap, more specifically, whether or not a signal according to charge can be extracted, and indicates a charge separation efficiency. In the expression (1), I0 is a signal detected by one of the two charge detection portions (P+ semiconductor regions 73) and I1 is a signal detected by the other charge detection portion.

$$C\,\mathrm{mod}=\{|I0-I1|/(I0+I1)\}\times 100 \tag{1}$$

Therefore, for example, if infrared light incident from the outside enters the region of the inactive tap and photoelectric conversion is performed in the inactive tap, then the possibility that electrons of a signal carrier generated by the photoelectric conversion may move into the N+ semiconductor region 71 in the inactive tap is high. Consequently, charge of some electrons obtained by the photoelectric conversion are not detected by the N+ semiconductor region 71 in the active tap, and the Cmod, more specifically, the charge separation efficiency, drops.

Therefore, by configuring the pixel 51 such that infrared light is condensed to the proximity of a central portion of the pixel 51, which is at a position spaced by substantially equal distances from the two signal extraction portions 65, the possibility that infrared light incident from the outside may be photoelectrically converted in the region of the inactive tap can be reduced and the charge separation efficiency can be improved thereby. Furthermore, in the pixel 51, Modulation contrast also can be improved. More specifically, it is possible to allow electrons obtained by photoelectric conversion to be introduced readily into the N+ semiconductor region 71 in the active tap.

With such a light reception device 1 as described above, the following advantageous effects can be achieved.

More specifically, since the light reception device 1 is of the back-illuminated type, quantum efficiency (QE)×aperture ratio (FF (Fill Factor)) can be maximized and the distance measurement characteristic by the light reception device 1 can be improved.

Figure 4:
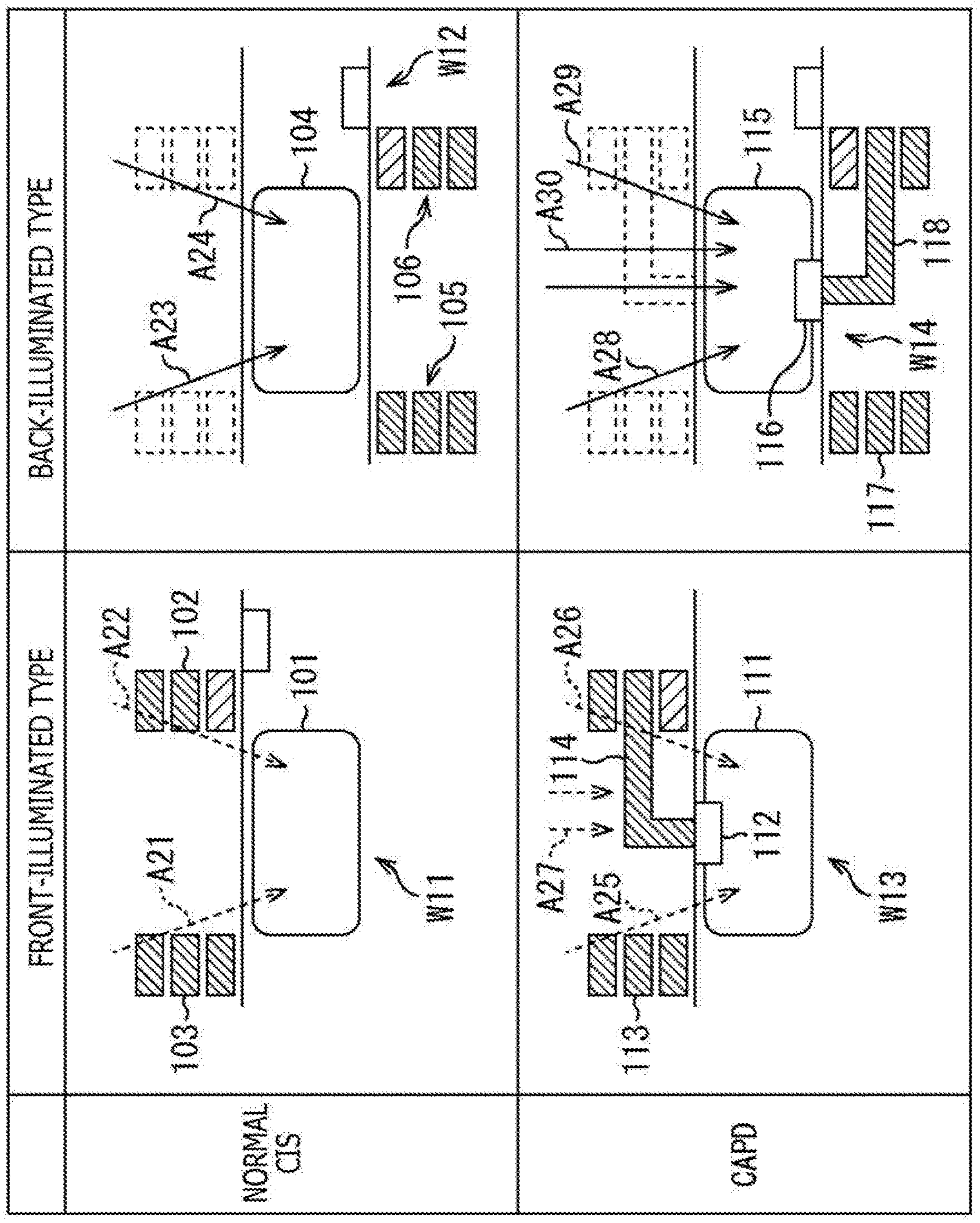
FIG. 4 is a view illustrating sensitivity improvement.

For example, as indicated by an arrow mark W11 of FIG. 4, an ordinary image sensor of the front-illuminated type is structured such that a wiring 102 and another wiring 103 are formed on the light indicant face side, to which light from the outside is incident, of a PD 101 that is a photoelectric conversion portion.

Therefore, it occurs such a situation that part of light incident obliquely to the PD 101 with some angle as indicated by an arrow mark A21 or another arrow mark A22 from the outside is blocked by the wiring 102 or the wiring 103 and does not enter the PD 101.

In contrast, an image sensor of the back-illuminated type is structured such that a wiring 105 and another wiring 106 are formed on a face of a PD 104, which is a photoelectric conversion portion, on the opposite side to the light incident face to which light from the outside is incident, for example, as indicated by an arrow mark W12.

Therefore, in comparison with an alternative case in which the image sensor is of the front-illuminated type, a sufficient aperture ratio can be assured. More specifically, for example, light incident obliquely with respect to the PD 104 with a certain angle as indicated by an arrow mark A23 or another arrow mark A24 from the outside is incident to the PD 104 without being blocked by any wiring. As a consequence, it is possible to receive a greater amount of light thereby to improve the sensitivity of the pixel.

Such improvement effect as described above of the pixel sensitivity obtained by forming an image sensor as that of the back-illuminated type can be achieved also with the light reception device 1 that is a CAPD sensor of the back-illuminated type.

Furthermore, for example, in a CAPD sensor of the front-illuminated type, a signal extraction portion 112 called tap, more particularly, a P+ semiconductor region or an N+ semiconductor region of a tap, is formed on the light incident face side on which light from the outside is incident in the inside of a PD 111 that is a photoelectric conversion portion as indicated by an arrow mark W13. More particularly, a CAPD sensor of the front-illuminated type is structured such that a wiring 113 and a contact or a wiring 114 of a metal connected to the signal extraction portion 112 are formed on the light incident face side.

Therefore, for example, not only such a situation that part of light incident obliquely on the PD 111 with a certain angle as indicated by an arrow mark A25 or another arrow mark A26 from the outside is blocked by the wiring 113 or the like and is not incident on the PD 111 but also such a situation that also light incident perpendicularly on the PD 111 as indicated by an arrow mark A27 is blocked by the wiring 114 and is not incident on the PD 111.

In contrast, a CAPD sensor of the back-illuminated type is structured such that a signal extraction portion 116 is formed at a portion of the face of a PD 115, which is a photoelectric conversion portion, on the opposite side to the light incident face on which light from the outside is incident as indicated, for example, by an arrow mark W14. Furthermore, on the face on the opposite side to the light incident face of the PD 115, a wiring 117 and a contact and a wiring 118 of metal connected to the signal extraction portion 116 are formed.

Here, the PD 115 corresponds to the substrate 61 depicted in FIG. 2, and the signal extraction portion 116 corresponds to the signal extraction portion 65 depicted in FIG. 2.

In a CAPD sensor of the back-illuminated type of such a structure as described above, a sufficient aperture ratio can be assured in comparison with that in an alternative case of the front-illuminated type. Therefore, the quantum efficiency (QE)×aperture ratio (FF) can be maximized and the distance measurement characteristic can be improved.

More specifically, for example, light incident obliquely toward the PD 115 with a certain angle as indicated by an arrow mark A28 or another arrow mark A29 from the outside enters the PD 115 without being blocked. Similarly, for example, also light incident perpendicularly toward the PD 115 as indicated by an arrow mark A30 enters the PD 115 without being blocked by a wiring or the like.

In this manner, in a CAPD sensor of the back-illuminated type, not only light incident with a certain angle but also light incident perpendicularly to the PD 115, which is otherwise reflected by a wiring or the like connected to a signal extraction portion in a CAPD sensor of the front-illuminated type, can be received. As a consequence, a greater amount of light can be received to improve the sensitivity of the pixel. More specifically, the quantum efficiency (QE)×aperture ratio (FF) can be maximized, and as a result, the distance measurement characteristic can be improved.

Especially, in the case where a tap is arranged not at a pixel outer edge but in the proximity of the middle of a pixel, although, in a CAPD sensor of the front-illuminated type, a sufficient aperture ratio cannot be assured and the sensitivity of the pixel is degraded, in the light reception device 1 that is a CAPD sensor of the back-illuminated type, a sufficient aperture ratio can be assured irrespective of the arrangement position of the tap, and the sensitivity of the pixel can be improved.

Furthermore, in the light reception device 1 of the back-illuminated type, since the signal extraction portion 65 is formed in the proximity of the face on the opposite side to the light incident face of the substrate 61 on which infrared light from the outside is incident, occurrence of photoelectric conversion of infrared light in a region of an inactive tap can be reduced. As a consequence, the Cmod, more specifically, the charge separation efficiency, can be improved.

Figure 5:
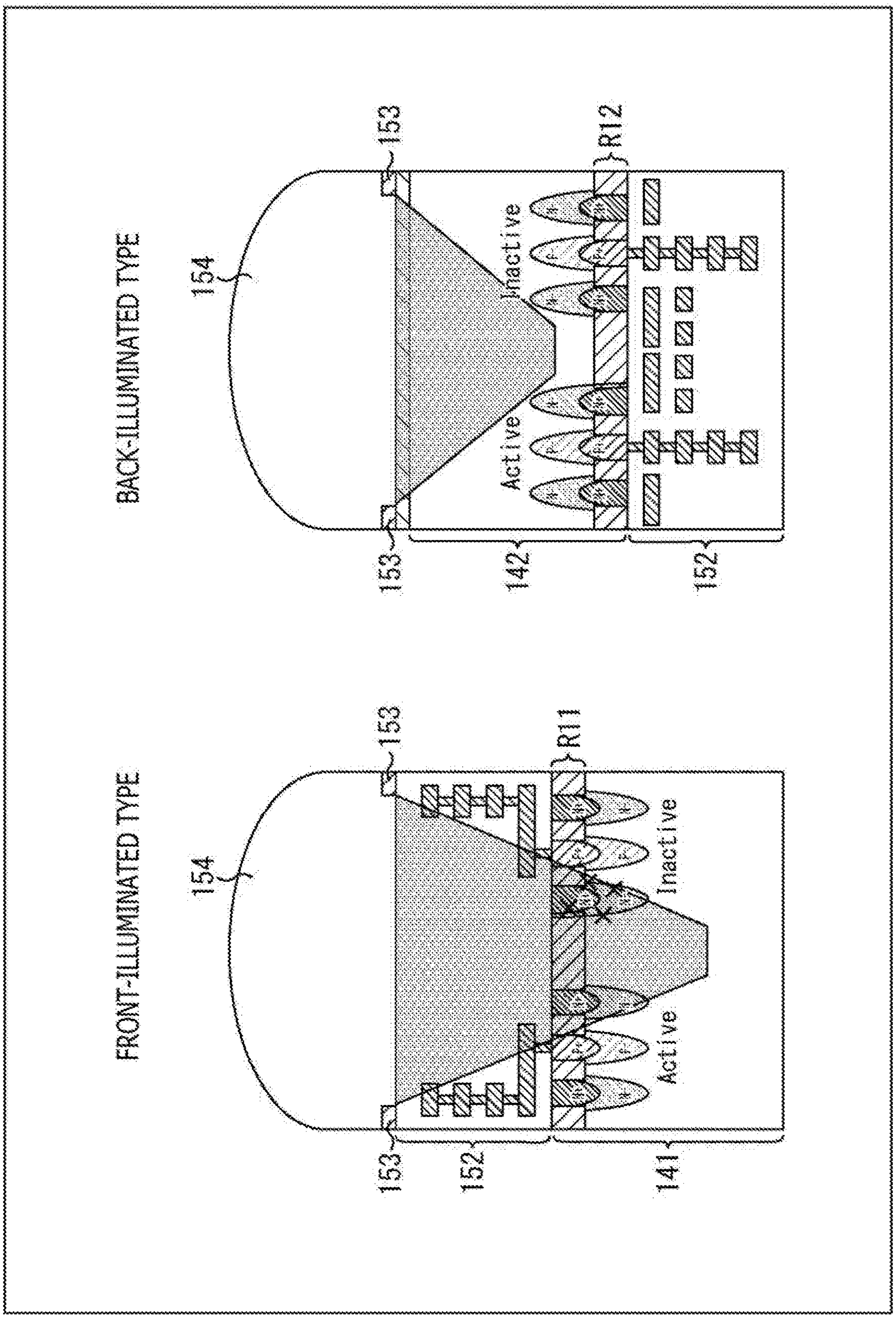
FIG. 5 is a view illustrating improvement of a charge separation efficiency.

FIG. 5 depicts cross sectional views of the CAPD sensor of the front-illuminated type and the back-illuminated type.

In the CAPD sensor of the front-illuminated type on the left side in FIG. 5, the upper side of a substrate 141 in FIG. 5 is the light incident face, and a wiring layer 152 including a plurality of layers of wirings, an inter-pixel shading portion 153 and an on-chip lens 154 are stacked on the light incident face side of the substrate 141.

In the CAPD sensor of the back-illuminated type on the right side in FIG. 5, a wiring layer 152 including a plurality of layers of wirings is formed on the lower side of a substrate 142 that is the opposite side to the light incident face in FIG. 5, and an inter-pixel shading portion 153 and an on-chip lens 154 are stacked on the upper side of the substrate 142 that is the light incident face side.

Note that a gray trapezoidal shape in FIG. 5 indicates a region in which the light intensity is high because infrared light is condensed by the on-chip lens 154.

For example, a CAPD sensor of the front-illuminated type includes a region R11 in which an inactive tap and an active tap exist on the light incident face side of the substrate 141. Therefore, there are many components incident directly on the inactive tap, and if photoelectric conversion occurs in the region of the inactive tap, then signal carriers obtained by the photoelectric conversion are not detected in the N+ semiconductor region of the active tap.

In a CAPD sensor of the front-illuminated type, since the intensity of infrared light is high in the region R11 in the proximity of the light incident face of the substrate 141, the probability that photoelectric conversion of infrared light is performed in the region R11 is high. More specifically, since the light amount of infrared light incident on the proximity of the inactive tap is great, signal carriers that cannot be detected by the active tap increase, resulting in degradation of the charge separation efficiency.

In contrast, in a CAPD sensor of the back-illuminated type, a region R12 in which the inactive tap and the active tap exist is positioned in the proximity of the face on the opposite side to the light incident face side. Here, the substrate 142 corresponds to the substrate 61 depicted in FIG. 2.

In this example, since the region R12 exists at a portion of the face on the opposite side to the light incident face side of the substrate 142 and the region R12 is positioned far from the light incident face, the intensity of incident infrared light is comparatively low in the proximity of the region R12.

Signal carries generated by photoelectric conversion in a region in which the intensity of infrared light is high such as a region in the proximity of the center or of the light incident face of the substrate 142 are introduced to the active tap by the electric field generated in the substrate 142 and detected by the N+ semiconductor region of the active tap.

On the other hand, in the proximity of the region R12 including the inactive tap, since the intensity of incident infrared light is comparatively low, the possibility that photoelectric conversion of infrared light may be performed in the region R12 is low. In short, since the light amount of infrared light incident on the proximity of the inactive tap is small, the number of signal carriers (electrons) that are generated by photoelectric conversion in the proximity of the inactive tap and move to the N+ semiconductor region of the inactive tap decreases, and the charge separation efficiency can be improved thereby. As a result, the distance measurement characteristic can be improved.

Furthermore, in the light reception device 1 of the back-illuminated type, since thinning of the substrate 61 can be implemented, the extraction efficiency of electrons (charge) that are a signal carrier can be improved.

Figure 6:
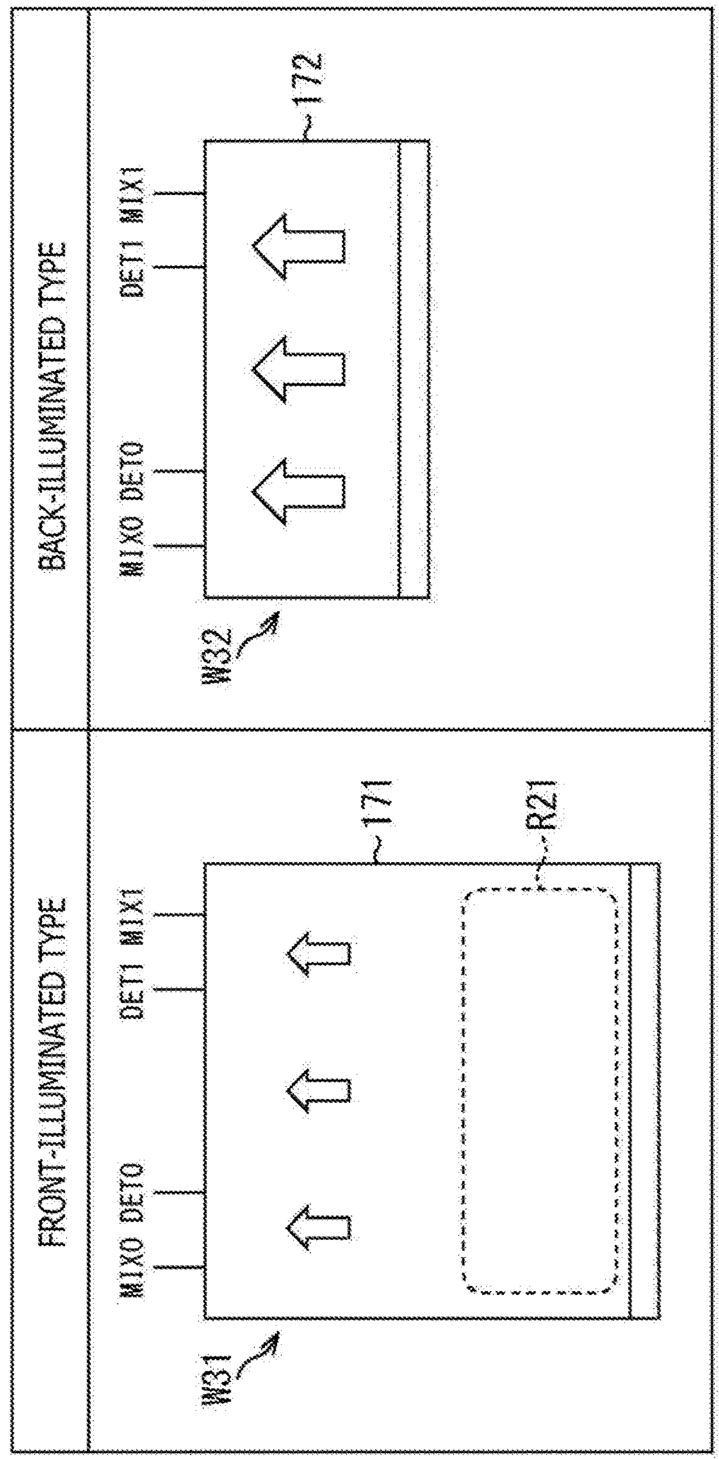
FIG. 6 is a view illustrating improvement of the extraction efficiency of electrons.

For example, since, in a CAPD sensor of the front-illuminated type, the aperture ratio cannot be assured sufficiently, it is necessary to provide a certain degree of thickness to a substrate 171 in order to assure a higher quantum efficiency as indicated by an arrow mark W31 of FIG. 6 and suppress reduction of the quantum efficiency×aperture ratio.

This makes the inclination of the potential moderate in a region in the proximity of the face on the opposite side to the light incident face in the substrate 171, for example, at a portion of region R21 and substantially makes the electric field in a direction perpendicular to the substrate 171 weaker. In this case, since the moving speed of the signal carrier becomes lower, the period of time required to detect a signal carrier in the N+ semiconductor region of the active tap after photoelectric conversion is performed increases. Note that an arrow mark in the substrate 171 in FIG. 6 represents an electric field in a direction perpendicular to the substrate 171 in the substrate 171.

Furthermore, if the substrate 171 is thick, then the distance of movement of a signal carrier from a position far from the active tap in the substrate 171 to the N+ semiconductor region in the active tap becomes long. Therefore, at a position far from the active tap, the period of time required until a signal carrier is detected in the N+ semiconductor region of the active tap after photoelectric conversion is performed further increases.

Figure 7:
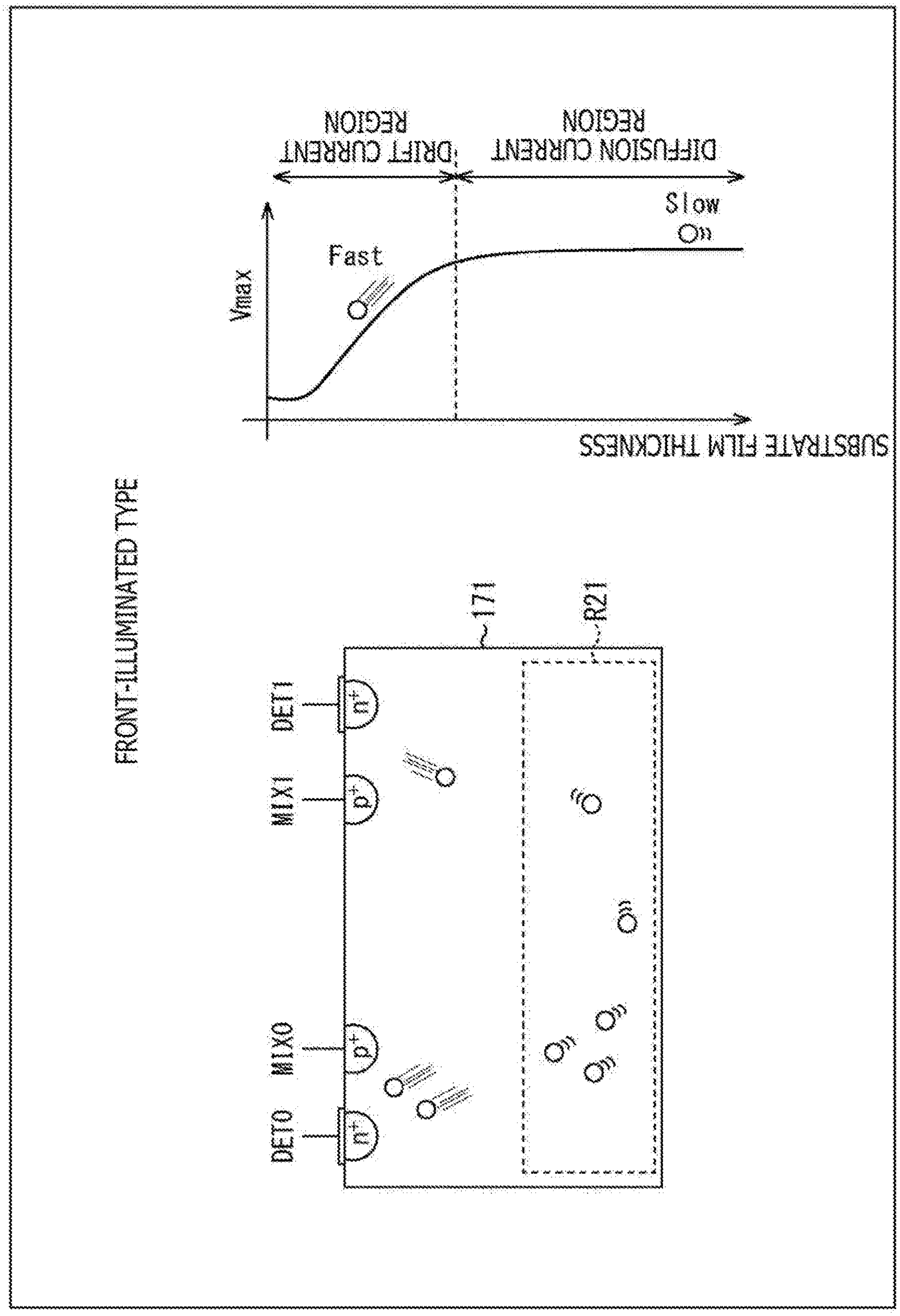
FIG. 7 is a view illustrating a moving speed of a signal carrier in a front-illuminated type.

FIG. 7 depicts a relationship between the position in the thicknesswise direction of the substrate 171 and the speed of movement of a signal carrier. A region R21 corresponds to a diffusion current region.

In this manner, if the substrate 171 has an increased thickness, for example, when the driving frequency is high, in short, when changeover between active and inactive of a tap (signal extraction portion) is performed at a high speed, it becomes impossible to fully pull electrons generated at a position remote from the active tap such as the region R21 into the N+ semiconductor region. More specifically, if the period of time during which the tap is active is short, then a situation that electrons (charge) generated in the region R21 and so forth cannot be detected by the N+ semiconductor region of the active tap occurs, resulting in degradation of the extraction efficiency of electrons.

In contrast, in a CAPD sensor of the back-illuminated type, since a sufficient aperture ratio can be assured, even if a substrate 172 is made thinner, for example, as indicated by an arrow mark W32 in FIG. 6, a sufficient quantum efficiency×aperture ratio can be assured. Here, the substrate 172 corresponds to the substrate 61 of FIG. 2, and an arrow mark in the substrate 172 represents an electric field having a direction perpendicular to the substrate 172.

Figure 8:
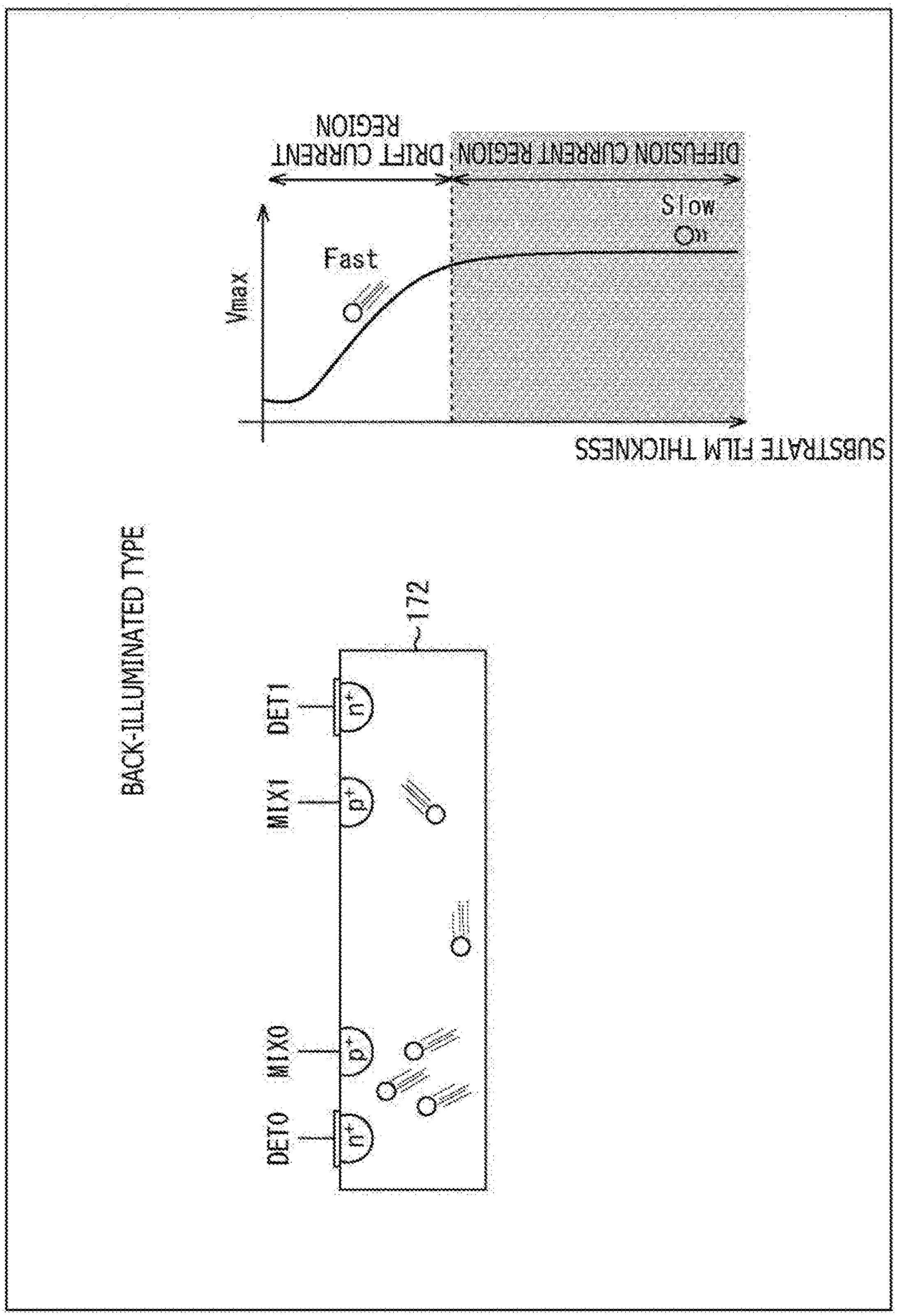
FIG. 8 is a view illustrating a moving speed of a signal carrier in a back-illuminated type.

FIG. 8 depicts a relationship between the position in the thicknesswise direction of the substrate 172 and the speed of movement of a signal carrier.

If the thickness of the substrate 172 in a direction perpendicular to the substrate 172 is made thinner in this manner, then the electric field substantially in a direction perpendicular to the substrate 172 becomes stronger, and only electrons (charge) only in a drift current region in which the speed of movement of the signal carrier is high are used while electrons in the diffusion current region in which the speed of movement of the signal carrier is low are not used. By using only electrons (charge) only in the drift current region, the time required to detect a signal carrier in the N+ semiconductor region of the active tap after photoelectric conversion is performed becomes short. Furthermore, if the thickness of the substrate 172 decreases, then also the distance of movement of the signal carrier to the N+ semiconductor region in the active tap decreases.

From those circumstances, in a CAPD sensor of the back-illuminated type, even when the driving frequency is high, signal carriers (electrons) generated in the regions in the substrate 172 can be pulled fully into the N+ semiconductor region of the active tap, and the extraction efficiency of electrons can be improved.

Furthermore, by reduction in thickness of the substrate 172, a sufficient electron extraction efficiency can be assured even with a high driving frequency, and a high speed driving resistance can be improved.

Especially, in a CAPD sensor of the back-illuminated type, since a voltage can be applied to the substrate 172, more specifically, directly to the substrate 61, the response speed in changeover between active and inactive of the tap is high, and the CAPD sensor can be driven with a high driving frequency. Furthermore, since a voltage can be applied directly to the substrate 61, a region in which modulation can be performed in the substrate 61 becomes wider.

Furthermore, with the light reception device 1 (CAPD sensor) of the back-illuminated type, since a sufficient aperture ratio can be obtained, the pixel can be refined as much, and the miniaturization resistance of the pixel can be improved.

Furthermore, by forming the light reception device 1 as that of the back-illuminated type, the liberalization in BEOL (Back End Of Line) capacity design becomes possible, and As a consequence, the degree of freedom in design of the saturation signal level (Qs) can be improved.

Modification 1 of First Embodiment

<Example of Configuration of Pixel>

Note that the foregoing description is given taking a case in which, in a portion of the signal extraction portion 65 in the substrate 61, the N+ semiconductor region 71 and the P+ semiconductor region 73 are rectangular regions as depicted in FIG. 3 as an example. However, the shapes of the N+ semiconductor region 71 and the P+ semiconductor region 73 when they are viewed in a direction perpendicular to the substrate 61 may be any shape.

Figure 9:
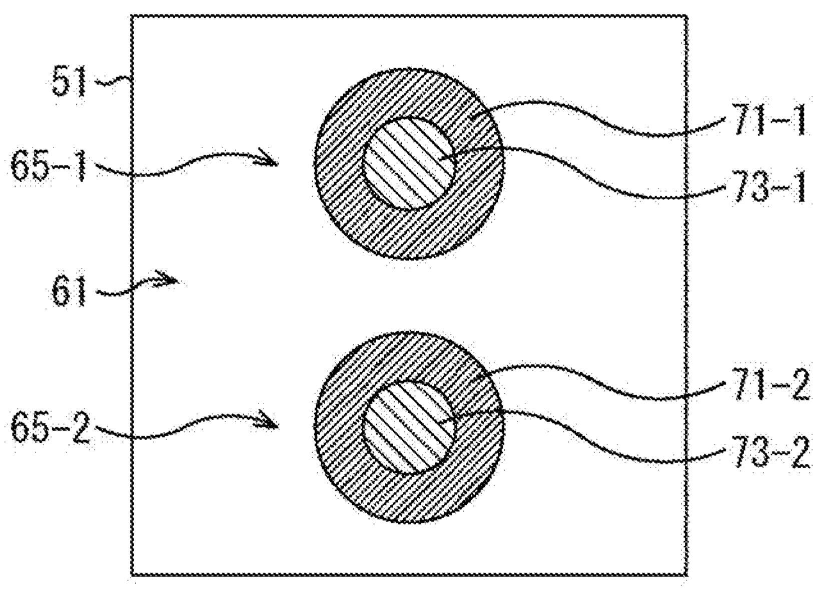
FIG. 9 is a view depicting an example of a different configuration of a portion of the signal extraction portion of the pixel.

More specifically, the N+ semiconductor region 71 and the P+ semiconductor region 73 may be formed in a circular shape, for example, as depicted in FIG. 9. Note that, in FIG. 9, portions corresponding to those in the case of FIG. 3 are denoted by like reference signs, and description of them is omitted suitably.

FIG. 9 depicts the N+ semiconductor region 71 and the P+ semiconductor region 73 when a portion of the signal extraction portions 65 of the pixel 51 is viewed in a direction perpendicular to the substrate 61.

In this example, an oxide film 64 not depicted is formed at a central portion of the pixel 51, and a signal extraction portion 65 is formed at a portion from the center to a rather end side portion of the pixel 51. Especially, in the pixel 51 here, two signal extraction portions 65 are formed.

At each signal extraction portion 65, a circular P+ semiconductor region 73 is formed at a central position, and the P+ semiconductor region 73 is surrounded by an N+ semiconductor region 71 of a circular shape, more particularly, of a ring shape, centered at the P+ semiconductor region 73.

Figure 10:
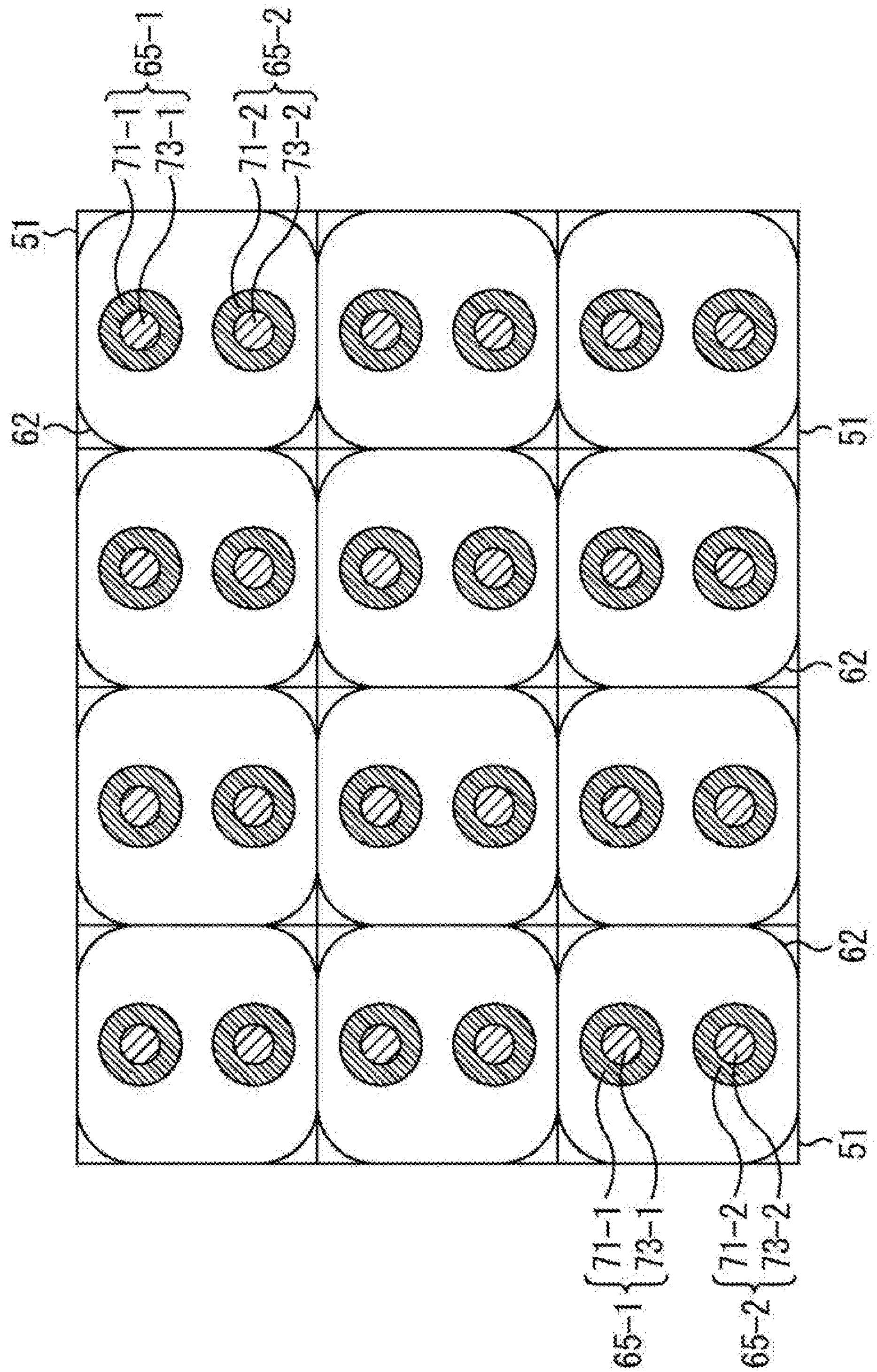
FIG. 10 is a view illustrating a relationship between a pixel and an on-chip lens.

FIG. 10 is a plan view where an on-chip lens 62 is overlaid at part of a pixel array section 20 in which pixels 51 having the signal extraction portions 65 depicted in FIG. 9 are arranged two-dimensionally in a matrix.

The on-chip lens 62 is formed in a unit of a pixel as depicted in FIG. 10. More specifically, a unit region in which one on-chip lens 62 is formed corresponds to one pixel.

Note that, although a separation portion 75 including an oxide film or the like is interposed between the N+ semiconductor region 71 and the P+ semiconductor region 73, the separation portion 75 may be provided or may not be provided.

Modification 2 of First Embodiment

<Example of Configuration of Pixel>

Figure 11:
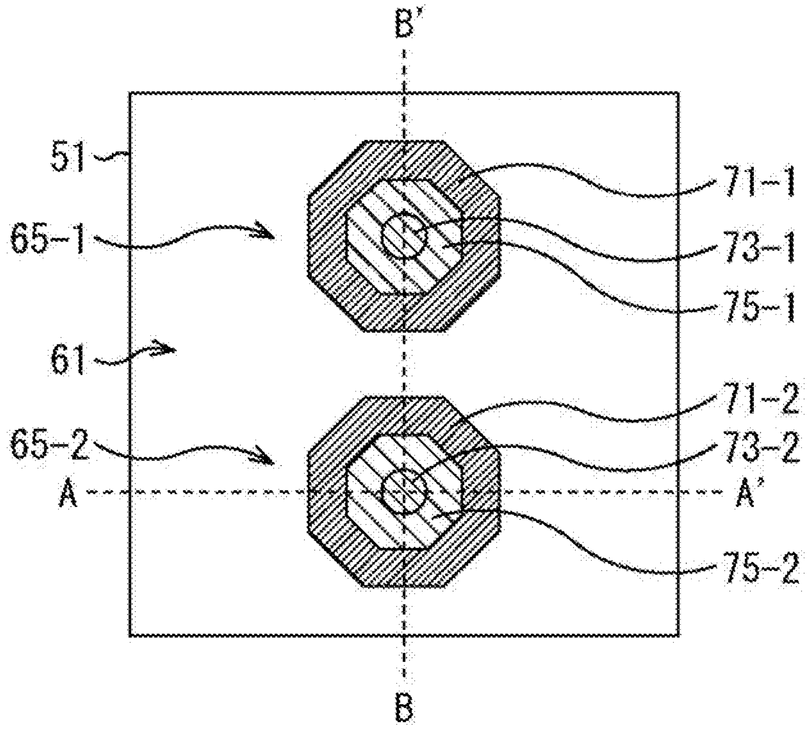
FIG. 11 is a view depicting a different example of a configuration of a portion of the signal extraction portion of the pixel.

FIG. 11 is a plan view depicting a modification of a planar shape of the signal extraction portion 65 of the pixel 51.

The signal extraction portion 65 may have a planar shape of such a rectangular shape as depicted in FIG. 3, such a circular shape depicted in FIG. 9 or, for example, such an octagonal shape as depicted in FIG. 11.

Furthermore, FIG. 11 depicts a plan view in the case where a separation portion 75 including an oxide film or the like is located between the N+ semiconductor region 71 and the P+ semiconductor region 73.

A line A-A' depicted in FIG. 11 indicates a sectional line of FIG. 37 hereinafter described, and another line B-B' indicates a sectional line of FIG. 36 hereinafter described.

Second Embodiment

<Example of Configuration of Pixel>

Furthermore, although the foregoing description is given taking the configuration that the P+ semiconductor region 73 is surrounded by the N+ semiconductor region 71 in the signal extraction portion 65 as an example, an N+ semiconductor region may be surrounded by a P+ semiconductor region.

Figure 12:
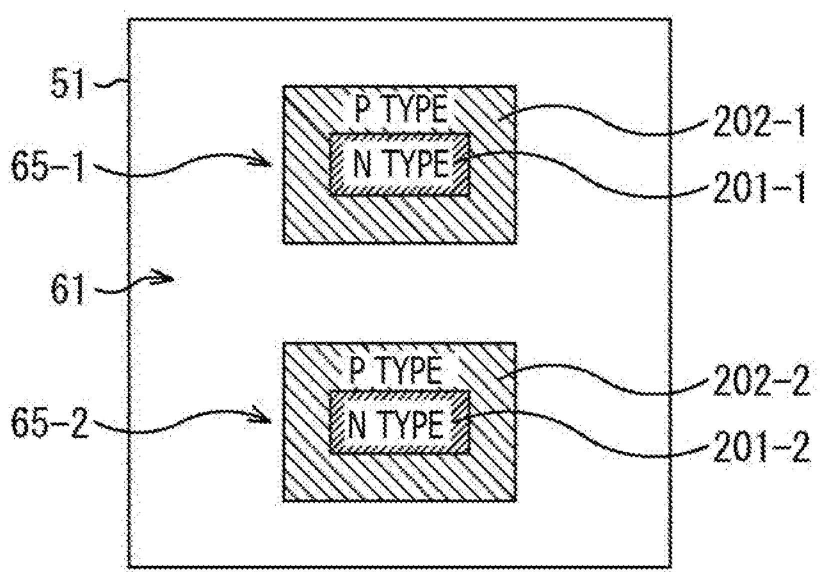
FIG. 12 is a view depicting a different example of a configuration of a portion of the signal extraction portion of the pixel.

In such a case as just described, the pixel 51 is configured, for example, in such a manner as depicted in FIG. 12. Note that, in FIG. 12, portions corresponding to those in the case of FIG. 3 are denoted by like reference signs to those in FIG. 3, and description of them is suitably omitted.

FIG. 12 depicts arrangement of an N+ semiconductor region and a P+ semiconductor region when a portion of the signal extraction portion 65 of the pixel 51 is viewed from a direction perpendicular to the substrate 61.

In this example, an oxide film 64 not depicted is formed at a middle portion of the pixel 51, and a signal extraction portion 65-1 is formed at a rather upper side portion in FIG. 12 from the middle of the pixel 51 while another signal extraction portion 65-2 is formed at a rather lower side portion in FIG. 12 from the middle of the pixel 51. Especially, in this example, the formation position of the signal extraction portion 65 in the pixel 51 is same as that in the case of FIG. 3.

In the signal extraction portion 65-1, an N+ semiconductor region 201-1 of a rectangular shape corresponding to the N+ semiconductor region 71-1 depicted in FIG. 3 is formed at the center of the signal extraction portion 65-1. Furthermore, the N+ semiconductor region 201-1 is surrounded by a P+ semiconductor region 202-1 of a rectangular shape, more particularly, of a rectangular frame shape, corresponding to the P+ semiconductor region 73-1 depicted in FIG. 3. More specifically, the P+ semiconductor region 202-1 is formed so as to surround the N+ semiconductor region 201-1.

Similarly, in the signal extraction portion 65-2, an N+ semiconductor region 201-2 of a rectangular shape corresponding to the N+ semiconductor region 71-2 depicted in FIG. 3 is formed at the center of the signal extraction portion 65-2. Furthermore, the N+ semiconductor region 201-2 is surrounded by a P+ semiconductor region 202-2 of a rectangular shape, more particularly, of a rectangular frame shape, corresponding to the P+ semiconductor region 73-2 depicted in FIG. 3.

Note that, in the case where there is no necessity for specifically distinguishing the N+ semiconductor region 201-1 and the N+ semiconductor region 201-2 from each other, each of them is sometimes referred to merely as N+ semiconductor region 201. Furthermore, in the following description, in the case where there is no necessity to specifically distinguishing the P+ semiconductor region 202-1 and the P+ semiconductor region 202-2 from each other, each of them is sometimes referred to merely as P+ semiconductor region 202.

Also, in the case where the signal extraction portion 65 is configured in such a manner as depicted in FIG. 12, similarly as in the case of the configuration depicted in FIG. 3, the N+ semiconductor region 201 functions as a charge detection section for detecting the amount of signal carriers, and the P+ semiconductor region 202 functions as a voltage application section for applying a voltage directly to the substrate 61 to generate an electric field.

Modification 1 of Second Embodiment

<Example of Configuration of Pixel>

Furthermore, similarly to the example depicted in FIG. 9, also in the case of such arrangement that the N+ semiconductor region 201 is surrounded by the P+ semiconductor region 202, the shapes of the N+ semiconductor region 201 and the P+ semiconductor region 202 may be any shape.

Figure 13:
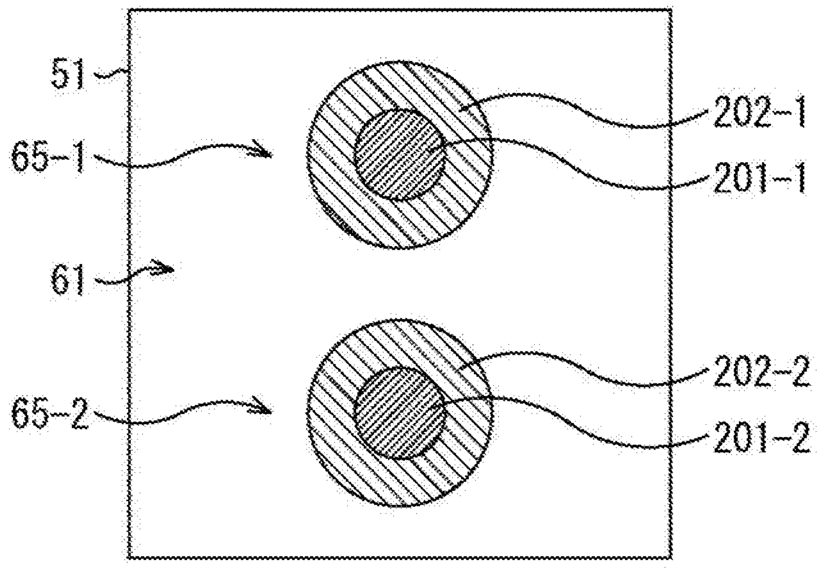
FIG. 13 is a view depicting a different example of a configuration of a portion of the signal extraction portion of the pixel.

More specifically, the N+ semiconductor region 201 and the P+ semiconductor region 202 may be formed in circular shapes, for example, as depicted in FIG. 13. Note that, in FIG. 13, portions corresponding to those in the case of FIG. 12 are denoted by like reference signs to those in FIG. 12, and description of them is suitably omitted.

FIG. 13 depicts an N+ semiconductor region 201 and a P+ semiconductor region 202 when a portion of the signal extraction portion 65 of the pixel 51 is viewed from a direction perpendicular to the substrate 61.

In this example, an oxide film 64 not depicted is formed at a middle portion of the pixel 51, and a signal extraction portion 65 is formed at a portion a rather end side of the pixel 51 from the middle. Especially, in the pixel 51 here, two signal extraction portions 65 are formed.

Furthermore, in each signal extraction portion 65, an N+ semiconductor region 201 of a circular shape is formed at a central position of the signal extraction portion 65, and the N+ semiconductor region 201 is surrounded by the P+ semiconductor region 202 of a circular shape, more particularly, of a ring shape, centered at the N+ semiconductor region 201.

Third Embodiment

<Example of Configuration of Pixel>

Furthermore, the N+ semiconductor region and the P+ semiconductor region formed in the signal extraction portion 65 may have a line shape (oblong shape).

Figure 14:
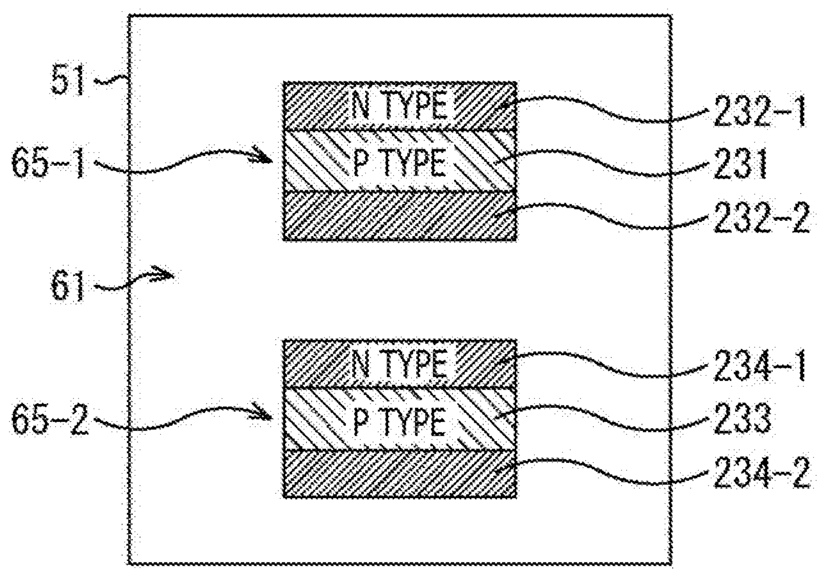
FIG. 14 is a view depicting a different example of a configuration of a portion of the signal extraction portion of the pixel.

In such a case as just described, for example, the pixel 51 is configured in such a manner as depicted in FIG. 14. Note that, in FIG. 14, portions corresponding to those in the case of FIG. 3 are denoted by like reference signs to those in FIG. 3, and description of them is suitably omitted.

FIG. 14 depicts arrangement of an N+ semiconductor region and a P+ semiconductor region when a portion of the signal extraction portion 65 of the pixel 51 is viewed from a direction perpendicular to the substrate 61.

In this example, an oxide film 64 not depicted is formed at a middle portion of the pixel 51, and a signal extraction portion 65-1 is formed at a rather upper side in FIG. 14 from the middle of the pixel 51 while another signal extraction portion 65-2 is formed at a rather lower side portion in FIG. 14 from the middle of the pixel 51. Especially in this example, the formation positions of the signal extraction portions 65 in the pixel 51 are same as those in the case of FIG. 3.

In the signal extraction portion 65-1, a P+ semiconductor region 231 of a line shape corresponding to the P+ semiconductor region 73-1 depicted in FIG. 3 is formed at the center of the signal extraction portion 65-1. In addition, an N+ semiconductor region 232-1 and another N+ semiconductor region 232-2 of line shapes corresponding to the N+ semiconductor region 71-1 depicted in FIG. 3 are formed around the P+ semiconductor region 231 so as to sandwich the P+ semiconductor region 231. More specifically, the P+ semiconductor region 231 is formed at a position sandwiched by the N+ semiconductor region 232-1 and the N+ semiconductor region 232-2.

Note that, in the case where there is no necessity to distinguish the N+ semiconductor region 232-1 and the N+ semiconductor region 232-2 from each other, each of them is sometimes referred to merely as N+ semiconductor region 232.

Although the example depicted in FIG. 3 is configured such that the P+ semiconductor region 73 is surrounded by the N+ semiconductor regions 71, the example depicted in FIG. 14 is structured such that the P+ semiconductor region 231 is sandwiched by the two N+ semiconductor regions 232 provided adjacent each other.

Similarly, in the signal extraction portion 65-2, a P+ semiconductor regions 233 of a line shape corresponding to the P+ semiconductor region 73-2 depicted in FIG. 3 are formed at the center of the signal extraction portion 65-2. In addition, an N+ semiconductor region 234-1 and another N+ semiconductor region 234-2 of line shapes corresponding to the N+ semiconductor region 71-2 depicted in FIG. 3 are formed around the P+ semiconductor regions 233 in such a manner as to sandwich the P+ semiconductor regions 233 therebetween.

Note that, in the case where there is no necessity to distinguish the N+ semiconductor region 234-1 and the N+ semiconductor region 234-2 from each other, each of them is sometimes referred to merely as N+ semiconductor region 234.

In the signal extraction portion 65 of FIG. 14, the P+ semiconductor region 231 and the P+ semiconductor regions 233 function as voltage application portions corresponding to the P+ semiconductor region 73 depicted in FIG. 3, and the N+ semiconductor region 232 and the N+ semiconductor region 234 function as charge detection portions corresponding to the N+ semiconductor region 71 depicted in FIG. 3. In this case, for example, both regions of the N+ semiconductor region 232-1 and the N+ semiconductor region 232-2 are connected to the FD portion A.

Each of the P+ semiconductor regions 231, N+ semiconductor regions 232, P+ semiconductor regions 233 and N+ semiconductor regions 234 having a line shape may have any length in the lateral direction in FIG. 14, and the regions mentioned may not have lengths equal to each other.

Fourth Embodiment

<Example of Configuration of Pixel>

Furthermore, although the example depicted in FIG. 14 is described taking the structure that the P+ semiconductor region 231 and the P+ semiconductor regions 233 are sandwiched by the N+ semiconductor regions 232 or the N+ semiconductor regions 234 as an example, conversely the N+ semiconductor regions may be shaped so as to be sandwiched by the P+ semiconductor regions.

Figure 15:
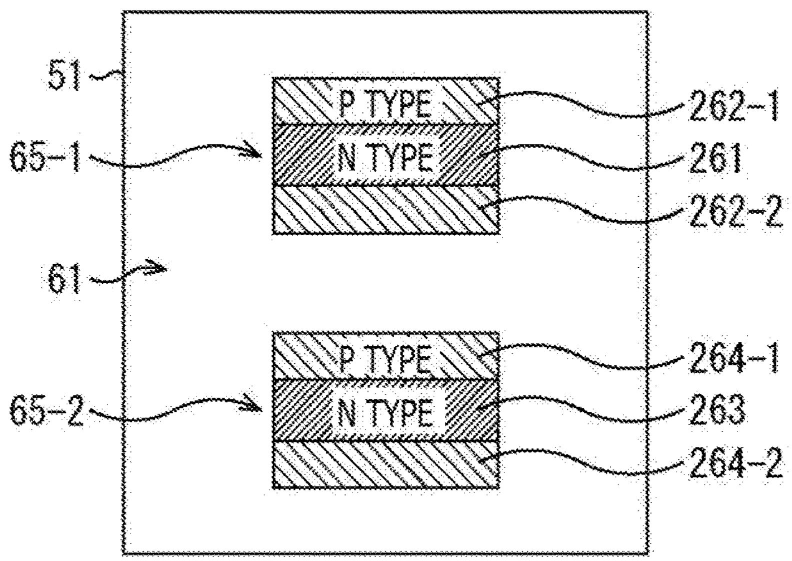
FIG. 15 is a view depicting a different example of a configuration of a portion of the signal extraction portion of the pixel.

In such a case as just described, for example, the pixel 51 is configured in such a manner as depicted in FIG. 15. Note that, in FIG. 15, portions corresponding to those in the case of FIG. 3 are denoted by like reference signs to those in FIG. 3, and description of them is suitably omitted.

FIG. 15 depicts arrangement of an N+ semiconductor region and a P+ semiconductor region when a portion of the signal extraction portion 65 at the pixel 51 is viewed from a direction perpendicular to the substrate 61.

In this example, an oxide film 64 not depicted is formed at a middle portion of the pixel 51, and a signal extraction portion 65 is formed at a rather end side from the middle of the pixel 51. Especially in this example, the formation positions of the two signal extraction portions 65 in the pixel 51 are same as those in the case of FIG. 3.

In the signal extraction portion 65-1, an N+ semiconductor region 261 of a line shape corresponding to the N+ semiconductor region 71-1 depicted in FIG. 3 is formed at the center of the signal extraction portion 65-1. Then, a P+ semiconductor region 262-1 and another P+ semiconductor region 262-2 of line shapes corresponding to the P+ semiconductor region 73-1 depicted in FIG. 3 are formed around the N+ semiconductor region 261 so as to sandwich the N+ semiconductor region 261 therebetween. More specifically, the N+ semiconductor region 261 is formed at a position sandwiched between the P+ semiconductor region 262-1 and the P+ semiconductor region 262-2.

Note that, in the case where there is no necessity to distinguish the P+ semiconductor region 262-1 and the P+ semiconductor region 262-2 from each other, each of them is sometimes referred to merely as P+ semiconductor region 262.

Similarly, in the signal extraction portion 65-2, an N+ semiconductor region 263 of a line shape corresponding to the N+ semiconductor region 71-2 depicted in FIG. 3 is formed at the center of the signal extraction portion 65-2. Furthermore, a P+ semiconductor region 264-1 and another P+ semiconductor region 264-2 of line shapes corresponding to the P+ semiconductor region 73-2 depicted in FIG. 3 are formed around the N+ semiconductor region 263 so as to sandwich the N+ semiconductor region 263 therebetween.

Note that, in the case where there is no necessity to distinguish the P+ semiconductor region 264-1 and the P+ semiconductor region 264-2 from each other, each of them is hereinafter referred to sometimes merely as P+ semiconductor region 264.

In the signal extraction portion 65 of FIG. 15, the P+ semiconductor region 262 and the P+ semiconductor region 264 function as voltage application portions corresponding to the P+ semiconductor region 73 depicted in FIG. 3, and the N+ semiconductor region 261 and the N+ semiconductor region 263 function as charge detection portions corresponding to the N+ semiconductor region 71 depicted in FIG. 3. Note that the regions including the N+ semiconductor region 261, P+ semiconductor region 262, N+ semiconductor region 263 and P+ semiconductor region 264 having line shapes may have any length in the transverse direction in FIG. 15, and the lengths of the regions may not be equal to each other.

Fifth Embodiment

<Example of Configuration of Pixel>

Furthermore, although the foregoing description is given of examples in which two signal extraction portions 65 are provided in each of pixels configuring the pixel array section 20, the number of signal extraction sections provided in each pixel may otherwise be one or be three or more.

Figure 16:
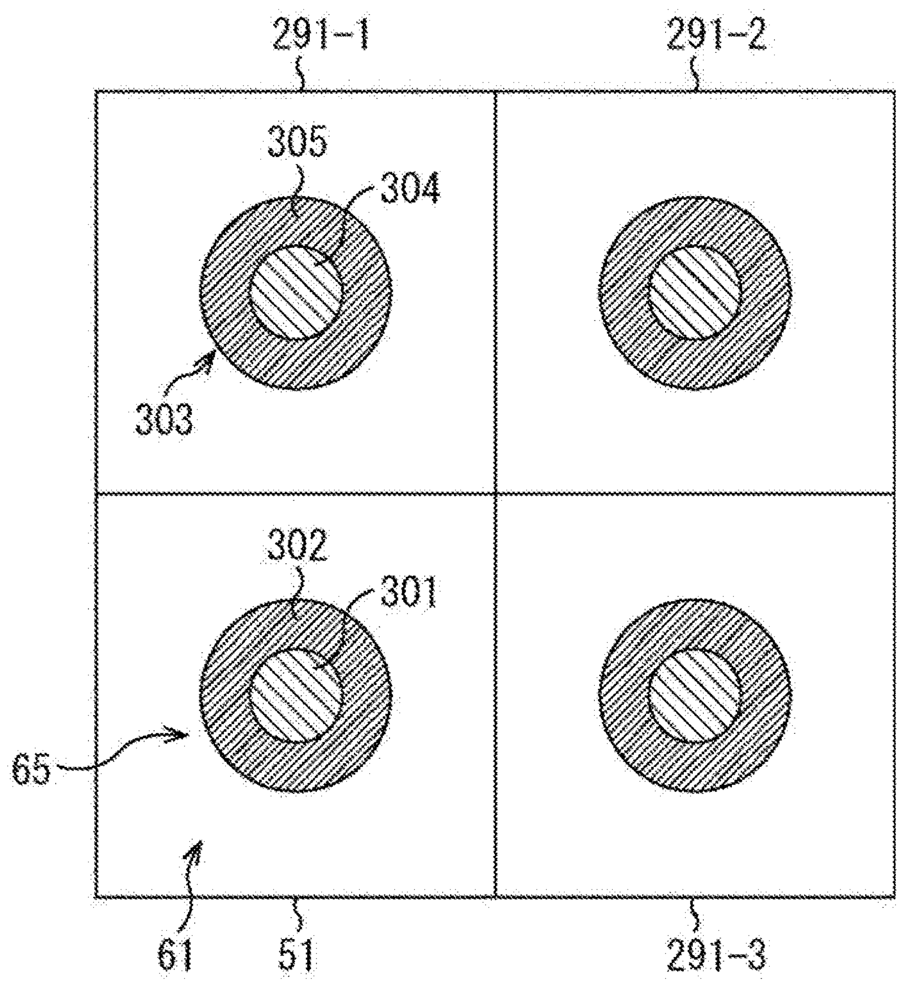
FIG. 16 is a view depicting a different example of a configuration of the pixel.

For example, in the case where one signal extraction portion is provided in the pixel 51, the pixel is configured in such a manner as depicted, for example, in FIG. 16. Note that, in FIG. 16, portions corresponding to those in the case of FIG. 3 are denoted by like reference signs to those in FIG. 3, and description of them is suitably omitted.

FIG. 16 depicts arrangement of an N+ semiconductor region and a P+ semiconductor region when a portion at a signal extraction portion in some pixels provided in the pixel array section 20 is viewed from a direction perpendicular to the substrate.

In this example, a pixel 51 provided in the pixel array section 20 and pixels 291-1 to 291-3 that are pixels 51 neighboring with the pixel 51 but have the different reference signs for identification from the pixel 51, and one signal extraction portion is formed at each pixel.

More specifically, in the pixel 51, one signal extraction portion 65 is formed at a middle portion of the pixel 51. In addition, at the signal extraction portion 65, a circular P+ semiconductor region 301 is formed at a central position, and the P+ semiconductor region 301 is surrounded by an N+ semiconductor region 302 of a circular shape, more particularly, of a ring shape, centered at the P+ semiconductor region 301.

Here, the P+ semiconductor region 301 corresponds to the P+ semiconductor region 73 depicted in FIG. 3 and functions as a voltage application portion. Furthermore, the N+ semiconductor region 302 corresponds to the N+ semiconductor region 71 depicted in FIG. 3 and functions as a charge detection portion. Note that the P+ semiconductor region 301 and the N+ semiconductor region 302 may have any shape.

Also, the pixels 291-1 to 291-3 around the pixel 51 are structured similarly to the pixel 51.

More specifically, for example, one signal extraction portion 303 is formed at a middle portion of the pixel 291-1. Then, in the signal extraction portion 303, a circular P+ semiconductor region 304 is formed at a central position, and the P+ semiconductor region 304 is surrounded by an N+ semiconductor region 305 of a circular shape, more particularly, of a ring shape, centered at the P+ semiconductor region 304.

The P+ semiconductor region 304 and the N+ semiconductor region 305 correspond to the P+ semiconductor region 301 and the N+ semiconductor region 302, respectively.

Note that, in the case where there is no necessity to distinguish the pixel 291-1 to the pixel 291-3 from each other, each of them is sometimes referred to merely as pixel 291.

In the case where one signal extraction portion (tap) is formed on each pixel in this manner, if it is tried to measure the distance to a target by the indirect ToF method, several pixels neighboring with each other are used and distance information is calculated on the basis of pixel signals obtained from the pixels.

For example, if attention is paid to the pixel 51, then in a state in which the signal extraction portion 65 of the pixel 51 serves as an active tap, the pixels are driven such that the signal extraction portions 303 of several pixels 291 neighboring with the pixel 51 serve as inactive taps.

As an example, for example, the signal extraction portions of the pixels neighboring upwardly, downwardly, leftwardly or rightwardly with the pixel 51 in FIG. 16 such as the pixel 291-1 or the pixel 291-3 are driven so as to serve as inactive taps.

Thereafter, if the voltage to be applied is changed over such that the signal extraction portion 65 of the pixel 51 serves as an inactive tap, then the signal extraction portions 303 of the several pixels 291 neighboring with the pixel 51 including the pixel 291-1 now are caused to serve as active taps.

Then, distance information is calculated on the basis of pixel signals read out from the signal extraction portions 65 in a state in which the signal extraction portions 65 serve as active taps and pixel signals read out from the signal extraction portions 303 in a state in which the signal extraction portions 303 serve as active taps.

Also, in the case where the number of signal extraction portions (taps) to be provided in a pixel in this manner is 1, distance measurement can be performed by the indirect ToF method using pixels neighboring with each other.

Sixth Embodiment

<Example of Configuration of Pixel>

Meanwhile, three or more signal extraction portions (taps) may be provided in each pixel as described hereinabove.

Figure 17:
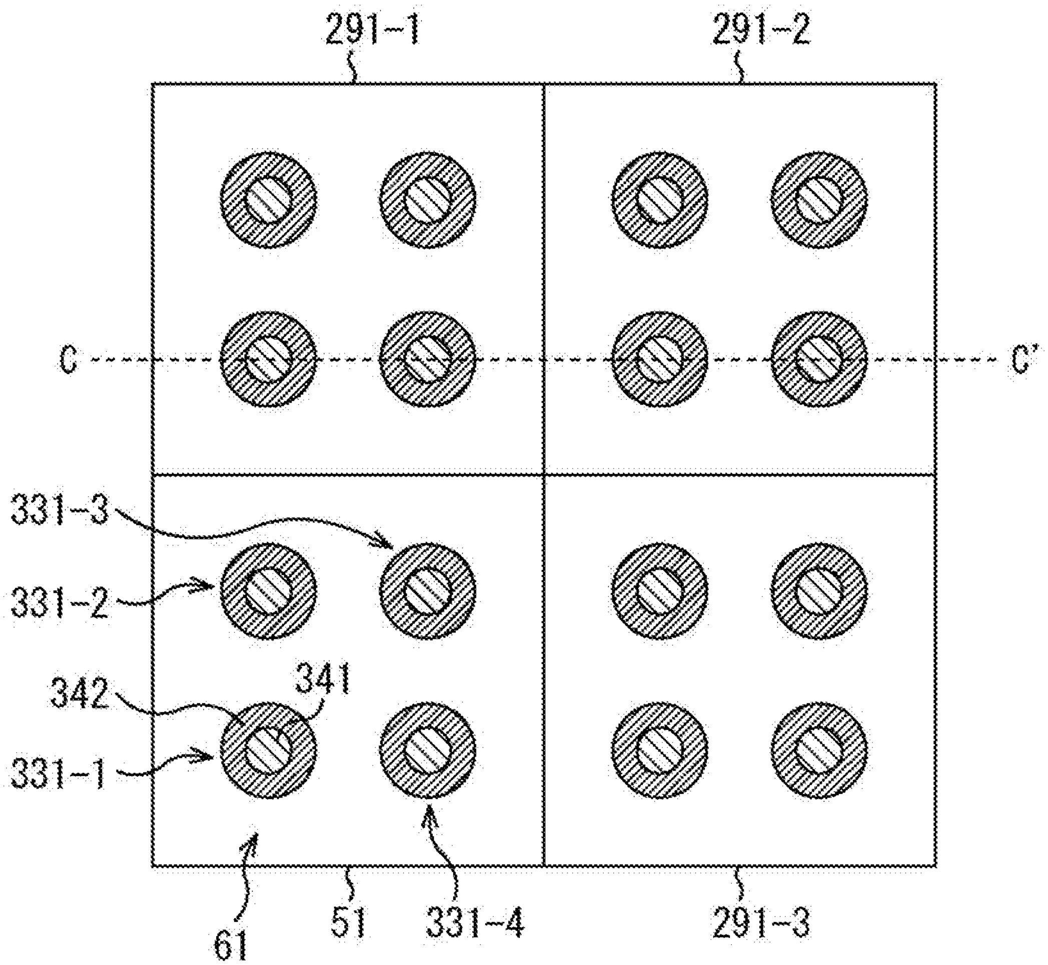
FIG. 17 is a view depicting a different example of a configuration of the pixel.

For example, in the case where four signal extraction portions (taps) are provided, each pixel of the pixel array section 20 is configured in such a manner as depicted in FIG. 17. Note that, in FIG. 17, portions corresponding to those in the case of FIG. 16 are denoted by like reference signs to those in FIG. 16, and description of them is suitably omitted.

FIG. 17 depicts arrangement of an N+ semiconductor region and a P+ semiconductor region when a portion at a signal extraction portion of some pixels provided in the pixel array section 20 is viewed in a direction perpendicular to the substrate.

A sectional view taken along line C-C' depicted in FIG. 17 is such as FIG. 36 hereinafter described.

In this example, a pixel 51 and pixels 291 provided in the pixel array section 20 are depicted, and four signal extraction portions are formed at each of the pixels.

More specifically, in the pixel 51, a signal extraction portion 331-1, another signal extraction portion 331-2, a further signal extraction portion 331-3 and a still further signal extraction portion 331-4 are formed at positions between the middle of the pixel 51 and end portions of the pixel 51, more specifically, at a left lower side position, a left upper side position, a right upper side position and a right lower side position in FIG. 17 in the middle of the pixel 51, respectively.

The signal extraction portion 331-1 to the signal extraction portion 331-4 correspond to the signal extraction portion 65 depicted in FIG. 16.

For example, at the signal extraction portion 331-1, a circular P+ semiconductor region 341 is formed at a central position and is surrounded by an N+ semiconductor region 342 of a circular shape, more particularly, of a ring shape, centered at the P+ semiconductor region 341.

Here, the P+ semiconductor region 341 corresponds to the P+ semiconductor region 301 depicted in FIG. 16 and functions as a voltage application portion. Furthermore, the N+ semiconductor region 342 corresponds to the N+ semiconductor region 302 depicted in FIG. 16 and functions as a charge detection portion. Note that the P+ semiconductor region 341 and the N+ semiconductor region 342 may have any shape.

Also, the signal extraction portion 331-2 to the signal extraction portion 331-4 are configured similarly to the signal extraction portion 331-1 and individually have a P+ semiconductor region that functions as a voltage application portion and an N+ semiconductor region that functions as a charge detection portion. Furthermore, the pixels 291 formed around the pixel 51 are structured similarly to the pixel 51.

Note that, in the case where there is no necessity to distinguish the signal extraction portion 331-1 to the signal extraction portion 331-4 from one another in the following description, each of them is sometimes referred to merely as signal extraction portion 331.

In the case where four signal extraction portions are provided in each pixel in this manner, upon distance measurement, for example, by the indirect ToF method, the four signal extraction portions in the pixel are used to calculate distance information.

If attention is paid to the pixel 51 as an example, then the pixel 51 is driven such that, in a state in which, for example, the signal extraction portion 331-1 and the signal extraction portion 331-3 serve as active taps, the signal extraction portion 331-2 and the signal extraction portion 331-4 serve as inactive taps.

Thereafter, the voltage to be applied to each signal extraction portion 331 is changed over. More specifically, the pixel 51 is driven such that the signal extraction portion 331-1 and the signal extraction portion 331-3 serve as inactive taps and the signal extraction portion 331-2 and the signal extraction portion 331-4 serve as active taps.

Then, distance information is calculated on the basis of pixel signals read out from the signal extraction portion 331-1 and the signal extraction portion 331-3 that are in a state in which the signal extraction portion 331-1 and the signal extraction portion 331-3 serve as active taps and pixel signals read out from the signal extraction portion 331-2 and the signal extraction portion 331-4 that are in a state in which the signal extraction portion 331-2 and the signal extraction portion 331-4 serve as active taps.

Seventh Embodiment

<Example of Configuration of Pixel>

Furthermore, a signal extraction portion (tap) may be shared by pixels neighboring with each other in the pixel array section 20.

Figure 18:
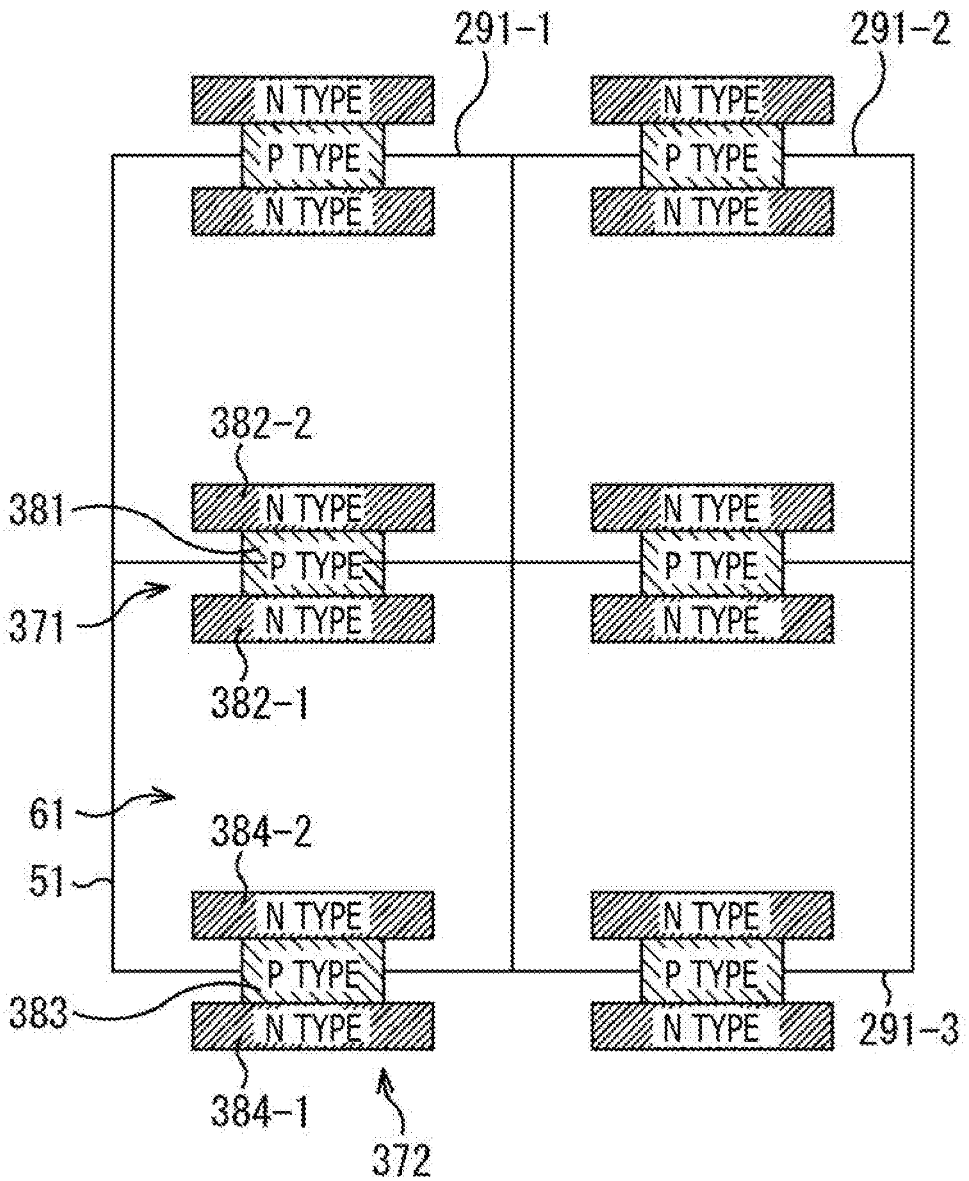
FIG. 18 is a view depicting a different example of a configuration of the pixel.

In such a case as just described, each pixel of the pixel array section 20 is configured, for example, in such a manner as depicted in FIG. 18. Note that, in FIG. 18, portions corresponding to those in the case of FIG. 16 are denoted by like reference signs to those in FIG. 16, and description of them is suitably omitted.

FIG. 18 indicates arrangement of an N+ semiconductor region and a P+ semiconductor region when a portion at a signal extraction portion of some pixels provided in the pixel array section 20 is a viewed from a direction perpendicular to the substrate.

In this example, a pixel 51 and pixels 291 provided in the pixel array section 20 are depicted, and two signal extraction portions are formed on each of the pixels.

For example, in the pixel 51, a signal extraction portion 371 is formed at an upper side end portion in FIG. 18 of the pixel 51, and another signal extraction portion 372 is formed at a lower side end portion in FIG. 18 of the pixel 51.

The signal extraction portion 371 is shared by the pixel 51 and the pixel 291-1. In short, the signal extraction portion 371 is used also as a tap of the pixel 51 and is used also as a tap of the pixel 291-1. Furthermore, the signal extraction portion 372 is shared by the pixel 51 and a pixel not depicted neighboring on the lower side in FIG. 18 with the pixel 51.

In the signal extraction portion 371, a P+ semiconductor region 381 of a line shape corresponding to the P+ semiconductor region 231 depicted in FIG. 14 is formed at the center position. Furthermore, at upper and lower positions in FIG. 18 of the P+ semiconductor region 381, an N+ semiconductor region 382-1 and another N+ semiconductor region 382-2 of line shapes corresponding to the N+ semiconductor region 232 depicted in FIG. 14 are formed so as to sandwich the P+ semiconductor region 381 therebetween.

Especially, in the present example, the P+ semiconductor region 381 is formed at a boundary portion between the pixel 51 and the pixel 291-1. Meanwhile, the N+ semiconductor region 382-1 is formed in the region of the pixel 51 and the N+ semiconductor region 382-2 is formed in the region of the pixel 291-1.

Here, the P+ semiconductor region 381 functions as a voltage application portion, and the N+ semiconductor region 382-1 and the N+ semiconductor region 382-2 function as charge detection portions. Note that, in the case where there is no necessity to distinguish the N+ semiconductor region 382-1 and the N+ semiconductor region 382-2 from each other, each of them is sometimes referred to merely as N+ semiconductor region 382.

Furthermore, the P+ semiconductor regions 381 and the N+ semiconductor regions 382 may be formed in any shape. Furthermore, the N+ semiconductor region 382-1 and the N+ semiconductor region 382-2 may be connected to the same FD portion or may be connected to FD portions different from each other.

In the signal extraction portion 372, a P+ semiconductor region 383, an N+ semiconductor region 384-1 and another N+ semiconductor region 384-2 of line shapes are formed.

The P+ semiconductor region 383, N+ semiconductor region 384-1 and N+ semiconductor region 384-2 correspond to the P+ semiconductor region 381, N+ semiconductor region 382-1 and N+ semiconductor region 382-2, respectively, and have similar arrangement shape and function. Note that, in the case where there is no necessity to distinguish the N+ semiconductor region 384-1 and the N+ semiconductor region 384-2 from each other, each of them is sometimes referred to merely as N+ semiconductor region 384.

In this manner, also in the case where a signal extraction portion (tap) is shared by neighboring pixels, distance measurement by the indirect ToF method can be performed by operation similar to that in the example depicted in FIG. 3.

In the case where a signal extraction portion is shared between neighboring pixels as depicted in FIG. 18, the distance between P+ semiconductor regions paired with each other for generating an electric field, more specifically, electric current such as, for example, the distance between the P+ semiconductor region 381 and the P+ semiconductor region 383 becomes long. More specifically, where a signal extraction portion is shared between pixels, the distance between P+ semiconductor regions can be increased to the utmost.

Since this makes it difficult for current to flow between the P+ semiconductor regions, the power consumption of the pixels can be reduced and the configuration is advantageous also in miniaturization of pixels.

Note that, although an example in which one signal extraction portion is shared by two pixels neighboring with each other is described here, one signal extraction portion may otherwise be shared by three or more pixels neighboring with each other. Furthermore, in the case where a signal extraction portion is shared by two or more pixels neighboring with each other, only a charge detection portion for detecting a signal carrier from within the signal extraction portion may be shared or only a voltage application portion for generating an electric field may be shared.

Eighth Embodiment

<Example of Configuration of Pixel>

Furthermore, an on-chip lens or an inter-pixel shading portion provided in each pixel such as the pixel 51 of the pixel array section 20 may not specifically be provided.

Figure 19:
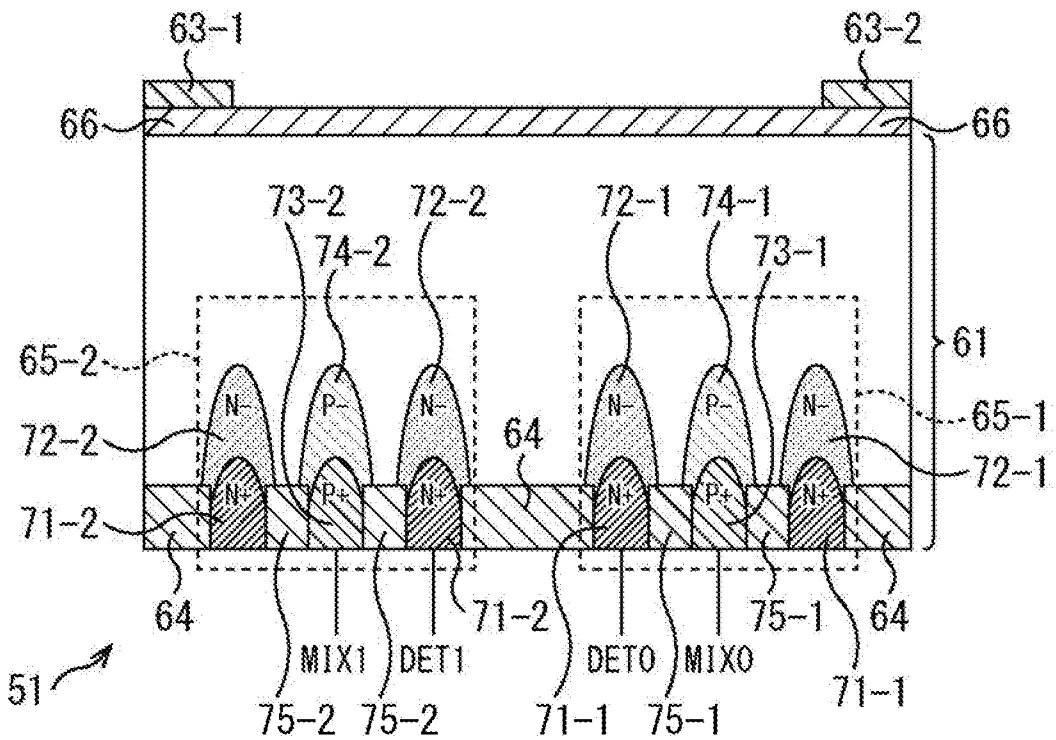
FIG. 19 is a view depicting a different example of a configuration of the pixel.

More specifically, for example, the pixel 51 can be configured in such a manner as depicted in FIG. 19. Note that, in FIG. 19, portions corresponding to those in the case of FIG. 2 are denoted by like reference signs to those in FIG. 2, and description of them is suitably omitted.

The configuration of the pixel 51 depicted in FIG. 19 is different from the pixel 51 depicted in FIG. 2 in that the on-chip lens 62 is not provided but is same as the configuration of the pixel 51 of FIG. 2 in regard to the other matters.

Since the pixel 51 depicted in FIG. 19 does not include an on-chip lens 62 provided on the light indent face side of the substrate 61, attenuation of infrared light incident from the outside to the substrate 61 can be reduced further. As a consequence, the light amount of infrared light that can be received by the substrate 61 increases, and the sensitivity of the pixel 51 can be improved.

Modification 1 of Eighth Embodiment

<Example of Configuration of Pixel>

Figure 20:
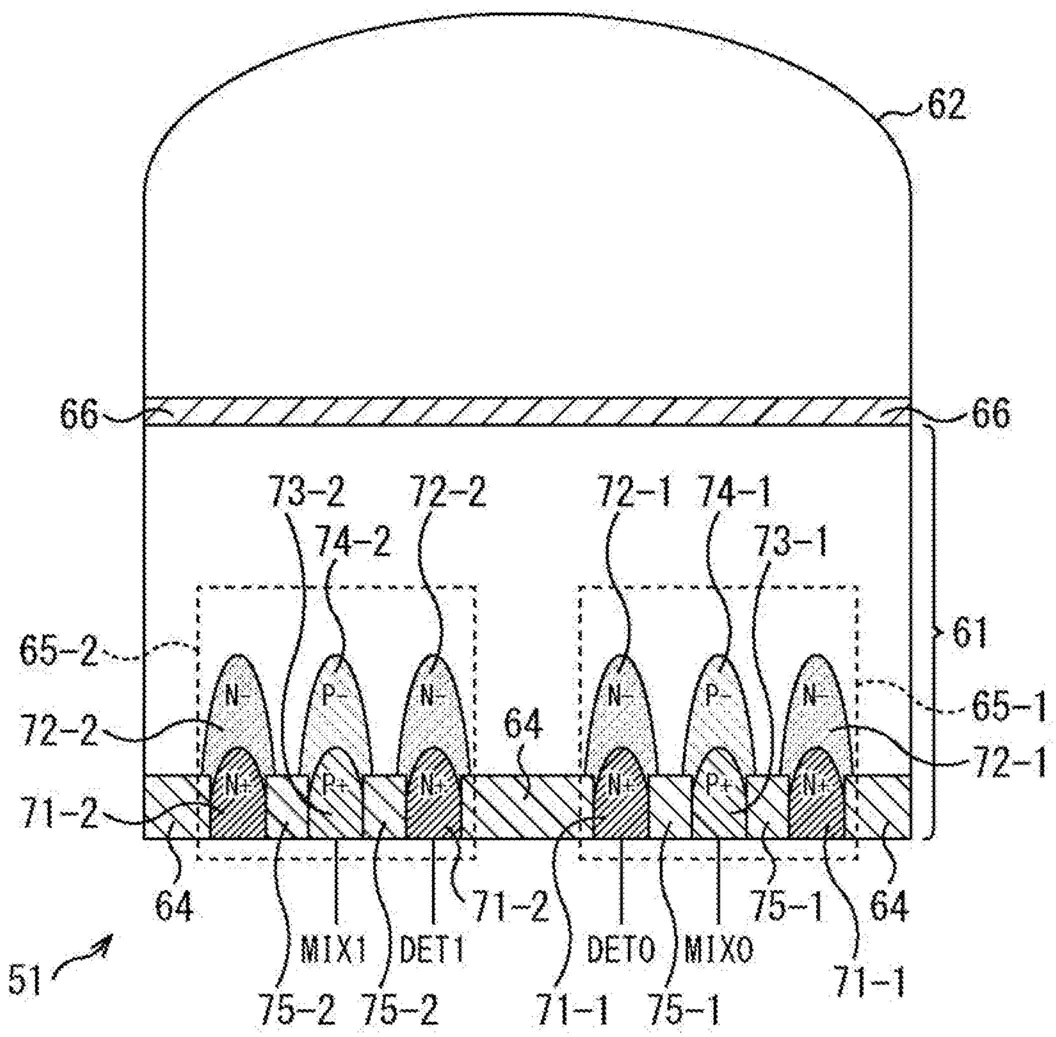
FIG. 20 is a view depicting a different example of a configuration of the pixel.

Furthermore, the pixel 51 may be configured, for example, in such a manner as depicted in FIG. 20. Note that, in FIG. 20, portions corresponding to those in the case of FIG. 2 are denoted by like reference signs to those in FIG. 2, and description of them is suitably omitted.

The configuration of the pixel 51 depicted in FIG. 20 is different from the pixel 51 depicted in FIG. 2 in that the inter-pixel shading film 63-1 and the inter-pixel shading film 63-2 are not provided but is same as the configuration of the pixel 51 of FIG. 2 in the other respects.

In the example depicted in FIG. 20, since the inter-pixel shading films 63 are not provided on the light incident face side of the substrate 61, the suppression effect of crosstalk degrades. However, since also infrared light blocked by the inter-pixel shading films 63 is permitted to enter the substrate 61, the sensitivity of the pixel 51 can be improved.

Note that it is also a matter of course that neither the on-chip lens 62 nor the inter-pixel shading films 63 may be provided on the pixel 51.

Modification 2 of Eighth Embodiment

<Example of Configuration of Pixel>

Figure 21:
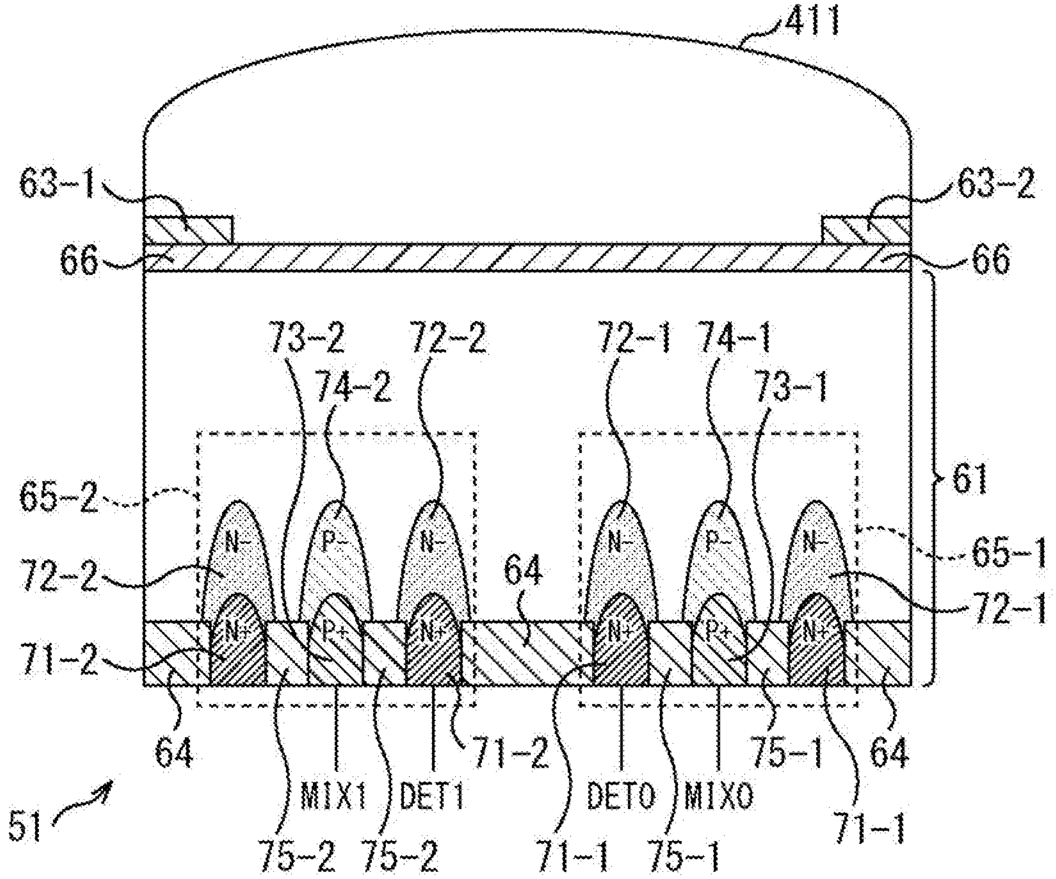
FIG. 21 is a view depicting a different example of a configuration of the pixel.

Furthermore, also the thickness in the optical axis direction of an on-chip lens may be optimized, for example, as depicted in FIG. 21. Note that, in FIG. 21, portions corresponding to those in the case of FIG. 2 are denoted by like reference signs to those in FIG. 2, and description of them is suitably omitted.

The configuration of the pixel 51 depicted in FIG. 21 is different from that of the pixel 51 depicted in FIG. 2 in that an on-chip lens 411 is provided in place of the on-chip lens 62 but is same as the configuration of the pixel 51 of FIG. 2 in the other respects.

In the pixel 51 depicted in FIG. 21, the on-chip lens 411 is formed on the light incident face side, more specifically, on the upper side in FIG. 21, of the substrate 61. This on-chip lens 411 is reduced in thickness in the optical axis direction, more specifically, in the vertical direction in FIG. 21, in comparison with the on-chip lens 62 depicted in FIG. 2.

Generally, that the on-chip lens to be provided on the front face of the substrate 61 is thicker is advantages for condensing of light incident to the on-chip lens. However, since reduction of the thickness of the on-chip lens 411 increases the transmittance as much and can improve the sensitivity of the pixel 51, it is better to appropriately determine the thickness of the on-chip lens 411 in response to the thickness of the substrate 61, the position to which infrared light is to be condensed and so forth.

Ninth Embodiment

<Example of Configuration of Pixel>

Furthermore, a separation region for improving the separation characteristic between neighboring pixels to suppress crosstalk may be provided between pixels formed on the pixel array section 20.

Figure 22:
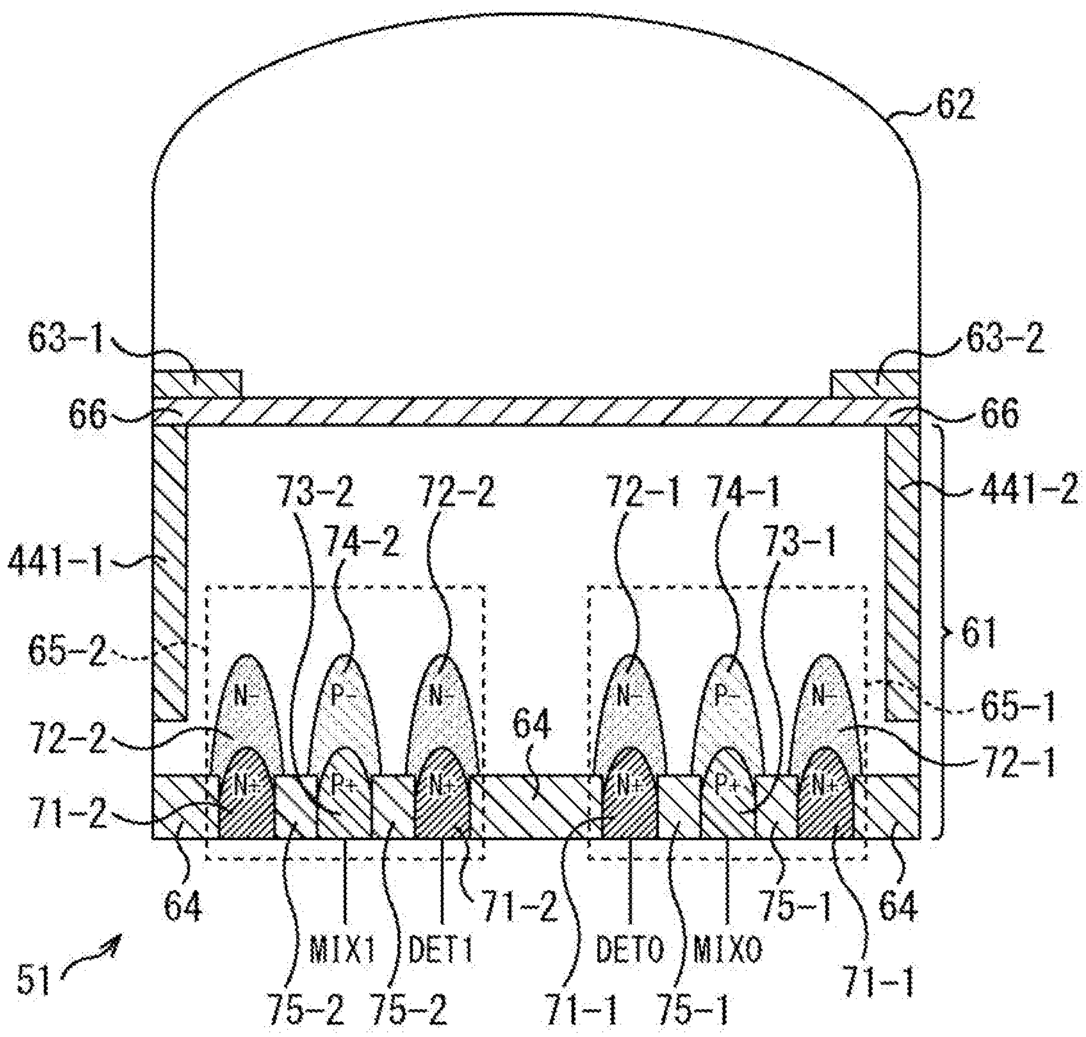
FIG. 22 is a view depicting a different example of a configuration of the pixel.

In such a case as just described, each pixel 51 is configured, for example, in such a manner as depicted in FIG. 22. Note that, in FIG. 22, portions corresponding to those in the case of FIG. 2 are denoted by like reference signs to those in FIG. 2, and description of them is suitably omitted.

The configuration of the pixel 51 depicted in FIG. 22 is different from the pixel 51 depicted in FIG. 2 in that a separation region 441-1 and another separation region 441-2 are provided in the substrate 61 but has a configuration same as that of the pixel 51 of FIG. 2 in the other respects.

In the pixel 51 depicted in FIG. 22, the separation region 441-1 and the separation region 441-2 for separating neighboring pixels from each other are formed each from a shading film or the like at a boundary portion between the pixel 51 in the substrate 61 and a different pixel neighboring with the pixel 51, more specifically, at left and right end portions in FIG. 22 of the pixel 51. Note that, in the case where there is no necessity to distinguish the separation region 441-1 and the separation region 441-2 from each other, each of them is sometimes referred to merely as separation region 441.

For example, at the time of formation of a separation region 441, a long groove (trench) is formed with a predetermined depth in the downward direction in FIG. 22 (direction perpendicular to the plane of the substrate 61) from the light incident face side of the substrate 61, more specifically, from the upper side face in FIG. 22 in the substrate 61, and a shading film is formed by embedding in the groove portion to form a separation region 441. This separation region 441 functions as a pixel separation region for shading infrared light that is incident to the substrate 61 from the light incident face and is directed toward a different pixel neighboring with the pixel 51.

By forming the separation region 441 of the embedded type in this manner, the separation characteristic of infrared light between pixels can be improved and occurrence of crosstalk can be suppressed.

Modification 1 of Ninth Embodiment

<Example of Configuration of Pixel>

Figure 23:
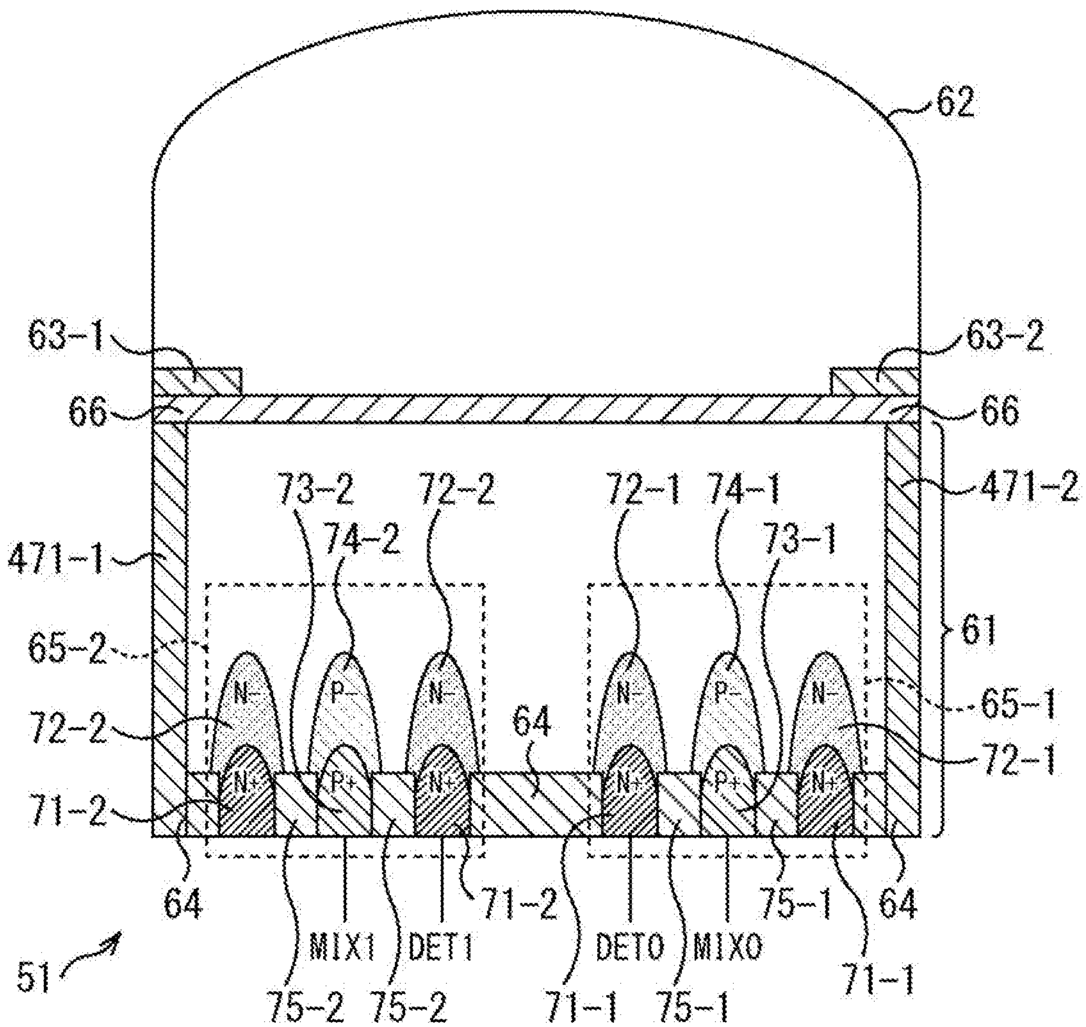
FIG. 23 is a view depicting a different example of a configuration of the pixel.

Furthermore, in the case where a separation region of the embedded type is formed on the pixel 51, a separation region 471-1 and another separation region 471-2 that extend through the substrate 61 as depicted, for example, in FIG. 23 may be provided. Note that, in FIG. 23, portions corresponding to those in the case of FIG. 2 are denoted by like reference signs to those in FIG. 2, and description of them is suitably omitted.

The configuration of the pixel 51 depicted in FIG. 23 is different from the pixel 51 depicted in FIG. 2 in that the separation region 471-1 and the separation region 471-2 are provided in the substrate 61, but is same in configuration as the pixel 51 of FIG. 2 in regard to the other respects. More specifically, the pixel 51 depicted in FIG. 23 is configured such that the separation region 471-1 and the separation region 471-2 are provided in place of the separation region 441 of the pixel 51 depicted in FIG. 22.

In the pixel 51 depicted in FIG. 23, the separation region 471-1 and the separation region 471-2 extending through the substrate 61 are formed each from a shading film or the like at a boundary portion between the pixel 51 in the substrate 61 and different pixels neighboring with the pixel 51, more specifically, at left and right end portions in FIG. 23 of the pixel 51. Note that, in the case where there is no necessity to distinguish the separation region 471-1 and the separation region 471-2 from each other, each of them is sometimes referred to merely as separation region 471.

For example, at the time of formation of a separation region 471, a groove (trench) long in the upward direction in FIG. 23 includes the face on the opposite side to the light incident face side of the substrate 61, more specifically, from the lower side face in FIG. 23. At this time, such grooves are formed so as to reach the light incident face of the substrate 61 such that they extend through the substrate 61. Then, a shading film is formed by embedding in each of the groove portions formed in this manner to form a separation region 471.

Also, with such separation regions 471 of the embedded type as just described, the separation characteristic of infrared light between pixels can be improved and occurrence of crosstalk can be suppressed.

Tenth Embodiment

<Example of Configuration of Pixel>

Furthermore, the thickness of the substrate on which the signal extraction portion 65 is formed can be determined in response to various characteristics and so forth of the pixels.

Figure 24:
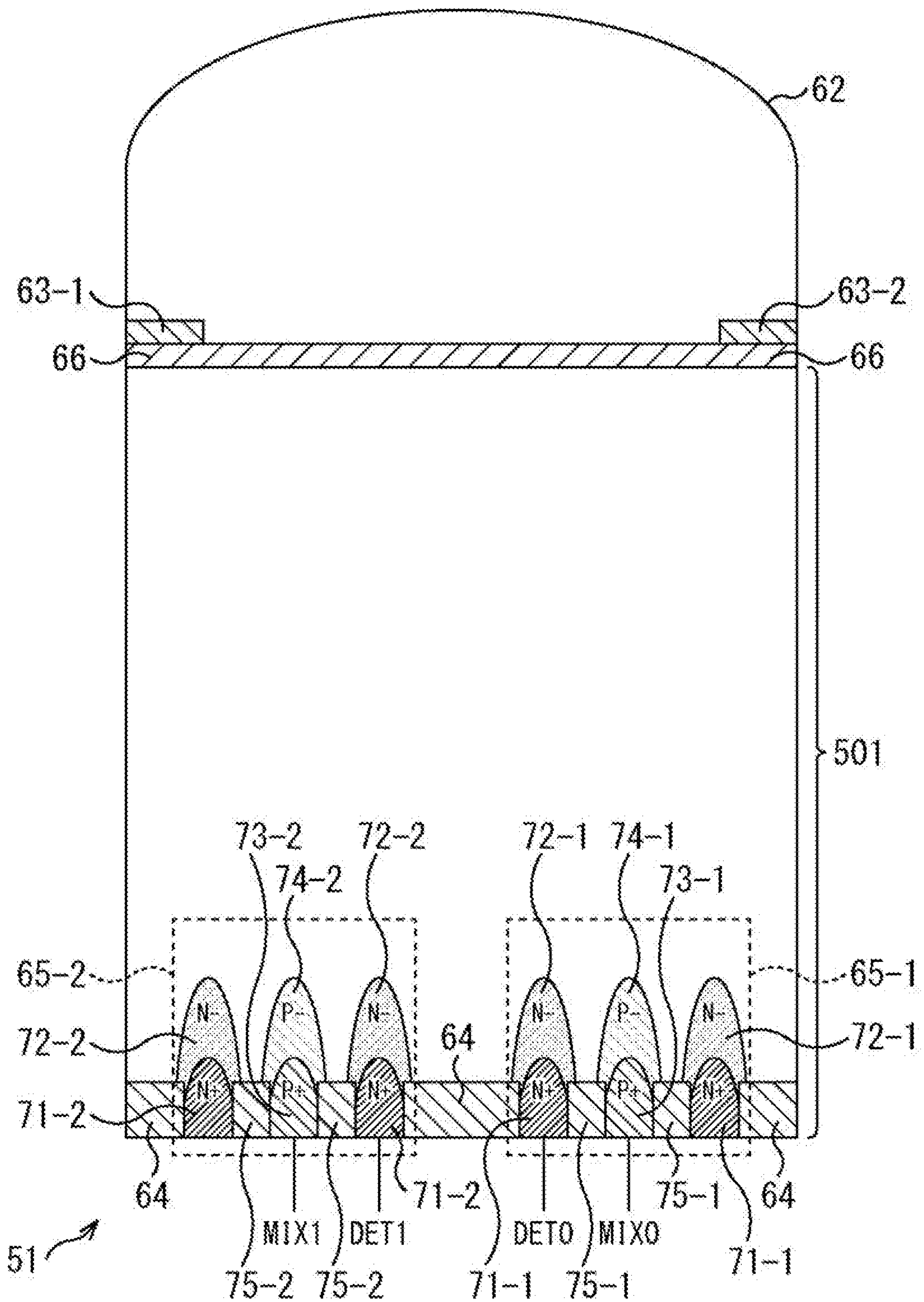
FIG. 24 is a view depicting a different example of a configuration of the pixel.

Therefore, a substrate 501 that configures the pixels 51, for example, as depicted in FIG. 24 can be made thicker than the substrate 61 depicted in FIG. 2. Note that, in FIG. 24, portions corresponding to those in the case of FIG. 2 are denoted by like reference signs to those in FIG. 2, and description of them is suitably omitted.

The configuration of the pixel 51 depicted in FIG. 24 is different from the pixel 51 depicted in FIG. 2 in that the substrate 501 is provided in place of the substrate 61 but is same in configuration as the pixel 51 of FIG. 2 in regard to the other respects.

More specifically, in the pixel 51 depicted in FIG. 24, an on-chip lens 62, a fixed charge film 66 and an inter-pixel shading films 63 are formed on the light incident face side of the substrate 501. Furthermore, in the proximity of the surface of the face on the opposite side to the light incident face side of the substrate 501, an oxide film 64, a signal extraction portion 65 and a separation portion 75 are formed.

The substrate 501 is configured, for example, from a P-type semiconductor substrate of a thickness of 20 μm or more, and the substrate 501 and the substrate 61 are different only in thickness of the substrate while the positions at which the oxide film 64, the signal extraction portion 65 and the separation portion 75 are formed are same between the substrate 501 and the substrate 61.

Note that it is better to optimize also the film thicknesses and so forth of various layers (films) formed suitably on the light incident face side and so forth of the substrate 501 or the substrate 61 in response to the characteristic and so forth of the pixels 51.

Eleventh Embodiment

<Example of Configuration of Pixel>

Figure 25:
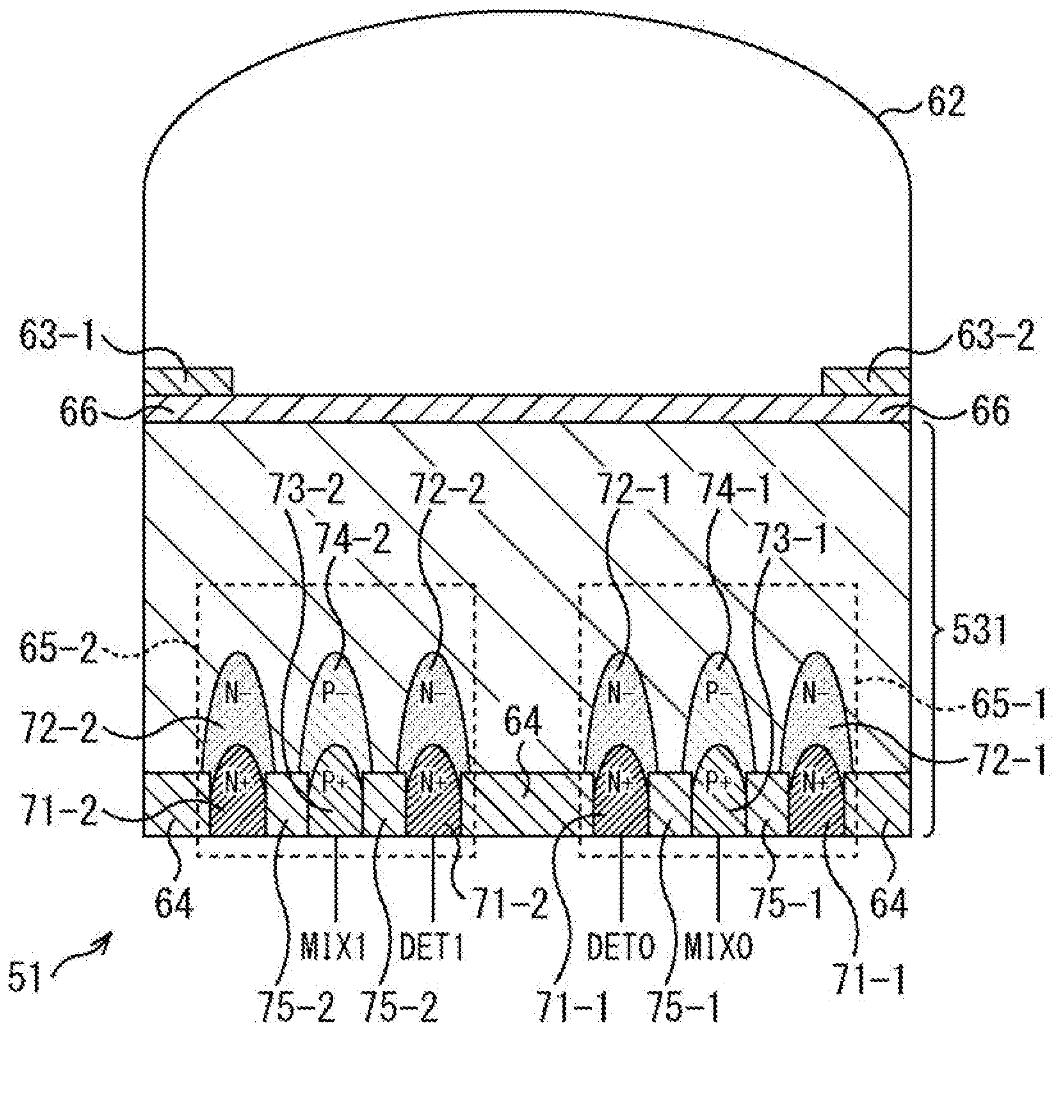
FIG. 25 is a view depicting a different example of a configuration of the pixel.

Furthermore, although the foregoing description is directed to an example in which the substrate configuring the pixels 51 is configured from a P-type semiconductor substrate, the substrate may otherwise be configured from an N-type semiconductor substrate as depicted, for example, in FIG. 25. Note that, in FIG. 25, portions corresponding to those in the case of FIG. 2 are denoted by like reference signs to those in FIG. 2, and description of them is suitably omitted.

The configuration of the pixel 51 depicted in FIG. 25 is different from the pixel 51 depicted in FIG. 2 in that a substrate 531 is provided in place of the substrate 61 but is same as the configuration of the pixel 51 of FIG. 2 in the other respects.

In the pixel 51 depicted in FIG. 25, an on-chip lens 62, a fixed charge film 66 and an inter-pixel shading films 63 are formed on the light incident face side of the substrate 531 that is configured from an N-type semiconductor layer such as, for example, a silicon substrate.

An oxide film 64, a signal extraction portion 65 and a separation portion 75 are formed in the proximity of the surface of the face on the opposite side to the light incident face side of the substrate 531. The positions at which the oxide film 64, the signal extraction portion 65 and the separation portion 75 are formed are same positions between the substrate 531 and the substrate 61, and also the configuration of the signal extraction portion 65 is same between the substrate 531 and the substrate 61.

In the substrate 531, for example, the thickness in the vertical direction in FIG. 25, more specifically, the thickness in a direction perpendicular to the plane of the substrate 531, is 20 μm or less.

Furthermore, the substrate 531 is an N− Epi substrate of a high resistance having a substrate concentration, for example, on the order of 1 E+13 or less, and the resistance (resistivity) of the substrate 531 is, for example, 500 [Ωm] or more. This can reduce the power consumption by the pixel 51.

Here, the relationship between the substrate concentration and the resistance of the substrate 531 is such that, for example, when the substrate concentration is 2.15 E+12 [$cm^3$], the resistance is 2000 [Ωm], when the substrate concentration is 4.30 E+12 [$cm^3$], the resistance is 1000 [Ωm], when the substrate concentration is 8.61 E+12 [$cm^3$], the resistance is 500 [Ωm], when the substrate concentration is 4.32 E+13 [$cm^3$], the resistance is 100 [Ωm], and so forth.

Even if the substrate 531 of the pixel 51 is formed as an N-type semiconductor substrate in this manner, similar advantageous effects can be obtained by operation similar to that of the example depicted in FIG. 2.

Twelfth Embodiment

<Example of Configuration of Pixel>

Furthermore, similarly as in the example described hereinabove with reference to FIG. 24, also the thickness of the N-type semiconductor substrate can be determined in response to various characteristics and so forth of the pixels.

Figure 26:
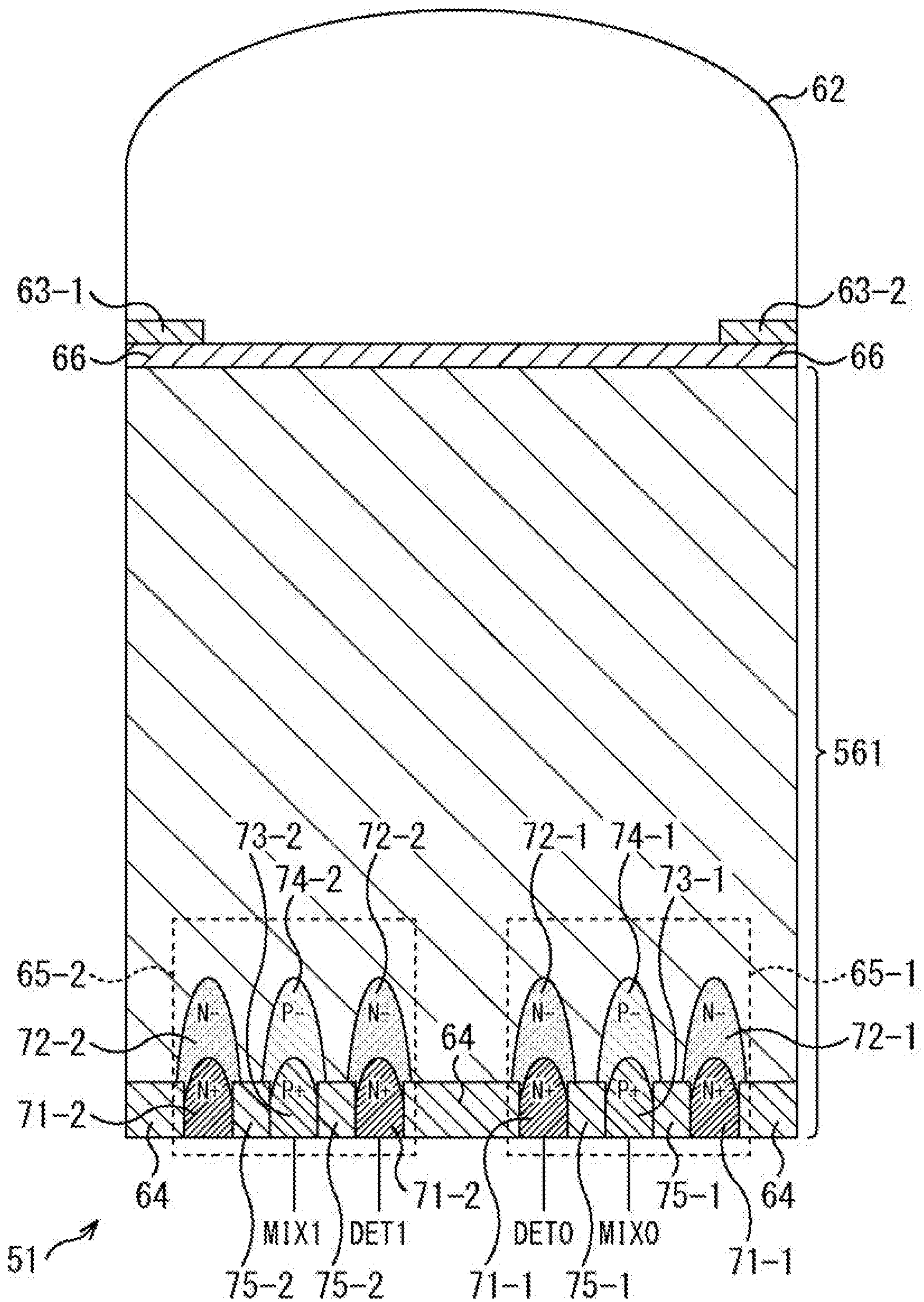
FIG. 26 is a view depicting a different example of a configuration of the pixel.

Therefore, for example, as depicted in FIG. 26, a substrate 561 configuring the pixel 51 can be made thicker than the substrate 531 depicted in FIG. 25. Note that, in FIG. 26, portions corresponding to those in the case of FIG. 25 are denoted by like reference signs to those in FIG. 25, and description of them is suitably omitted.

The configuration of the pixel 51 depicted in FIG. 26 is different from the pixel 51 depicted in FIG. 25 in that the substrate 561 is provided in place of the substrate 531 but is a same configuration as that of the pixel 51 of FIG. 25 in the other respects.

More specifically, in the pixel 51 depicted in FIG. 26, an on-chip lens 62, a fixed charge film 66 and an inter-pixel shading films 63 are formed on the light incident face side of the substrate 561. Furthermore, an oxide film 64, a signal extraction portion 65 and a separation portion 75 are formed in the proximity of the surface of the face on the opposite side to the light incident face side of the substrate 561.

The substrate 561 is configured from an N-type semiconductor substrate of a thickness, for example, equal to or greater than 20μ, and the substrate 561 and the substrate 531 are different from each other only in substrate thickness while the positions at which the oxide film 64, signal extraction portion 65 and separation portion 75 are formed are same positions between the substrate 561 and the substrate 531.

Thirteenth Embodiment

<Example of Configuration of Pixel>

Furthermore, for example, a bias may be applied to the light incident face side of the substrate 61 to strengthen the electric field in a direction (hereinafter referred to as Z direction) perpendicular to the plane of the substrate 61 in the substrate 61.

Figure 27:
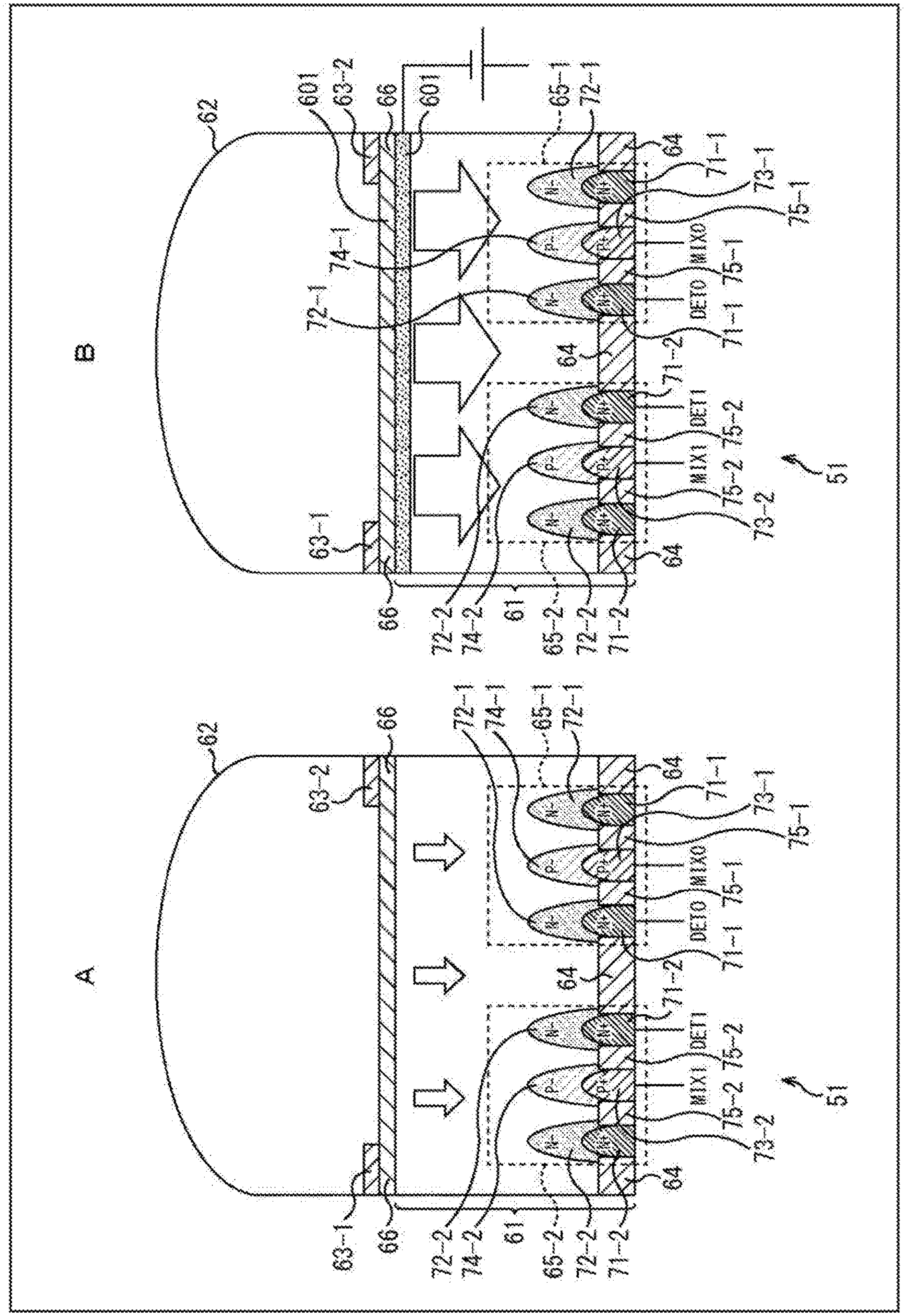
FIG. 27 is a view depicting a different example of a configuration of the pixel.

In such a case as just described, the pixel 51 is configured, for example, in such a manner as depicted in FIG. 27. Note that, in FIG. 27, portions corresponding to those in the case of FIG. 2 are denoted by like reference signs to those in FIG. 2, and description of them is suitably omitted.

A of FIG. 27 depicts the pixel 51 depicted in FIG. 2, and an arrow mark in the substrate 61 of the pixel 51 represents an electric field strength in the Z direction in the substrate 61.

In contrast, B of FIG. 27 depicts a configuration of the pixel 51 in the case where a bias (voltage) is applied to the light incident face of the substrate 61. Although the configuration of the pixel 51 in B of FIG. 27 is a basically same configuration as that of the pixel 51 depicted in FIG. 2, a P+ semiconductor region 601 is newly and additionally formed on a light incident face side interface of the substrate 61.

By applying a voltage (negative bias) of 0 V or less from the inside or the outside of the pixel array section 20 to the P+ semiconductor region 601 formed on the light incident face side interface of the substrate 61, the electric field in the Z direction is strengthened. An arrow mark in the substrate 61 of the pixel 51 in B of FIG. 27 represents an electric field strength in the Z direction in the substrate 61. The thickness of the arrow mark drawn in the substrate 61 in B of FIG. 27 is greater than that of the arrow mark in the pixel 51 in A of FIG. 27 and the electric field in the Z direction is strengthened further. By applying a negative bias to the P+ semiconductor region 601 formed on the light incident face side of the substrate 61 in this manner, the electric field in the Z direction can be strengthened and the extraction efficiency of electrons by the signal extraction portion 65 can be improved.

Note that the configuration for applying a voltage to the light incident face side of the substrate 61 is not limited to the configuration of provision of the P+ semiconductor region 601 but any other configuration may be applied. For example, a transparent electrode film may be formed by stacking between the light incident face of the substrate 61 and the on-chip lens 62 such that a negative bias is applied by applying a voltage to the transparent electrode film.

Fourteenth Embodiment

<Example of Configuration of Pixel>

Furthermore, a reflection member of a large area may be provided on the face on the opposite side to the light incident face of the substrate 61 in order to improve the sensitivity of the pixel 51 to infrared rays.

Figure 28:
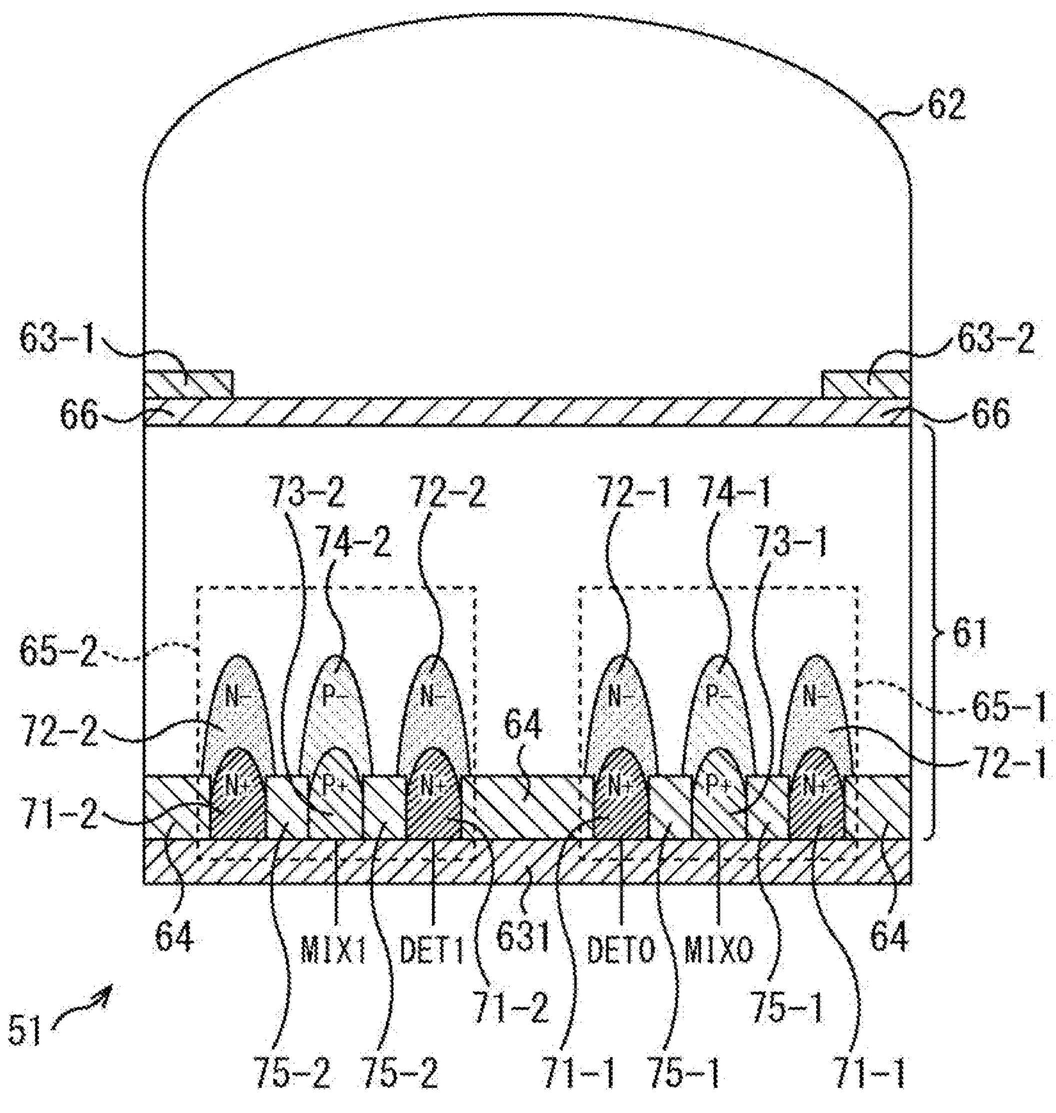
FIG. 28 is a view depicting a different example of a configuration of the pixel.

In such a case as just described, the pixel 51 is configured, for example, in such a manner as depicted in FIG. 28. Note that, in FIG. 28, portions corresponding to those in the case of FIG. 2 are denoted by like reference signs to those in FIG. 2, and description of them is suitably omitted.

The configuration of the pixel 51 depicted in FIG. 28 is different from the pixel 51 of FIG. 2 in that the reflection member 631 is provided on the face on the opposite side to the light incident face of the substrate 61 but is a configuration same as that of the pixel 51 of FIG. 2.

In the example depicted in FIG. 28, a reflection member 631 that reflects infrared light is provided in such a manner as to cover the overall face on the opposite side to the light incident face of the substrate 61.

This reflection member 631 may be any reflection member if the reflectivity of infrared light is high. For example, metal such as copper or aluminum provided in a multilayer wiring layer stacked on the face on the opposite side to the light incident face of the substrate 61 may be used as the reflection member 631, or a reflection structure of a polysilicon film or an oxide film may be formed on the face on the opposite side to the light incident face of the substrate 61 such that it serves as the reflection member 631.

By providing the reflection member 631 on the pixel 51 in this manner, infrared light having been incident to the inside of the substrate 61 from the light incident face through the on-chip lens 62 and having transmitted through the substrate 61 without being photoelectrically converted in the substrate 61 can be reflected by the reflection member 631 such that it is incident again to the inside of the substrate 61. This can further increase the amount of infrared light to be photoelectrically converted in the substrate 61 and improve the quantum efficiency (QE), more specifically, the sensitivity of the pixel 51 to infrared light.

Fifteenth Embodiment

<Example of Configuration of Pixel>

Furthermore, in order to suppress erroneous detection of light by a neighboring pixel, a shading member of a large area may be provided on the face on the opposite side to the light incident face of the substrate 61.

In such a case as just described, the pixel 51 can be configured such that, for example, the reflection member 631 depicted in FIG. 28 can be replaced by the shading member. More specifically, in the pixel 51 depicted in FIG. 28, the reflection member 631 that covers the overall face on the opposite side to the light incident face of the substrate 61 is used as a shading member 631' that shades infrared light. The shading member 631' substitutes the reflection member 631 of the pixel 51 of FIG. 28.

The shading member 631' may be any shading member if the infrared light shading rate thereof is high. For example, metal such as copper or aluminum provided in a multilayer wiring layer stacked on the face on the opposite side to the light incident face of the substrate 61 may be used as the shading member 631', or a shading structure of a polysilicon film or an oxide film may be formed on the face on the opposite side to the light incident face of the substrate 61 such that it serves as the shading member 631'.

By providing the shading member 631' on the pixel 51 in this manner, infrared light having been incident to the inside of the substrate 61 from the light incident face through the on-chip lens 62 and having transmitted through the substrate 61 without being photoelectrically converted in the substrate 61 can be suppressed from being scattered by the wiring layer and entering a neighboring pixel. This can prevent the neighboring pixel from detecting light in error.

Note that the shading member 631' can be caused to serve also as reflection member 631 by configuring the same, for example, from a material containing metal.

Sixteenth Embodiment

<Example of Configuration of Pixel>

Furthermore, a P-well region configured from a P-type semiconductor region may be formed in place of the oxide film 64 in the substrate 61 of the pixel 51.

Figure 29:
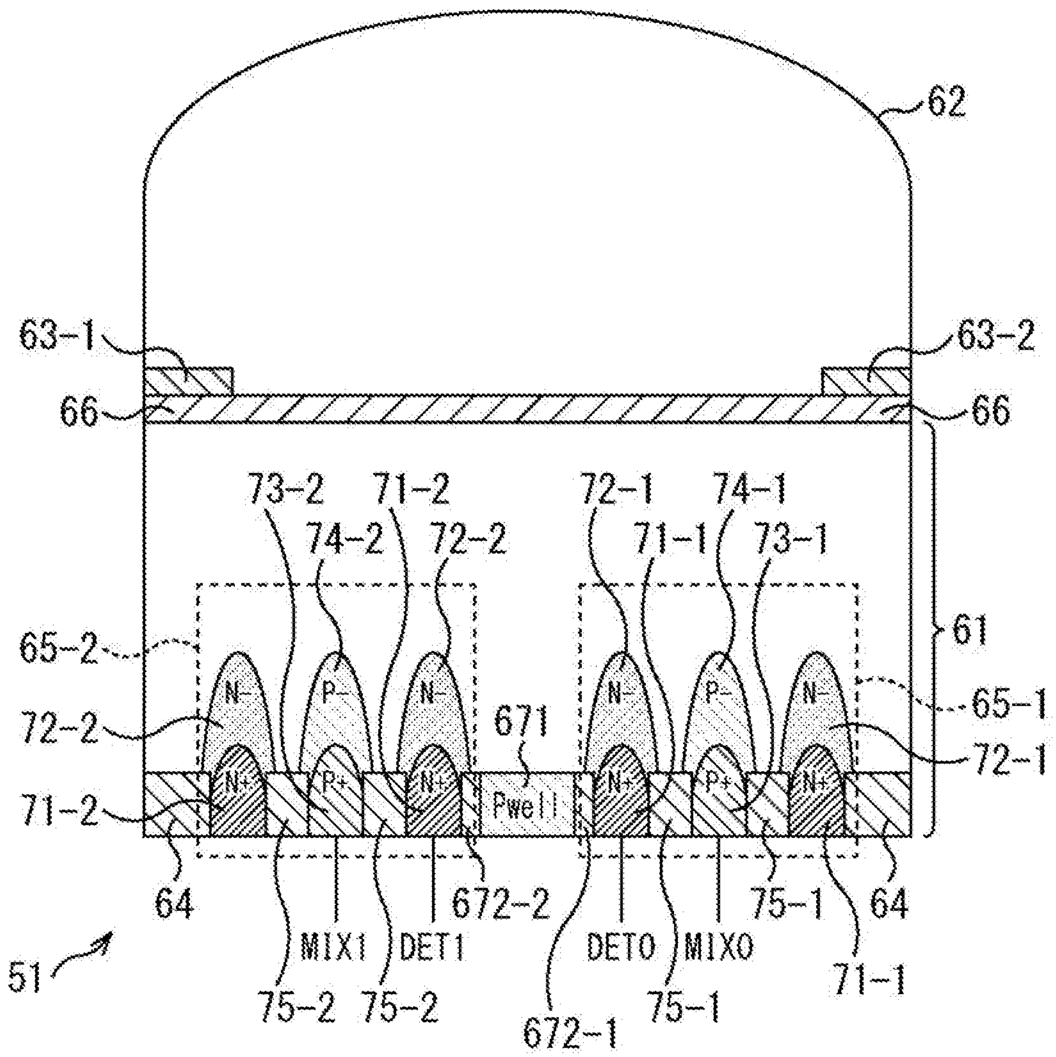
FIG. 29 is a view depicting a different example of a configuration of the pixel.

In such a case as just described, the pixel 51 is configured, for example, in such a manner as depicted in FIG. 29. Note that, in FIG. 29, portions corresponding to those in the case of FIG. 2 are denoted by like reference signs to those in FIG. 2, and description of them is suitably omitted.

The configuration of the pixel 51 depicted in FIG. 29 is different from the pixel 51 depicted in FIG. 2 in that a P well region 671, a separation region 672-1 and another separation region 672-2 are provided in place of the oxide film 64, but is same as the structure of the pixel 51 depicted in FIG. 2 in the other respects.

In the example depicted in FIG. 29, the P well region 671 configured from a P-type semiconductor region is formed at a middle portion on the inner side of the face side opposite to the light incident face, more specifically, of the face on the lower side in FIG. 29, in the substrate 61. Furthermore, between the P well region 671 and the N+ semiconductor region 71-1, the separation region 672-1 for separating the regions from each other includes an oxide film or the like. Similarly, also between the P well region 671 and the N+ semiconductor region 71-2, the separation region 672-2 for separating the regions from each other includes an oxide film or the like. In the pixel 51 depicted in FIG. 29, the P− semiconductor region 74 has a region greater in the upward direction in FIG. 29 than the N− semiconductor region 72.

Seventeenth Embodiment

<Example of Configuration of Pixel>

Furthermore, a P-well region configured from a P-type semiconductor region may be provided in addition to the oxide film 64 in the substrate 61 of the pixel 51.

Figure 30:
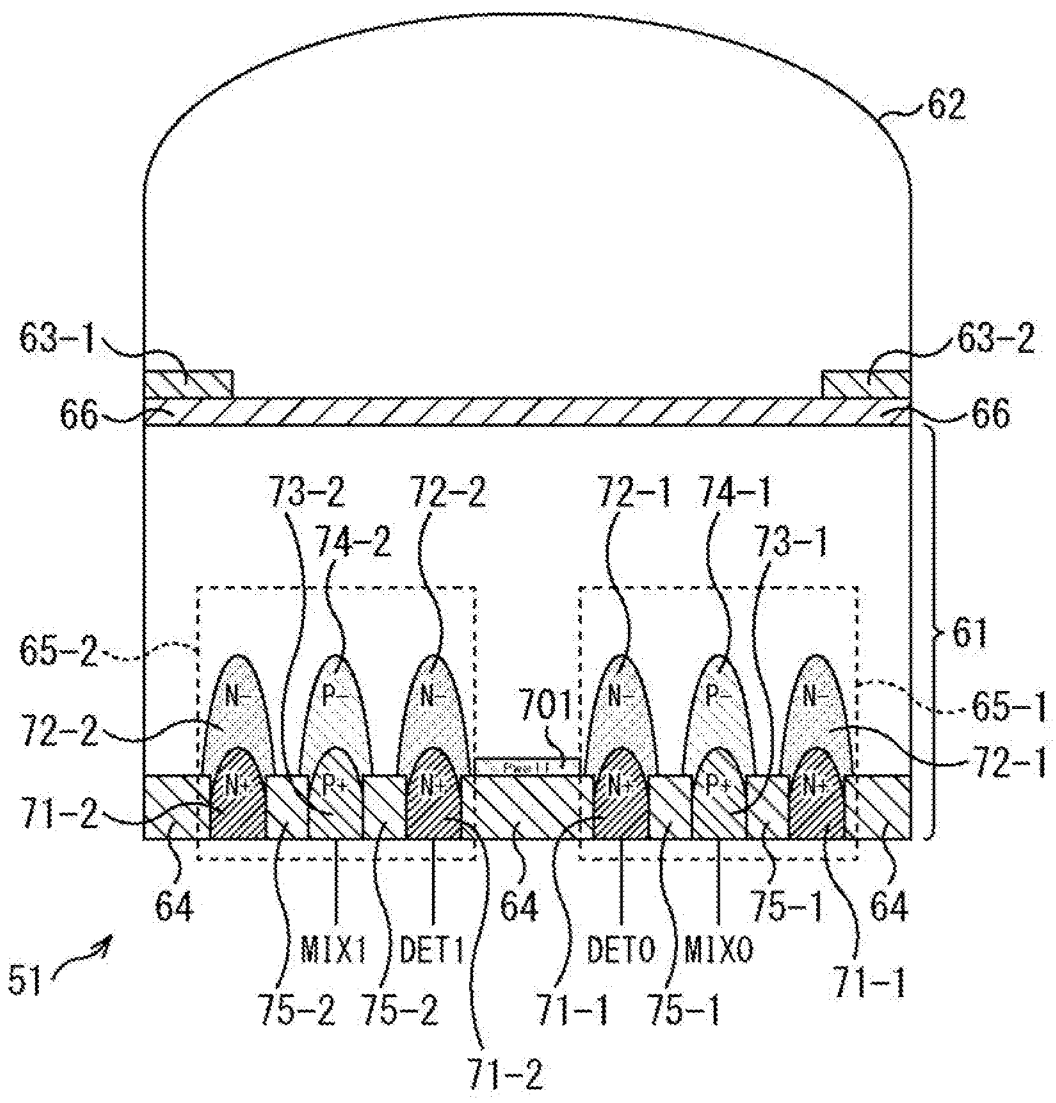
FIG. 30 is a view depicting a different example of a configuration of the pixel.

In such a case as just described, the pixel 51 is configured, for example, in such a manner as depicted in FIG. 30. Note that, in FIG. 30, portions corresponding to those in the case of FIG. 2 are denoted by like reference signs to those in FIG. 2, and description of them is suitably omitted.

The configuration of the pixel 51 depicted in FIG. 30 is different from the pixel 51 depicted in FIG. 2 in that a P well region 701 is provided newly but is a configuration same as that of the pixel 51 of FIG. 2 in the other respects. More specifically, in the example depicted in FIG. 30, the P well region 701 configured from a P-type semiconductor region is formed on the upper side of the oxide film 64 in the substrate 61.

According to the present technology, by configuring a CAPD sensor as that of the back-illuminated type as described above, characteristics such as the pixel sensitivity can be improved.

<Example of Configuration of Equivalent Circuit of Pixel>

Figure 31:
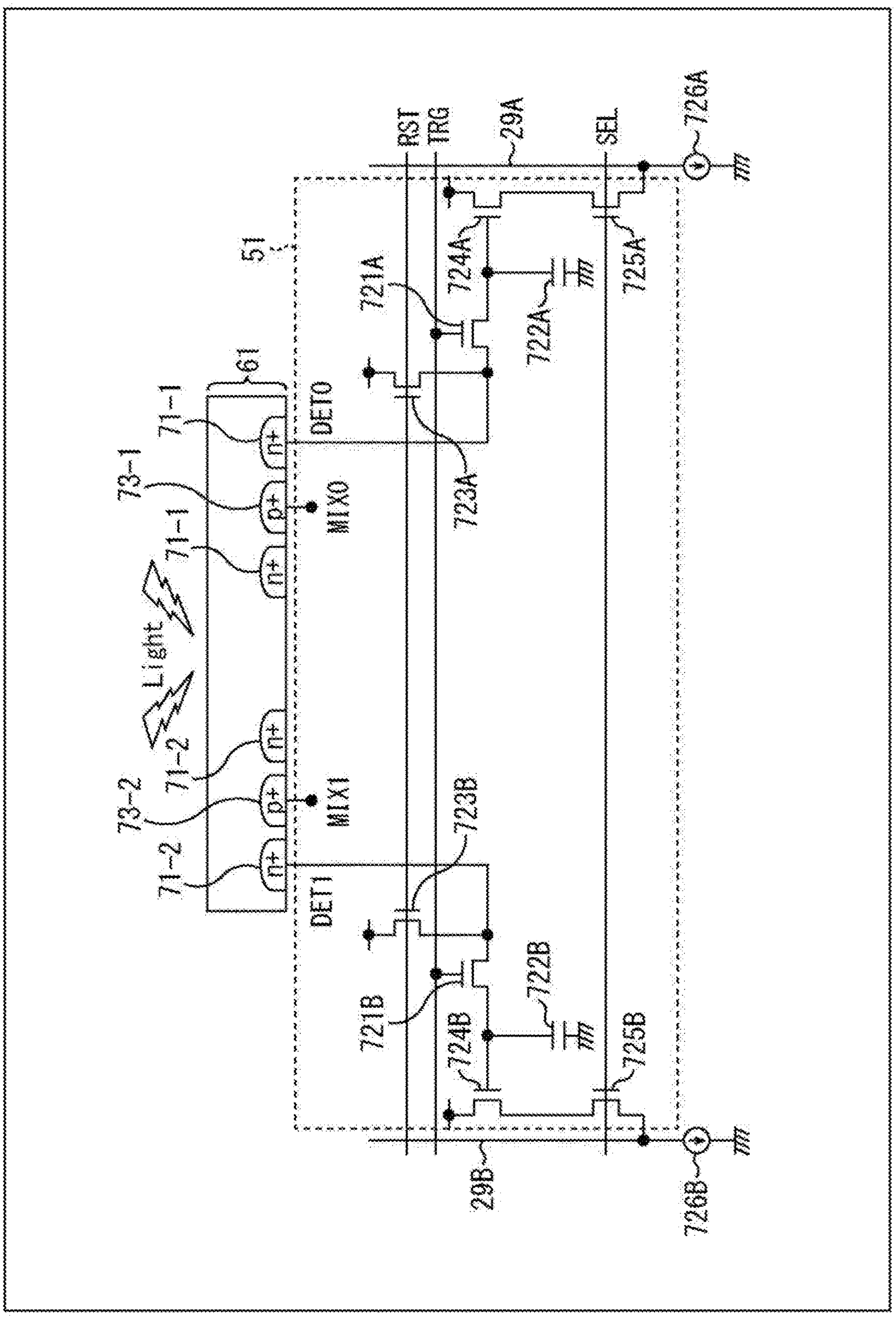
FIG. 31 is a view depicting a different example of a configuration of the pixel.

FIG. 31 depicts an equivalent circuit of the pixel 51.

The pixel 51 includes, for the signal extraction portion 65-1 including the N+ semiconductor region 71-1, P+ semiconductor region 73-1 and so forth, a transfer transistor 721A, an FD 722A, a reset transistor 723A, an amplification transistor 724A and a selection transistor 725A.

Furthermore, the pixel 51 includes, for the signal extraction portion 65-2 including the N+ semiconductor region 71-2, P+ semiconductor region 73-2 and so forth, a transfer transistor 721B, an FD 722B, a reset transistor 723B, an amplification transistor 724B and a selection transistor 725B.

The tap driving section 21 applies a predetermined voltage MIX0 (first voltage) to the P+ semiconductor region 73-1 and applies a predetermined voltage MIX1 (second voltage) to the P+ semiconductor region 73-2. In the example described hereinabove, one of the voltages MIX0 and MIX1 is 1.5 V and the other is 0 V. Each of the P+ semiconductor regions 73-1 and 73-2 is a voltage application portion to which the first voltage or the second voltage is applied.

The N+ semiconductor regions 71-1 and 71-2 are charge detection portions that detect and accumulate charge generated by photoelectric conversion of light incident to the substrate 61.

The transfer transistor 721A transfers the charge accumulated in the N+ semiconductor region 71-1 to the FD 722A when it is placed into a conducting state in response to that a driving signal TRG supplied to the gate electrode thereof is placed into an active state. The transfer transistor 721B transfers the charge accumulated in the N+ semiconductor region 71-2 to the FD 722B when it is placed into a conducting state in response to that the driving signal TRG supplied to the gate electrode thereof is placed into an active state.

The FD 722A temporarily retains charge DET0 supplied from the N+ semiconductor region 71-1. The FD 722B temporarily retains charge DET1 supplied from the N+ semiconductor region 71-2. The FD 722A corresponds to the FD portion A described hereinabove with reference to FIG. 2, and the FD 722B corresponds to the FD portion B.

The reset transistor 723A resets the potential of the FD 722A to a predetermined level (power supply voltage VDD) when it is placed into a conducting state in response to that a driving signal RST supplied to the gate electrode thereof is placed into an active state. The reset transistor 723B resets the potential of the FD 722B to a predetermined level (power supply voltage VDD) when it is placed into a conducting state in response to that the driving signal RST supplied to the gate electrode thereof is placed into an active state. Note that, when the reset transistors 723A and 723B are placed into an active state, also the transfer transistors 721A and 721B are placed into an active state simultaneously.

The amplification transistor 724A is connected at the source electrode thereof to a vertical signal line 29A through the selection transistor 725A to configure a source follower circuit together with a load MOS of a constant current source circuit section 726A connected to one end of the vertical signal line 29A. The amplification transistor 724B is connected at the source electrode thereof to another vertical signal line 29B through the selection transistor 725B to configure a source follower circuit together with a load MOS of a constant current source circuit section 726B connected to one end of the vertical signal line 29B.

The selection transistor 725A is connected between the source electrode of the amplification transistor 724A and the vertical signal line 29A. If a selection signal SEL supplied to the gate electrode of the selection transistor 725A is placed into an active state, then the selection transistor 725A is placed into a conducting state in response to this and outputs a pixel signal outputted from the amplification transistor 724A to the vertical signal line 29A.

The selection transistor 725B is connected between the source electrode of the amplification transistor 724B and the vertical signal line 29B. If a selection signal SEL supplied to the gate electrode of the selection transistor 725B is placed into an active state, then the selection transistor 725B is placed into a conducting state in response to this and outputs a pixel signal outputted from the amplification transistor 724B to the vertical signal line 29B.

The transfer transistors 721A and 721B, reset transistors 723A and 723B, amplification transistors 724A and 724B and selection transistors 725A and 725B of the pixel 51 are controlled, for example, by the vertical driving section 22.

<Different Example of Configuration of Equivalent Circuit of Pixel>

Figure 32:
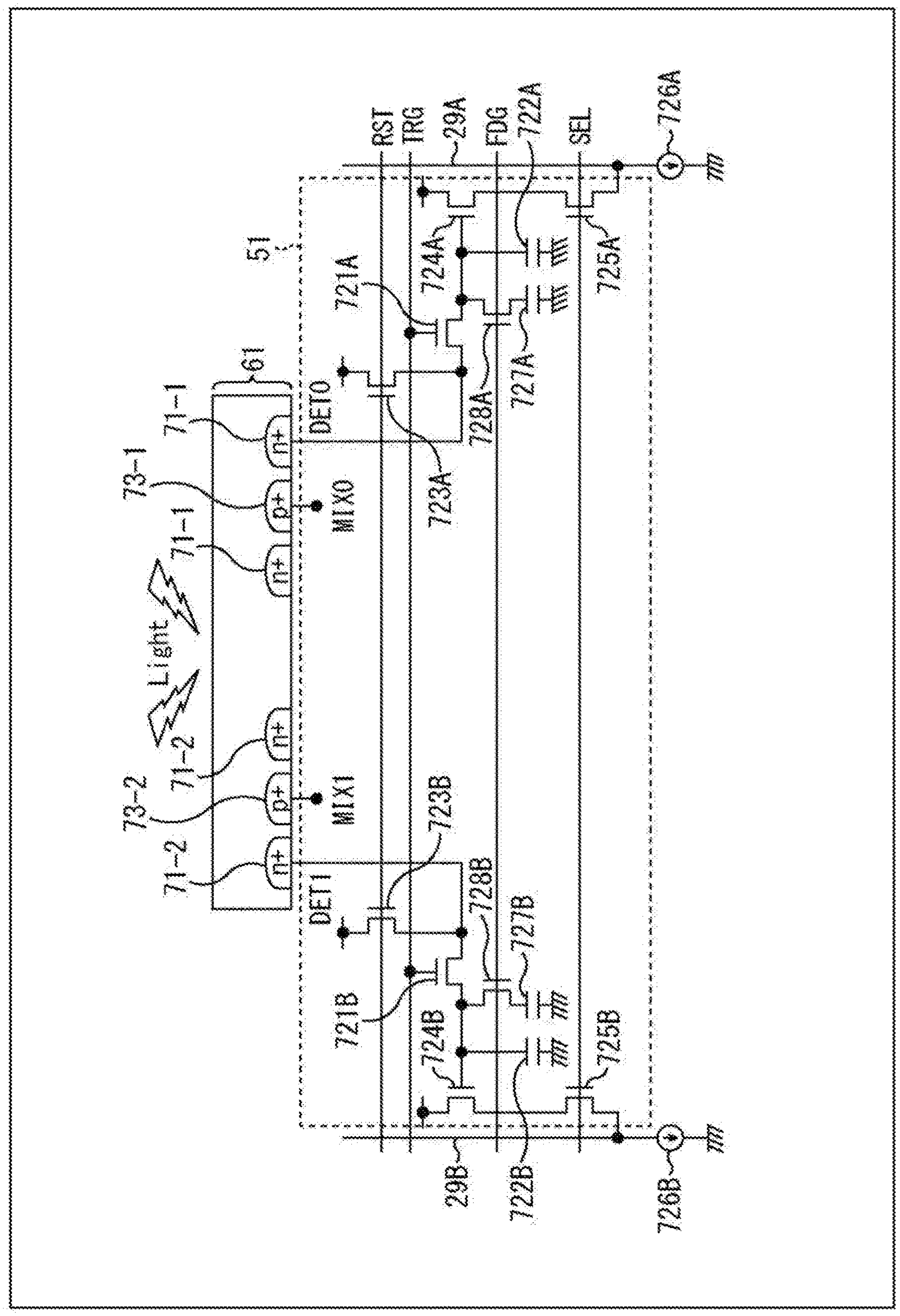
FIG. 32 is a view depicting another equivalent circuit of the pixel.

FIG. 32 depicts a different equivalent circuit of the pixel 51.

In FIG. 32, portions corresponding to those in the case of FIG. 31 are denoted by like reference signs to those in FIG. 31, and description of them is suitably omitted.

The equivalent circuit of FIG. 32 is different from the equivalent circuit of FIG. 31 in that an additional capacitor 727 and a switching transistor 728 for controlling connection of the additional capacitor 727 are added to both the signal extraction portions 65-1 and 65-2.

More specifically, an additional capacitor 727A is connected between the transfer transistor 721A and the FD 722A through a switching transistor 728A and another additional capacitor 727B is connected between the transfer transistor 721B and the FD 722B through a switching transistor 728B.

If a driving signal FDG supplied to the gate electrode of the switching transistor 728A is placed into an active state, then the switching transistor 728A is placed into a conducting state in response to this thereby to connect the additional capacitor 727A to the FD 722A. If the driving signal FDG supplied to the gate electrode of the switching transistor 728B is placed into an active state, then the switching transistor 728B is placed into a conducting stage in response to this thereby to connect the additional capacitor 727B to the FD 722B.

For example, at high illumination where the light amount of incident light is great, the arrow mark A22 places the switching transistors 728A and 728B into an active state to connect the FD 722A and the additional capacitor 727A to each other and connect the FD 722B and the additional capacitor 727B to each other. As a consequence, at high illumination, a greater amount of charge can be accumulated.

On the other hand, at low illumination where the light amount of incident light is small, the arrow mark A22 places the switching transistors 728A and 728B into an inactive state thereby to disconnect the additional capacitors 727A and 727B from the FDs 722A and 722B, respectively.

Although the additional capacitors 727 may be omitted as in the equivalent circuit of FIG. 31, where the additional capacitors 727 are provided and are selectively used in response to the incident light amount, a high dynamic range can be assured.

<Example of Arrangement of Voltage Supply Line>

Now, arrangement of voltage supply lines for applying a predetermined voltage MIX0 or MIX1 to the P+ semiconductor regions 73-1 and 73-2 that are voltage application portions of the signal extraction portion 65 of each pixel 51 is described with reference to FIGS. 33 to 35. A voltage supply line 741 depicted in FIGS. 33 and 34 corresponds to the voltage supply line 30 depicted in FIG. 1.

Figure 33:
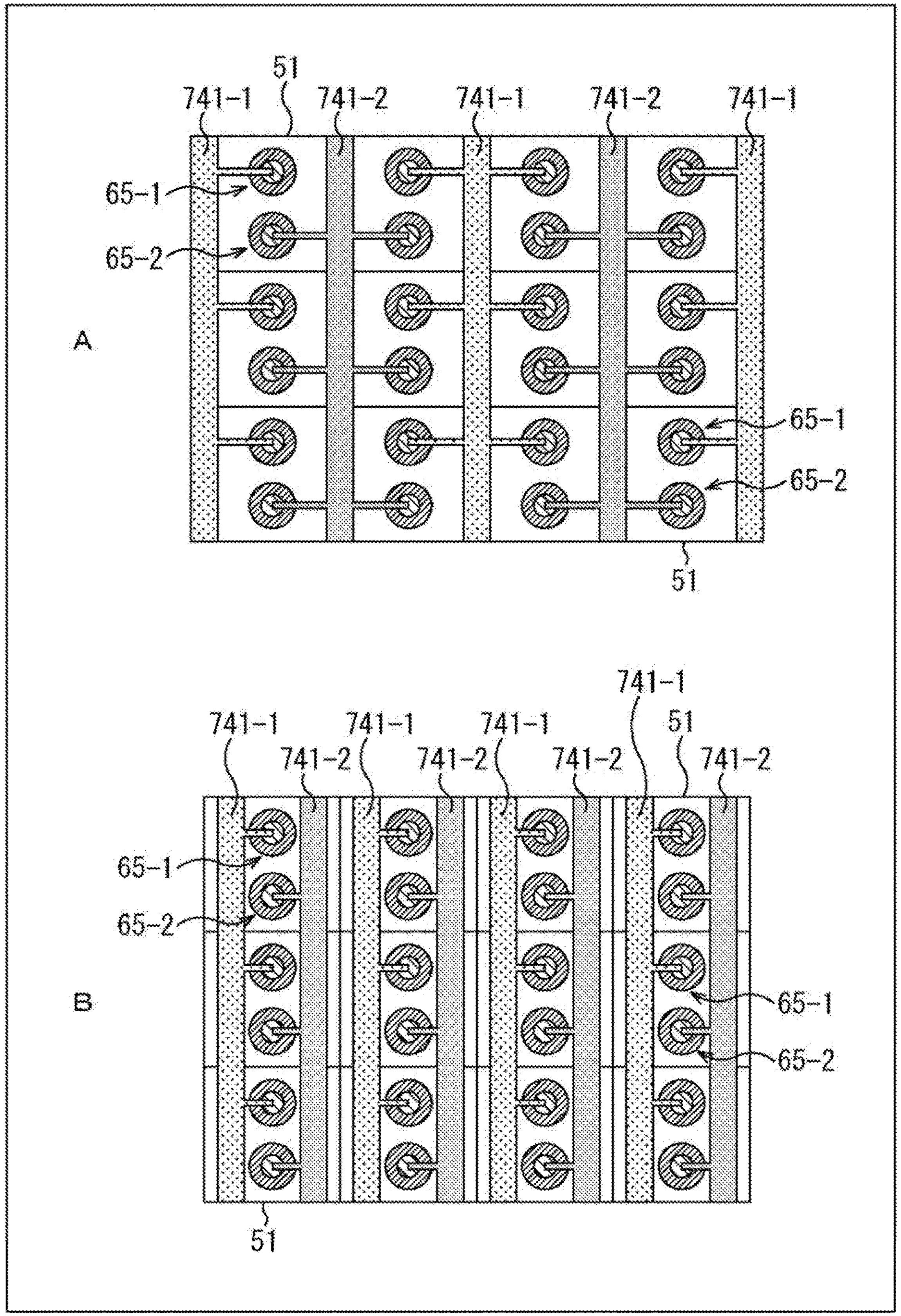
FIG. 33 is a view depicting an example of arrangement of a voltage supply line to which Periodic arrangement is adopted.
Figure 34:
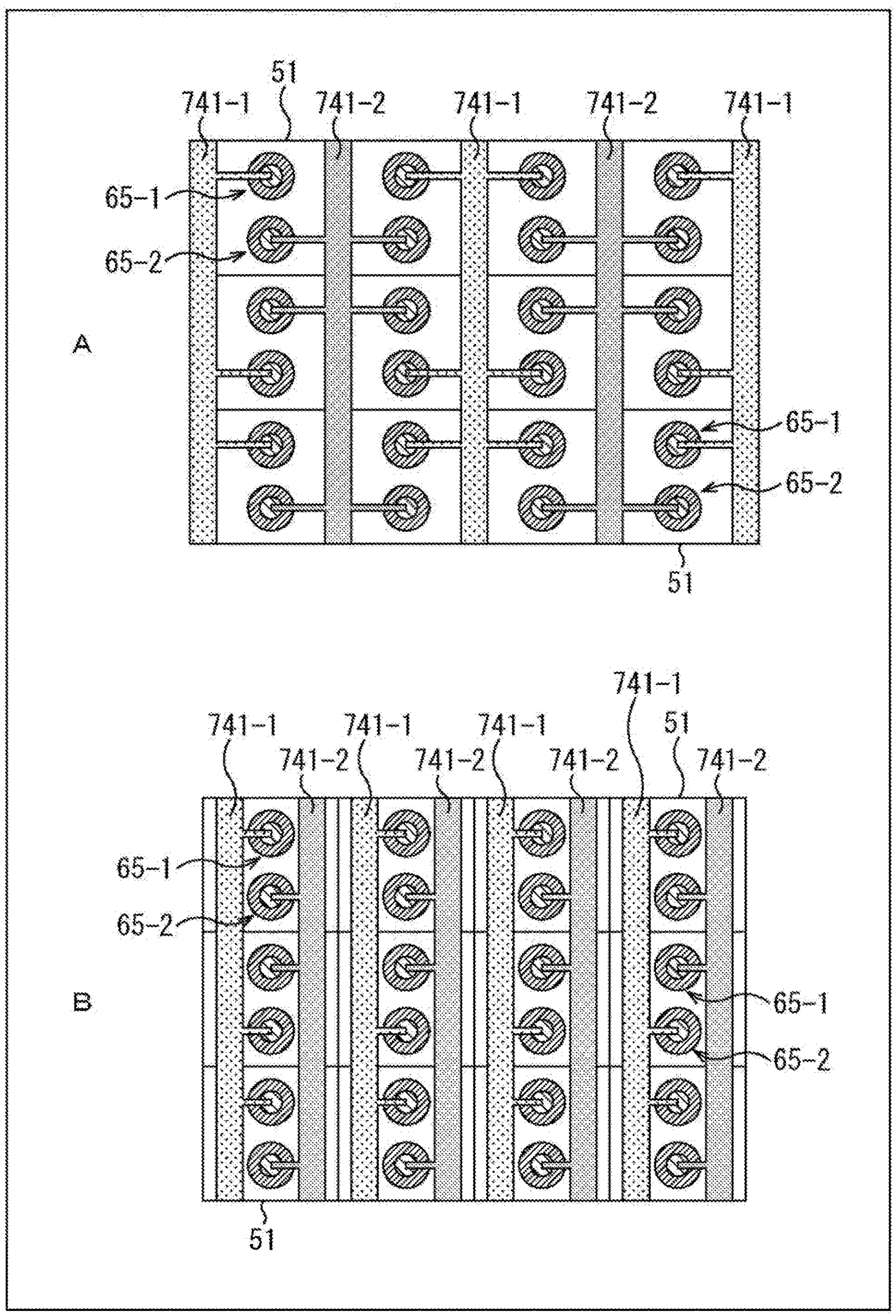
FIG. 34 is a view depicting an example of arrangement of a voltage supply line for which Mirror arrangement is adopted.

Note that, although the circular configuration depicted in FIG. 9 is adopted as the configuration of the signal extraction portion 65 of each pixel 51 in FIGS. 33 and 34, it is a matter of course that a different configuration may be adopted.

A of FIG. 33 is a plan view depicting a first arrangement example of voltage supply lines.

In the first arrangement example, a voltage supply line 741-1 or 741-2 is wired along a vertical direction between (on the boundary between) two pixels neighboring with each other in the horizontal direction among a plurality of pixels 51 arranged two-dimensionally in a matrix.

The voltage supply line 741-1 is connected to the P+ semiconductor region 73-1 of the signal extraction portion 65-1 that is one of the two signal extraction portions 65 in each pixel 51. The voltage supply line 741-2 is connected to the P+ semiconductor region 73-2 of the signal extraction portion 65-2 that is the other of the two signal extraction portions 65 in each pixel 51.

In this first arrangement example, since the two voltage supply lines 741-1 and 741-2 are arranged for two columns of pixels, the number of voltage supply lines 741 arranged in the pixel array section 20 is substantially equal to the number of columns of the pixels 51.

B of FIG. 33 is a plan view depicting a second arrangement example of a voltage supply line.

In the second arrangement example, for one pixel column of a plurality of pixels 51 arranged two-dimensionally in a matrix, two voltage supply lines 741-1 and 741-2 are wired along the vertical direction.

The voltage supply line 741-1 is connected to the P+ semiconductor region 73-1 of the signal extraction portion 65-1 that is one of the two signal extraction portions 65 in the pixel 51. The voltage supply line 741-2 is connected to the P+ semiconductor region 73-2 of the signal extraction portion 65-2 that is the other of the two signal extraction portions 65 in the pixel 51.

In this second arrangement example, since two voltage supply lines 741-1 and 741-2 are wired for one pixel column, four voltage supply lines 741 are arranged for two columns of pixels. In the pixel array section 20, the number of voltage supply lines 741 to be arranged is approximately twice the number of columns of the pixels 51.

Both the arrangement examples of A and B of FIG. 33 are Periodic arrangement (cyclic arrangement) in which the configuration that the voltage supply line 741-1 is connected to the P+ semiconductor region 73-1 of the signal extraction portion 65-1 and the voltage supply line 741-2 is connected to the P+ semiconductor region 73-2 of the signal extraction portion 65-2 is cyclically repeated for the pixels lined up in the vertical direction.

The first arrangement example of A of FIG. 33 can reduce the number of voltage supply lines 741-1 and 741-2 to be wired in the pixel array section 20.

Although the second arrangement example of B of FIG. 33 includes an increased number of wirings in comparison with the first arrangement example, since the number of signal extraction portions 65 to be connected to one voltage supply line 741 decreases to ½, the load to the wirings can be reduced. Therefore, the second arrangement example of B of FIG. 33 is effective when high speed driving is required or the total pixel number of pixels of the pixel array section 20 is great.

A of FIG. 34 is a plan view depicting a third arrangement example of voltage supply lines.

The third arrangement example is an example in which two voltage supply lines 741-1 and 741-2 are arranged for two columns of pixels similarly as in the first arrangement example of A of FIG. 33.

The third arrangement example is different from the first arrangement example of A of FIG. 33 in that the connection destinations of the signal extraction portions 65-1 and 65-2 are different between two pixels lined up in the vertical direction.

More specifically, for example, although, at a certain pixel 51, the voltage supply line 741-1 is connected to the P+ semiconductor region 73-1 of the signal extraction portion 65-1 and the voltage supply line 741-2 is connected to the P+ semiconductor region 73-2 of the signal extraction portion 65-2, at a pixel 51 above or below the certain pixel 51, the voltage supply line 741-1 is connected to the P+ semiconductor region 73-2 of the signal extraction portion 65-2 and the voltage supply line 741-2 is connected to the P+ semiconductor region 73-1 of the signal extraction portion 65-1.

B of FIG. 34 is a plan view depicting a fourth arrangement example of a voltage supply line.

The fourth arrangement example is an example in which two voltage supply lines 741-1 and 741-2 are arranged for two columns of pixels similarly as in the second arrangement example of B of FIG. 33.

The fourth arrangement example is different from the second arrangement example of B of FIG. 33 in that the connection destinations of the signal extraction portions 65-1 and 65-2 are different between two pixels lined up in the vertical direction.

More specifically, although, for example, at a certain pixel 51, the voltage supply line 741-1 is connected to the P+ semiconductor region 73-1 of the signal extraction portion 65-1 and the voltage supply line 741-2 is connected to the P+ semiconductor region 73-2 of the signal extraction portion 65-2, at a pixel 51 below or above the certain pixel 51, the voltage supply line 741-1 is connected to the P+ semiconductor region 73-2 of the signal extraction portion 65-2 and the voltage supply line 741-2 is connected to the P+ semiconductor region 73-1 of the signal extraction portion 65-1.

The third arrangement example of A of FIG. 34 can reduce the number of voltage supply lines 741-1 and 741-2 to be wired in the pixel array section 20.

Although the fourth arrangement example of B of FIG. 34 includes an increased number of wirings in comparison with the third arrangement example, since the number of signal extraction portions 65 connected to one voltage supply line 741 decreases to ½, the load to the wirings can be reduced, and the fourth arrangement example is effective when high speed driving is required or the total pixel number of pixels of the pixel array section 20 is great.

Both the arrangement examples of A and B of FIG. 34 are Mirror arrangement in which the connection destinations of two pixels neighboring with each other upwardly and downwardly (in the vertical direction) are mirror inverted.

Figure 35:
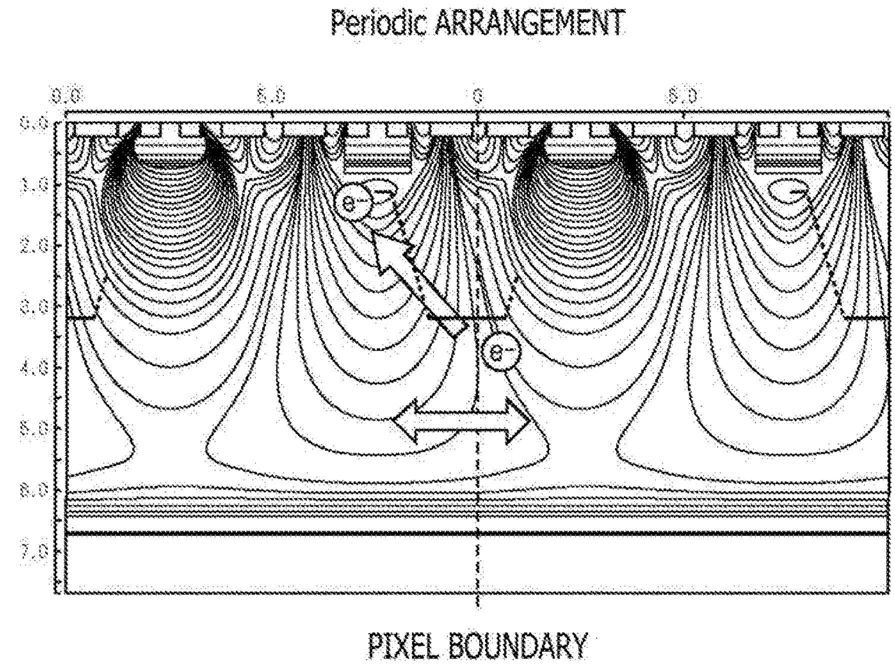
FIG. 35 is a view illustrating characteristics of the Periodic arrangement and the Mirror arrangement.
Figure 35:
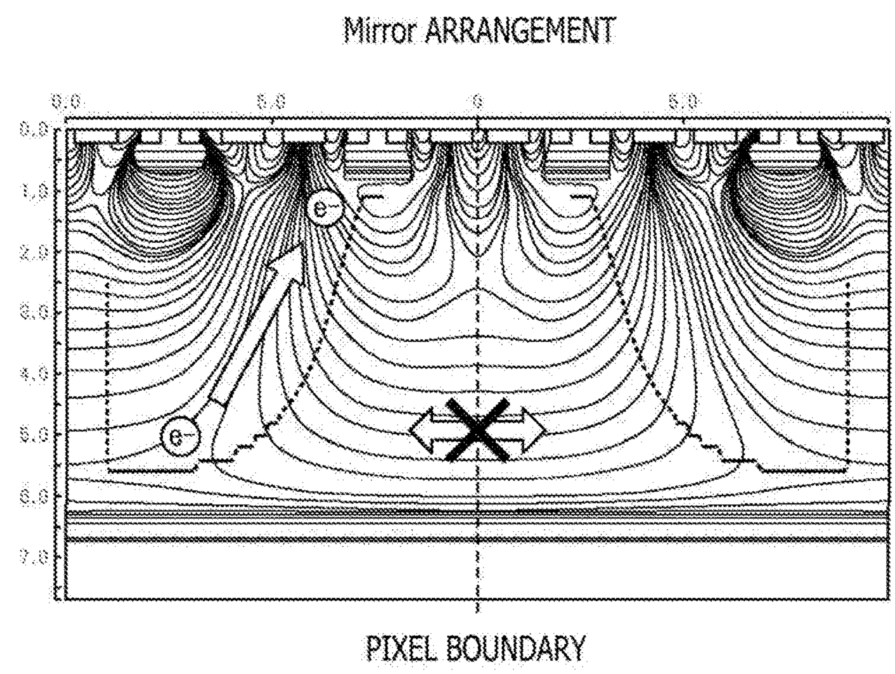

In the Periodic arrangement, since the voltages to be applied to two signal extraction portions 65 neighboring with each other across a pixel boundary are different voltages, transfer of charge occurs between the neighboring pixels, as depicted in A of FIG. 35. Therefore, although the transfer efficiency of charge is higher than that of the Mirror arrangement, the crosstalk characteristic between neighboring pixels is inferior to that of the Mirror arrangement.

On the other hand, in the Mirror arrangement, since the voltages to be applied to two signal extraction portions 65 neighboring with each other across a pixel boundary are equal voltages to each other, transfer of charge between the neighboring pixels is suppressed, as depicted in B of FIG. 35. Therefore, although the transfer efficiency of charge is inferior to that of the Periodic arrangement, the crosstalk characteristic between the neighboring pixels is better than that of the Periodic arrangement.

<Sectional Configuration of Plural Pixels in Fourteenth Embodiment>

In the sectional configuration of pixels depicted in FIG. 2 and so forth, illustration of multilayer wiring layers formed on the front face side opposite to the light incident face of the substrate 61 is omitted.

Therefore, in the following, sectional views of plural pixels neighboring with each other are depicted in a form in which multilayer wiring layers are not omitted in several ones of the embodiments described above.

Figure 36:
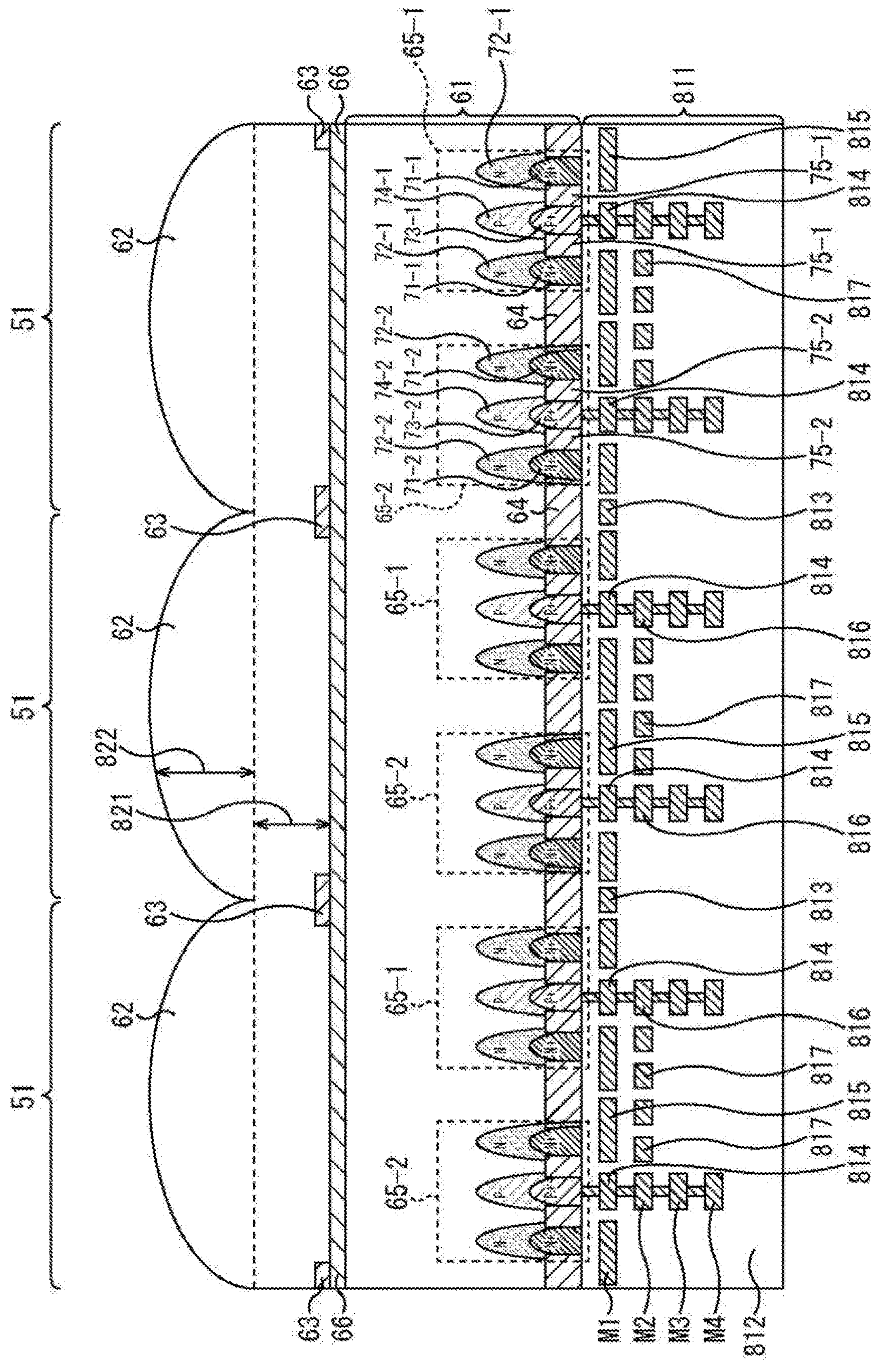
FIG. 36 is a sectional view of a plurality of pixels in a fourteenth embodiment.
Figure 37:
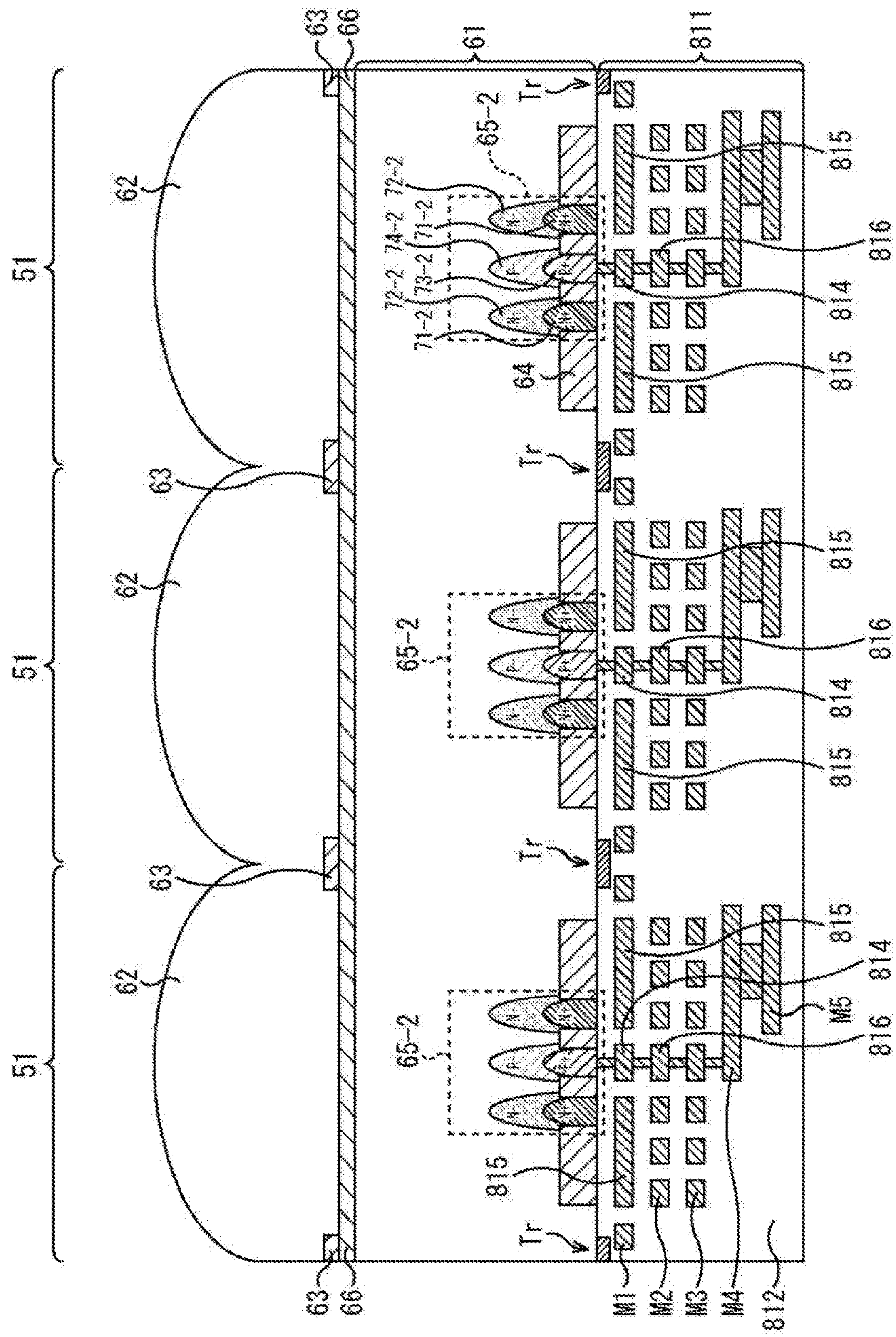
FIG. 37 is a sectional view of a plurality of pixels in the fourteenth embodiment.

First, sectional views of plural pixels of the fourteenth embodiment depicted in FIG. 28 are depicted in FIGS. 36 and 37.

The fourteenth embodiment depicted in FIG. 28 is directed to a configuration of pixels including a reflection member 631 of a large area on the opposite side to the light incident face of the substrate 61.

FIG. 36 is correspond to a sectional view taken along line B-B' of FIG. 11, and FIG. 37 is correspond to a sectional view taken along line A-A' of FIG. 11. Also, a sectional view taken along line C-C' of FIG. 17 can be indicated in such a manner as in FIG. 36.

As depicted in FIG. 36, an oxide film 64 is formed at a central portion of each pixel 51, and a signal extraction portion 65-1 and another signal extraction portion 65-2 are formed on the opposite sides of the oxide film 64.

In the signal extraction portion 65-1, an N+ semiconductor region 71-1 and another N− semiconductor region 72-1 are formed in such a manner as to be centered at the P+ semiconductor region 73-1 and the P− semiconductor region 74-1 and surround the P+ semiconductor region 73-1 and the P− semiconductor region 74-1, respectively. The P+ semiconductor region 73-1 and the N+ semiconductor region 71-1 are held in contact with a multilayer wiring layer 811. The P− semiconductor region 74-1 is arranged above the P+ semiconductor region 73-1 (on the on-chip lens 62 side) in such a manner as to cover the P+ semiconductor region 73-1, and the N− semiconductor region 72-1 is arranged above the N+ semiconductor region 71-1 (on the on-chip lens 62 side) in such a manner as to cover the N+ semiconductor region 71-1. More specifically, the P+ semiconductor region 73-1 and the N+ semiconductor region 71-1 are arranged on the multilayer wiring layer 811 side in the substrate 61, and the N− semiconductor region 72-1 and the P− semiconductor region 74-1 are arranged on the on-chip lens 62 side in the substrate 61. Furthermore, between the N+ semiconductor region 71-1 and the P+ semiconductor region 73-1, a separation portion 75-1 for separating the regions from each other includes an oxide film or the like.

In the signal extraction portion 65-2, the N+ semiconductor region 71-2 and the N− semiconductor region 72-2 are formed in such a manner as to be centered at the P+ semiconductor region 73-2 and the P− semiconductor region 74-2 and surround the P+ semiconductor region 73-2 and the P− semiconductor region 74-2, respectively. The P+ semiconductor region 73-2 and the N− semiconductor region 71-2 are held in contact with the multilayer wiring layer 811. The P− semiconductor region 74-2 is arranged above the P+ semiconductor region 73-2 (on the on-chip lens 62 side) in such a manner as to cover the P+ semiconductor region 73-2, and the N− semiconductor region 72-2 is arranged above the N+ semiconductor region 71-2 (on the on-chip lens 62 side) in such a manner as to cover the N+ semiconductor region 71-2. More specifically, the P+ semiconductor region 73-2 and the N+ semiconductor region 71-2 are arranged on the multilayer wiring layer 811 side in the substrate 61, and the N− semiconductor region 72-2 and the P− semiconductor region 74-2 are arranged on the on-chip lens 62 side in the substrate 61. Furthermore, between the N+ semiconductor region 71-2 and the P+ semiconductor region 73-2, a separation portion 75-2 for separating the regions from each other includes an oxide film or the like.

Also, between the N+ semiconductor region 71-1 of the signal extraction portion 65-1 of a predetermined pixel 51, which is a boundary region between pixels 51 neighboring with each other, and the N+ semiconductor region 71-2 of the signal extraction portion 65-2 of a next pixel 51, an oxide film 64 is formed.

A fixed charge film 66 is formed on an interface on the light incident face side of the substrate 61 (upper face in FIGS. 36 and 37).

As depicted in FIG. 36, if the on-chip lens 62 formed for each pixel on the light incident face side of the substrate 61 is divided into a raised portion 821 having a thickness increased uniformly over an overall area of a region in the pixel and a curved face portion 822 having a thickness that varies depending upon the position in the pixel, then the thickness of the raised portion 821 is formed smaller than that of the curved face portion 822. As the thickness of the raised portion 821 increases, oblique incident light is reflected more likely by the inter-pixel shading films 63, and therefore, by forming the raised portion 821 thinner, also oblique incident light can be taken into the substrate 61. Furthermore, as the thickness of the curved face portion 822 is increased, the incident light can be condensed more to the pixel center.

The multilayer wiring layer 811 is formed on the opposite side to the light incident face side of the substrate 61 on which the on-chip lens 62 is formed for each pixel. More specifically, the substrate 61 that is a semiconductor layer is arranged between the on-chip lens 62 and the multilayer wiring layer 811. The multilayer wiring layer 811 is configured from five layers of metal layers M1 to M5 and an interlayer insulating film 812 between the metal layers M1 to M5. More specifically, in FIG. 36, since the metal layer M5 on the outermost side from among the five layers of metal layers M1 to M5 of the multilayer wiring layer 811 is at a place that is not visible, this is not depicted. However, the metal layer M5 is depicted in FIG. 37 that is a sectional view from a direction different from that of the sectional view of FIG. 36.

As depicted in FIG. 37, a pixel transistor Tr is formed in a pixel boundary region at an interface portion of the multilayer wiring layer 811 to the substrate 61. The pixel transistor Tr is one of a transfer transistor 721, a reset transistor 723, an amplification transistor 724 and a selection transistor 725 depicted in FIGS. 31 and 32.

The metal film M1 nearest to the substrate 61 from among the five layers of metal layers M1 to M5 of the multilayer wiring layer 811 includes a power supply line 813 for supplying a power supply voltage, a voltage application wire 814 for applying a predetermined voltage to the P+ semiconductor region 73-1 or 73-2 and a reflection member 815 that is a member for reflecting incident light. Although, in the metal film M1 of FIG. 36, wires other than the power supply line 813 and the voltage application wire 814 serve as the reflection member 815, in order to prevent the illustration from being complicated, some reference signs are omitted. The reflection member 815 is a dummy wire provided in order to reflect incident light and is correspond to the reflection member 631 depicted in FIG. 28. The reflection member 815 is arranged below the N+ semiconductor regions 71-1 and 71-2 such that they overlap with the N+ semiconductor regions 71-1 and 71-2 serving as the charge detection sections as viewed in plan. Note that, in the case where the shading member 631' of the fifteenth embodiment is provided in place of the reflection member 631 of the fourteenth embodiment depicted in FIG. 28, the portion of the reflection member 815 of FIG. 36 serves as the shading member 631'.

Furthermore, in the metal film M1, in order to transfer charge accumulated in the N+ semiconductor region 71 to the FD 722, also a charge extraction wire (not depicted in FIG. 36) that connects the N+ semiconductor region 71 and the transfer transistor 721 to each other is formed.

Note that, although, in the present example, the reflection member 815 (reflection member 631) and the charge extraction wire are arranged in the same layer of the metal film M1, they are not necessarily arranged restrictively in the same layer.

In the metal film M2 of the second layer from the substrate 61 side, for example, a voltage application wire 816 connected to the voltage application wire 814, for example, of the metal film M1, a control line 817 for transmitting a driving signal TRG, another driving signal RST, a selection signal SEL, a further driving signal FDG and so forth, a ground line and so forth are formed. Furthermore, in the metal film M2, an FD 722B and an additional capacitor 727A are formed.

In the metal film M3 of the third layer from the substrate 61 side, for example, a vertical signal line 29, a VSS wire for shielding and so forth are formed.

In the metal films M4 and M5 of the fourth and fifth layers from the substrate 61 side, voltage supply lines 741-1 and 741-2 (FIGS. 33 and 34) for applying a predetermined voltage MIX0 or MIX1 are formed, for example, in the P+ semiconductor regions 73-1 and 73-2 that are a voltage application section of the signal extraction portion 65.

Note that planar arrangement of the metal layers M1 to M5 of the five layers of the multilayer wiring layer 811 is hereinafter described with reference to FIGS. 42 and 43.

<Sectional Configuration of Plural Pixels of Ninth Embodiment>

Figure 38:
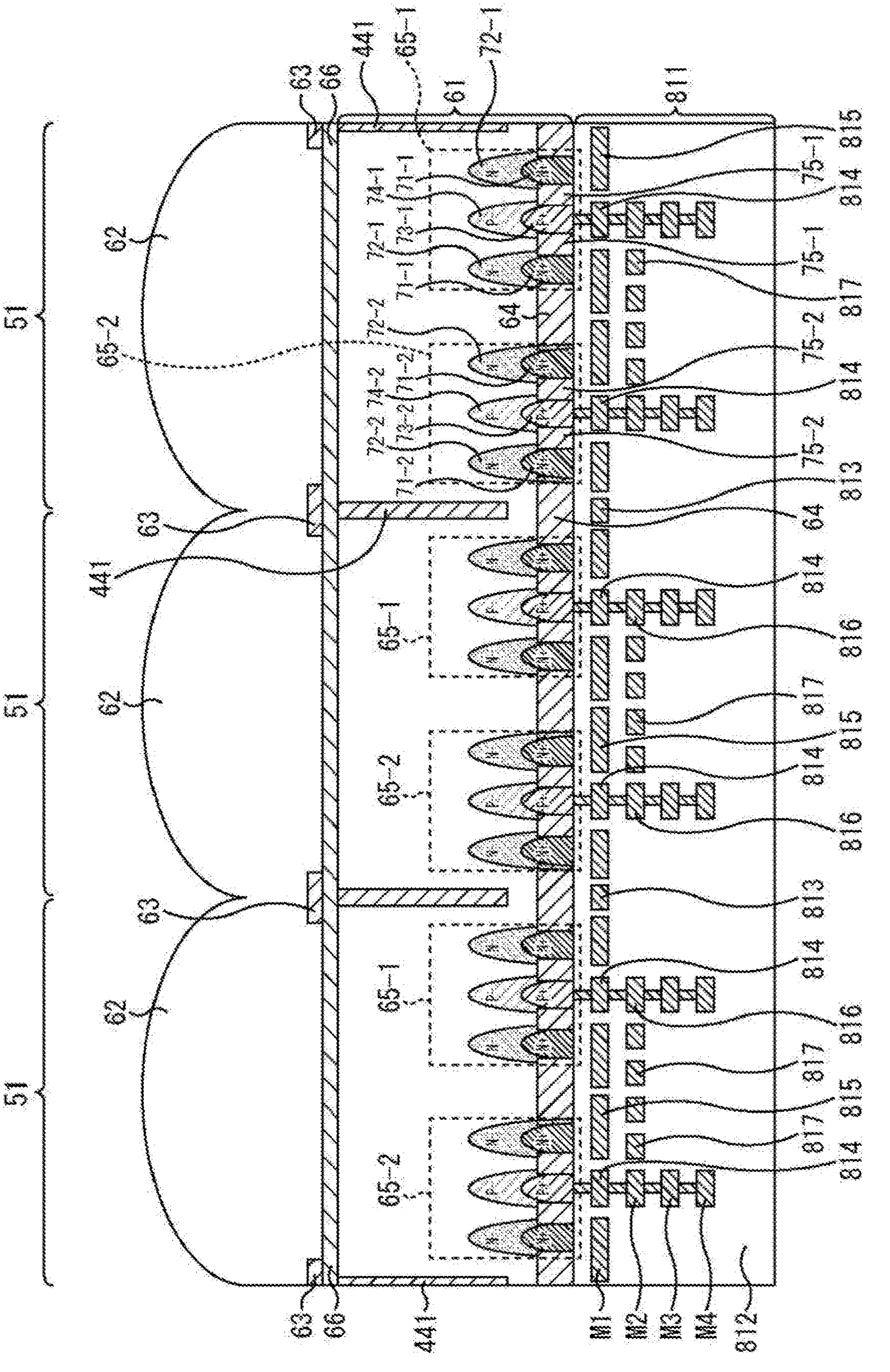
FIG. 38 is a sectional view of a plurality of pixels in a ninth embodiment.

FIG. 38 is a sectional view depicting the pixel structure of the ninth embodiment depicted in FIG. 22 in regard to a plurality of pixels without omitting a multilayer wiring layer.

The ninth embodiment depicted in FIG. 22 is a configuration of a pixel that includes a separation region 441 in which a long groove (trench) is formed to a predetermined depth from the rear face (light incident face) side of the substrate 61 at a pixel boundary portion in the substrate 61 and is filled with a shading film.

The configuration of the other part including the signal extraction portions 65-1 and 65-2, five layers of the metal layers M1 to M5 of the multilayer wiring layer 811 and so forth is similar to the configuration depicted in FIG. 36.

<Sectional Configuration Plural Pixels of Modification 1 of Ninth Embodiment>

Figure 39:
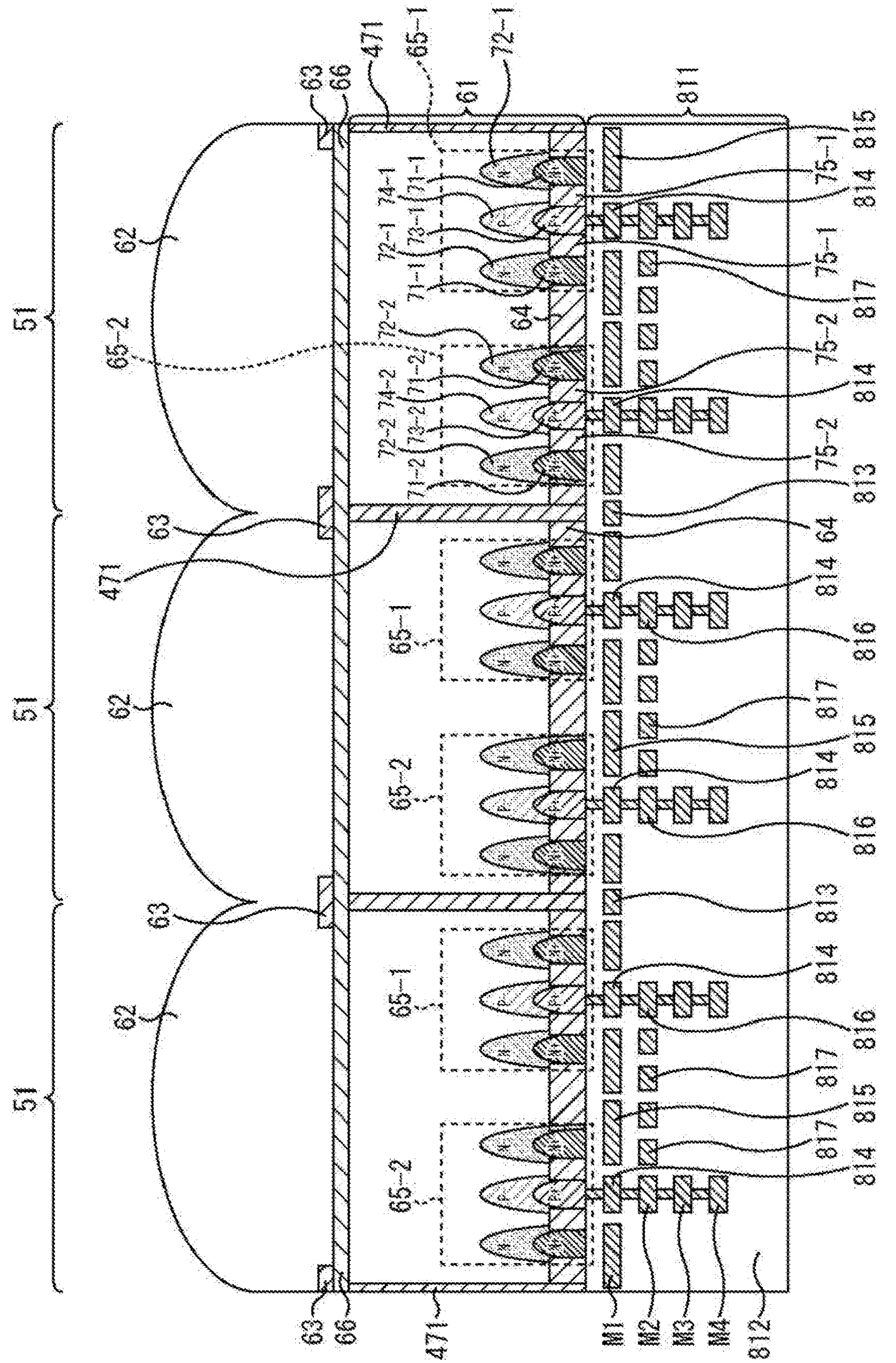
FIG. 39 is a sectional view of a plurality of pixels in a modification 1 of the ninth embodiment.

FIG. 39 is a sectional view depicting a pixel structure of a modification 1 of the ninth embodiment depicted in FIG. 23 in regard to a plurality of pixels in a form in which the multilayer wiring layer is not omitted.

The modification 1 of the ninth embodiment depicted in FIG. 23 is a configuration of a pixel that includes a separation region 471, which extends through the entire substrate 61, at a pixel boundary portion in the substrate 61.

The configuration of the other part including the signal extraction portions 65-1 and 65-2, the five layers of metal layers M1 to M5 of the multilayer wiring layer 811 and so forth is similar to the configuration depicted in FIG. 36.

<Sectional Configuration of Plural Pixels of Sixteenth Embodiment>

Figure 40:
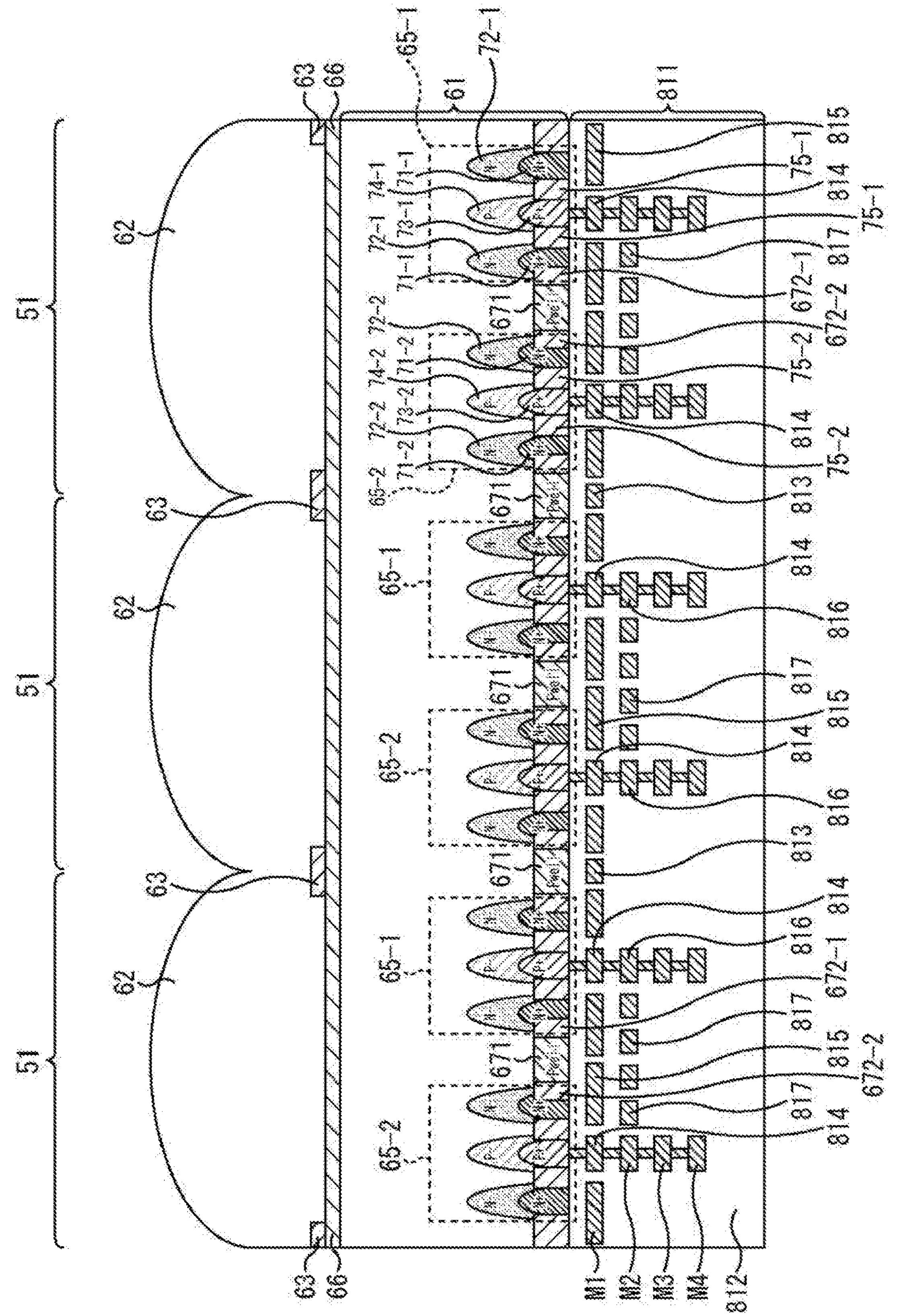
FIG. 40 is a sectional view of a plurality of pixels in a fifteenth embodiment.

FIG. 40 is a sectional view depicting a pixel structure of the sixteenth embodiment depicted in FIG. 29 in regard to a plurality of pixels in a form in which the multilayer wiring layer is not omitted.

The sixteenth embodiment depicted in FIG. 29 is a configuration including a P well region 671 provided at a middle portion on the inner side of the opposite face side to the light incident face in the substrate 61, more specifically, of the lower side face in FIG. 40. Furthermore, a separation region 672-1 includes an oxide film or the like between the P well region 671 and the N+ semiconductor region 71-1. Similarly, also between the P well region 671 and the N+ semiconductor region 71-2, another separation region 672-2 includes an oxide film or the like. Also, at a pixel boundary portion of the lower side face of the substrate 61, a P well region 671 is formed.

The configuration of the other part including the signal extraction portions 65-1 and 65-2, the five layers of metal layers M1 to M5 of the multilayer wiring layer 811 and so forth is similar to the configuration depicted in FIG. 36.

<Sectional Configuration of Plural Pixels of Tenth Embodiment>

Figure 41:
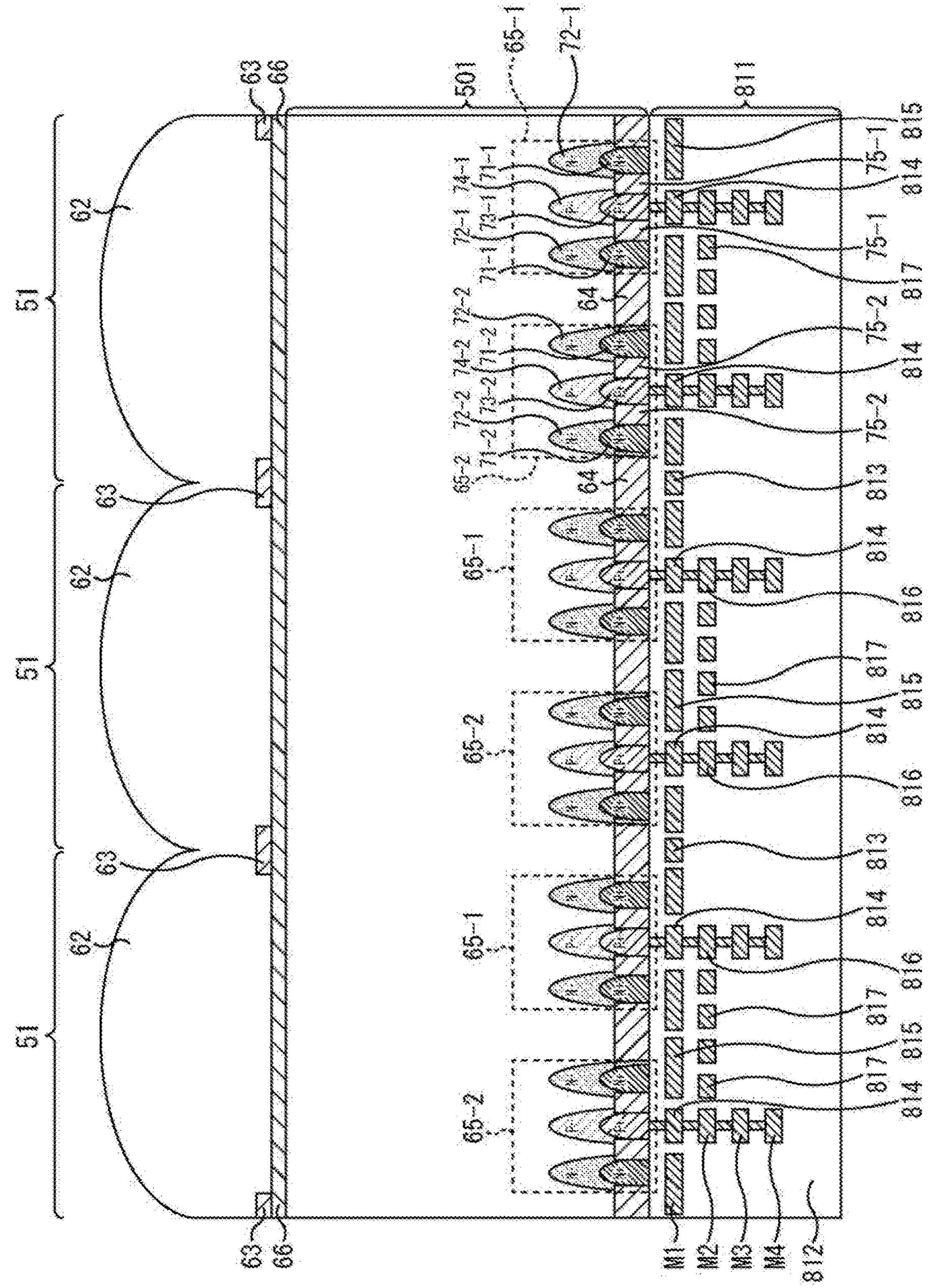
FIG. 41 is a sectional view of a plurality of pixels in a tenth embodiment.

FIG. 41 is a sectional view depicting a pixel structure of the tenth embodiment depicted in FIG. 24 in regard to a plurality of pixels in a form in which the multilayer wiring layer is not omitted.

The tenth embodiment depicted in FIG. 24 is directed to a configuration of a pixel in which a substrate 501 of an increased substrate thickness is provided in place of the substrate 61.

The configuration of the other part including the signal extraction portions 65-1 and 65-2, the five layers of metal layers M1 to M5 of the multilayer wiring layer 811 and so forth is similar to the configuration depicted in FIG. 36.

<Example of Planar Arrangement of Five Layers of Metal Layers M1 to M5>

Figure 42:
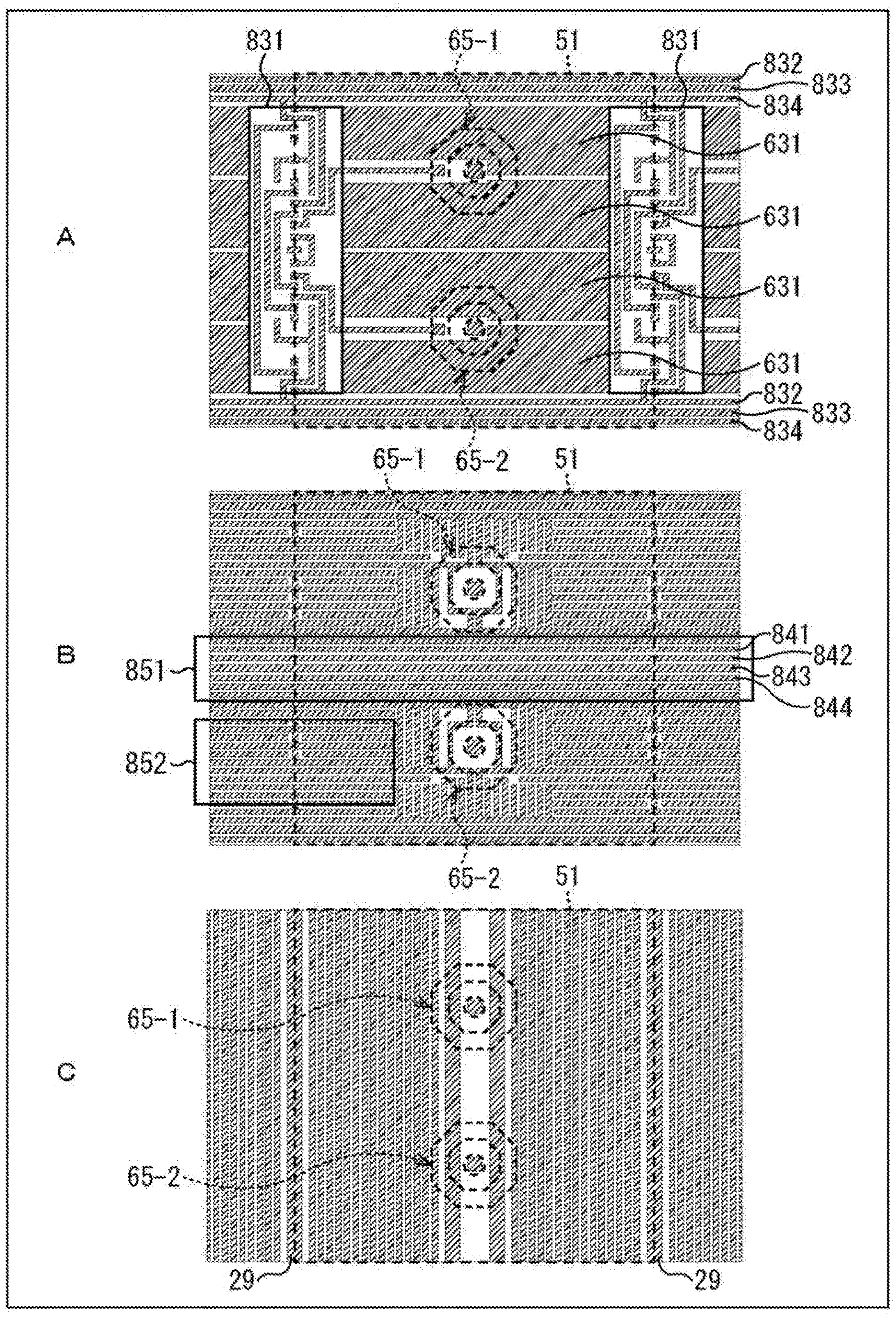
FIG. 42 is a view illustrating five layers of metal films of a multilayer wire layer.
Figure 43:
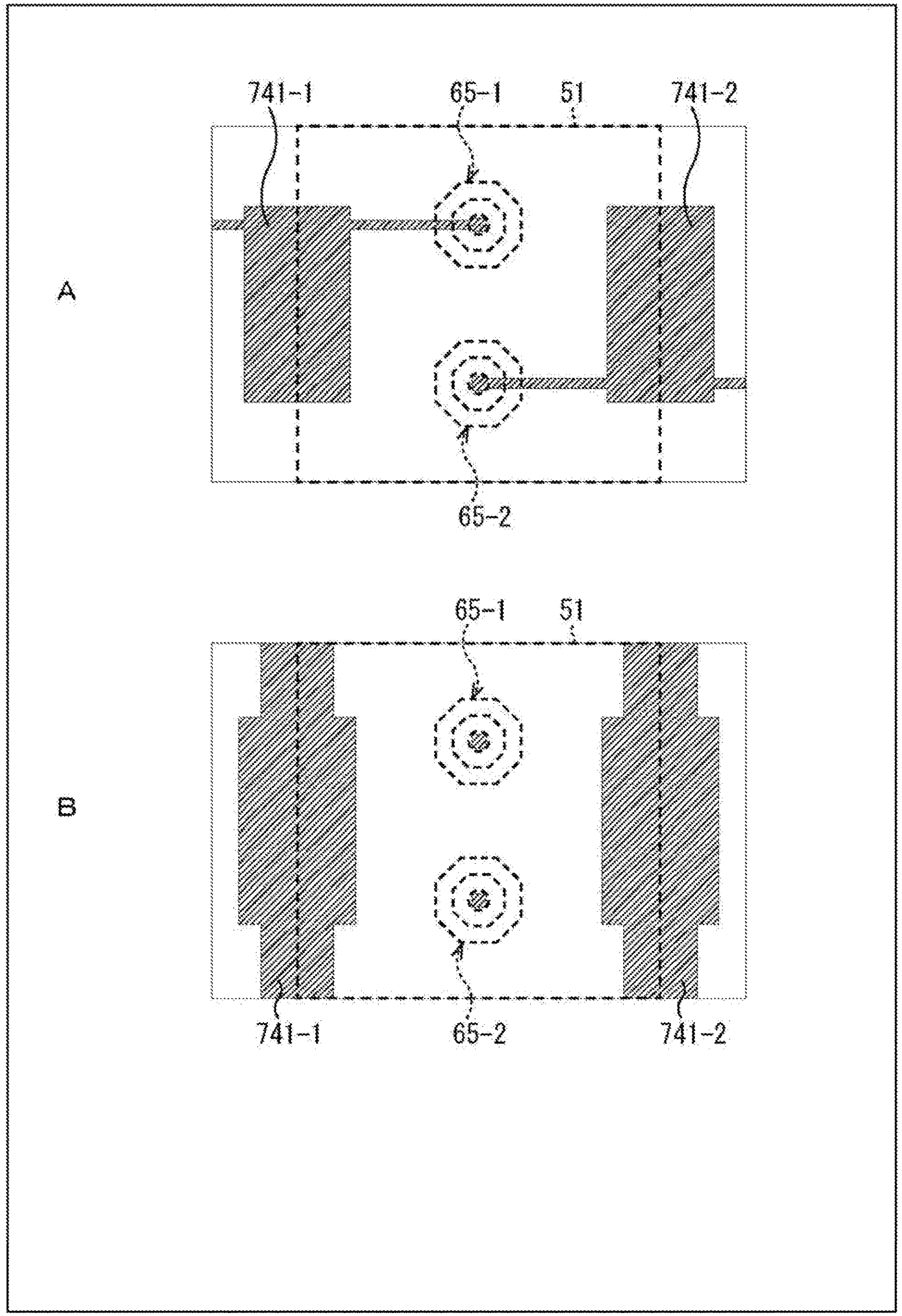
FIG. 43 is a view illustrating five layers of metal films of the multilayer wire layer.

Now, examples of planar arrangement of the five layers of metal layers M1 to M5 of the multilayer wiring layer 811 depicted in FIGS. 36 to 46 are described with reference to FIGS. 42 and 43.

A of FIG. 42 depicts a planar arrangement example of the metal film M1 of the first layer from among the five layers of metal layers M1 to M5 of the multilayer wiring layer 811.

B of FIG. 42 depicts a planar arrangement example of the metal film M2 of the second layer from among the five layers of metal layers M1 to M5 of the multilayer wiring layer 811.

C of FIG. 42 depicts a planar arrangement example of the metal film M3 of the third layer from among the five layers of metal layers M1 to M5 of the multilayer wiring layer 811.

A of FIG. 43 depicts a planar arrangement example of the metal film M4 of the fourth layer from among the five layers of metal layers M1 to M5 of the multilayer wiring layer 811.

B of FIG. 43 depicts a planar arrangement example of the metal layer M5 of the fifth layer from among the five layers of metal layers M1 to M5 of the multilayer wiring layer 811.

Note that, in A to C of FIG. 42 and A and B of FIG. 43, a region of a pixel 51 and regions of signal extraction portions 65-1 and 65-2 having an octagonal shape depicted in FIG. 11 are indicted by broken lines.

In A to C of FIG. 42 and A and B of FIG. 43, the vertical direction of the drawings is a vertical direction of the pixel array section 20 and the horizontal direction of the drawings is a horizontal direction of the pixel array section 20.

In the metal film M1 of the first layer of the multilayer wiring layer 811, a reflection member 631 that reflects infrared light is formed as indicated in A of FIG. 42. In the region of the pixel 51, two reflection members 631 are formed for each of the signal extraction portions 65-1 and 65-2, and the two reflection members 631 of the signal extraction portion 65-1 and the two reflection member 631 of the signal extraction portion 65-1 are formed symmetrically with respect to the vertical direction.

Furthermore, between the reflection member 631 of pixels 51 neighboring with each other in the horizontal direction, a pixel transistor wiring region 831 is arranged. In the pixel transistor wiring region 831, wires for connecting the pixel transistors Tr of the transfer transistor 721, reset transistor 723, amplification transistor 724 or selection transistor 725 are formed. Also, the wires for the pixel transistors Tr are formed symmetrically in the vertical direction with reference to an intermediate line (not depicted) between the two signal extraction portions 65-1 and 65-2.

Furthermore, between the reflection members 631 of pixels 51 neighboring with each other in the vertical direction, such wires as a ground line 832, a power supply line 833, another ground line 834 and so forth are formed. Also, the wires are formed symmetrically in the vertical direction with reference to an intermediate line between the two signal extraction portions 65-1 and 65-2.

Since the metal film M1 of the first layer is arranged symmetrically between the region on the signal extraction portion 65-1 side in the pixel and the region on the signal extraction portion 65-2 side in this manner, the wiring load is adjusted equally between the signal extraction portions 65-1 and 65-2. As a consequence, driving dispersion of the signal extraction portions 65-1 and 65-2 is reduced.

In the metal film M1 of the first layer, since the reflection member 631 of a large area is formed on the lower side of the signal extraction portions 65-1 and 65-2 formed on the substrate 61, infrared light having been incident to the inside of the substrate 61 through the on-chip lens 62 and having transmitted through the substrate 61 without photoelectrically converted in the substrate 61 can be reflected by the reflection member 631 so as to be incident on the inside of the substrate 61 again. As a consequence, the amount of infrared light that is photoelectrically converted in the substrate 61 is increased further, and the quantum efficiency (QE), more specifically, the sensitivity of the pixel 51 to infrared light, can be improved.

On the other hand, in the case where, in the metal film M1 of the first layer, a shading member 631' is arranged in a region same as that of the reflection member 631 in place of the reflection member 631, light having been incident to the inside of the substrate 61 through the on-chip lens 62 and having transmitted through the substrate 61 without photoelectrically converted in the substrate 61 is scattered by the wiring layer and can be suppressed from being incident to a neighboring pixel. As a consequence, light can be prevented from being detected in error by the neighboring pixel.

In the metal film M2 of the second layer of the multilayer wiring layer 811, a control line region 851 in which control lines 841 to 844 for transmitting a predetermined signal in a horizontal direction and so forth are formed is arranged between the signal extraction portions 65-1 and 65-2 as depicted in B of FIG. 42. The control lines 841 to 844 are lines for transmitting, for example, a driving signal TRG, another driving signal RST, a selection signal SEL or a driving signal FDG.

By arranging the control line region 851 between two signal extraction portions 65, the influences of them upon the signal extraction portions 65-1 and 65-2 become equal, and a driving dispersion between the signal extraction portions 65-1 and 65-2 can be reduced.

Furthermore, in a predetermined region different from the control line region 851 of the metal film M2 of the second layer, a capacitance region 852 in which an FD 722B and an additional capacitor 727A are formed is arranged. In the capacitance region 852, the FD 722B or the additional capacitor 727A is configured by forming the metal film M2 into a pattern of a comb tooth shape.

By arranging the FD 722B or the additional capacitor 727A in the metal film M2 of the second layer, the pattern of the FD 722B or the additional capacitor 727A can be arranged freely in response to a desired line capacity in design, and the degree of freedom in design can be improved.

In the metal film M3 of the third layer of the multilayer wiring layer 811, at least a vertical signal line 29 for transmitting a pixel signal outputted from each pixel 51 to the column processing section 23 is formed, as depicted in C of FIG. 42. As the vertical signal line 29, three or more lines can be arranged for one pixel column in order to assure a high reading out speed of a pixel signal. Furthermore, in addition to the vertical signal line 29, a shield wire may be arranged to reduce the coupling capacitance.

In the metal film M4 of the fourth layer and the metal layer M5 of the fifth layer of the multilayer wiring layer 811, voltage supply lines 741-1 and 741-2 for applying a predetermined voltage MIX0 or MIX1 are formed in the P+ semiconductor regions 73-1 and 73-2 of the signal extraction portion 65 of each pixel 51.

The metal film M4 and the metal layer M5 depicted in A and B of FIG. 43 indicate an example in the case where the voltage supply line 741 of the first arrangement example depicted in A of FIG. 33 is adopted.

The voltage supply line 741-1 of the metal film M4 is connected to the voltage application wire 814 (for example, FIG. 36) of the metal film M1 through the metal films M3 and M2, and the voltage application wire 814 is connected to the P+ semiconductor region 73-1 of the signal extraction portion 65-1 of the pixel 51. Similarly, the voltage supply line 741-2 of the metal film M4 is connected to the voltage application wire 814 (for example, FIG. 36) of the metal film M1 through the metal films M3 and M2, and the voltage application wire 814 is connected to the P+ semiconductor region 73-2 of the signal extraction portion 65-2 of the pixel 51.

The voltage supply lines 741-1 and 741-2 of the metal layer M5 are connected to the tap driving section 21 around the pixel array section 20. The voltage supply line 741-1 of the metal film M4 and the voltage supply line 741-1 of the metal layer M5 are connected to each other through a via or the like not depicted at a predetermined position at which both metal films exist in a planar region. The predetermined voltage MIX0 or MIX1 from the tap driving section 21 is transmitted through the voltage supply lines 741-1 and 741-2 of the metal layer M5 and supplied to the voltage supply lines 741-1 and 741-2 of the metal film M4 and then supplied from the voltage supply lines 741-1 and 741-2 to the voltage application wire 814 of the metal film M1 through the metal films M3 and M2.

By forming the light reception device 1 as a CAPD sensor of the back-illuminated type, the line width and the layout of driving lines can be designed freely in that, for example, as depicted in A and B of FIG. 43, the voltage supply lines 741-1 and 741-2 for applying the predetermined voltage MIX0 or MIX1 to the signal extraction portion 65 of each pixel 51 can be wired in the vertical direction as depicted in A and B of FIG. 43. Furthermore, also wiring suitable for high speed driving or wiring taking load reduction into consideration is possible.

<Example of Planar Arrangement of Pixel Transistor>

Figure 44:
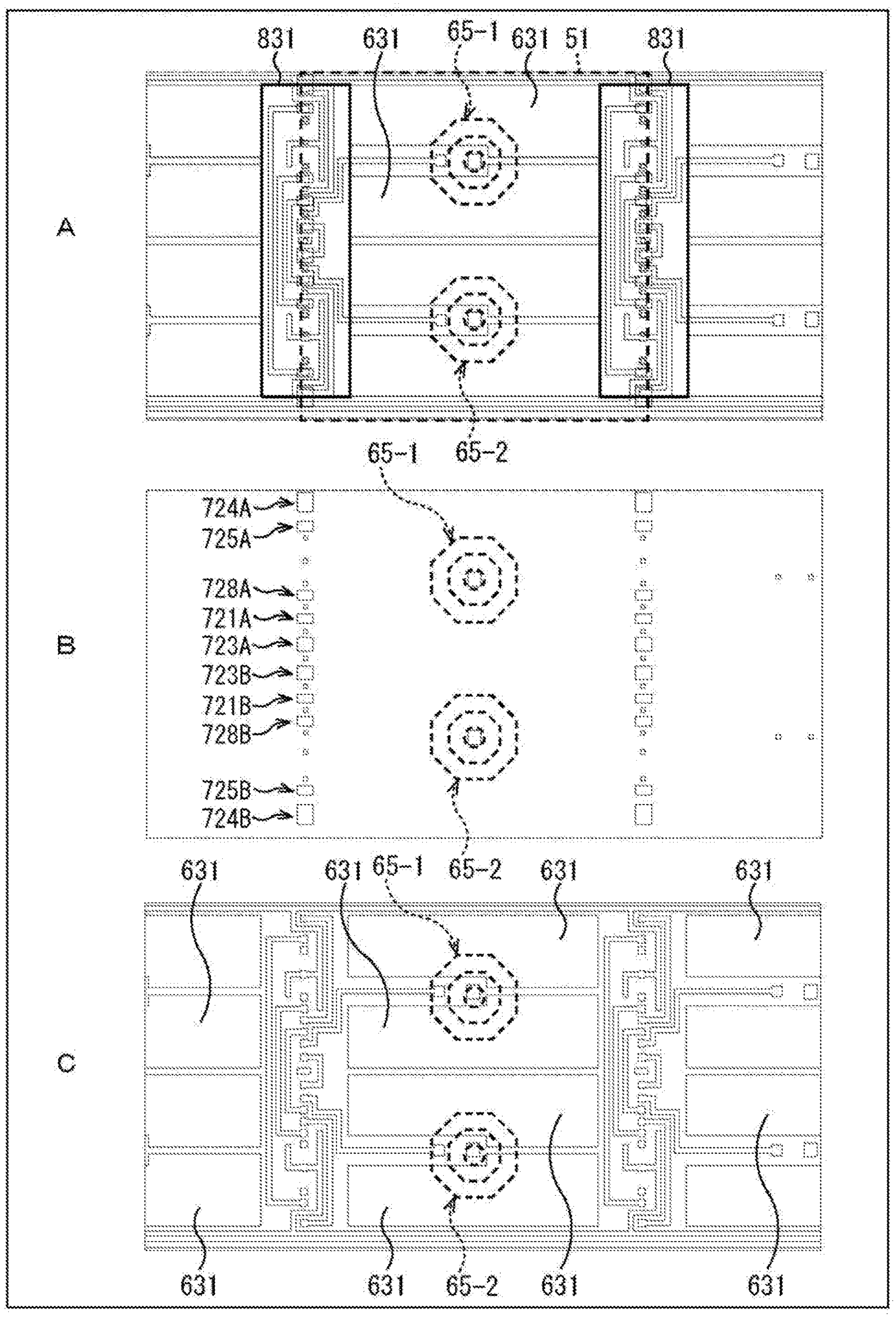
FIG. 44 is a view illustrating a polysilicon layer.

FIG. 44 is a plan view where the metal film M1 of the first layer depicted in A of FIG. 42 and a polysilicon layer for forming gate electrodes and so forth of pixel transistors Tr formed on the metal film M1 are laid one on the other.

A of FIG. 44 is a plan view where a metal film M1 of C of FIG. 44 and a polysilicon layer of B of FIG. 44 are placed one on the other. B of FIG. 44 is a plan view only of the polysilicon layer, and C of FIG. 44 is a plan view only of the metal film M1. Although the plan view of the metal film M1 of C of FIG. 44 is same as the plan view depicted in A of FIG. 42, slanting lines are omitted.

As described hereinabove with reference to A of FIG. 42, a pixel transistor wiring region 831 is formed between reflection members 631 of pixels.

In the pixel transistor wiring region 831, pixel transistors Tr individually corresponding to the signal extraction portions 65-1 and 65-2 are arranged in such a manner as depicted, for example, in B of FIG. 44.

In B of FIG. 44, with reference to an intermediate line (not depicted) between the two signal extraction portions 65-1 and 65-2, the gate electrodes of reset transistors 723A and 723B, transfer transistors 721A and 721B, switching transistors 728A and 728B, selection transistors 725A and 725B and amplification transistors 724A and 724B include the nearer side to the intermediate line.

Also, lines for connecting the pixel transistors Tr of the metal film M1 depicted in C of FIG. 44 are formed symmetrically in the vertical direction with reference to an intermediate line (not depicted) between the signal extraction portions 65-1 and 65-2.

By arranging a plurality of pixel transistors Tr included in the pixel transistor wiring region 831 symmetrically in a region on the signal extraction portion 65-1 side and another region on the signal extraction portion 65-2 side, a driving dispersion of the signal extraction portions 65-1 and 65-2 can be reduced.

<Modification of Reflection Member 631>

Now, a modification of the reflection member 631 formed in the metal film M1 is described with reference to FIGS. 45 and 46.

In the example described above, the reflection member 631 of a large area is arranged in a peripheral region of the signal extraction portion 65 in the pixel 51 as depicted in A of FIG. 42.

Figure 45:
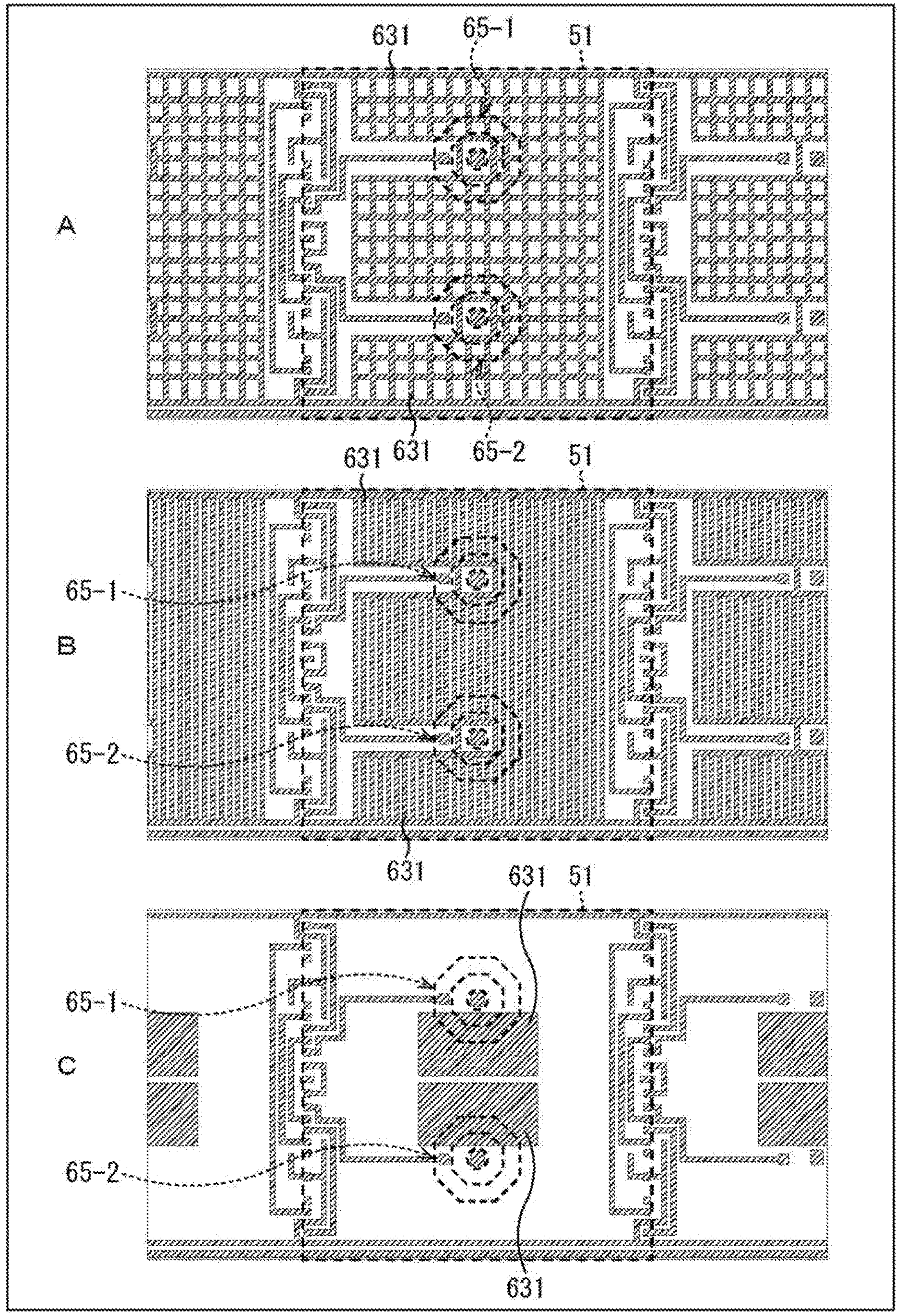
FIG. 45 is a view depicting a modification of a reflection member to be formed on the metal film.

In contrast, it is also possible to arrange the reflection member 631 in a lattice-shaped pattern as indicated, for example, in A of FIG. 45. By forming the reflection member 631 in a lattice-shaped pattern in this manner, the pattern anisotropy can be eliminated and the XY anisotropy of the reflection capability can be reduced. More specifically, by forming the reflection member 631 in a lattice-shaped pattern, reflection of incident light to a one-sided partial region can be reduced, and it is possible to reflect the incident light isotropically. Therefore, distance measurement accuracy is improved.

As an alternative, the reflection member 631 may be arranged in a stripe-shaped pattern as depicted, for example, in B of FIG. 45. By forming the reflection member 631 in a stripe-shaped pattern in this manner, it is also possible to use the pattern of the reflection member 631 as a wiring capacitor, and therefore, a configuration that expands the dynamic range to the maximum can be improved.

Note that, although B of FIG. 45 depicts an example of a stripe shape in the vertical direction, alternatively a strip shape in the horizontal direction may be applied.

As another alternative, the reflection member 631 may be arranged only in a pixel central region, more particularly, only between two signal extraction portions 65, as depicted, for example, in C of FIG. 45. By forming the reflection member 631 in a pixel central region but not at pixel ends in this manner, while an advantageous effect of sensitivity improvement by the reflection member 631 is achieved in the pixel central region, a component to be reflected to a neighboring pixel when oblique light is incident can be suppressed, and a configuration that focuses on suppression of crosstalk can be implemented.

Figure 46:
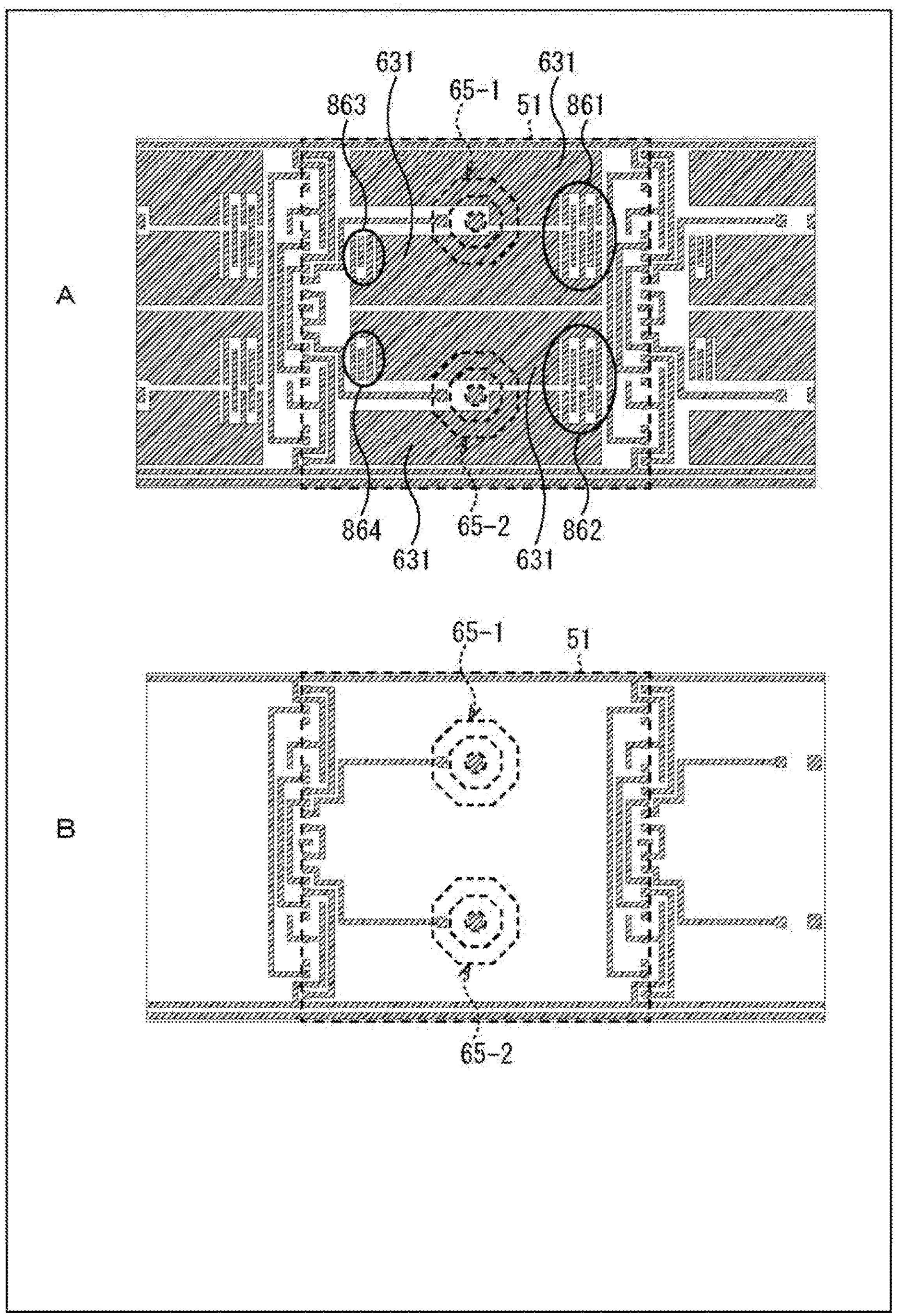
FIG. 46 is a view depicting a modification of a reflection member to be formed on the metal film.

As a further alternative, by arranging part of the reflection member 631 in a comb tooth pattern as depicted, for example, in A of FIG. 46, part of the metal film M1 may be allocated to a wiring capacitance of the FD 722 or the additional capacitor 727. The comb tooth shape in the regions 861 to 864 surrounded by a solid line round mark in A of FIG. 46 configures at least part of the FD 722 or the additional capacitor 727. The FD 722 or the additional capacitor 727 may be arranged such that it is suitably distributed to the metal film M1 and the metal film M2. The pattern of the metal film M1 can be arranged in a good balance to the capacitance of the FD 722 or the additional capacitor 727.

B of FIG. 46 depicts a pattern of the metal film M1 in the case where the reflection member 631 is not arranged. In order to further increase the amount of infrared light to be photoelectrically converted in the substrate 61 to improve the sensitivity of the pixel 51, it is preferable to arrange the reflection member 631. However, it is also possible to adopt a configuration in which the reflection member 631 is not arranged.

The arrangement examples of the reflection member 631 depicted in FIGS. 45 and 46 can be applied similarly also to the shading member 631'.

<Example of Substrate Configuration of Light Reception Device>

Figure 47:
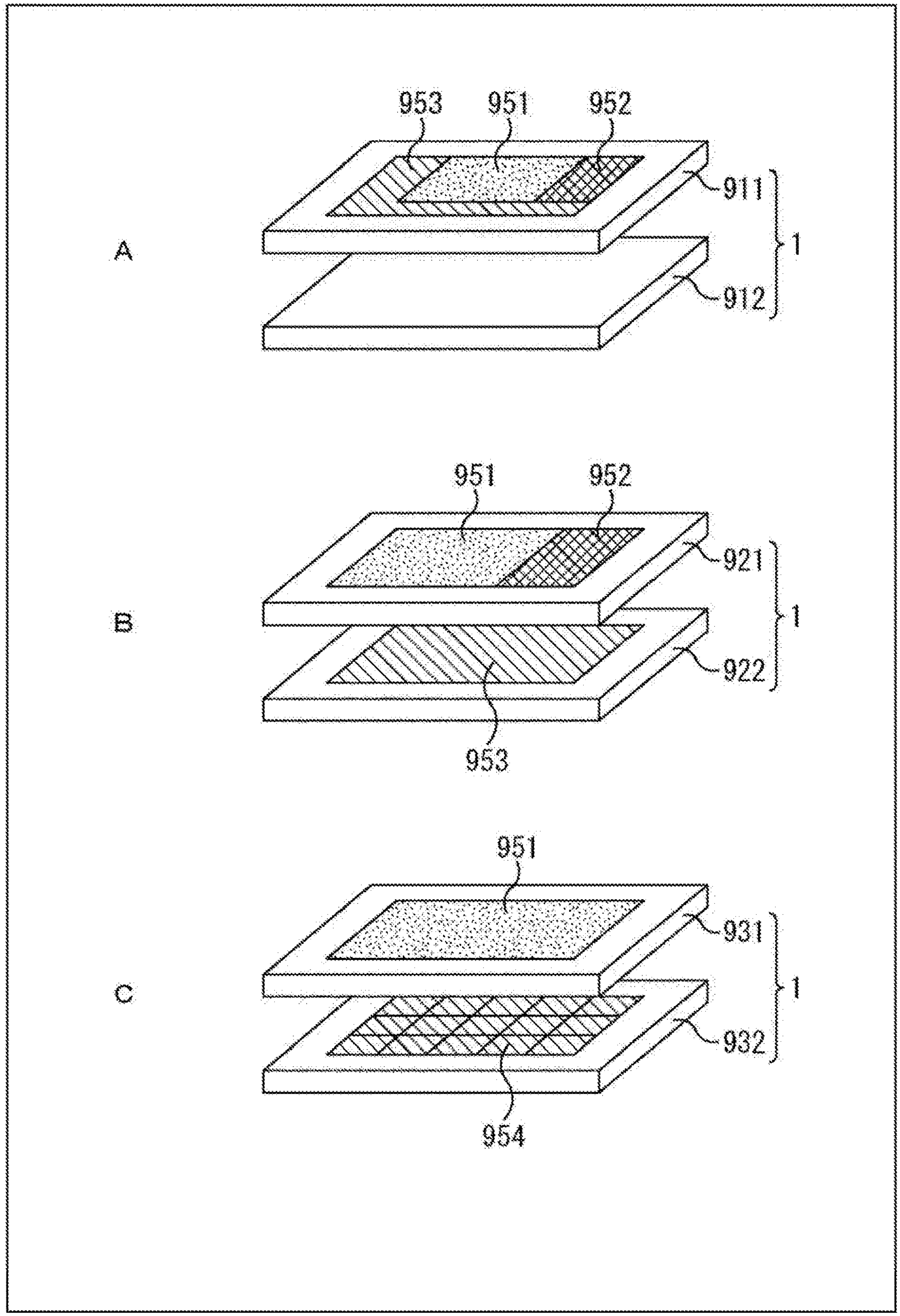
FIG. 47 is a view illustrating a substrate configuration of the light reception device.

The light reception device 1 of FIG. 1 can adopt one of substrate configurations of A to C of FIG. 47.

A of FIG. 47 depicts an example in which the light reception device 1 is configured from a single semiconductor substrate 911 and an underlying support substrate 912.

In this case, on the upper side semiconductor substrate 911, a pixel array region 951 corresponding to the pixel array section 20 described hereinabove, a control circuit 952 for controlling the pixels of the pixel array region 951 and a logic circuit 953 including a signal processing circuit of a pixel signal.

The control circuit 952 includes the tap driving section 21, the vertical driving section 22, the horizontal driving section 24 and so forth described hereinabove. The logic circuit 953 includes a column processing section 23 for performing an AD conversion process of a pixel signal and so forth and a signal processing section 31 that performs a distance measurement process for calculating a distance from a ratio of pixel signals obtained by two or more signal extraction portions 65 in the pixel, a calibration process and so forth.

As an alternative, it is also possible to configure the light reception device 1 such that a first semiconductor substrate 921 on which a pixel array region 951 and a control circuit 952 are formed and a second semiconductor substrate 922 on which a logic circuit 953 is formed are stacked as indicated in B of FIG. 47. Note that the first semiconductor substrate 921 and the second semiconductor substrate 922 are electrically connected to each other, for example, by a penetrating via or Cu—Cu metal bond.

As another alternative, it is also possible to configure the light reception device 1 such that a first semiconductor substrate 931 on which only a pixel array region 951 is formed and a second semiconductor substrate 932 on which an area controlling circuit 954 in which a control circuit for controlling each pixel and a signal processing circuit for processing a pixel signal are provided in a unit of one pixel or in a unit of an area of a plurality of pixels is formed are stacked as depicted in C of FIG. 47. The first semiconductor substrate 931 and the second semiconductor substrate 932 are electrically connected to each other, for example, through penetrating vias or Cu—Cu metal bond.

With the configuration in which a control circuit and a signal processing circuit are provided in a unit of one pixel or in a unit of an area of a plurality of pixels as in the light reception device 1 of C of FIG. 47, an optimum driving timing or gain can be set for each divisional control unit, and optimized distance information can be acquired irrespective of the distance or the reflectivity. Furthermore, since not the overall area of the pixel array region 951 but only part of the region can be driven to calculate distance information, it is also possible to suppress the power consumption in response to an operation mode.

<Example of Noise Countermeasures around Pixel Transistor>

Incidentally, at a boundary portion of pixels 51 lined up in the horizontal direction in the pixel array section 20, the pixel transistors Tr of the reset transistor 723, amplification transistor 724, selection transistor 725 and so forth are arranged as depicted in the sectional view of FIG. 37.

Figure 48:
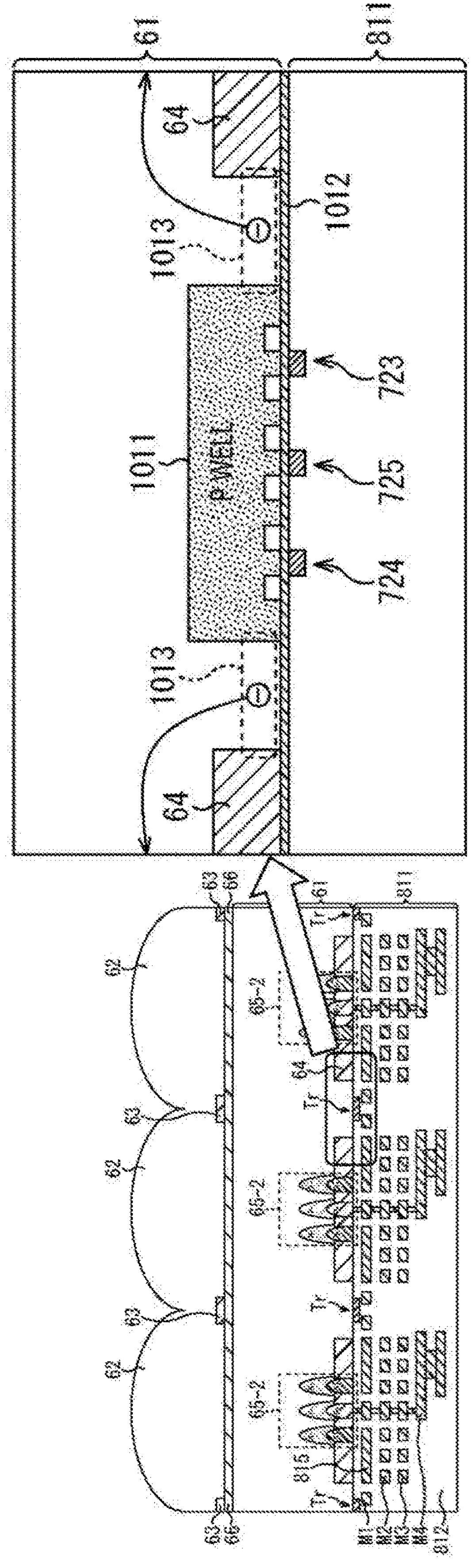
FIG. 48 is a view illustrating noise around a pixel transistor region.

More particularly depicting the pixel transistor arrangement region of the pixel boundary portion depicted in FIG. 37, as depicted in FIG. 48, the pixel transistors Tr such as the reset transistor 723, amplification transistor 724, selection transistor 725 and so forth are formed in a P well region 1011 formed on the front face side of the substrate 61.

The P well region 1011 is formed in a spaced relationship by a predetermined distance in a plane direction from the oxide film 64 such as an STI (Shallow Trench Isolation) formed around the N+ semiconductor region 71 of the signal extraction portion 65. Furthermore, on the rear face side interface of the substrate 61, an oxide film 1012 that serves also as a gate insulating film for the pixel transistors Tr is formed.

Thus, in the rear face side interface of the substrate 61, electrons are likely to be accumulated in a gap region 1013 between the oxide film 64 and the P well region 1011 by a potential generated by positive charge in the oxide film 1012, and in the case where there is no discharging mechanism for electrons, the electrons overflow and diffuse and then are collected into the N-type semiconductor region and make noise.

Figure 49:
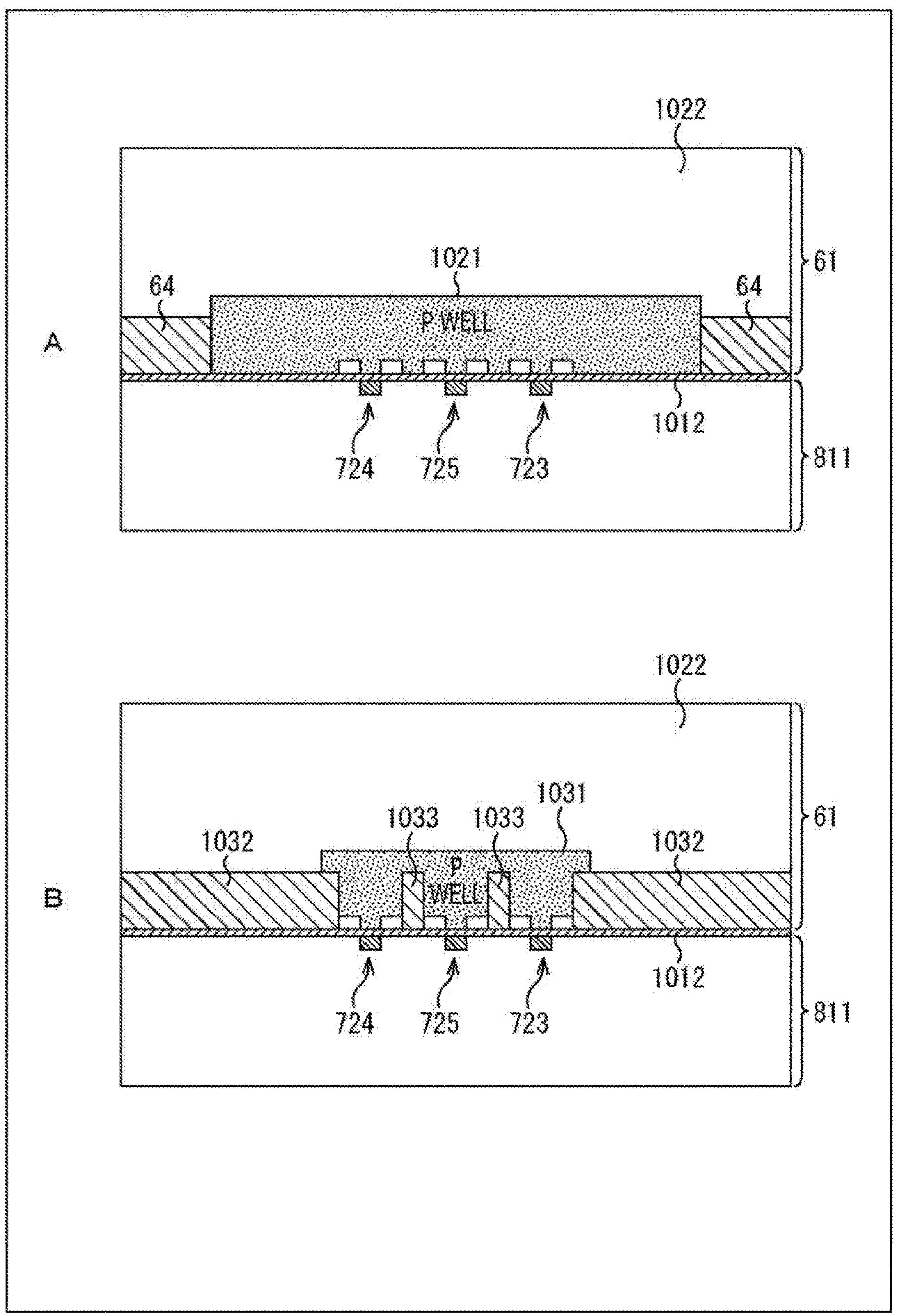
FIG. 49 is a view illustrating a noise suppression structure around the pixel transistor region.

Therefore, as depicted in A of FIG. 49, the P well region 1021 can be formed such that it extends in the plane direction until it comes to contact with a neighboring oxide film 64 such that the gap region 1013 does not exist in the rear face side interface of the substrate 61. Since this makes it possible to prevent electrons from being accumulated into the gap region 1013 depicted in FIG. 48, noise can be suppressed. The impurity concentration of the P well region 1021 is higher than that of a P-type semiconductor region 1022 of the substrate 61, which is a photoelectric conversion region.

As an alternative, an oxide film 1032 formed around the N+ semiconductor region 71 of the signal extraction portion 65 may be formed so as to extend in the plane direction to a P well region 1031 such that the gap region 1013 does not exist in the rear face side interface of the substrate 61 as depicted in B of FIG. 49. In this case, also the pixel transistors Tr in the P well region 1031 such as the reset transistor 723, amplification transistor 724, selection transistor 725 and so forth are separated from each other by an oxide film 1033. The oxide film 1033 is formed, for example, by STI and can be formed by the same step as that for the oxide film 1032.

Since, by the configuration of A or B of FIG. 49, the gap region 1013 can be eliminated by contact between an insulating film (oxide film 64, oxide film 1032) at a boundary portion of a pixel and a P well region (P well region 1021, P well region 1031) on the rear face side interface of the substrate 61, the accumulation of electrons can be prevented and noise can be suppressed. The configuration of A or B of FIG. 49 can be applied also to any embodiment described herein.

Figure 50:
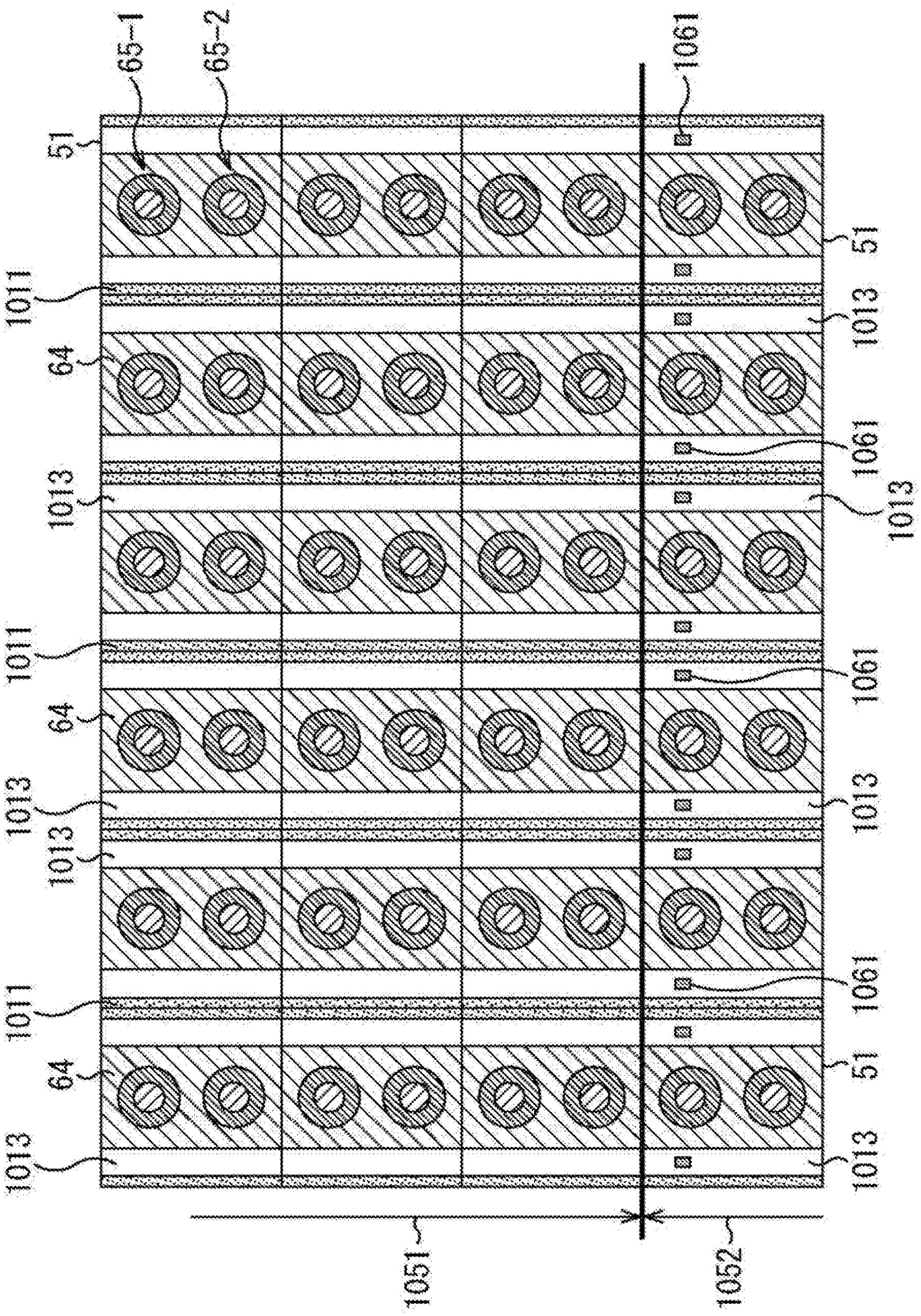
FIG. 50 is a view illustrating a charge discharging structure around the pixel transistor region.
Figure 51:
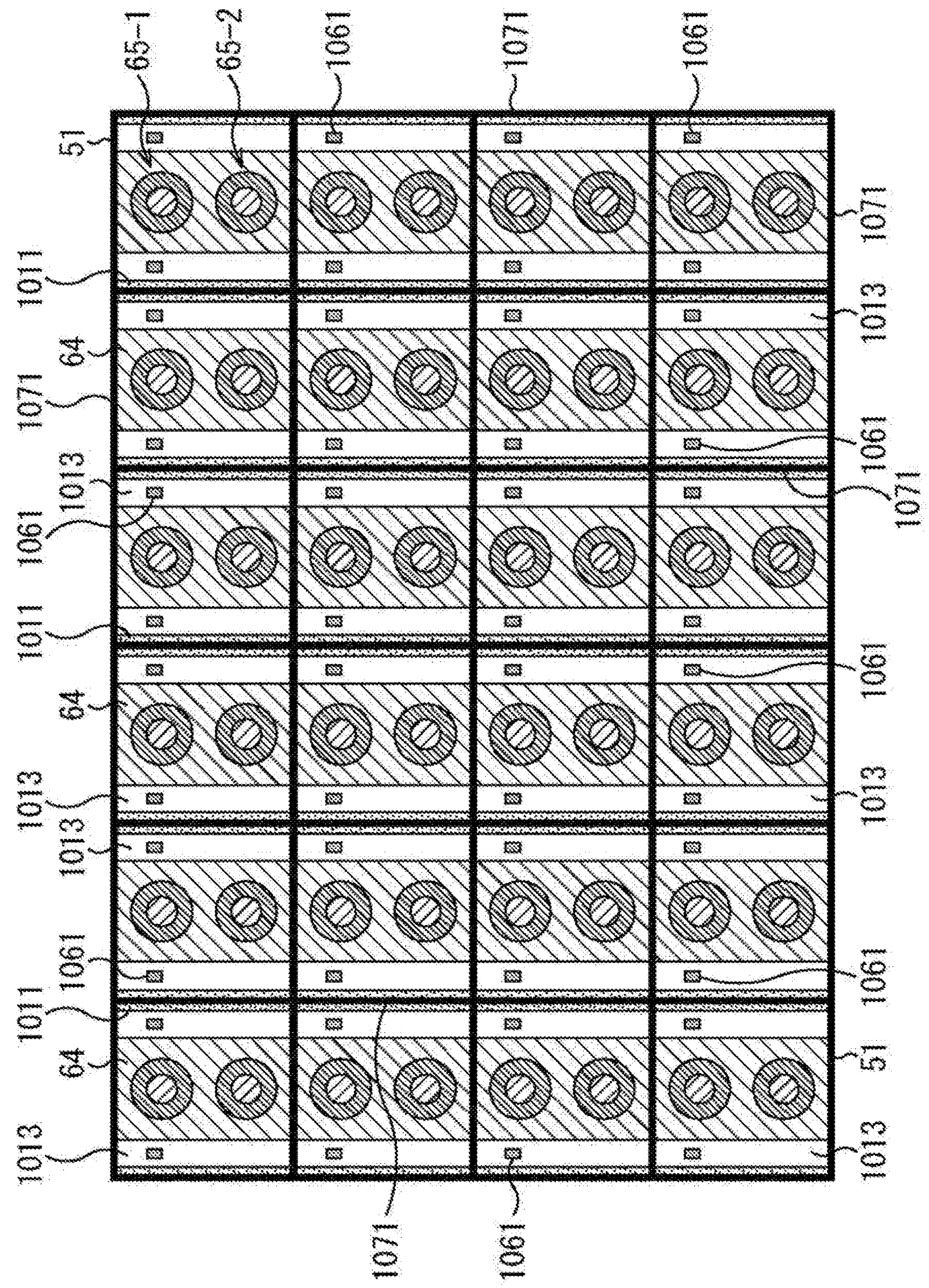
FIG. 51 is a view illustrating the charge discharging structure around the pixel transistor region.

Alternatively, in the case where the configuration that the gap region 1013 is left as it is adopted, accumulation of electrons generated in the gap region 1013 can be suppressed by adopting such a configuration as depicted in FIG. 50 or 51.

FIG. 50 depicts arrangement of the oxide film 64, P well region 1011 and gap region 1013 in a plan view in which two-tap pixels 51 having two signal extraction portions 65-1 and 65-2 for one pixel are arranged two-dimensionally.

In the case where the pixels arranged two-dimensionally are not separated by STI or DTI (Deep Trench Isolation), the P well region 1011 is formed like a column connecting to a plurality of pixels arrayed in a column direction as depicted in FIG. 50.

An N-type diffusion layer 1061 is provided as the drain for discharging charge in the gap region 1013 between the substrate 61 in an ineffective pixel region 1052 arranged on the outer side of an effective pixel region 1051 of the pixel array section 20 such that electrons are discharged to the N-type diffusion layer 1061. The N-type diffusion layer 1061 is formed on the rear face side interface of the substrate 61, and the GND (0 V) or a positive voltage is applied to the N-type diffusion layer 1061. Electrons generated in the gap region 1013 of each pixel 51 move in the vertical direction (column direction) to the N-type diffusion layer 1061 in the ineffective pixel region 1052 and are collected by the N-type diffusion layer 1061 shared by the pixel columns, and therefore, noise can be suppressed.

On the other hand, in the case where pixels are separated from each other by a pixel separation portion 1071 for which STI, DTI or the like is used, the N-type diffusion layer 1061 is provided in the gap region 1013 of each pixel 51, as depicted in FIG. 51. As a consequence, since electrons generated in the gap region 1013 of each pixel 51 are discharged from the N-type diffusion layer 1061, noise can be suppressed. The configurations of FIGS. 50 and 51 can be applied to any of the embodiments described herein.

<Noise around Effective Pixel Region>

Now, discharge of charge around an effective pixel region is further described.

A peripheral portion neighboring with the effective pixel region includes, for example, a shaded pixel region in which shaded pixels are arranged.

Figure 52:
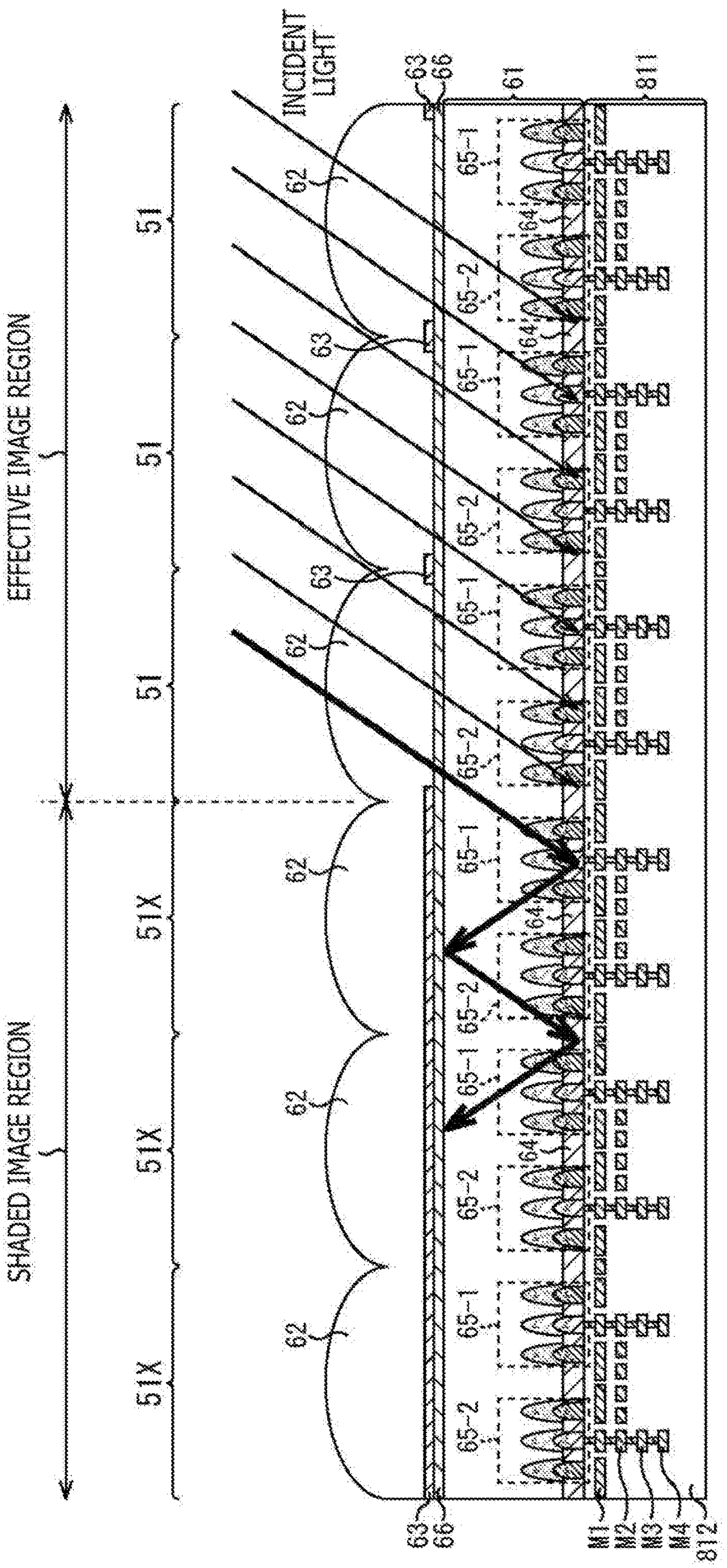
FIG. 52 is a view illustrating charge discharging around an effective pixel region.

As depicted in FIG. 52, in a shaded pixel 51X in the shaded pixel region, a signal extraction portion 65 and so forth are formed similarly as in the pixel 51 in the effective pixel region. Furthermore, on the shaded pixel 51X in the shaded pixel region, an inter-pixel shading films 63 is formed over an overall pixel region to form a structure by which light is not incident to the shaded pixel 51X. Furthermore, in the shaded pixel 51X, a driving signal is not applied in many cases.

On the other hand, in the shaded pixel region neighboring with the effective pixel region, oblique incident light from a lens, diffraction light from the inter-pixel shading films 63 and reflection light from the multilayer wiring layer 811 are incident to generate photoelectrons. Since the generated photoelectrons do not have a discharge destination, they are accumulated in the shaded pixel region and are diffused to the effective pixel region by a concentration gradient, whereupon they are mixed with signal charge to make noise. The noise around the effective pixel region gives rise to so-called picture frame unevenness.

Figure 53:
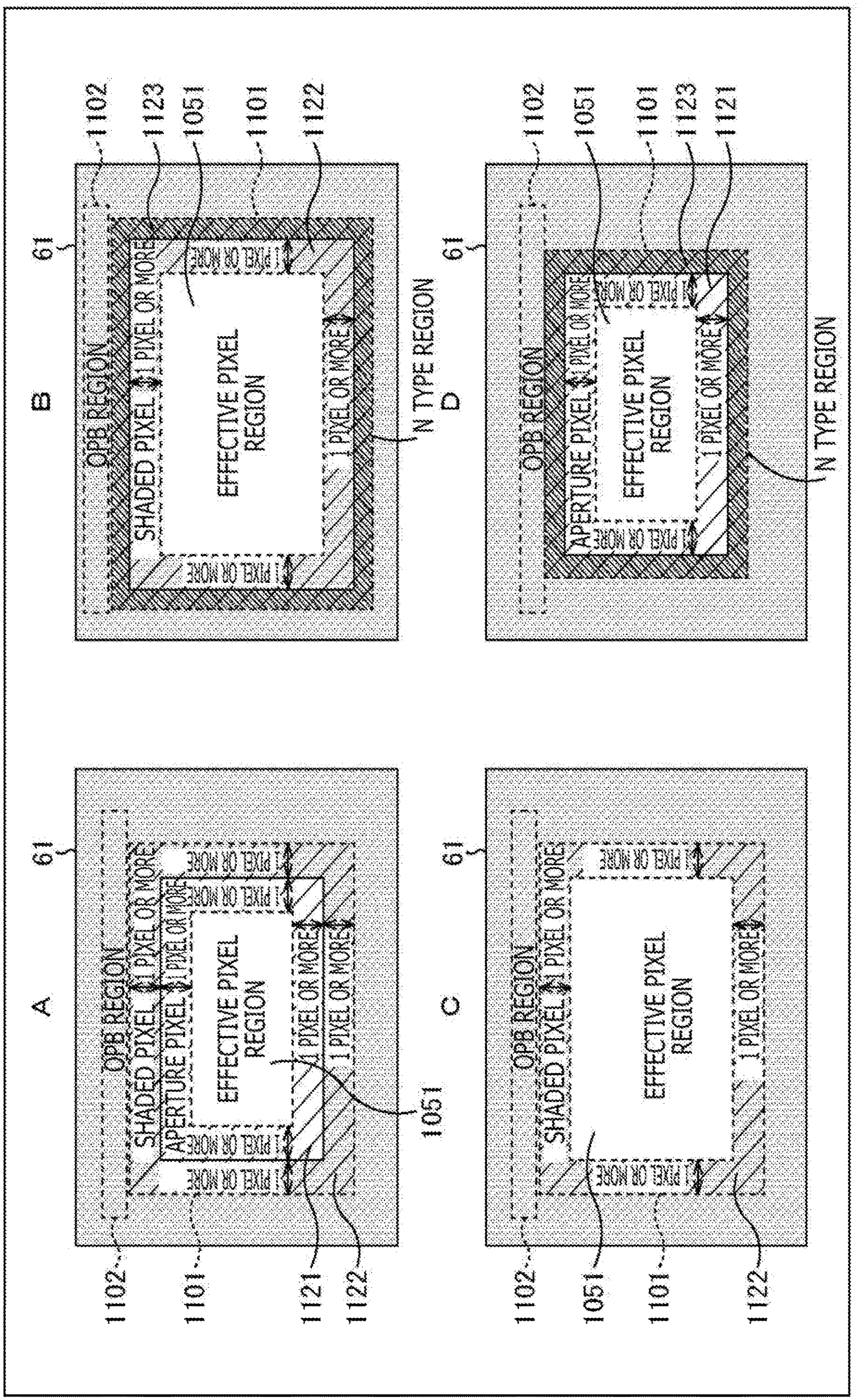
FIG. 53 is a top plan view depicting an example of a configuration of the charge discharging region provided on an outer periphery of the effective pixel region.

Therefore, as countermeasures against noise generated around the effective pixel region, the light reception device 1 allows a charge discharging region 1101 of one of A to D of FIG. 53 to be provided on the outer periphery of the effective pixel region 1051.

A to D of FIG. 53 are plan views depicting examples of a configuration of the charge discharging region 1101 provided on the outer periphery of the effective pixel region 1051.

In any of A to D of FIG. 53, the charge discharging region 1101 is provided on the outer periphery of an effective pixel region 1051 arranged at a middle portion of a substrate 61, and Furthermore, an OPB region 1102 is provided on the outer side of the charge discharging region 1101. The charge discharging region 1101 is a region indicated by slanting lines between an inner side rectangle of a broken line and an outer side rectangle of a broken line. The OPB region 1102 is a region in which an inter-pixel shading film 63 is formed over an overall area and OPB pixels that are driven similarly to the pixels 51 in the effective pixel region to detect a black level signal are arranged. In A to D of FIG. 53, a region indicated by gray indicates a rectangle in which the inter-pixel shading film 63 is formed to block light.

The charge discharging region 1101 in A of FIG. 53 is configured from an aperture pixel region 1121 in which aperture pixels are arranged and a shaded pixel region 1122 in which shaded pixels 51X are arranged. The aperture pixels in the aperture pixel region 1121 are pixels that have a pixel structure same as that of the pixels 51 in the effective pixel region 1051 and perform predetermined driving. The shaded pixels 51X in the shaded pixel region 1122 are pixels that have a pixel structure same as that of the pixels 51 in the effective pixel region 1051 except that the inter-pixel shading film 63 is formed over an overall area of the pixel region, and perform predetermined driving.

The aperture pixel region 1121 has a pixel column or a pixel row of one or more pixels in each column or each row on the four sides of the outer periphery of the effective pixel region 1051. Also, the shaded pixel region 1122 has a pixel column or a pixel row of one or more pixels in each column or each row on the four sides of the outer periphery of the aperture pixel region 1121.

The charge discharging region 1101 in B of FIG. 53 is configured from a shaded pixel region 1122 in which shaded pixels 51X are arranged and an N-type region 1123 in which an N-type diffusion layer is arranged.

Figure 54:
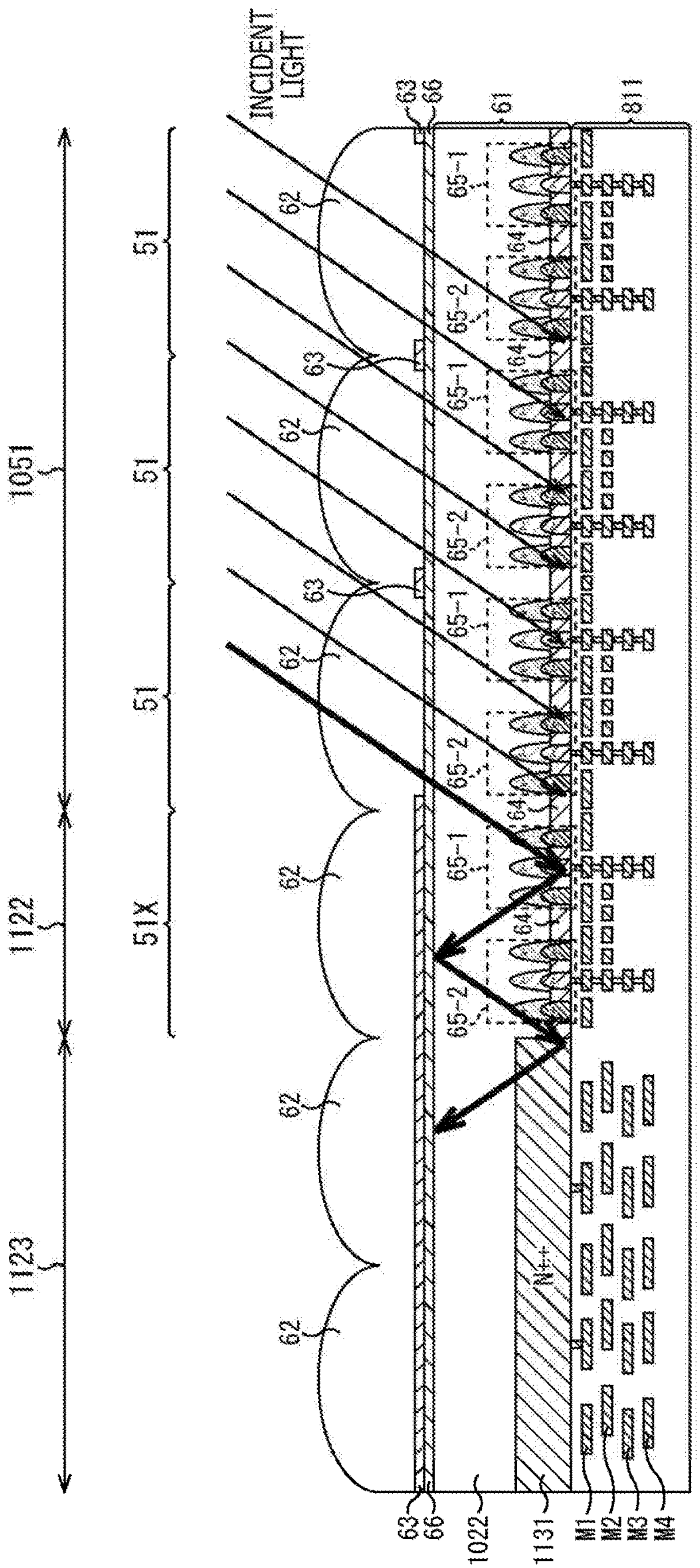
FIG. 54 is a sectional view where the charge exhausting region is configured from a shaded pixel region and an N type region.

FIG. 54 is a sectional view in the case where the charge discharging region 1101 is configured from the shaded pixel region 1122 and the N-type region 1123.

The N-type region 1123 is a region that is shaded with an inter-pixel shading film 63 over an overall area of the region thereof and in which an N-type diffusion layer 1131 that is a high concentration N-type semiconductor layer is formed in the P-type semiconductor region 1022 of the substrate 61 in place of the signal extraction portion 65. To the N-type diffusion layer 1131, 0 V or a positive voltage is supplied normally or intermittently from the metal film M1 of the multilayer wiring layer 811. The N-type diffusion layer 1131 may be formed, for example, over an overall area of the P-type semiconductor region 1022 of the N-type region 1123 and formed in a continuous substantially annular shape as viewed in plan or may be formed partially in the P-type semiconductor region 1022 of the N-type region 1123 such that a plurality of N-type diffusion layers 1131 are scattered in a substantially annular shape as viewed in plan.

Referring back to B of FIG. 53, the shaded pixel region 1122 has a pixel column or a pixel row of one pixel or more in each column or each row on the four sides of the outer periphery of the effective pixel region 1051. Also, the N-type region 1123 has a predetermined column width or row width in each column or each row of the four sides of the outer periphery of the shaded pixel region 1122.

The charge discharging region 1101 in C of FIG. 53 is configured from a shaded pixel region 1122 in which shaded pixels are arranged. The shaded pixel region 1122 has a pixel column or a pixel row of one or more pixels in each column or each row of the four sides of the outer periphery of the effective pixel region 1051.

The charge discharging region 1101 in C of FIG. 53 is configured from an aperture pixel region 1121 in which aperture pixels are arranged and an N-type region 1123 in which an N-type diffusion layer is arranged.

It is sufficient if the predetermined driving performed by the aperture pixels in the aperture pixel region 1121 and the shaded pixels 51X in the shaded pixel region 1122 includes operation for normally or intermittently applying a positive voltage to the N type semiconductor region of pixels, and preferably is operation of applying a driving signal to pixel transistors and the P type semiconductor region or the N type semiconductor region similarly to driving of the pixel 51 at a timing according to that for the pixels 51 in the effective pixel region 1051.

The examples of a configuration of the charge discharging region 1101 depicted in A to D of FIG. 53 are mere examples and are not restrictive. It is sufficient if the charge discharging region 1101 is configured such that it includes one of aperture pixels that perform predetermined driving, shaded pixels that perform predetermined driving and an N type region having an N type diffusion layer to which 0 V or a positive voltage is applied normally or intermittently. Therefore, for example, aperture pixels, shaded pixels and an N type region may exist in a mixed manner in one pixel column or pixel row, or pixels of different types of aperture pixels, shaded pixels and N type region may be arranged in a pixel row or a pixel column on the four sides of the periphery of the effective pixel region.

Since electron accumulation in regions other than the effective pixel region 1051 can be suppressed by providing the charge discharging region 1101 on the outer periphery of the effective pixel region 1051 in this manner, generation of noise caused by addition to signal charge of photo charge diffused to the effective pixel region 1051 from the outer side of the effective pixel region 1051 can be suppressed.

Furthermore, by providing the charge discharging region 1101 in front of the OPB region 1102, photoelectrons generated in the shading region on the outer side of the effective pixel region 1051 can be prevented from being diffused to the OPB region 1102, and therefore, noise can be prevented from being added to a black level signal. The configurations depicted in A to D of FIG. 53 can be applied also to any of the embodiments described hereinabove.

Eighteenth Embodiment

Now, a flow of current in the case where a pixel transistor is arranged on a substrate 61 having a photoelectric conversion region is described with reference to FIG. 55.

In the pixel 51, for example, the positive voltage of 1.5 V and the voltage of 0 V are applied to the P+ semiconductor regions 73 of the two signal extraction portions 65 such that an electric field is generate between the two P+ semiconductor regions 73, and current flows from the P+ semiconductor region 73 to which 1.5 V is applied to the P+ semiconductor region 73 to which 0 V is applied. However, since also the P well region 1011 formed at the pixel boundary portion is connected to the GND (0 V), not only current flows between the two signal extraction portions 65, but also current flows to the P well region 1011 from the P+ semiconductor region 73 to which 1.5 V is applied as depicted in A of FIG. 55.

Figure 55:
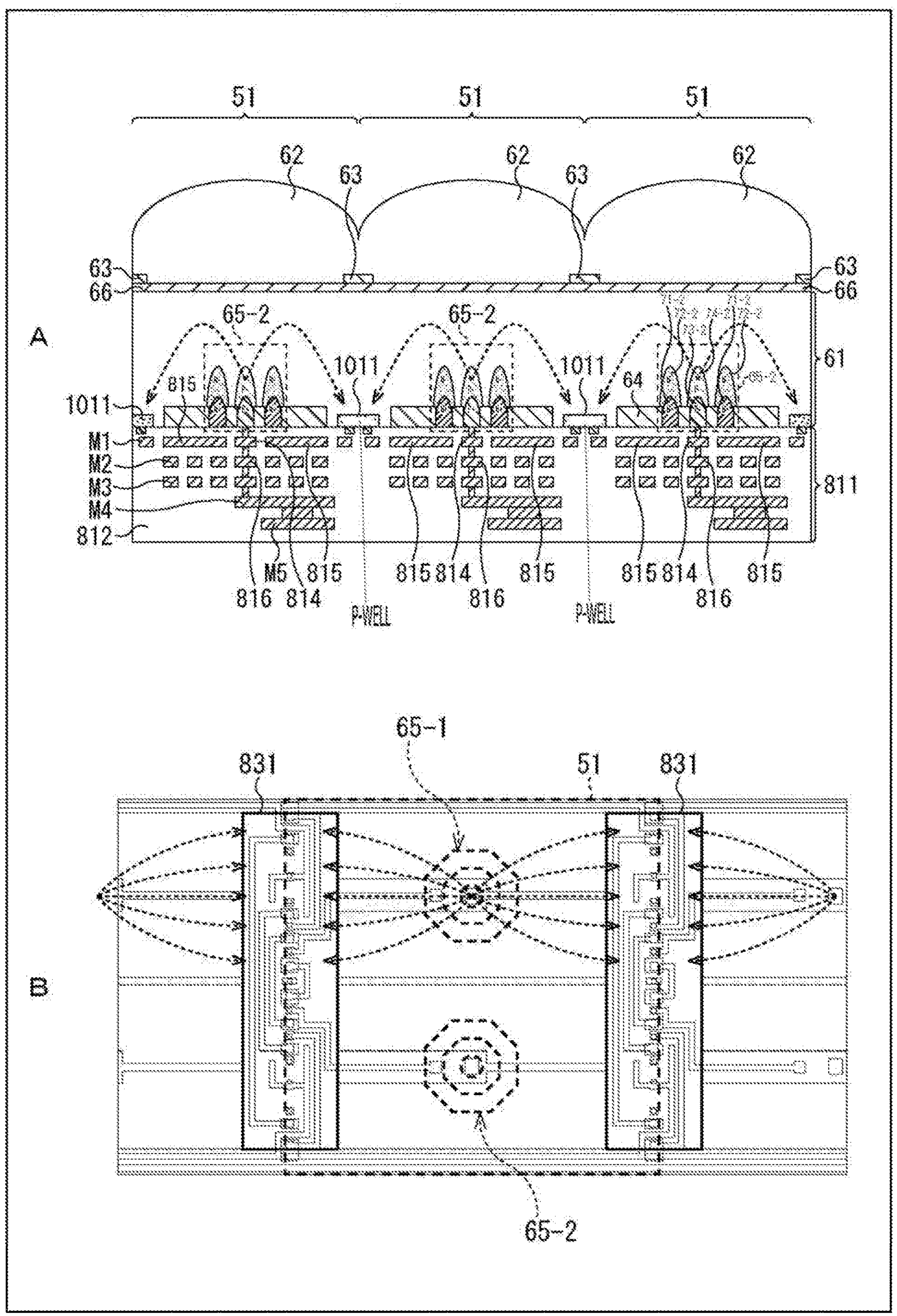
FIG. 55 is a view illustrating a flow of current where a pixel transistor is arranged on a substrate having a photoelectric conversion region.

B of FIG. 55 is a plan view depicting arrangement of the pixel transistor wiring region 831 depicted in A of FIG. 42.

While the area of the signal extraction portion 65 can be reduced by layout change, since the area of the pixel transistor wiring region 831 depends upon the occupation area of one pixel transistor and the number of pixel transistors and the wire area, it is difficult to reduce the area of the pixel transistor wiring region 831 only by ideas on the layout design. Therefore, if it is intended to reduce the area of the pixels 51, then the area of the pixel transistor wiring region 831 makes a major limiting factor. In order to achieve a high resolution while the optical size of the sensor is maintained, it is necessary to reduce the pixel size. However, the area of the pixel transistor wiring region 831 is a constraint. Furthermore, if the area of the pixel 51 is reduced while the area of the pixel transistor wiring region 831 is maintained, then the route of current flowing to the pixel transistor wiring region 831 indicated by a broken line arrow mark in B of FIG. 55 is reduced, resulting in decrease of the resistance and increase of the current. Therefore, area reduction of the pixel 51 leads to increase of power consumption.

<Example of Configuration of Pixel>

Figure 56:
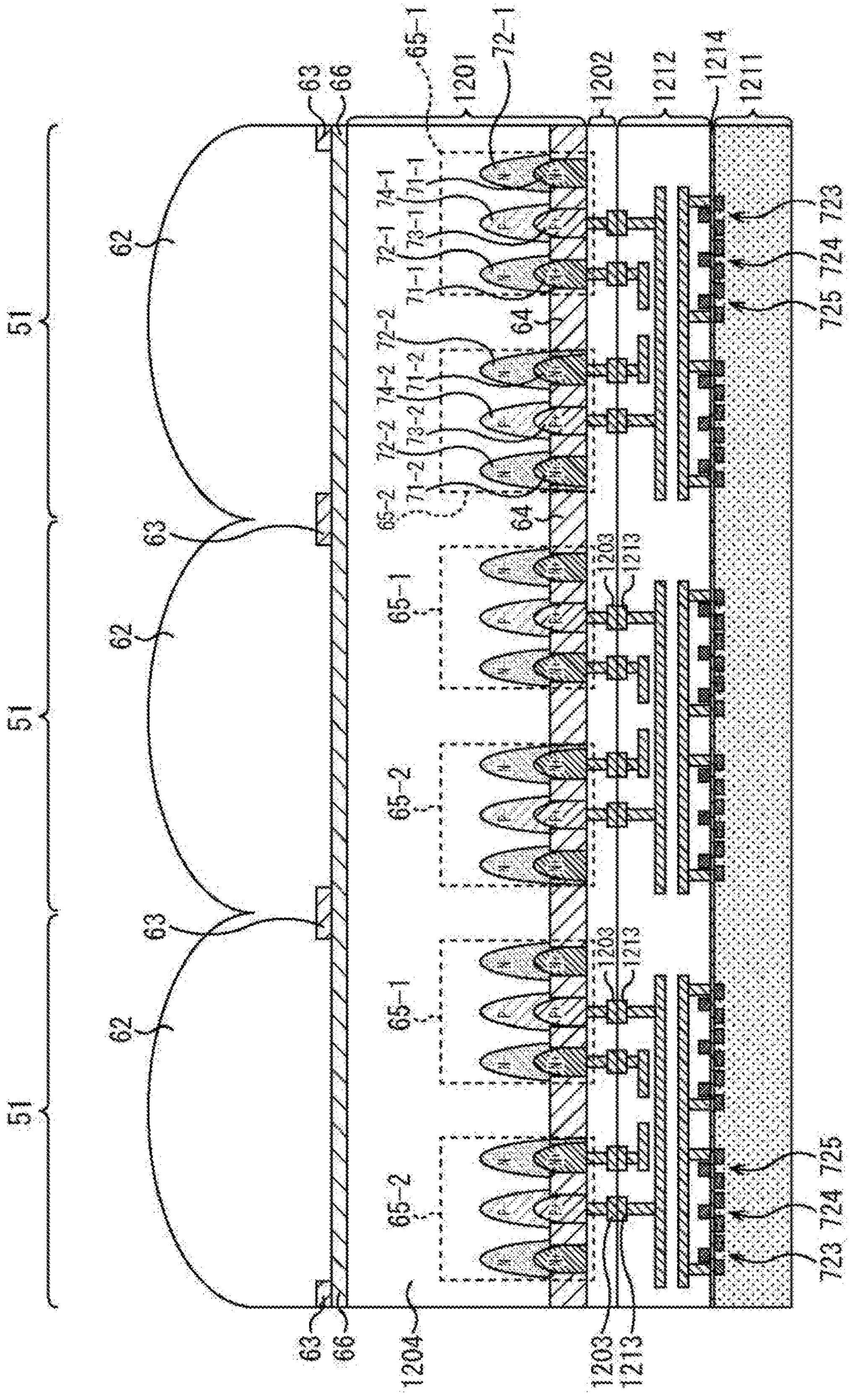
FIG. 56 is a sectional view of a plurality of pixels according to an eighteenth embodiment.

Thus, for the light reception device 1, such a configuration as depicted in FIG. 56 can be adopted in which the light reception device 1 has a stacked structure in which two substrates are stacked and all pixel transistors are arranged on one of the substrates different from the substrate that has a photoelectric conversion region.

FIG. 56 is a sectional view of a pixel according to an eighteenth embodiment.

FIG. 56 depicts a sectional view of a plurality of pixels corresponding to line B-B' of FIG. 11 similarly to FIG. 36 and so forth described hereinabove.

Note that, in FIG. 56, portions corresponding to those in the sectional view of a plurality of pixels of the fourteenth embodiment depicted in FIG. 36 are denoted by like reference signs to those in FIG. 36, and description of them is suitably omitted.

In the eighteenth embodiment of FIG. 56, the light reception device 1 is configured by stacking two substrates including a substrate 1201 and another substrate 1211. The substrate 1201 corresponds to the substrate 61 in the fourteenth embodiment depicted in FIG. 36 and is configured from a silicon substrate or the like having, for example, a P-type semiconductor region 1204 as a photoelectric conversion region. Also, the substrate 1211 is configured from a silicon substrate or the like.

Note that the substrate 1201 having the photoelectric conversion region may be configured not from a silicon substrate or the like but from a glass substrate or a plastic substrate to which a compound semiconductor such as, for example, GaAs, InP or GaSb, a narrow band gap semiconductor such as Ge or an organic photoelectric conversion film is applied. In the case where the substrate 1201 is configured from a compound semiconductor, improvement of the quantum efficiency and improvement of the sensitivity by the band structure of the direct transition type and lowering of the profile of the sensor by thin film formation of the substrate can be anticipated. Furthermore, since the mobility of electrons becomes high, the electron collection efficiency can be improved, and since the mobility of holes is low, the power consumption can be reduced. In the case where the substrate 1201 is configured from a narrow band gap semiconductor, improvement of the quantum efficiency and improvement of the sensitivity of the near infrared region by the narrow band gap can be anticipated.

The substrate 1201 and the substrate 1211 are pasted together such that a wiring layer 1202 of the substrate 1201 and a wiring layer 1212 of the substrate 1211 are opposed to each other. Then, a metal wire 1203 of the wiring layer 1202 on the substrate 1201 side and a metal wire 1213 of the wiring layer 1212 on the substrate 1211 side are electrically connected to each other, for example, by Cu—Cu bonding. Note that the electric connection between the wiring layers is not limited to Cu—Cu bonding but may be same metal bonding such as Au—Au bonding or Al—Al bonding or dissimilar metal bonding such as Cu—Au bonding, Cu—Al bonding or Au—Al bonding. Furthermore, one of the wiring layer 1202 of the substrate 1201 or the wiring layer 1212 of the substrate 1211 can further include the reflection member 631 of the fourteenth embodiment or the shading member 631' of the fifteenth embodiment.

The substrate 1201 having the photoelectric conversion region is different from the substrate 61 of the first to seventeenth embodiments in that all pixel transistors Tr such as the reset transistor 723, the amplification transistor 724 and the selection transistor 725 are not formed on the substrate 1201.

In the eighteenth embodiment of FIG. 56, the pixel transistors Tr such as the reset transistor 723, the amplification transistor 724 and the selection transistor 725 are formed on the lower substrate 1211 in FIG. 56. Although, in FIG. 56, the reset transistor 723, the amplification transistor 724 and the selection transistor 725 are depicted, also the transfer transistor 721 is formed in a region not depicted of the substrate 1211.

Between the substrate 1211 and the wiring layer 1212, an insulating film (oxide film) 1214 that serves also as a gate insulating film of the pixel transistors is formed.

Therefore, though not depicted, in the case where the pixel according to the eighteenth embodiment is viewed on a sectional view taken along line A-A' of FIG. 11, the pixel transistors Tr formed at the pixel boundary portion are not formed on the substrate 1201 in FIG. 37.

Figure 57:
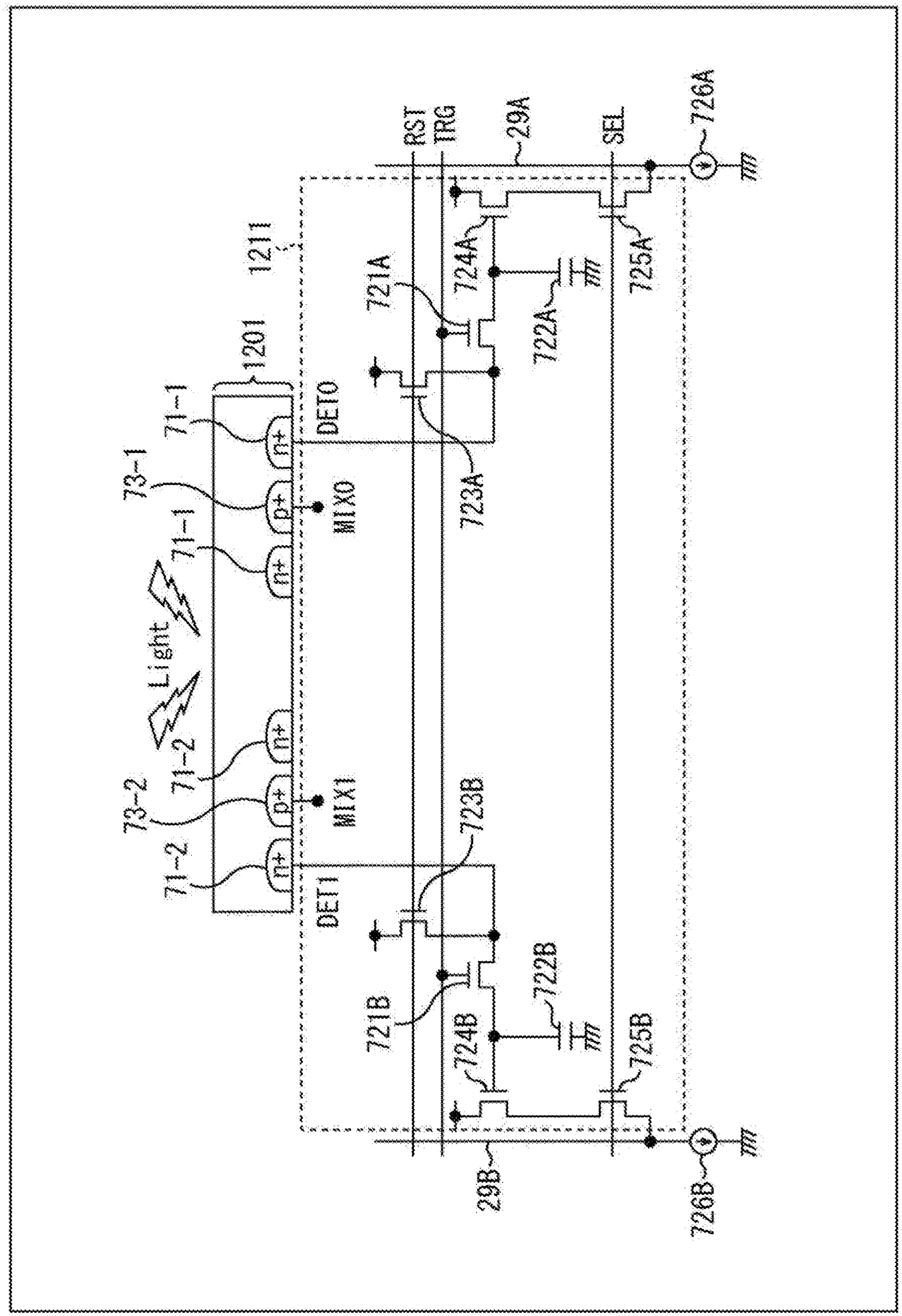
FIG. 57 is a view illustrating circuit sharing of two substrates.

If elements arranged on the substrate 1201 and the substrate 1211 are depicted using the equivalent circuit of the pixel 51 depicted in FIG. 31, then as depicted in FIG. 57, the P+ semiconductor region 73 as a voltage application portion and the N+ semiconductor region 71 as a charge detection portion are formed on the substrate 1201, and the transfer transistor 721, the FD 722, the reset transistor 723, the amplification transistor 724 and the selection transistor 725 are formed on the substrate 1211.

Figure 58:
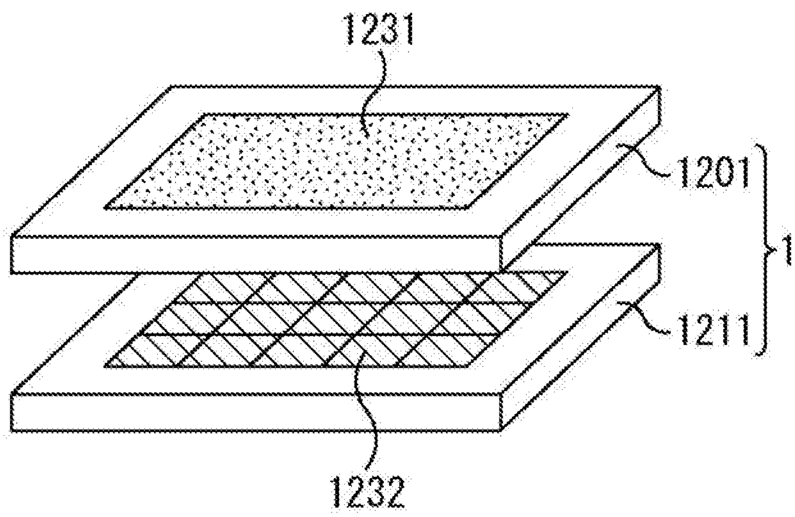
FIG. 58 is a view illustrating a substrate configuration according to the eighteenth embodiment.

If the light reception device 1 according to the eighteenth embodiment is depicted in line with FIG. 47, then the light reception device 1 is formed by stacking the substrate 1201 and the substrate 1211 as depicted in FIG. 58.

In a pixel array region 1231 of the substrate 1201, a portion of the pixel array region 951 depicted in C of FIG. 47 from which the transfer transistor 721, the FD 722, the reset transistor 723, the amplification transistor 724 and the selection transistor 725 are omitted is formed.

In an area controlling circuit 1232 of the substrate 1211, the transfer transistor 721, the FD 722, the reset transistor 723, the amplification transistor 724 and the selection transistor 725 of each pixel of the pixel array section 20 are formed in addition to the area controlling circuit 954 depicted in C of FIG. 47. Also, the tap driving section 21, a vertical driving section 22, the column processing section 23, the horizontal driving section 24, the system controlling section 25, the signal processing section 31 and the data storage section 32 depicted in FIG. 1 are formed on the substrate 1211.

Figure 59:
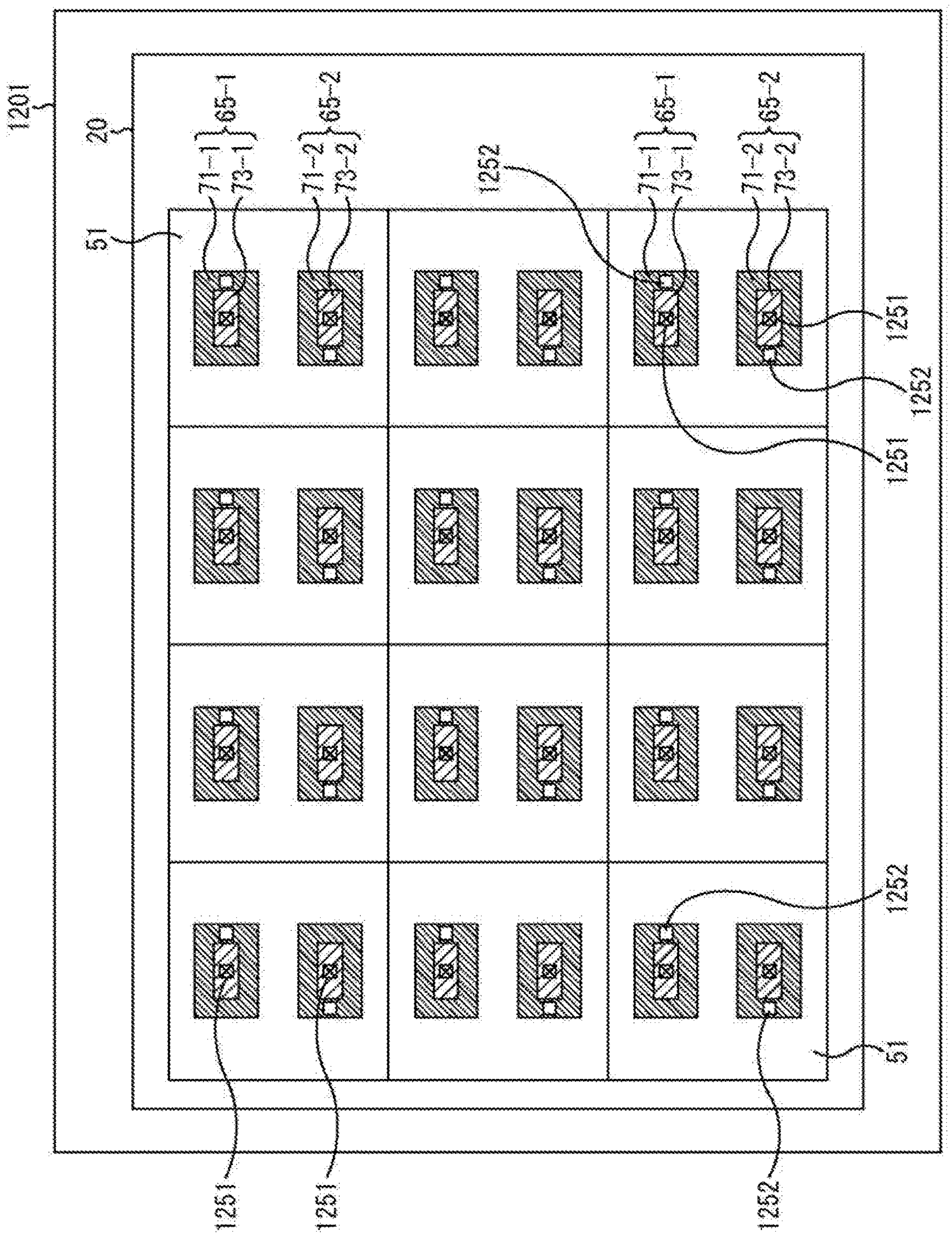
FIG. 59 is a plan view depicting arrangement of a MIX joining portion and a DET joining portion.

FIG. 59 is a plan view depicting a MIX joining portion that is an electrical joining portion between the substrate 1201 and the substrate 1211 between which a voltage MIX is transferred and a DET joining portion that is an electrical joining portion between the substrate 1201 and the substrate 1211 between which charge DET is transferred. Note that, in FIG. 59, in order to prevent the illustration from becoming complicated, part of reference signs of a MIX joining portion 1251 and a DET joining portion 1252 are omitted.

As depicted in FIG. 59, the MIX joining portion 1251 for supplying the a voltage MIX and the DET joining portion 1252 for acquiring charge DET are provided, for example, for each pixel 51. In this case, the voltage MIX and the charge DET are transferred in a unit of a pixel between the substrate 1201 and the substrate 1211.

Figure 60:
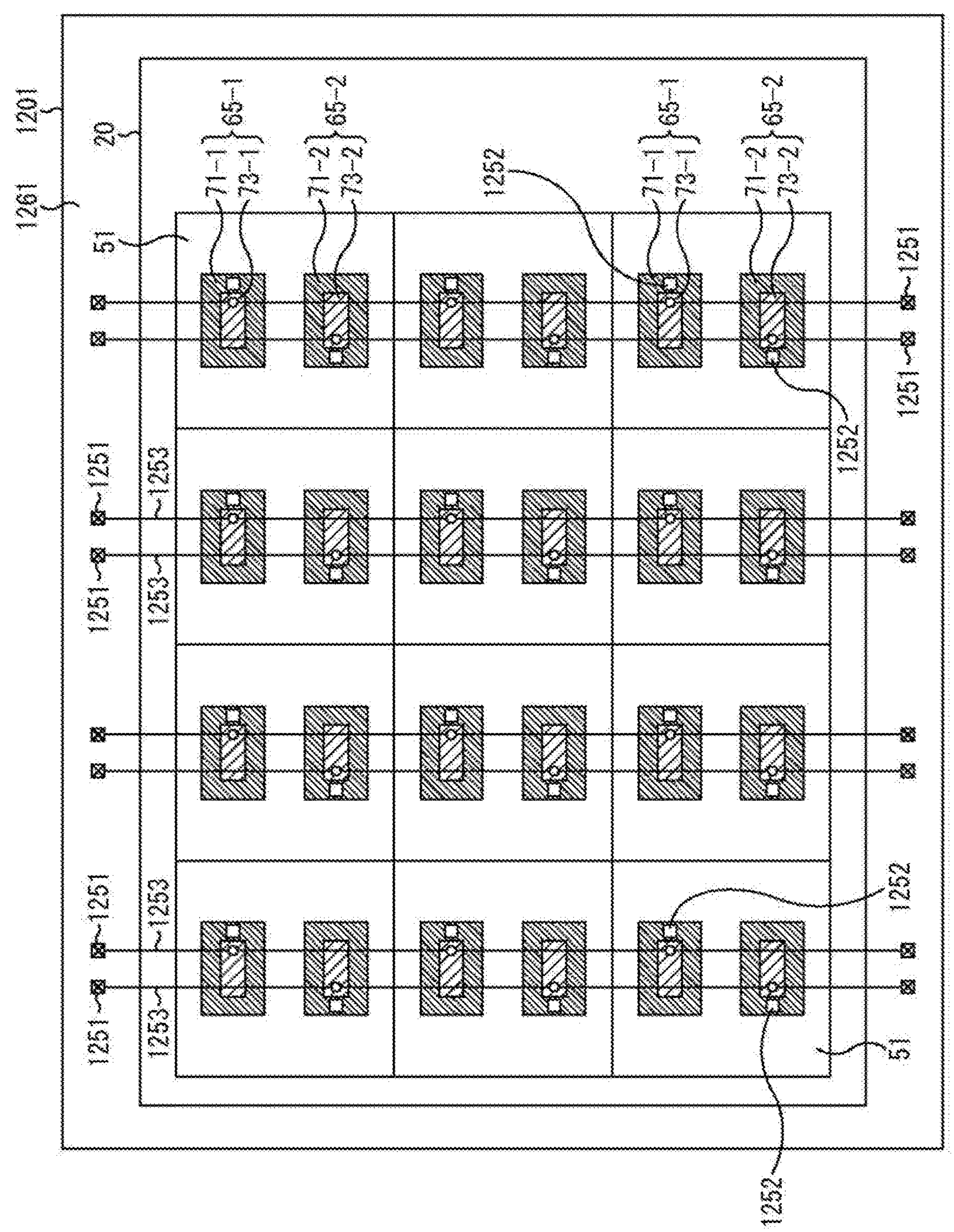
FIG. 60 is a plan view depicting arrangement of a MIX joining portion and a DET joining portion.

Alternatively, although the DET joining portion 1252 for acquiring the charge DET is provided in a unit of a pixel in the pixel region as depicted in FIG. 60, the MIX joining portion 1251 for supplying the voltage MIX may otherwise be provided in a peripheral portion 1261 on the outer side of the pixel array section 20. In the peripheral portion 1261, the voltage MIX supplied from the substrate 1211 is supplied to the P+ semiconductor region 73, which is a voltage application section for each pixel 51, through a voltage supply line 1253 wired in the perpendicular direction in the substrate 1201. By using the MIX joining portion 1251 for supplying the voltage MIX commonly to a plurality of pixels in this manner, the number of MIX joining portions 1251 in the entire substrate can be reduced and miniaturization of the pixel size or the chip size is facilitated.

Note that, although the example of FIG. 60 is an example in which the voltage supply line 1253 is wired in the vertical direction such that it is used commonly to pixel columns, the voltage supply line 1253 may otherwise be wired in the horizontal direction such that it is used commonly to pixel rows.

Furthermore, although the eighteenth embodiment described above is directed to an example in which electric connection between the substrate 1201 and the substrate 1211 is established using Cu—Cu bonding, a different electric connection method such as bump connection using, for example, TCV (Through Chip Via) or microbumps may be used.

According to the eighteenth embodiment described above, the light reception device 1 is configured from a stacked structure of the substrate 1201 and the substrate 1211, and on the substrate 1211 different from the substrate 1201 that includes the N+ semiconductor region 71 as a charge detection section, all pixel transistors that perform reading out operation of charge DET of the N+ semiconductor region 71 as a charge detection portion, more specifically, the transfer transistor 721, reset transistor 723, the amplification transistor 724 and the selection transistor 725, are arranged. As a consequence, the problem described hereinabove with reference to FIG. 55 can be solved.

More specifically, the area of the pixel 51 can be reduced irrespective of the area of the pixel transistor wiring region 831, and a higher resolution can be achieved without changing the optical size. Furthermore, since current increase from the signal extraction portion 65 to the pixel transistor wiring region 831 is avoided, the current consumption can be also reduced.

Nineteenth Embodiment

Now, a nineteenth embodiment is described.

Figure 61:
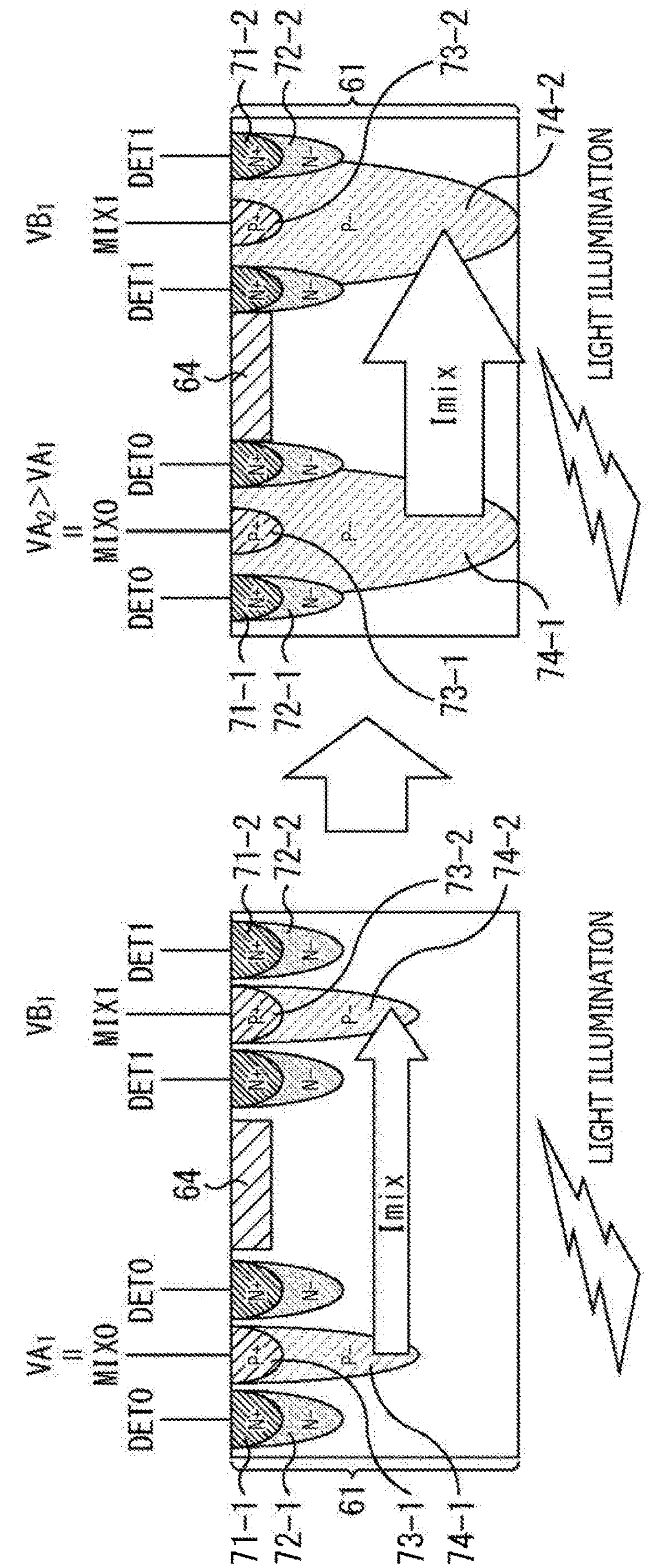
FIG. 61 is a view illustrating a problem of current consumption increase.

In order to increase the charge separation efficiency Cmod of the CAPD sensor, it is necessary to increase the potential of the P+ semiconductor region 73 or the P− semiconductor region 74 as a voltage application portion. Especially, in the case where it is necessary to detect long wavelength light such as infrared light with a high sensitivity, it is necessary to expand the P− semiconductor region 74 to a deep position of a semiconductor layer as depicted in FIG. 61 or to increase the positive voltage to be applied to a voltage $VA_2$ higher than a voltage $VA_1$. In this case, current Imix becomes liable to flow due to reduction of the resistance between voltage application portions, resulting in a problem of increase of current consumption. Furthermore, in the case where the pixel size is miniaturized in order to increase the resolution, the decrease of the distance between the voltage application portions decreases the resistance, resulting in a problem of increase of current consumption.

<First Example of Configuration of Nineteenth Embodiment>

Figure 62:
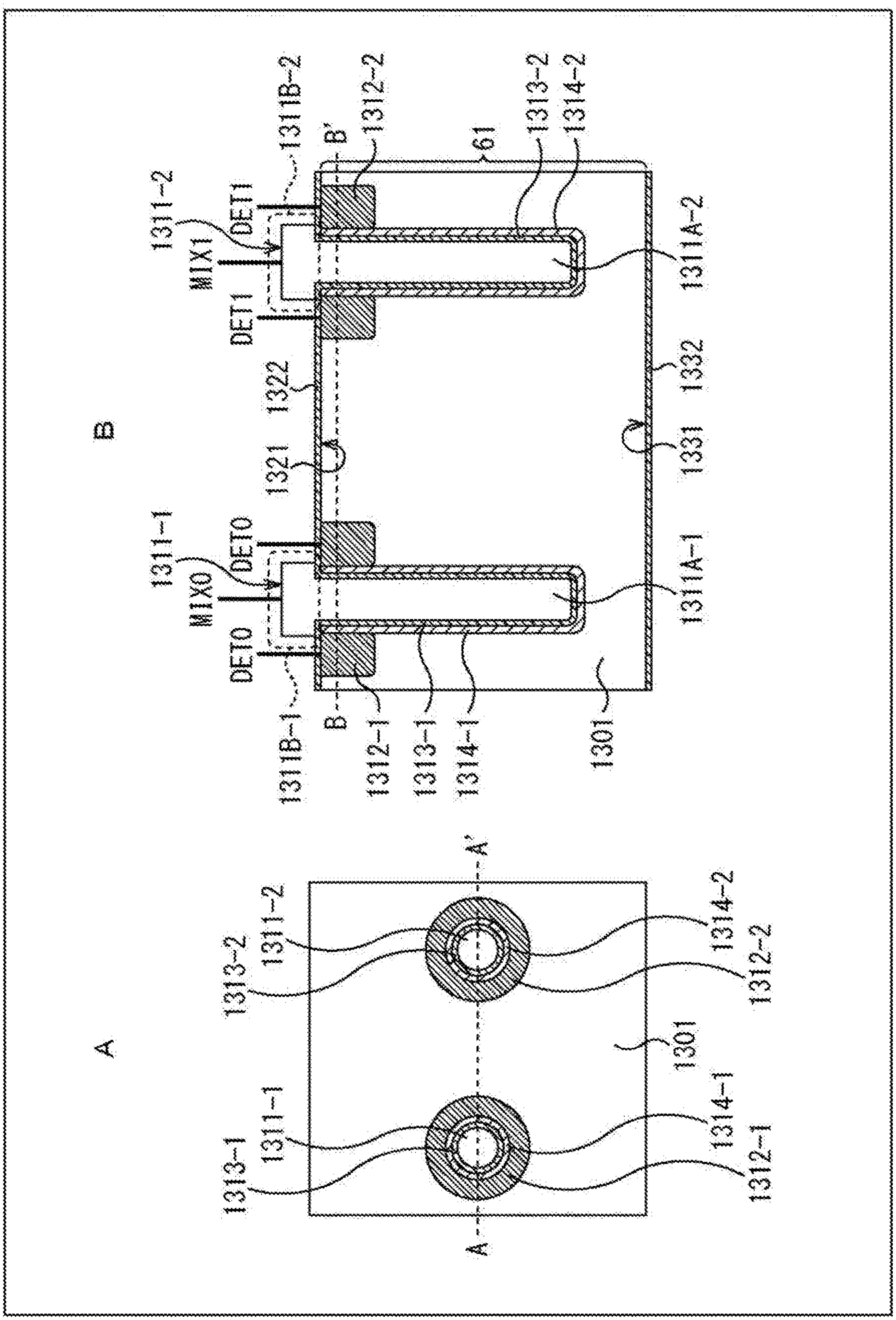
FIG. 62 is a plan view and a sectional view of a pixel according to a first example of a configuration of a nineteenth embodiment.

A of FIG. 62 is a plan view of a pixel according to a first example of a configuration of the nineteenth embodiment, and B of FIG. 62 is a sectional view of a pixel according to the first example of a configuration of the nineteenth embodiment.

A of FIG. 62 is a plan view along line B-B' of B of FIG. 62, and B of FIG. 62 is a sectional view taken along line A-A' of A of FIG. 62.

Note that FIG. 62 depicts only portions of pixels 51 formed on the substrate 61, and, for example, an on-chip lens 62 formed on the light incident face side, a multilayer wiring layer 811 formed on the opposite side to the light incident face and so forth are not depicted. The portions described above that are not depicted can be configured similarly as in the other embodiments described hereinabove. For example, on the multilayer wiring layer 811 on the opposite side to the light incident face, a reflection member 631 or a shading member 631' can be provided.

In the first example of a configuration of the nineteenth embodiment, an electrode portion 1311-1 that functions as a voltage application portion for applying a predetermined voltage MIX0 and another electrode portion 1311-2 that functions as a voltage application portion for applying another predetermined voltage MIX1 are formed at predetermined positions of a P-type semiconductor region 1301 that is a photoelectric conversion portion of the substrate 61.

The electrode portion 1311-1 is configured from an embedded portion 1311A-1 embedded in the P-type semiconductor region 1301 of the substrate 61 and a protruding portion 1311B-1 protruding to an upper portion of a first face 1321 of the substrate 61.

Similarly, the electrode portion 1311-2 is also configured from an embedded portion 1311A-2 embedded in the P-type semiconductor region 1301 of the substrate 61 and a protruding portion 1311B-2 protruding to an upper portion of the first face 1321 of the substrate 61. The electrode portions 1311-1 and 1311-2 include a metal material such as, for example, tungsten (W), aluminum (Al) or copper (Cu) or a conductive material of silicon, polysilicon or the like.

As depicted in A of FIG. 62, (the embedded portion 1311A-1 of) the electrode portion 1311-1 formed in a circular planar shape and (the embedded portion 1311A-2 of) the electrode portion 1311-2 are arranged point-symmetrically to each other with respect to a central point of the pixel.

On the outer periphery of (around) the electrode portion 1311-1, an N+ semiconductor region 1312-1 that functions as a charge detection portion is formed, and an insulating film 1313-1 and a hole concentration enhancement layer 1314-1 are inserted between the electrode portion 1311-1 and the N+ semiconductor region 1312-1.

Similarly, on the outer periphery of (around) the electrode portion 1311-2, an N+ semiconductor region 1312-2 that functions as a charge detection portion is formed, and an insulating film 1313-2 and a hole concentration enhancement layer 1314-2 are inserted between the electrode portion 1311-2 and the N+ semiconductor region 1312-2.

The electrode portion 1311-1 and the N+ semiconductor region 1312-1 configure the signal extraction portion 65-1 described hereinabove, and the electrode portion 1311-2 and the N+ semiconductor region 1312-2 configure the signal extraction portion 65-2 described hereinabove.

The electrode portion 1311-1 is covered with the insulating film 1313-1 in the substrate 61 as depicted in B of FIG. 62, and the insulating film 1313-1 is covered with the hole concentration enhancement layer 1314-1. Also, the electrode portion 1311-2, the insulating film 1313-2 and the hole concentration enhancement layer 1314-2 have a similar relationship thereamong.

The insulating films 1313-1 and 1313-2 include, for example, an oxide film ($SiO_2$) or the like and are formed at a same step as that for the insulating film 1322 formed on the first face 1321 of the substrate 61. Note that an insulating film 1332 is formed also on a second face 1331 on the opposite side to the first face 1321 of the substrate 61.

The hole concentration enhancement layers 1314-1 and 1314-2 are configured from a P-type semiconductor region and can be formed, for example, by an ion implantation method, a solid phase diffusion method, a plasma doping method and so forth.

In the following description, in the case where there is no necessity to specifically distinguish the electrode portions 1311-1 and 1311-2, each of them is sometimes referred to merely as electrode portion 1311, and in the case where there is no necessity to specifically distinguish the N+ semiconductor regions 1312-1 and 1312-2, each of them is sometimes referred to merely as N+ semiconductor region 1312.

Furthermore, in the case where there is no necessity to specifically distinguish the hole concentration enhancement layers 1314-1 and 1314-2, each of them is sometimes referred to simply as hole concentration enhancement layer 1314, and in the case where there is no necessity to specifically distinguish the insulating films 1313-1 and 1313-2, each of them is sometimes referred to simply as insulating film 1313.

The electrode portions 1311, the insulating films 1313 and the hole concentration enhancement layers 1314 can be formed by the following procedure. First, the P-type semiconductor region 1301 of the substrate 61 is etched from the first face 1321 side to form a trench to a predetermined depth. Then, the hole concentration enhancement layer 1314 is formed on the inner periphery of the formed trench by an ion implantation method, a solid phase diffusion method, a plasma doping method or the like and then the insulating film 1313 is formed. Then, a conductive material is filled into the inside of the insulating film 1313 to form the embedded portion 1311A. Thereafter, a conductive material such as a metal material is formed over an overall area of the first face 1321 of the substrate 61, and then only an upper portion of the electrode portion 1311 is left by the etching to form the protruding portion 1311B-1.

Although the electrode portion 1311 is configured such that the depth thereof at least reaches a position deeper than the N+ semiconductor region 1312 that is a charge detection portion, preferably it is configured such that the depth reaches a position deeper than one half the substrate 61.

With the pixel 51 according to the first example of a configuration of the nineteenth embodiment configured in such a manner as described above, since the trench is formed in the depthwise direction of the substrate 61 and a charge distribution effect for charge obtained by photoelectric conversion in a wide region in the depthwise direction of the substrate 61 is obtained by the electrode portion 1311 filled with the conductive material, the charge separation efficiency Cmod for long wavelength light can be increased.

Furthermore, since the structure for covering the outer periphery of the electrode portion 1311 with the insulating film 1313 is adopted, current flowing between the voltage application portions is suppressed, and therefore, the current consumption can be reduced. Alternatively, in the case where comparison is made with same current consumption, it becomes possible to apply a high voltage to the voltage application portions. Furthermore, even if the distance between the voltage application portions is shortened, since current consumption is suppressed, a high resolution can be achieved by miniaturizing the pixel size and increasing the pixel number.

Note that, although, in the first example of a configuration of the nineteenth embodiment, the protruding portion 1311B of the electrode portion 1311 may be omitted, by providing the protruding portion 1311B, an electric field is strengthened in the direction perpendicular to the substrate 61 and it becomes easier to collect charge.

Furthermore, in the case where it is desired to increase the modulation degree by the application voltage to further increase the charge separation efficiency Cmod, the hole concentration enhancement layer 1314 may be omitted. In the case where the hole concentration enhancement layer 1314 is provided, it is possible to suppress damage upon etching for formation of a trench or generation of electros arising from pollutant.

In the first example of a configuration of the nineteenth embodiment, whichever one of the first face 1321 and the second face 1331 of the substrate 61 may be the light incident face, and although any of the back-illuminated type and the front-illuminated type is possible, the back-illuminated type is more preferable.

<Second Example of Configuration of Nineteenth Embodiment>

Figure 63:
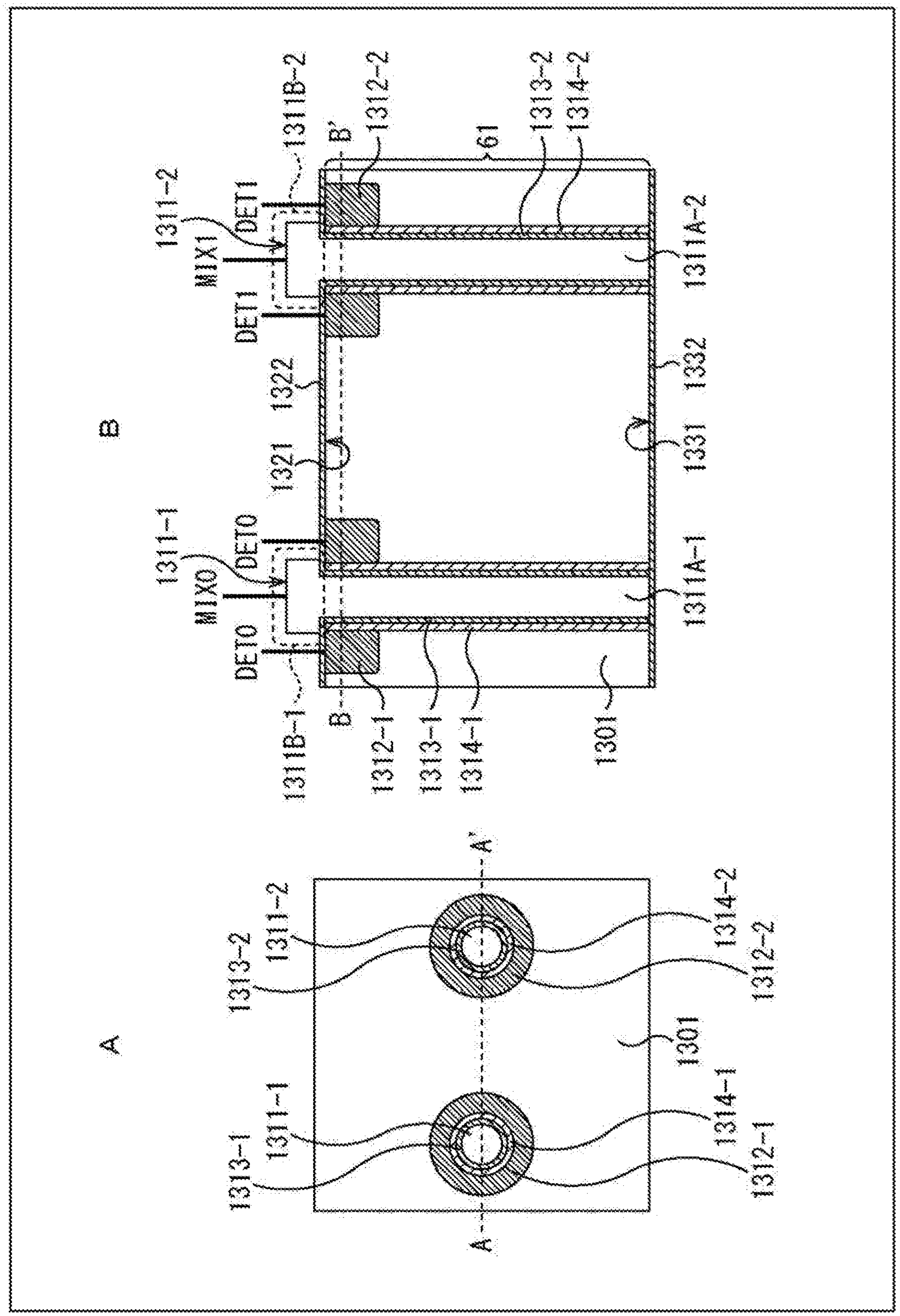
FIG. 63 is a plan view and a sectional view of a pixel according to a second example of a configuration the nineteenth embodiment.

A of FIG. 63 is a plan view of a pixel according to a second example of a configuration of the nineteenth embodiment, and B of FIG. 63 is a sectional view of the pixel according to the second example of a configuration of the nineteenth embodiment.

A of FIG. 63 is a plan view taken along line B-B' of B of FIG. 63, and B of FIG. 63 is a sectional view taken along line A-A' of A of FIG. 63.

Note that, in the second example of a configuration of FIG. 63, portions corresponding to those in FIG. 62 are denoted by like reference signs, and description is given paying attention to matters different from those of the first example of a configuration of FIG. 62 and description of common portions is suitably omitted.

The second example of a configuration of FIG. 63 is different in that the embedded portion 1311A of the electrode portion 1311 extends through the substrate 61 that is a semiconductor layer while it is same in the other respects. The embedded portion 1311A of the electrode portion 1311 is formed to extend from the first face 1321 to the second face 1331 of the substrate 61, and an insulating film 1313 and a hole concentration enhancement layer 1314 are still formed on an outer periphery of the electrode portion 1311. The second face 1331 on the side on which the N+ semiconductor region 1312 as a charge detection portion is not formed is covered over an overall area thereof with the insulating film 1332.

As in this second example of configuration, the embedded portion 1311A of the electrode portion 1311 as a voltage application portion may be configured such that it extends through the substrate 61. Also, in this case, since a charge distribution effect is obtained for charge generated by photoelectric conversion in a wide region in regard to the depthwise direction of the substrate 61, it is possible to increase the charge separation efficiency Cmod for long wavelength light.

Furthermore, since the electrode portion 1311 is structured such that the outer periphery thereof is covered with the insulating film 1313, current flowing between the voltage application portions is suppressed, and therefore, the current consumption can be reduced. Alternatively, in the case where comparison is made with same current consumption, it becomes possible to apply a high voltage to the voltage application portions. Furthermore, even if the distance between the voltage application portions is shortened, since current consumption is suppressed, a high resolution can be achieved by miniaturizing the pixel size and increasing the pixel number.

In the second example of a configuration of the nineteenth embodiment, whichever one of the first face 1321 and the second face 1331 of the substrate 61 may be the light incident face, and although any of the back-illuminated type and the front-illuminated type is possible, the back-illuminated type is more preferable.

<Other Examples of Planar Shape>

In the first example of a configuration and the second example of a configuration of the nineteenth embodiment described above, the electrode portion 1311 that is a voltage application portion and the N+ semiconductor region 1312 that is a charge detection portion are formed so as to have a circular planar shape.

However, the planar shapes of the electrode portion 1311 and the N+ semiconductor region 1312 is not limited to a circular shape but may be an octagonal shape depicted in FIG. 11, a rectangular shape depicted in FIG. 12, a square shape or the like. Also, the number of signal extraction portions 65 (taps) to be arranged in one pixel is not limited to two but may be four as depicted in FIG. 17 or some other number.

Figure 64:
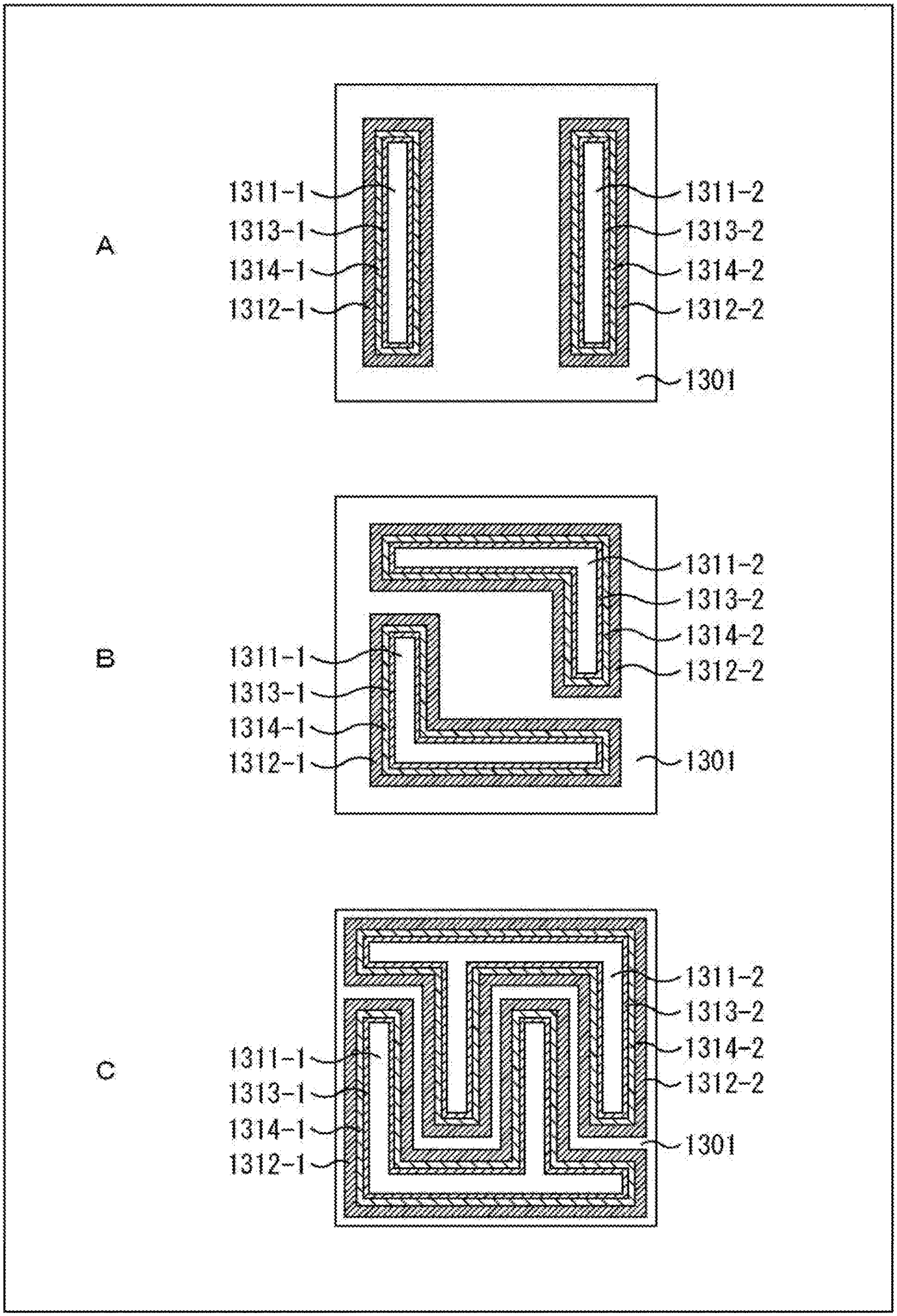
FIG. 64 is a view depicting other planar shapes of the first example of a configuration and the second example of a configuration of the nineteenth embodiment.

A to C of FIG. 64 are plan views taken along line B-B' of B of FIG. 62 and depict examples of a case in which the number of signal extraction portions 65 is two and the electrode portion 1311 and the N+ semiconductor region 1312 configuring the signal extraction portions 65 have planar shapes other than a circular shape.

A of FIG. 64 depicts an example in which the planar shapes of the electrode portion 1311 and the N+ semiconductor region 1312 is a rectangular shape elongated in the vertical direction.

In A of FIG. 64, the electrode portion 1311-1 and the electrode portion 1311-2 are arranged point-symmetrically with respect to a central point of the pixel. Furthermore, the electrode portion 1311-1 and the electrode portion 1311-2 are arranged in an opposing relationship to each other. Also, the shape and the positional relationship of the insulating films 1313, hole concentration enhancement layers 1314 and N+ semiconductor regions 1312 formed on the outer periphery of the electrode portions 1311 are similar to those of the electrode portions 1311.

B of FIG. 64 depicts an example in which the planar shapes of the electrode portion 1311 and the N+ semiconductor region 1312 is an L shape.

C of FIG. 64 depicts an example in which the planar shapes of the electrode portion 1311 and the N+ semiconductor region 1312 is a comb shape.

Also, in B and C of FIG. 64, the electrode portion 1311-1 and the electrode portion 1311-2 are arranged point-symmetrically with respect to a central point of the pixel. Furthermore, the electrode portion 1311-1 and the electrode portion 1311-2 are arranged in an opposing relationship to each other. Also, the shape and the positional relationship of the insulating films 1313, the hole concentration enhancement layers 1314 and the N+ semiconductor regions 1312 formed on the outer periphery of the electrode portions 1311 are similar to those of the electrode portions 1311.

Figure 65:
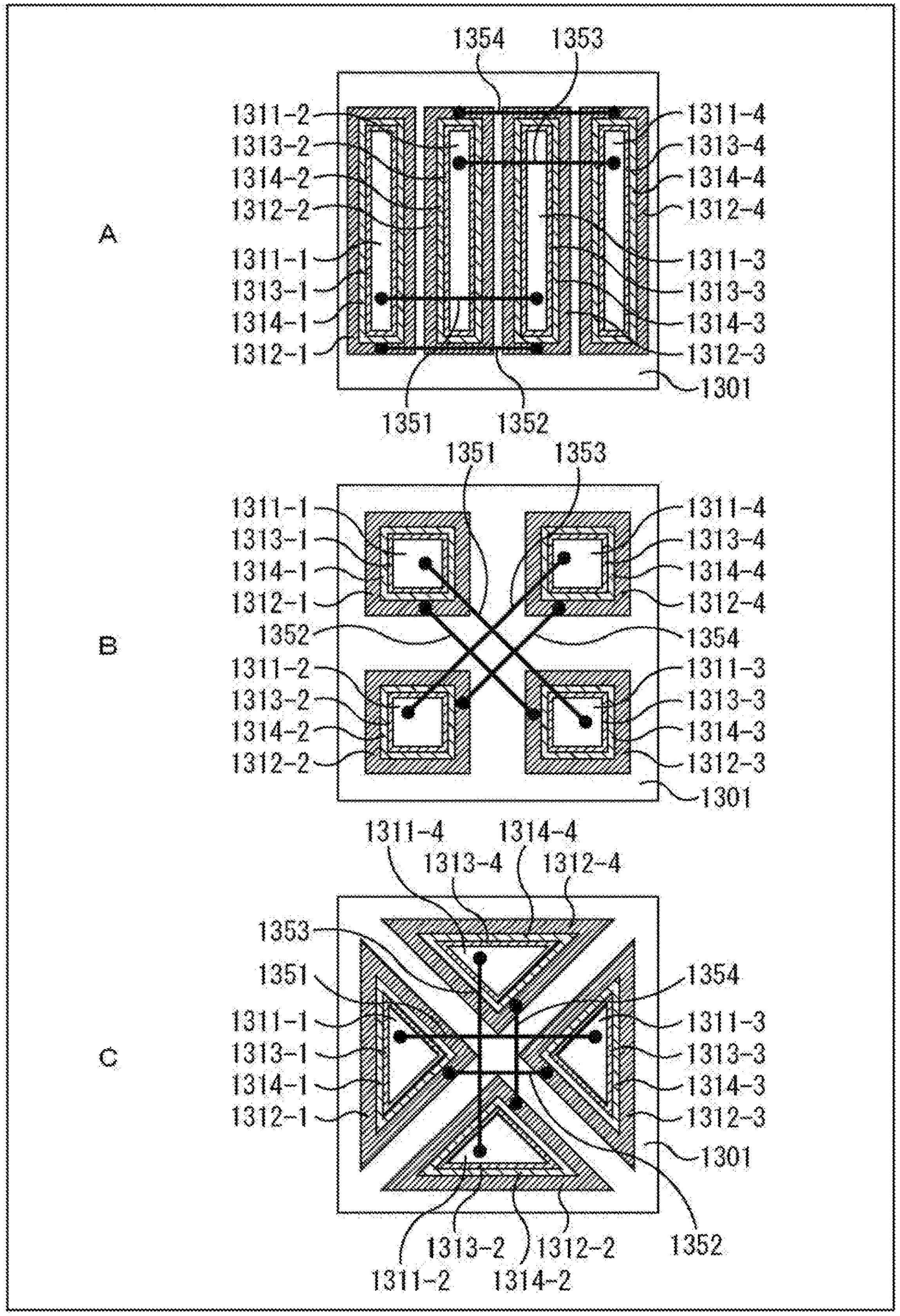
FIG. 65 is a view depicting other planar shapes of the first example of a configuration and the second example of a configuration of the nineteenth embodiment.

A to C of FIG. 65 are plan views taken along line B-B' of B of FIG. 62 and depict examples of a case in which the number of signal extraction portions 65 is four and the planar shapes of the electrode portion 1311 and the N+ semiconductor region 1312 configuring the signal extraction portion 65 is a shape other than a circular shape.

A of FIG. 65 depicts an example in which the planar shapes of the electrode portion 1311 and the N+ semiconductor region 1312 is a rectangular shape elongated in the vertical direction.

In A of FIG. 65, the vertically elongated electrode portions 1311-1 to 1311-4 are arranged at predetermined distances in the horizontal direction and are arranged point-symmetrically with respect to the central point of the pixel. Furthermore, the electrode portions 1311-1 and 1311-2 and the electrode portions 1311-3 and 1311-4 are arranged in an opposed relationship to each other.

The electrode portion 1311-1 and the electrode portion 1311-3 are electrically connected to each other by a wire 1351 and configure a voltage application portion for the signal extraction portion 65-1 (first tap TA) to which the voltage MIX0 is to be applied. The N+ semiconductor region 1312-1 and the N+ semiconductor region 1312-3 are electrically connected to each other by a wire 1352 and configure a charge detection portion for the signal extraction portion 65-1 (first tap TA) for detecting signal charge DET1.

The electrode portion 1311-2 and the electrode portion 1311-4 are electrically connected to each other by a wire 1353 and configure a voltage application portion for the signal extraction portion 65-2 (second tap TB) to which the voltage MIX1 is to be applied. The N+ semiconductor region 1312-2 and the N+ semiconductor region 1312-4 are electrically connected to each other by a wire 1354 and configure a charge detection portion for the signal extraction portion 65-2 (second tap TB) for detecting signal charge DET2.

Therefore, More specifically, in the arrangement of A of FIG. 65, sets of the voltage application portion and the charge detection portion of the signal extraction portion 65-1 that has a rectangular planar shape and sets of the voltage application portion and the charge detection portion of the signal extraction portion 65-2 that has a rectangular planer shape are arranged alternately in the horizontal direction.

Also, the insulating films 1313 and the hole concentration enhancement layers 1314 formed on the outer periphery of the electrode portion 1311 have a similar shape and positional relationship.

B of FIG. 65 depicts an example in which the planar shapes of the electrode portion 1311 and the N+ semiconductor region 1312 is a square shape.

In the arrangement of B of FIG. 65, sets of the voltage application portion and the charge detection portion of the signal extraction portion 65-1 that has a rectangular planar shape are arranged in an opposing relationship to each other in a diagonal direction of the pixel 51, and sets of the voltage application portion and the charge detection portion of the signal extraction portion 65-2 that has a rectangular planar shape are arranged in an opposing relationship to each other in a diagonal direction different from that of the signal extraction portion 65-1.

C of FIG. 65 depicts an example in which the planar shapes of the electrode portion 1311 and the N+ semiconductor region 1312 is a triangular shape.

In the arrangement of C of FIG. 65, sets of the voltage application portion and the charge detection portion of the signal extraction portion 65-1 that has a triangular planar shape are arranged in an opposing relationship to each other in a first direction (horizontal direction) of the pixel 51, and sets of the voltage application portion and the charge detection portion of the signal extraction portion 65-2 that has a triangular planar shape are arranged in an opposing relationship to each other in a second direction (vertical direction) orthogonal to the first direction and different from that of the signal extraction portion 65-1.

Also, the arrangements in B and C of FIG. 65 are similar in that the four electrode portions 1311-1 to 1311-4 are arranged point-symmetrically with respect to the central point of the pixel, that the electrode portion 1311-1 and the electrode portion 1311-3 are electrically connected to each other by the wire 1351, that the N+ semiconductor region 1312-1 and the N+ semiconductor region 1312-3 are electrically connected to each other by the wire 1352, that the electrode portion 1311-2 and the electrode portion 1311-4 are electrically connected to each other by the wire 1353, and that the N+ semiconductor region 1312-2 and the N+ semiconductor region 1312-4 are electrically connected to each other by the wire 1354. Also, the shape and the positional relationship of the insulating films 1313 and the hole concentration enhancement layers 1314 formed on the outer periphery of the electrode portions 1311 are similar to those of the electrode portions 1311.

<Third Example of Configuration of Nineteenth Embodiment>

Figure 66:
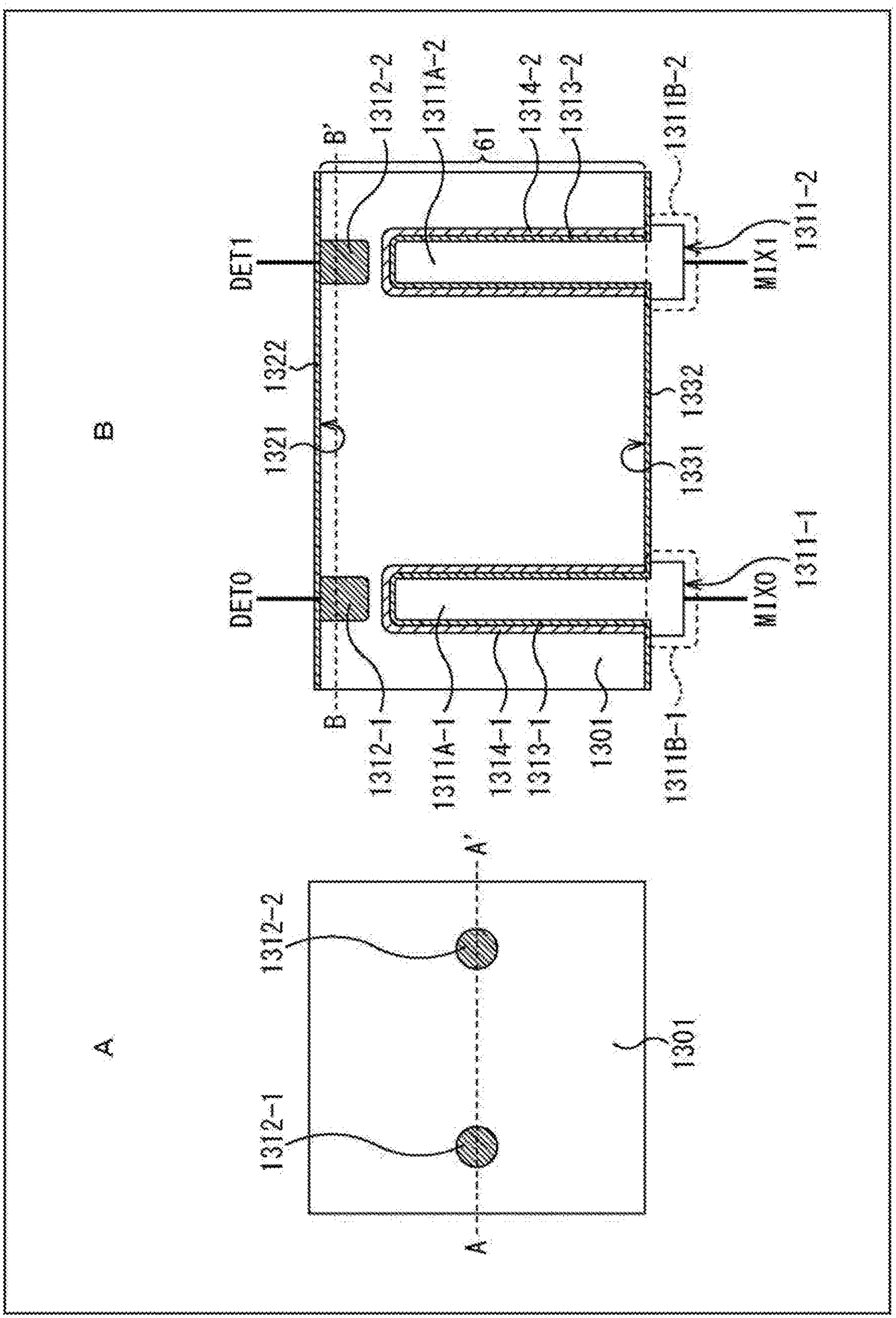
FIG. 66 is a plan view and a sectional view of a pixel according to a third example of a configuration of a nineteenth embodiment.

A of FIG. 66 is a plan view of a pixel according to a third example of a configuration of the nineteenth embodiment, and B of FIG. 66 is a sectional view of the pixel according to the third example of a configuration of the nineteenth embodiment.

A of FIG. 66 is a plan view taken along line B-B' of B of FIG. 66, and B of FIG. 66 is a sectional view taken along line A-A' of FIG. 66.

Note that, in the third example of a configuration of FIG. 66, portions corresponding to those in the first example of a configuration of FIG. 62 are denoted by like referenced characters, and description is given paying attention to matters different from those of the first example of a configuration of FIG. 62 and description of common portions is suitably omitted.

In the first example of a configuration of FIG. 62 and the second example of a configuration of FIG. 63, the electrode portion 1311 that is a voltage application portion and the N+ semiconductor region 1312 that is a charge detection portion are arranged on the same plane side of the substrate 61, more specifically, on the periphery (in the neighborhood) of the first face 1321 side.

In contrast, in the third example of a configuration of FIG. 66, the electrode portion 1311 that is a voltage application portion is arranged on the plane side on the opposite side to the first face 1321 of the substrate 61 on which the N+ semiconductor region 1312 that is a charge detection portion is formed, more specifically, on the second face 1331 side. The protruding portion 1311B of the electrode portion 1311 is formed at an upper portion of the second face 1331 of the substrate 61.

Furthermore, the electrode portion 1311 is arranged at a position at which the central position thereof overlaps with the N+ semiconductor region 1312 as viewed in a plan view. Although the example of FIG. 66 is an example in which the circular planar regions of the electrode portion 1311 and the N+ semiconductor region 1312 coincide fully with each other, they need not necessarily coincide fully with each other and one of the planar regions may be greater than the other. Furthermore, also the central positions may not fully coincide with each other, but it is sufficient if it can be regarded that they substantially coincide with each other.

The third example of a configuration is similar to the first example of a configuration described above except the positional relationship of the electrode portion 1311 and the N+ semiconductor region 1312. As in this third example of a configuration, the embedded portion 1311A of the electrode portion 1311 as a voltage application portion is formed down to a deep position in the proximity of the N+ semiconductor region 1312 that is a charge detection portion formed on the first face 1321 that is on the opposite side to the second face 1331 and on which the electrode portion 1311 is formed. Also, in this case, since a charge distribution effect is obtained for charge generated by photoelectric conversion in a wide region in regard to the depthwise direction of the substrate 61, it is possible to increase the charge separation efficiency Cmod for ling wavelength light.

Furthermore, since the electrode portion 1311 is structured such that the outer periphery thereof is covered with the insulating film 1313, current flowing between the voltage application portions is suppressed, and As a consequence, current consumption can be reduced. Alternatively, in the case where comparison is made with same current consumption, it becomes possible to apply a high voltage to the voltage application portions. Furthermore, even if the distance between the voltage application portions is shortened, since current consumption is suppressed, a high resolution can be achieved by miniaturizing the pixel size and increase the pixel number.

In the third example of a configuration of the nineteenth embodiment, whichever one of the first face 1321 and the second face 1331 of the substrate 61 may be a light incident face and whichever one of the back-illuminated type and the front-illuminated type is possible. However, the back-illuminated type is more preferable. In the case where the third example of a configuration is configured as of the back-illuminated type, the second face 1331 is a face on the side on which the on-chip lens 62 is formed, and for example, as depicted in FIG. 60, voltage supply lines 1253 for supplying an application voltage to the electrode portions 1311 are wired in a perpendicular direction to the pixel array section 20 such that each of them is connected to a wire on the front face side by a through-electrode that extends through the substrate 61 in the peripheral portion 1261 on the outer side of the pixel array section 20.

<Other Examples of Planar Shape>

In the third example of a configuration of the nineteenth embodiment described above, the electrode portion 1311 that is a voltage application portion and the N+ semiconductor region 1312 that is a charge detection portion are formed so as to have a circular shape.

However, the planar shapes of the electrode portion 1311 and the N+ semiconductor region 1312 is not limited to a circular shape but may be an octagonal shape depicted in FIG. 11, a rectangular shape depicted in FIG. 12, a square shape or the like. Also, the number of signal extraction portions 65 (taps) to be arranged in one pixel is not limited to two but may be four as depicted in FIG. 17 or some other number.

Figure 67:
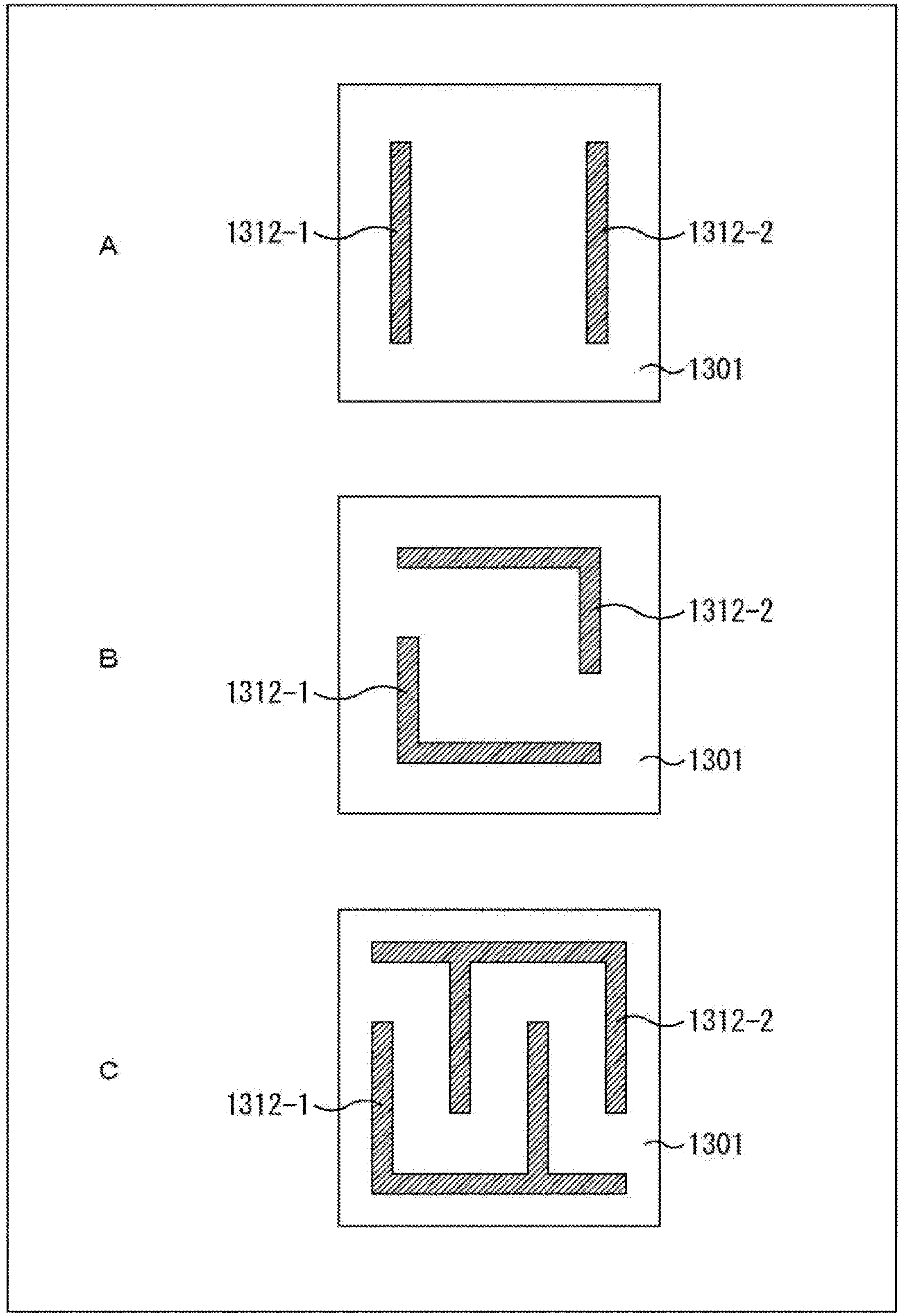
FIG. 67 is a view depicting other planar shapes of the third example of a configuration of the nineteenth embodiment.

A to C of FIG. 67 are plan views taken along line B-B' of B of FIG. 66 and depict examples of a case in which the number of signal extraction portions 65 is two and the planar shapes of the electrode portion 1311 and the N+ semiconductor region 1312 that configure the signal extraction portions 65 is a shape other than a circular shape.

A of FIG. 67 depicts an example in which the planar shapes of the electrode portion 1311 and the N+ semiconductor region 1312 is an oblong shape elongated in the vertical direction.

In A of FIG. 67, the N+ semiconductor region 1312-1 and the N+ semiconductor region 1312-2 that are charge detection portions are arranged point-symmetrically with respect to the central point of the pixel. Furthermore, the N+ semiconductor region 1312-1 and the N+ semiconductor region 1312-2 are arranged in an opposing relationship to each other. Also, the shape and the positional relationship of the electrode portion 1311 arranged on the second face 1331 side on the opposite side to the formation face of the N+ semiconductor region 1312 and the insulating film 1313 and hole concentration enhancement layer 1314 formed on the outer periphery of the electrode portion 1311 are similar to those of the N+ semiconductor region 1312.

B of FIG. 67 depicts an example in which the planar shapes of the electrode portion 1311 and the N+ semiconductor region 1312 is an L shape.

C of FIG. 67 depicts an example in which the planar shapes of the electrode portion 1311 and the N+ semiconductor region 1312 is a comb shape.

Also, in B and C of FIG. 67, the N+ semiconductor region 1312-1 and the N+ semiconductor region 1312-2 are arranged point-symmetrically with respect to the central point of the pixel. Furthermore, the N+ semiconductor region 1312-1 and the N+ semiconductor region 1312-2 are arranged in an opposing relationship to each other. Also, the shape and the positional relationship of the electrode portion 1311 arranged on the second face 1331 side on the opposite side to the formation face of the N+ semiconductor region 1312 and the insulating film 1313 and hole concentration enhancement layer 1314 formed on the outer periphery of the electrode portion 1311 are similar to those of the N+ semiconductor region 1312.

Figure 68:
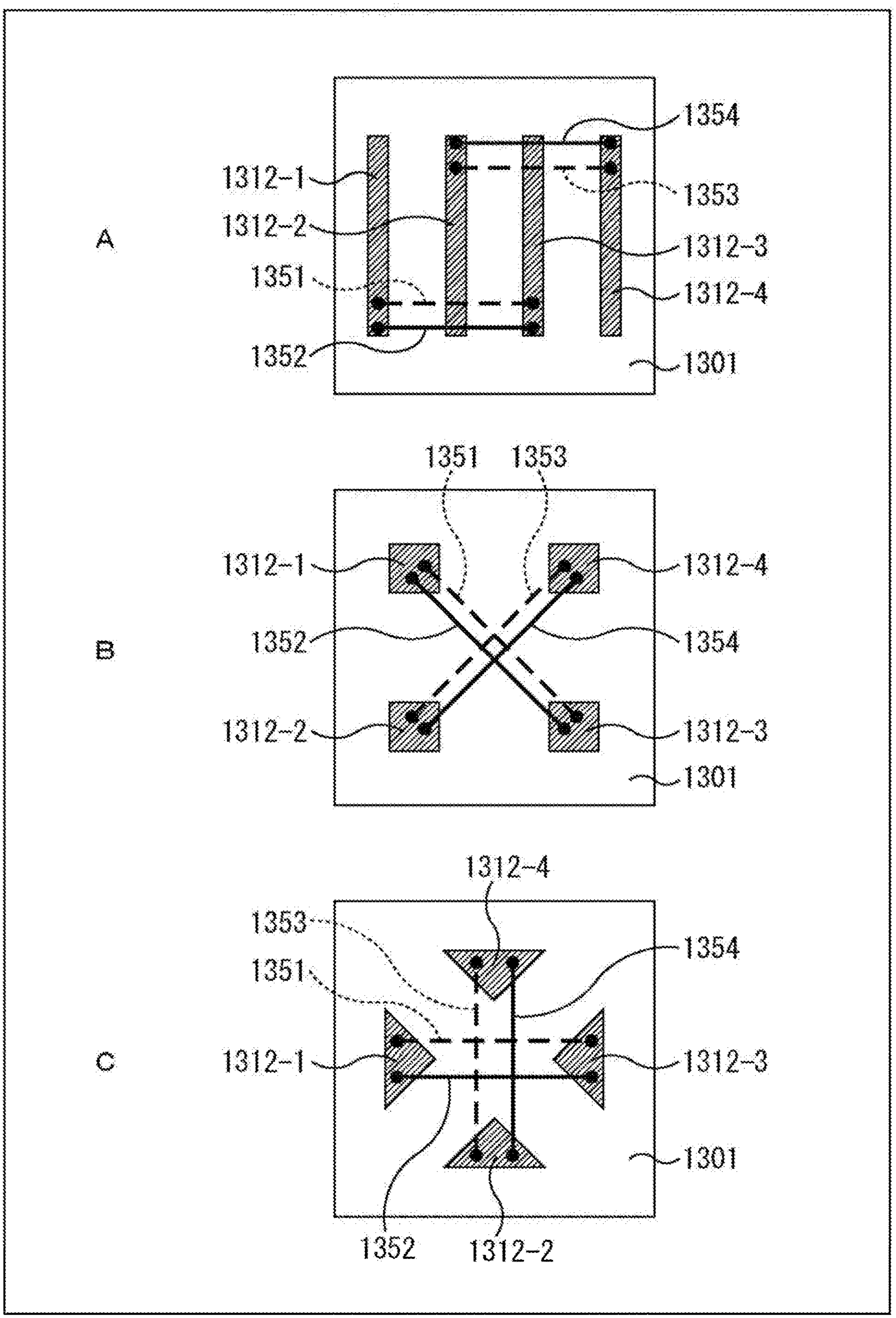
FIG. 68 is a view depicting other planar shapes of the third example of a configuration of the nineteenth embodiment.

A to C of FIG. 68 are plan views taken along line B-B' of B of FIG. 66 and depict an example of a case in which the number of signal extraction portions 65 is four and the planar shapes of the electrode portion 1311 and the N+ semiconductor region 1312 configuring the signal extraction portion 65 is a shape other than a circular shape.

A of FIG. 68 depicts an example in which the planar shapes of the electrode portion 1311 and the N+ semiconductor region 1312 is an oblong shape elongated in the vertical direction.

In A of FIG. 68, the longitudinally elongated N+ semiconductor regions 1312-1 and 1312-4 are arranged at a predetermined distance in the horizontal direction and are arranged point-symmetrically with respect to the central point of the pixel. Furthermore, the N+ semiconductor regions 1312-1 and 1312-2 and the N+ semiconductor regions 1312-3 and 1312-4 are arranged in an opposing relationship to each other.

The electrode portion 1311-1 and the electrode portion 1311-3 not depicted formed on the second face 1331 side are electrically connected to each other by the wire 1351 and configure a voltage application portion for the signal extraction portion 65-1 (first tap TA) to which, for example, the voltage MIX0 is applied. The N+ semiconductor region 1312-1 and the N+ semiconductor region 1312-3 are electrically connected to each other by the wire 1352 and configure a charge detection portion for the signal extraction portion 65-1 (first tap TA) that detects the signal charge DET1.

The electrode portion 1311-2 and the electrode portion 1311-4 not depicted formed on the second face 1331 side are electrically connected to each other by the wire 1353 and configure a voltage application portion for the signal extraction portion 65-2 (second tap TB) to which, for example, the voltage MIX1 is applied. The N+ semiconductor region 1312-2 and the N+ semiconductor region 1312-4 are electrically connected to each other by the wire 1354 and configure a charge detection portion for the signal extraction portion 65-2 (second tap TB) that detects the signal charge DET2.

Therefore, More specifically, in the arrangement of A of FIG. 68, sets of the voltage application portion and the charge detection portion of the signal extraction portion 65-1 that has a rectangular planar shape and sets of the voltage application portion and the charge detection portion of the signal extraction portion 65-2 that has a rectangular planer shape are arranged alternately in the horizontal direction.

Also, the insulating film 1313 and the hole concentration enhancement layer 1314 formed on the outer periphery of the electrode portion 1311 have a similar shape and positional relationship.

B of FIG. 68 depicts an example in which the planar shapes of the electrode portion 1311 and the N+ semiconductor region 1312 is a square shape.

In the arrangement of B of FIG. 68, sets of the voltage application portion and the charge detection portion of the signal extraction portion 65-1 that has a rectangular planar shape are arranged in an opposing relationship to each other in a diagonal direction of the pixel 51, and sets of the voltage application portion and the charge detection portion of the signal extraction portion 65-2 that has a rectangular planar shape are arranged in an opposing relationship to each other in a diagonal direction different from that of the signal extraction portion 65-1.

C of FIG. 68 depicts an example in which the planar shapes of the electrode portion 1311 and the N+ semiconductor region 1312 is a triangular shape.

In C of FIG. 68, sets of the voltage application portion and the charge detection portion of the signal extraction portion 65-1 that has a triangular planar shape are arranged in an opposing relationship to each other in a first direction (horizontal direction), and sets of the voltage application portion and the charge detection portion of the signal extraction portion 65-2 that has a triangular planar shape are arranged in an opposing relationship to each other in a second direction (vertical direction) orthogonal to the first direction and different from that of the signal extraction portion 65-1.

Also, in B and C of FIG. 68, it is similar that the four electrode portions 1311-1 to 1311-4 are arranged point-symmetrically with respect to the central point of the pixel, that the electrode portion 1311-1 and the electrode portion 1311-3 are electrically connected to each other by the wire 1351, that the N+ semiconductor region 1312-1 and the N+ semiconductor region 1312-3 are electrically connected to each other by the wire 1352, that the electrode portion 1311-2 and the electrode portion 1311-4 are electrically connected to each other by the wire 1353, and that the N+ semiconductor region 1312-2 and the N+ semiconductor region 1312-4 are connected to each other by the wire 1354. Also, the shape and the positional relationship of the insulating film 1313 and the hole concentration enhancement layer 1314 formed on the outer periphery of the electrode portion 1311 are similar to those of the electrode portion 1311.

<Other Examples of Wiring Layout>

The pixel circuits of FIGS. 31 and 32 described hereinabove and the example of the metal film M3 of FIG. 42 are directed to a configuration that two vertical signal lines 29 are arranged for one pixel column corresponding to two signal extraction portions 65 (two taps TA and TB).

However, it is also possible to adopt such a configuration that, for example, four vertical signal lines 29 are arranged for one pixel column and pixel signals of totaling four taps of two pixels neighboring with each other in the vertical direction are outputted simultaneously.

Figure 69:
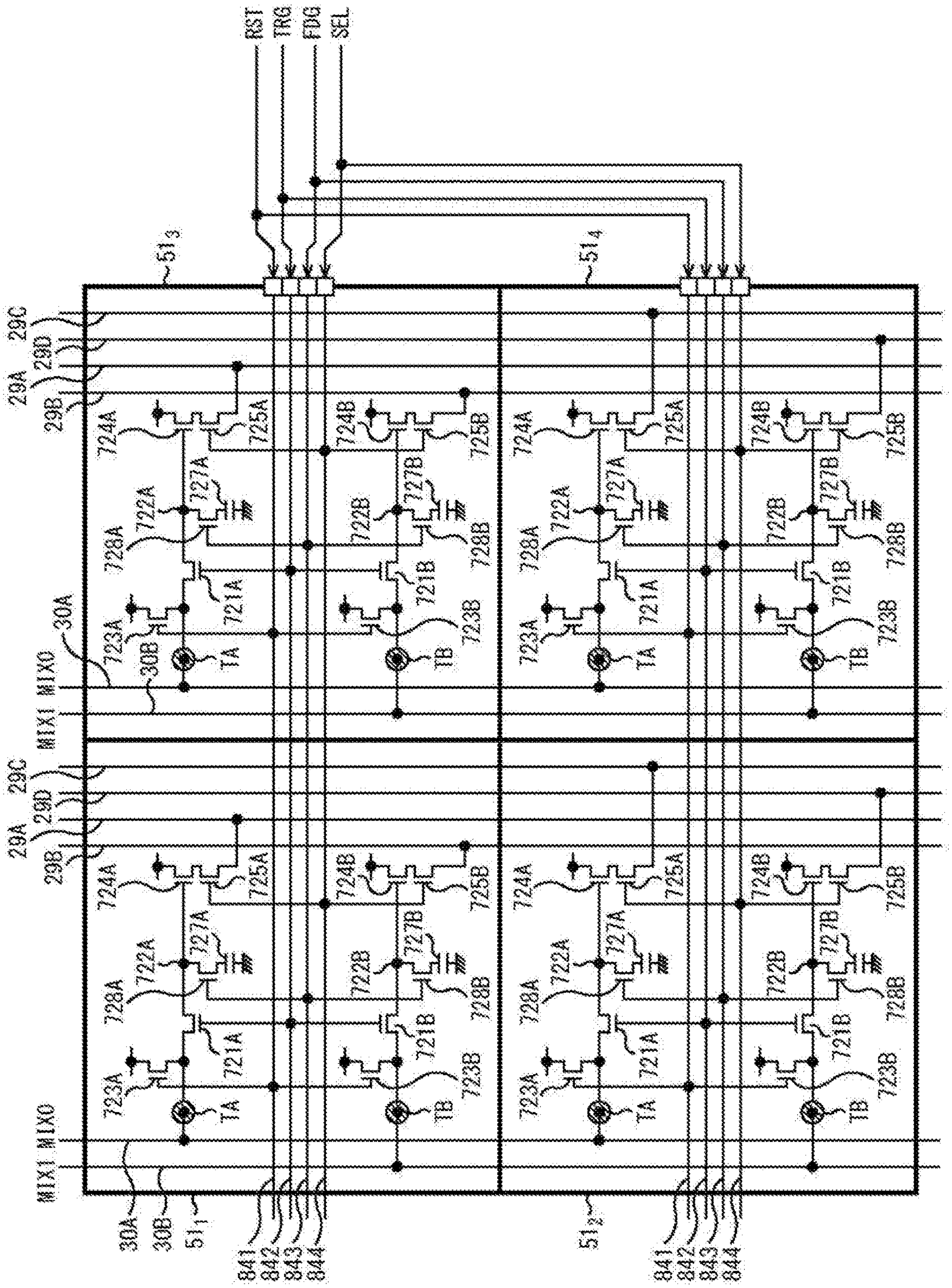
FIG. 69 is a view depicting an example of a circuit configuration of a pixel array section in the case where pixel signals of four taps are outputted simultaneously.

FIG. 69 depicts an example of a circuit configuration of the pixel array section 20 in the case where pixel signals of totaling four taps of two pixels neighboring with each other in the vertical direction.

FIG. 69 depicts a circuit configuration of four pixels of 2×2 among a plurality of pixels 51 arranged two-dimensionally in a matrix in the pixel array section 20. Note that, in the case where the four pixels 51 of 2×2 in FIG. 69 are to be distinguished from each other, they are represented like pixels $51_1$ to $51_4$.

The circuit configuration of each pixel 51 is a circuit configuration including an additional capacitor 727 and a switching transistor 728 for controlling connection of the additional capacitor 727 described hereinabove with reference to FIG. 32. The description of the circuit configuration is omitted, because the description is repeated.

For one pixel column of the pixel array section 20, voltage supply lines 30A and 30B are wired in the vertical direction. Furthermore, to the first tap TA of a plurality of pixels 51 arrayed in the vertical direction, a predetermined voltage MIX0 is supplied through the voltage supply line 30A, and to the second tap B, another predetermined voltage MIX1 is supplied through the voltage supply line 30B.

Furthermore, for one pixel array of the pixel array section 20, four vertical signal lines 29A to 29D are wired in the vertical direction.

In the pixel column of the pixel $51_1$ and the pixel $51_2$, the vertical signal line 29A transmits, for example, a pixel signal at the first tap TA of the pixel $51_1$ to the column processing section 23 (FIG. 1), the vertical signal line 29B transmits a pixel signal of the second tap TB of the pixel $51_1$ to the column processing section 23, the vertical signal line 29C transmits a signal of the first tap TA of the pixel $51_2$, which is in the same column as that of the pixel $51_1$ and neighbors with the pixel $51_1$, to the column processing section 23, and the vertical signal line 29D transmits a pixel signal at the second tap TB of the pixel $51_2$ to the column processing section 23.

In the pixel column of the pixel $51_3$ and the pixel $51_4$, the vertical signal line 29A transmits, for example, a pixel signal at the first tap TA of the pixel $51_3$ to the column processing section 23 (FIG. 1), the vertical signal line 29B transmits a pixel signal of the second tap TB of the pixel $51_3$ to the column processing section 23, the vertical signal line 29C transmits a signal of the first tap TA of the pixel $51_4$, which is in the same column as that of the pixel $51_3$ and neighbors with the pixel $51_3$, to the column processing section 23, and the vertical signal line 29D transmits a pixel signal at the second tap TB of the pixel $51_4$ to the column processing section 23.

On the other hand, in the horizontal direction of the pixel array section 20, a control line 841 for transmitting a driving signal RST to the reset transistor 723, another control line 842 for transmitting a driving signal TRG to the transfer transistor 721, a further control line 843 for transmitting a driving signal FDG to the switching transistor 728 and a still further control line 844 for transmitting a selection signal SEL to the selection transistor 725 are arranged in a unit of a pixel row.

As the driving signal RST, driving signal TRG, driving signal TRG and selection signal SEL, same signals are supplied from the vertical driving section 22 to the pixels 51 of two rows neighboring with each other in the vertical direction.

By arranging four vertical signal lines 29A to 29D for one pixel column in the pixel array section 20 in this manner, pixel signals can be read out simultaneously in a unit of two rows.

Figure 70:
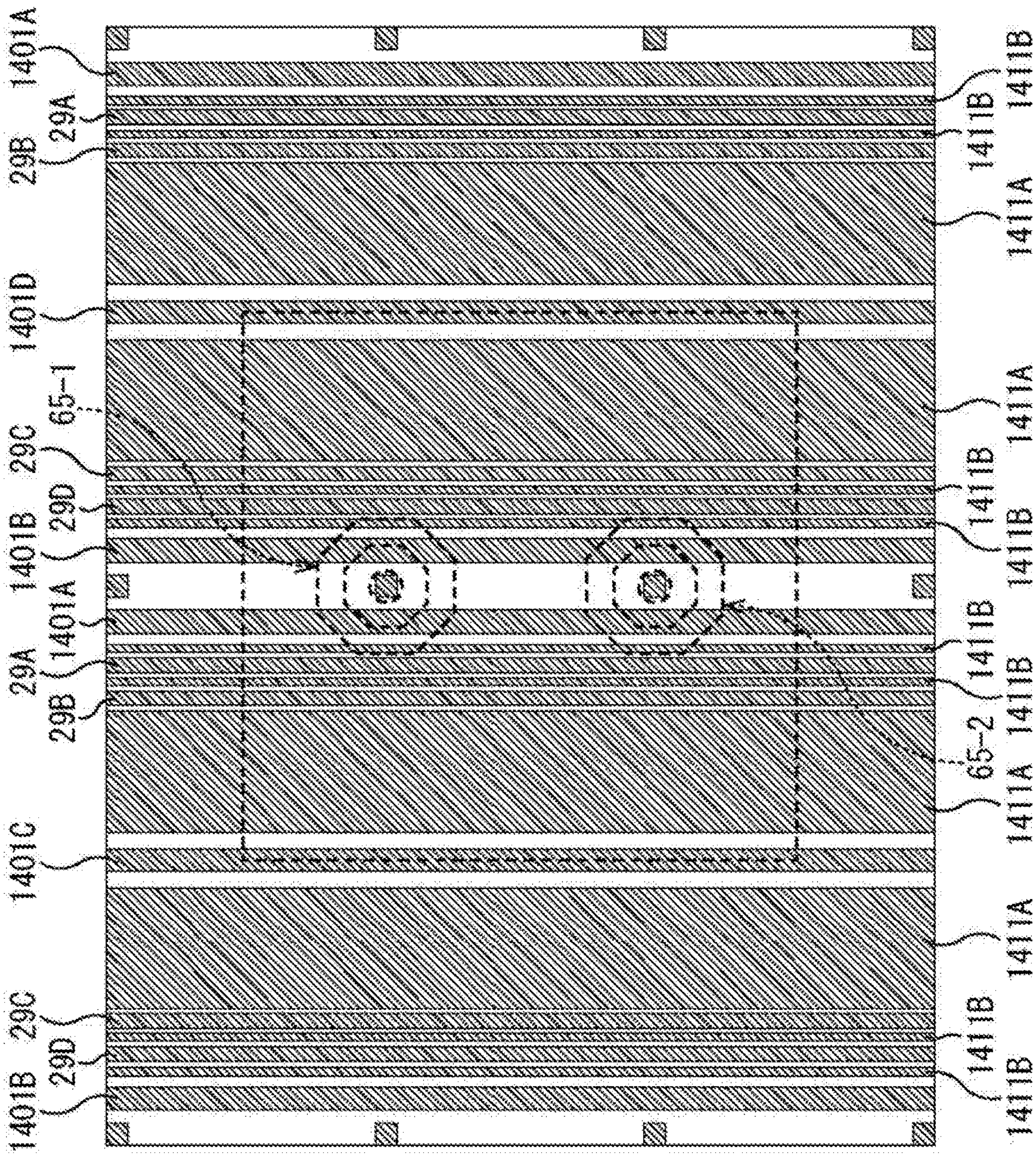
FIG. 70 is a view depicting a wiring layout in which four vertical signal lines are arranged.

FIG. 70 depicts a layout of the metal film M3 of the third layer in the multilayer wiring layer 811 in the case where four vertical signal lines 29A to 29D are arranged for one pixel column.

More specifically, FIG. 70 is a modification of the layout of the metal film M3 depicted in C of FIG. 42.

In the layout of the metal film M3 of FIG. 70, four vertical signal lines 29A to 29D are arranged for one pixel column. Furthermore, for one pixel column, four power supply lines 1401A to 1401D for supplying the power supply voltage VDD are arranged.

Note that, in FIG. 70, for reference, the region of the pixel 51 and the regions of the signal extraction portions 65-1 and 65-2 having an octagonal shape depicted in FIG. 11 are indicated by broken lines. This similarly applies also to FIGS. 71 to 76 hereinafter described.

In the layout of the metal film M3 of FIG. 70, VSS wires (ground wires) 1411 of the GND potential are arranged next to the power supply lines 1401A to 1401D. The VSS wires 1411 include VSS wires 1411B of a small width arranged next to the vertical signal lines 29A to 29D, and VSS wires 1411A of a great width arranged between the vertical signal line 29B and the power supply line 1401C at a pixel boundary portion and between the vertical signal line 29C and the power supply line 1401D at a pixel boundary portion.

In order to increase the stability of a signal, it is effective to increase the power supply voltage VDD to be supplied to the power supply lines 1401 or to increase the voltage MIX0 or MIX1 to be supplied to the voltage supply lines 30A and 30B. However, this increases current and deteriorates the reliability of the wiring system. Therefore, as depicted in FIG. 70, by providing, in at least one of VSS wires 1411 for one pixel column, the VSS wires 1411A of a line thickness greater than that of the power supply line 1401, the current density can be reduced and the reliability of the wiring system can be improved. FIG. 70 depicts an example in which two VSS wires 1411A are provided symmetrically in the pixel region for one pixel column.

Furthermore, in the layout of FIG. 70, next to each of the vertical signal lines 29A to 29D, a VSS wire 1411 (1411A or 1411B) is arranged. As a consequence, the vertical signal line 29 can make it less susceptible to potential fluctuations from the outside.

Note that, not only in the metal film M3 of the third layer of the multilayer wiring layer 811 depicted in FIG. 70 but also in the metal films of the other layers, neighboring wires of a signal line, a power supply line and a control line can be formed as VSS wires. For example, also for the control lines 841 to 844 of the metal film M2 of the second layer depicted in B of FIG. 42, VSS wires can be arranged on the opposite sides of each of the control lines 841 to 844. As a consequence, the influence of a potential fluctuation from the outside on the control lines 841 to 844 can be reduced.

Figure 71:
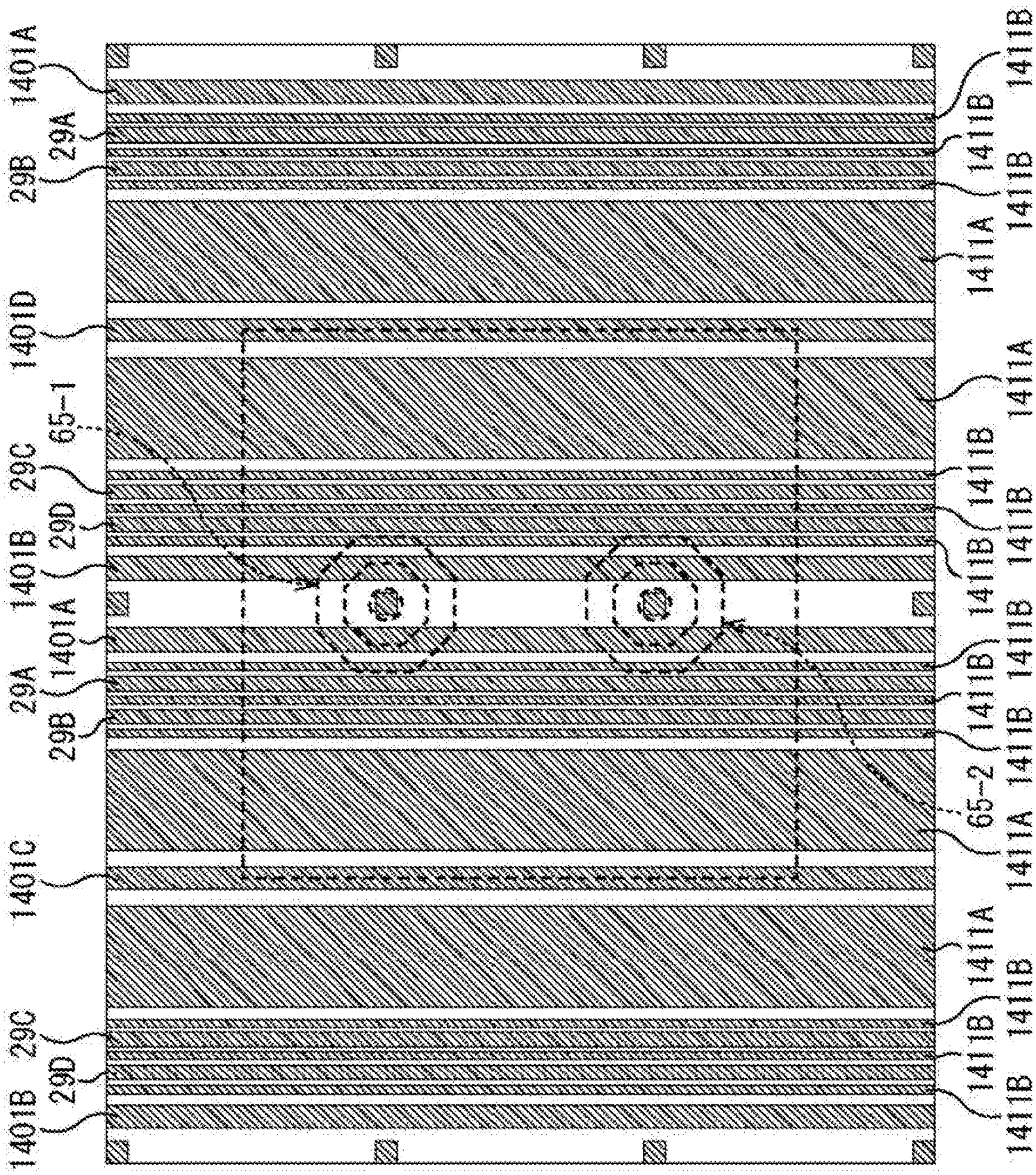
FIG. 71 is a view depicting a first modification of the wiring layout in which four vertical signal lines are arranged.

FIG. 71 depicts a first example of a modification of the layout of the metal film M3 of the third layer in the multilayer wiring layer 811 in the case where four vertical signal lines 29A to 29D are arranged for one pixel column.

The layout of the metal film M3 of FIG. 71 is different from the layout of the metal film M3 depicted in FIG. 70 in that the VSS wires 1411 individually next to the four vertical signal lines 29A to 29D have an equal line width.

More particularly, in the layout of the metal film M3 of FIG. 70, a VSS wires 1411A of a greater line width and a VSS wire 1411B of a smaller line width are arranged on the opposite sides of the vertical signal line 29C, and the VSS wires 1411A of a greater line width and the VSS wire 1411B of a smaller line width are arranged also on the opposite sides of the vertical signal line 29B.

In contrast, in the layout of the metal film M3 of FIG. 71, the VSS wires 1411B of a smaller line width are arranged on the opposite sides of the vertical signal line 29C, and the VSS wires 1411B of a smaller line width are arranged also on the opposite sides of the vertical signal line 29B. Also, on the opposite sides of the other vertical signal lines 29A and 29D, the VSS wires 1411B of a smaller line width are arranged. The VSS wires 1411B on the opposite sides of the four vertical signal lines 29A to 29D have an equal line width.

By making the line widths of the VSS wires 1411 on the opposite sides of the 29 equal to each other, the degree of influence of crosstalk can be uniformized and a characteristic dispersion can be reduced.

Figure 72:
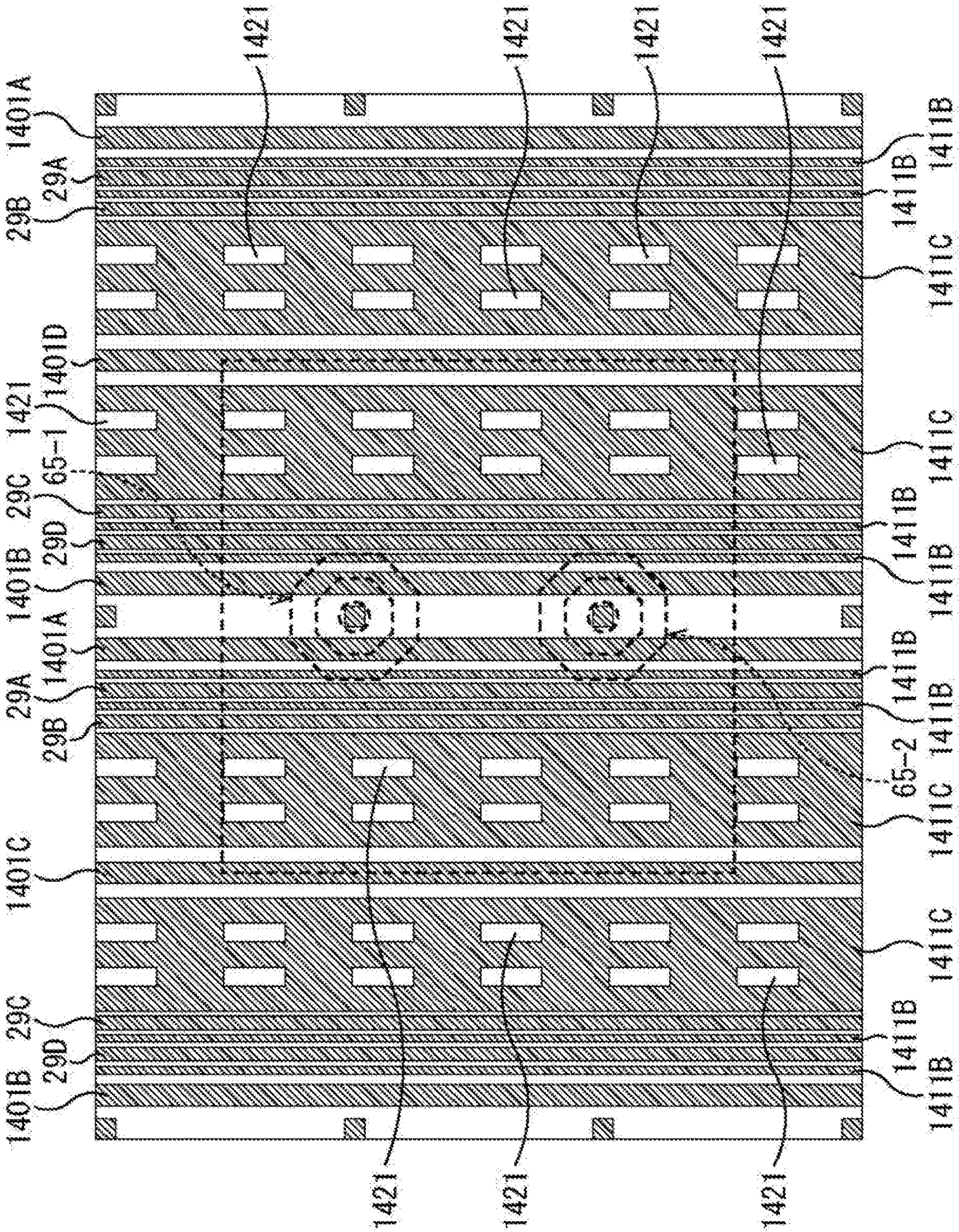
FIG. 72 is a view depicting a second modification of the wiring layout in which four vertical signal lines are arranged.

FIG. 72 depicts a second modification example of the layout of the metal film M3 of the third layer in the multilayer wiring layer 811 in the case where four vertical signal lines 29A to 29D are arranged for one pixel column.

The layout of the metal film M3 of FIG. 72 is different from the layout of the metal film M3 depicted in FIG. 70 in that the VSS wires 1411A of a greater line width are replaced by VSS wires 1411C on which a plurality of gaps 1421 are provided regularly on the inner side thereof.

More specifically, the VSS wire 1411C has a line width greater than that of the power supply line 1401 and has a plurality of gaps 1421 repeatedly arrayed in the vertical direction in the inside thereof in a predetermined cycle. Although, in the example of FIG. 72, the shape of the gap 1421 is a rectangular shape, this is not limited to a rectangular shape but may be a circular shape or a polygonal shape.

By providing a plurality of gaps 1421 on the inner side of the wiring region, the stability when the wide VSS wire 1411C is formed (processed) can be improved.

Note that, while FIG. 72 depicts a layout in which the VSS wire 1411A of the metal film M3 depicted in FIG. 70 is replaced by the VSS wire 1411C, it is a matter of course that also a layout in which the VSS wire 1411A of the metal film M3 depicted in FIG. 71 is replaced by the VSS wire 1411C.

<Different Example of Layout of Pixel Transistor>

Now, a modification of the arrangement example of the pixel transistor depicted in B of FIG. 44 is described with reference to FIG. 73.

Figure 73:
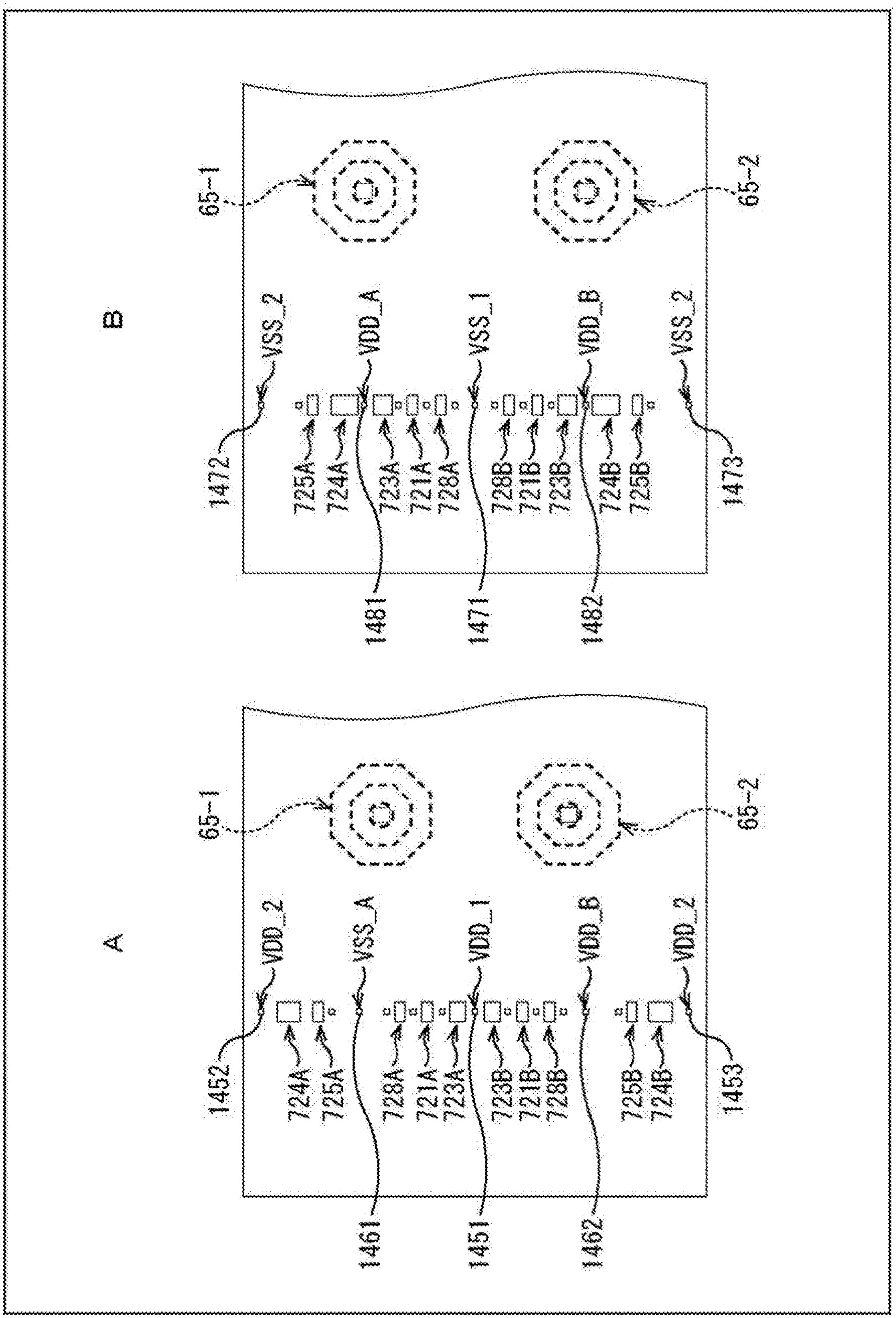
FIG. 73 is a view depicting a modification of an example of arrangement of pixel transistors.

A of FIG. 73 is a view depicting arrangement of the pixel transistor depicted in B of FIG. 44 again.

On the other hand, B of FIG. 73 depicts a modification of the arrangement of the pixel transistor.

In A of FIG. 73, the gate electrodes of reset transistors 723A and 723B, transfer transistors 721A and 721B, switching transistors 728A and 728B, selection transistors 725A and 725B and amplification transistors 724A and 724B are formed, with reference to an intermediate line (not depicted) between the two signal extraction portions 65-1 and 65-2, in order toward the outer side from the side near to the intermediate line as described hereinabove with reference to B of FIG. 44.

In the case of this arrangement of the pixel transistor, a contact 1451 for the first power supply voltage VDD (VDD_1) is arranged between the reset transistors 723A and 723B, and contacts 1452 and 1453 for the second power supply voltage VDD (VDD_2) are arranged on the outer sides of the gate electrodes of the amplification transistors 724A and 724B.

Furthermore, a contact 1461 for the first VSS wire (VSS_A) is arranged between gate electrodes of the selection transistor 725A and the switching transistor 728A, and a contact 1462 for the second VSS wire (VSS_B) is arranged between the gate electrodes of the selection transistor 725B and the switching transistor 728B.

In the case of such arrangement of the pixel transistor, the four power supply lines 1401A to 1401D are required for one pixel column as depicted in FIGS. 70 to 72.

On the other hand, in B of FIG. 73, with reference to an intermediate line (not depicted) between the two signal extraction portions 65-1 and 65-2, the gate electrodes of switching transistors 728A and 728B, transfer transistors 721A and 721B, reset transistors 723A and 723B, amplification transistors 724A and 724B and selection transistors 725A and 725B are formed in order from the side near to the intermediate line toward the outer sides.

In the case of this arrangement of the pixel transistor, a contact 1471 for the first VSS wire (VSS_1) is arranged between the switching transistors 728A and 728B, and contacts 1472 and 1473 for the second VSS wire (VSS_2) are arranged on the outer sides of the gate electrodes of the selection transistors 725A and 725B.

Furthermore, a contact 1481 for the first power supply voltage VDD (VDD_A) is arranged between the gate electrodes of the amplification transistor 724A and the reset transistor 723A, and a contact 1482 for the second power supply voltage VDD (VDD_B) is arranged between the gate electrodes of the amplification transistor 724B and the reset transistor 723B.

In the case of such arrangement of the pixel transistor, the number of contacts for the power supply voltages can be reduced in comparison with the pixel transistor layout of A of FIG. 73, and therefore, the circuitry can be simplified. Furthermore, also the wires for the power supply lines 1401 for wiring the pixel array section 20 can be reduced, and two power supply line 1401 can be configured for one pixel column.

Furthermore, in the pixel transistor layout of B of FIG. 73, the contact 1471 for the first VSS wire (VSS_1) between the switching transistors 728A and 728B can be omitted. This can reduce the density of transistors in the vertical direction. Furthermore, by decreasing contacts for the VSS wires, current flowing between the voltage supply line 741 (FIGS. 33 and 34) for applying the voltage MIX0 or MIX1 and the VSS wire can be reduced.

In the case where the contact 1471 for the first VSS wiring (VSS_1) is omitted, the amplification transistors 724A and 724B can be formed large in the vertical direction. This can reduce noise of the pixel transistors and decreases the dispersion of signals.

Otherwise, in the pixel transistor layout of B of FIG. 73, the contacts 1472 and 1473 for the second VSS wire (VSS_2) may be omitted. This can decrease the density of pixel transistors in the longitudinal direction. Furthermore, by decreasing the contacts fir the VSS wires, current flowing between the voltage supply line 741 (FIGS. 33 and 34) for applying the voltage MIX0 or MIX1 and the VSS wire can be reduced.

In the case where the contacts 1472 and 1473 for the second VSS wire (VSS_2) are omitted, the amplification transistors 724A and 724B can be formed larger in the vertical direction. This can reduce noise of the pixel transistors and decreases the dispersion of signals.

Figure 74:
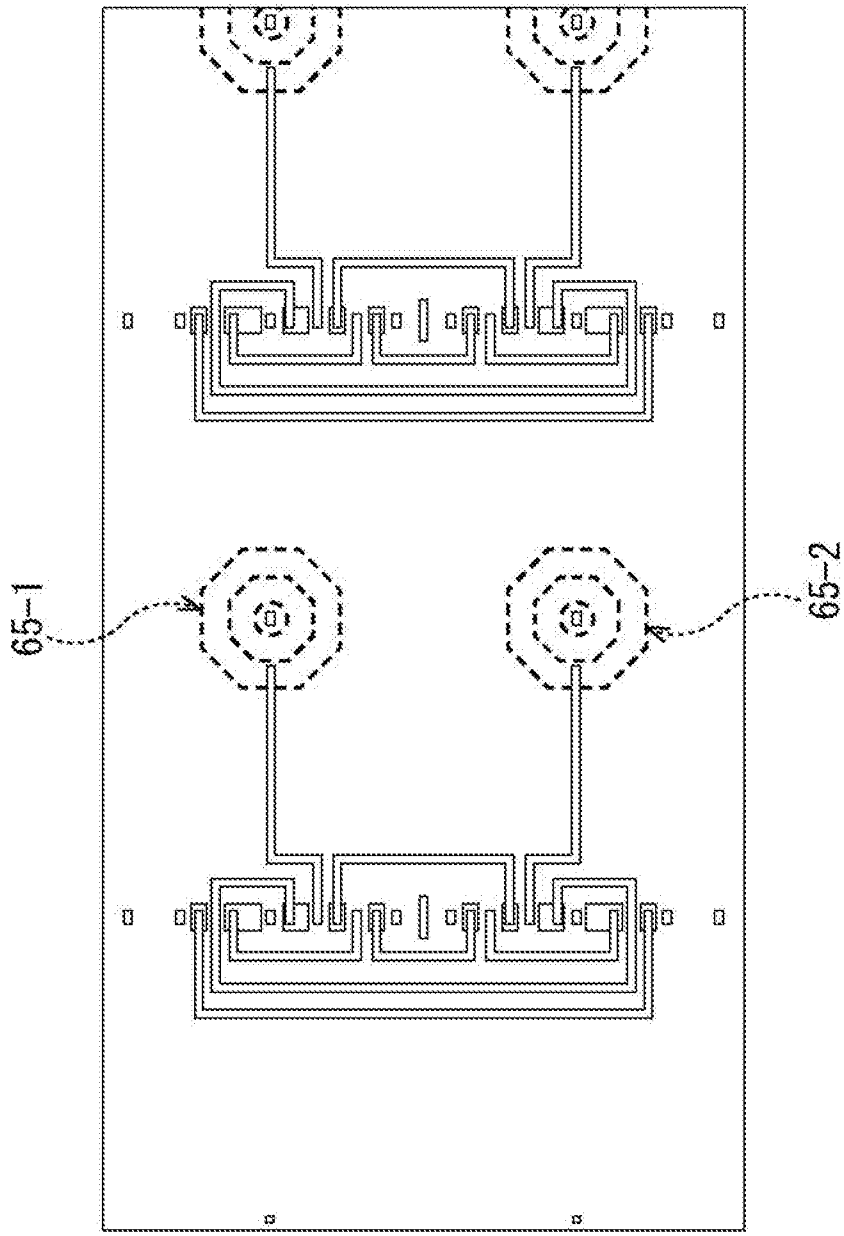
FIG. 74 is a view depicting a connection layout of a wiring layout in a pixel transistor layout of B of FIG. 73.

FIG. 74 depicts a wiring layout for connecting transistors Tr of the metal layer M1 in the pixel transistor layout of B of FIG. 73. FIG. 74 corresponds to wires for connecting the transistors Tr of the metal layer M1 depicted in C of FIG. 44. The wires that connect the transistors Tr to each other may be connected across some other wiring layer such as the metal film M2 or M3.

Figure 75:
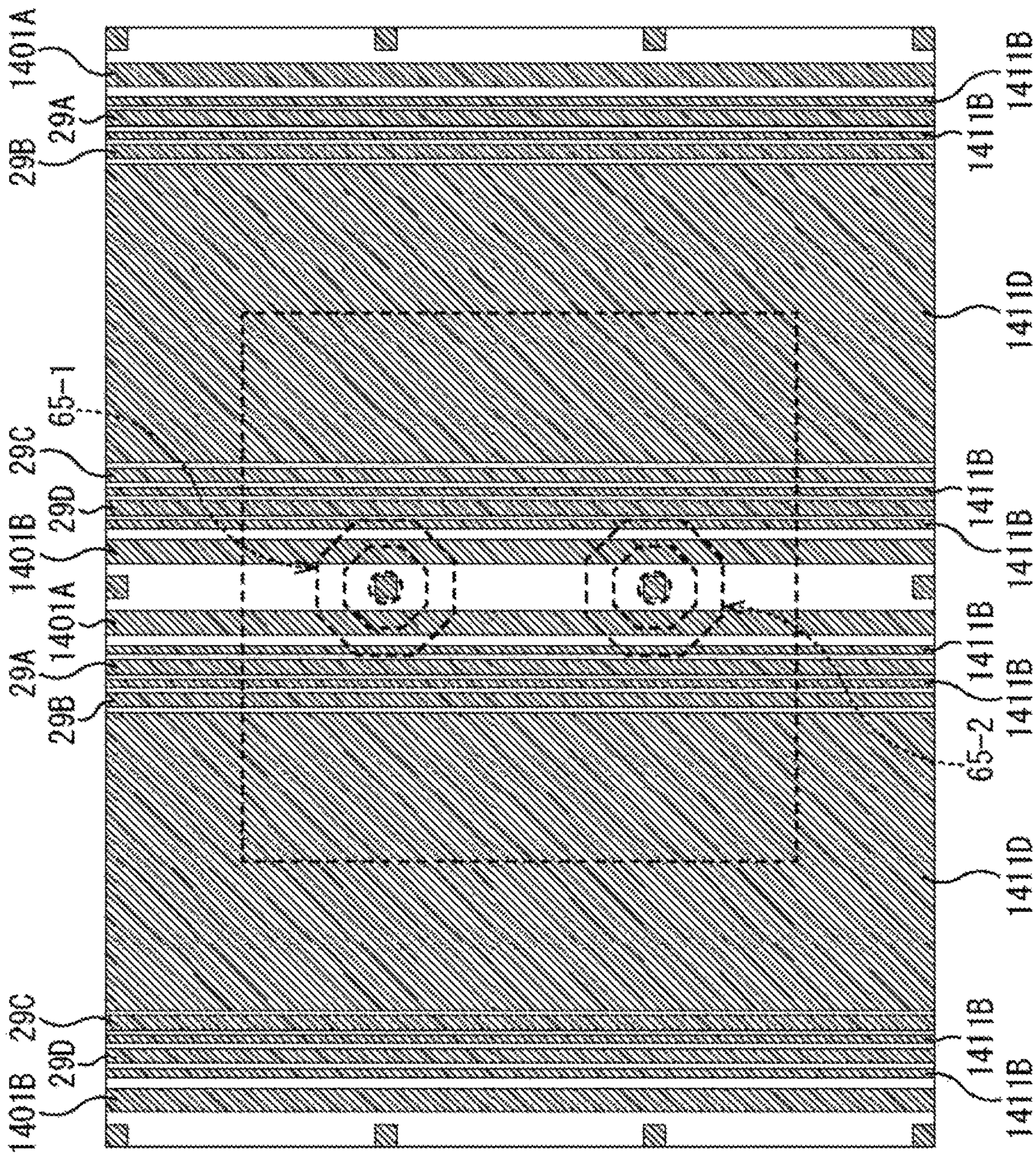
FIG. 75 is a view depicting a connection layout of the wiring layout in the pixel transistor layout of B of FIG. 73.

FIG. 75 depicts a layout of the metal film M3 of the third layer in the multilayer wiring layer 811 in the case where the pixel transistor layout of B of FIG. 73 is applied and two power supply lines 1401 are wired for one pixel column.

In FIG. 75, portions corresponding to those in FIG. 70 are denoted by like referenced characters, and description of them is suitably omitted.

If the layout of the metal film M3 of FIG. 75 is compared with the layout of the metal film M3 of FIG. 70, then the two power supply lines 1401C and 1401D are omitted from among the four power supply lines 1401A to 1401D of FIG. 70 and the VSS wires 1411A of a great line width are replaced by VSS wires 1411D of a greater line width.

By increasing the area (line width) of the VSS wires 1411 in this manner, the current density can be further reduced and the reliability of the wiring can be further improved.

Figure 76:
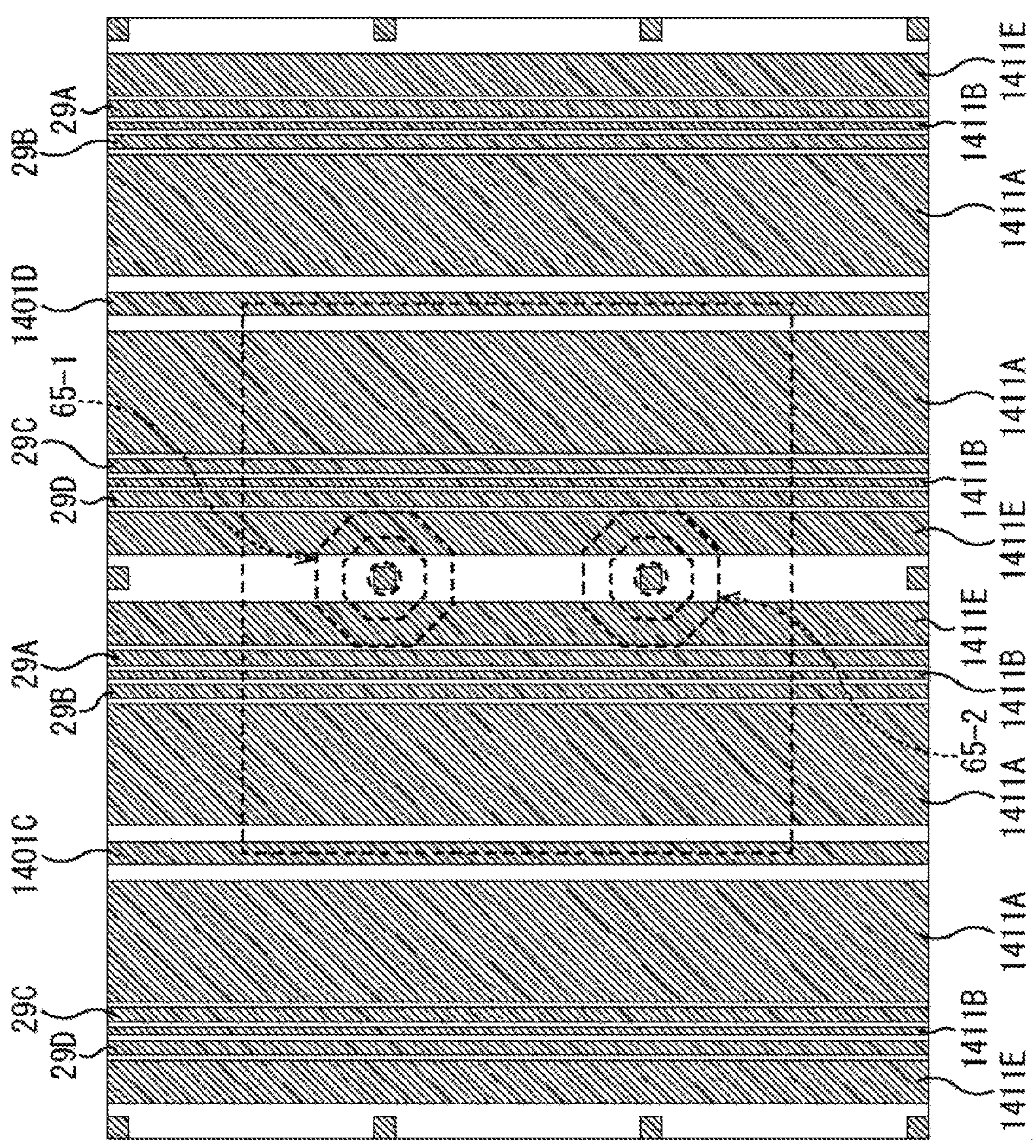
FIG. 76 is a view depicting a wiring layout in which two power supply lines are wired for one pixel column.

FIG. 76 depicts a different layout of the metal film M3 of the third layer in the multilayer wiring layer 811 in the case where the pixel transistor layout of B of FIG. 73 is applied and two power supply lines 1401 are wired for one pixel column.

In FIG. 76, portions corresponding to those in FIG. 70 are denoted by like referenced characters, and description of them is suitably omitted.

If the layout of the metal film M3 of FIG. 76 is compared with the layout of the metal film M3 of FIG. 70, then the power supply lines 1401A and 1401B are omitted from among the four power supply lines 1401A to 1401D of FIG. 70 and are replaced with VSS wires 1411E of a greater line width.

By increasing the area (line width) of the VSS wires 1411 in this manner, the current density can be further reduced and the reliability of the wiring can be further improved.

Note that, while the layouts of the metal layer M3 depicted in FIGS. 75 and 76 are examples in which the layout of the metal film M3 depicted in FIG. 70 is changed to the two power supply lines 1401, it is also possible to change the layouts of the metal film M3 depicted in FIGS. 71 and 72 to the two power supply lines 1401.

More specifically, also for the layout of the metal film M3 of FIG. 71 in which the VSS wires 1411 individually neighboring with the four vertical signal lines 29A to 29D have an equal line width and the layout of the metal film M3 of FIG. 72 in which the VSS wire 1411C in which a plurality of gaps 1421 are provided is applied, the configuration in which change to two power supply lines 1401 is performed is possible.

As a consequence, such an advantageous effect can be further achieved that the degree of influence of crosstalk can be uniformized and a characteristic dispersion can be reduced similarly as in FIG. 71 or that the stability when the VSS wires 1411C of a great width is formed can be improved similarly as in FIG. 72.

<Example of Wiring of Power Supply Lines and VSS Wires>

Figure 77:
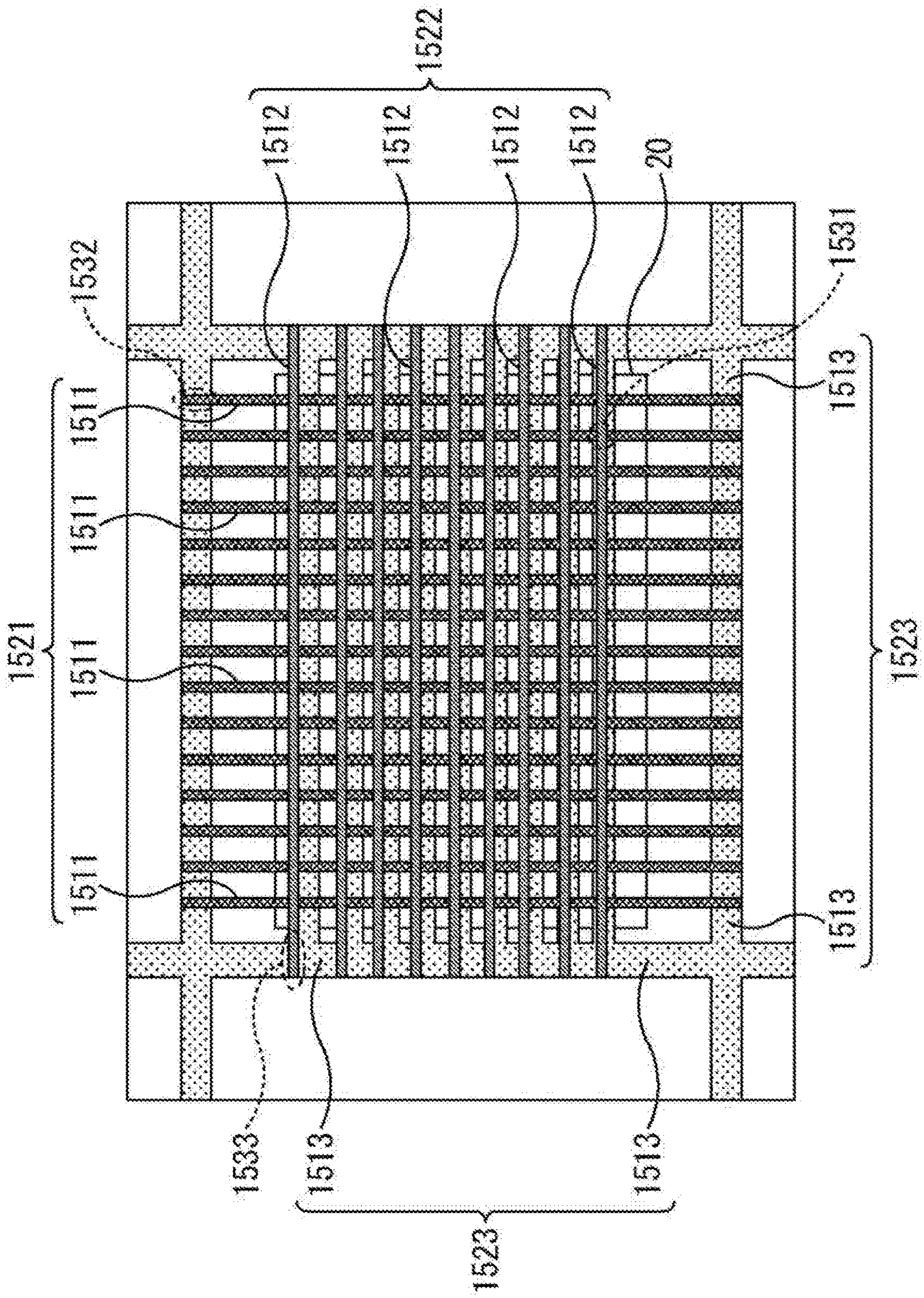
FIG. 77 is a plan view depicting an example of wiring of a VSS wire.

FIG. 77 is a plan view depicting an example of wiring of VSS wires in the multilayer wiring layer 811.

As depicted in FIG. 77, a VSS wire can be formed in a plurality of wiring layers in the multilayer wiring layer 811 like a first wiring layer 1521, a second wiring layer 1522 and a third wiring layer 1523.

In the first wiring layer 1521, for example, a plurality of vertical wires 1511 extending in the vertical direction in the pixel array section 20 are arranged at predetermined distances in the horizontal direction, and in the second wiring layer 1522, for example, a plurality of horizontal wires 1512 extending in the horizontal direction in the pixel array section 20 are arranged at predetermined direction in the vertical direction. Furthermore, in the third wiring layer 1523, for example, a wire 1513 is arranged with a line width greater than that of the vertical wires 1511 and the horizontal wires 1512 such that it extends in the vertical direction or the horizontal direction so as to surround at least the outer side of the pixel array section 20, and is connected to the GND potential. The wire 1513 is wired also in the pixel array section 20 such that it connects portions of the wire 1513, which are opposed to each other, to each other in the outer periphery.

The vertical wires 1511 of the first wiring layer 1521 and the horizontal wires 1512 of the second wiring layer 1522 are connected to each other through vias at overlapping portions 1531 at which they overlap with each other as viewed in plan.

Furthermore, the vertical wires 1511 of the first wiring layer 1521 and the wire 1513 of the third wiring layer 1523 are connected to each other through vias at overlapping portions 1532 at which they overlap with each other as viewed in plan.

Furthermore, the horizontal wires 1512 of the second wiring layer 1522 and the wire 1513 of the third wiring layer 1523 are connected to each other through vias at overlapping portions 1533 at which they overlap with each other as viewed in plan.

Note that, in FIG. 77, in order to prevent the illustration from being complicated, reference signs are applied to only one location in the overlapping portions 1531 to 1533.

In this manner, VSS wires can be formed in a plurality of wiring layers of the multilayer wiring layer 811 and wired such that the vertical wires 1511 and the horizontal wires 151 form a lattice pattern as viewed in plan in the pixel array section 20. This can reduce propagation delay in the pixel array section 20 and suppress a characteristic dispersion.

Figure 78:
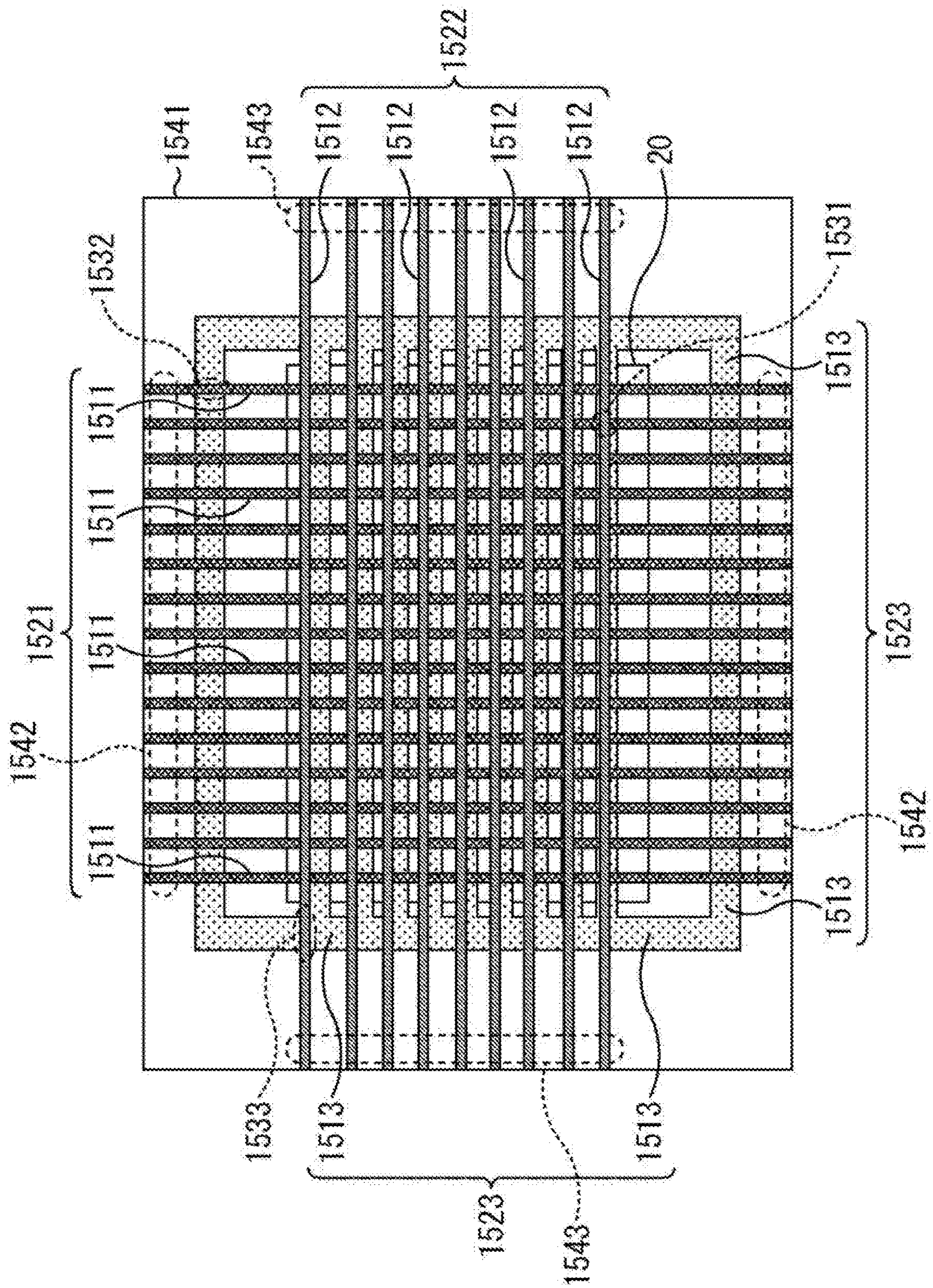
FIG. 78 is a plan view depicting an example of wiring of a VSS wire.

FIG. 78 is a plan view depicting a different example of wiring of VSS wires in the multilayer wiring layer 811.

Referring to FIG. 78, portions corresponding to those in FIG. 77 are denoted by like reference signs, and description of them is suitably omitted.

Although, in FIG. 77, the vertical wires 1511 of the first wiring layer 1521 and the horizontal wires 1512 of the second wiring layer 1522 are not formed on the outer side of the wire 1513 formed on the outer periphery of the pixel array section 20, in FIG. 78, they are formed such that they extend to the outer side of the wire 1513 on the outer periphery of the pixel array section 20. Furthermore, each of the vertical wires 1511 is connected to the GND potential in peripheral portions 1542 of the substrate 1541 on the outside of the pixel array section 20, and each of the horizontal wires 1512 is connected to the GND potential in peripheral portions 1543 of the substrate 1541 on the outside of the pixel array section 20.

More specifically, although, in FIG. 77, the vertical wires 1511 of the first wiring layer 1521 and the horizontal wires 1512 of the second wiring layer 1522 are connected to the GND potential through the wire 1513 on the outer periphery, in FIG. 78, also the vertical wires 1511 and the horizontal wires 1512 themselves are additionally connected directly to the GND potential. Note that the region in which the vertical wires 1511 and the horizontal wires 1512 themselves are connected to the GND potential may be on the four sides of the substrate 1541 like the peripheral portions 1542 and 1543 of FIG. 78 or may be on predetermined one, two or three sides.

In this manner, the VSS wires can be formed in a plurality of wiring layers of the multilayer wiring layer 811 and can be wired such that they form a lattice pattern as viewed in plan in the pixel array section 20. This can reduce propagation delay in the pixel array section 20 and suppress a characteristic dispersion.

Note that, although FIGS. 77 and 78 illustrate wiring examples of VSS wires, also power supply lines can be wired similarly.

The VSS wires 1411 and the power supply lines 1401 described above with reference to FIGS. 70 to 76 can be arranged like the VSS wires or the power supply lines depicted in FIGS. 77 and 78 in a plurality of wiring layers of the multilayer wiring layer 811. The VSS wires 1411 and the power supply lines 1401 described with reference to FIGS. 70 to 76 can be applied to any of the embodiments described herein.

<First Method of Pupil Correction>

Now, a first method of pupil correction of the light reception device 1 is described.

The light reception device 1 that is a CAPD sensor allows pupil correction of displacing the on-chip lens 62 or the inter-pixel shading film 63 toward the center of the plane of the pixel array section 20 in response to a difference in incident angle of a chief ray according to an in-plane position of the pixel array section 20.

Figure 79:
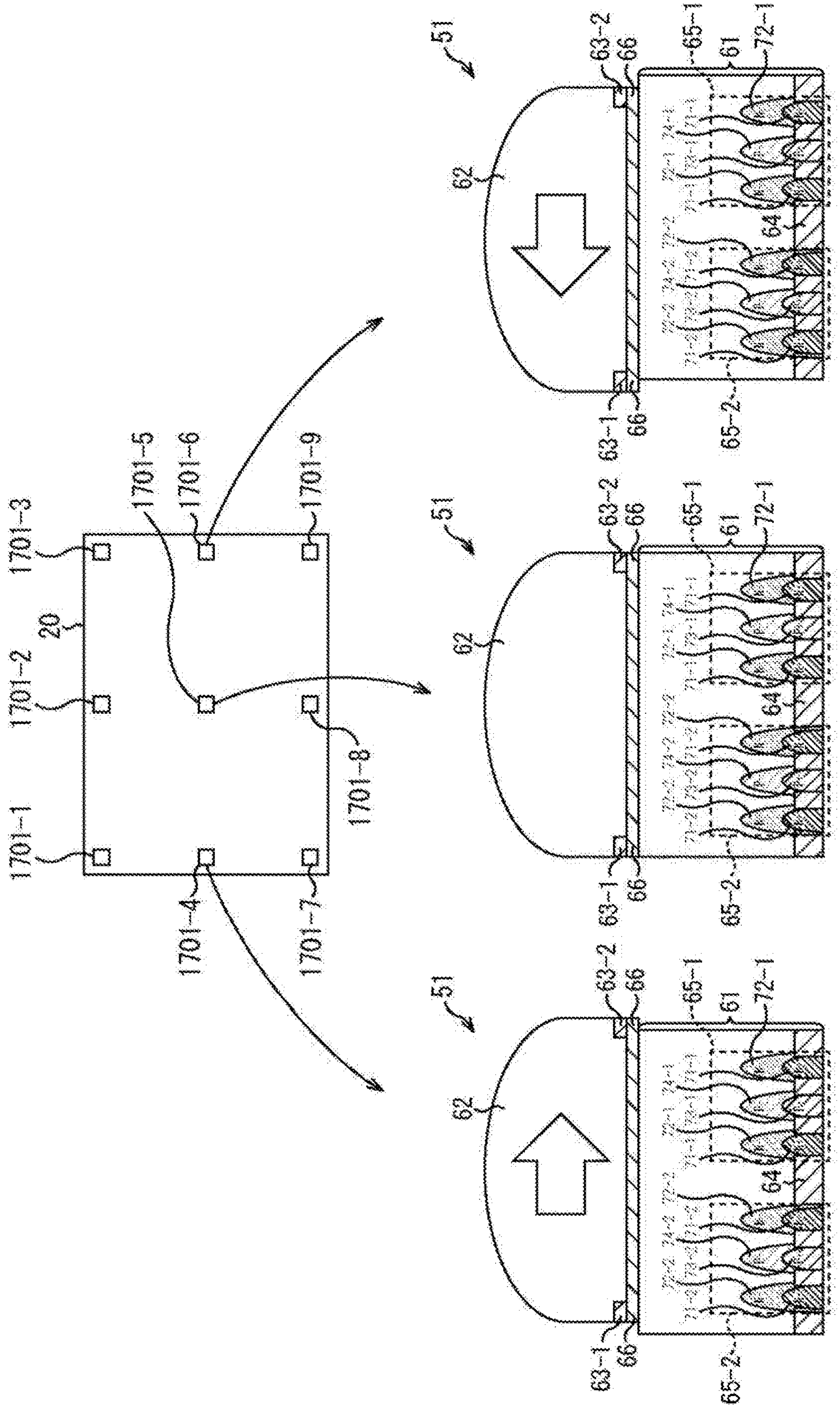
FIG. 79 is a view illustrating a first method for pupil correction.

More specifically, although, at the pixel 51 at a position 1701-5 at a central portion of the pixel array section 20 from among positions 1701-1 to 1701-9 of the pixel array section 20 as depicted in FIG. 79, the center of the on-chip lens 62 coincides with the center between the signal extraction portions 65-1 and 65-2 formed on the substrate 61, at the pixels 51 at the positions 1701-1 to 1701-4 and 1701-6 to 1701-9, the center of the on-chip lens 62 is arranged in a displaced relationship to the plane center side of the pixel array section 20. Also, the inter-pixel shading films 63-1 and 63-2 are arranged in a displaced relationship to the plane center side of the pixel array section 20 similarly to the on-chip lens 62.

Figure 80:
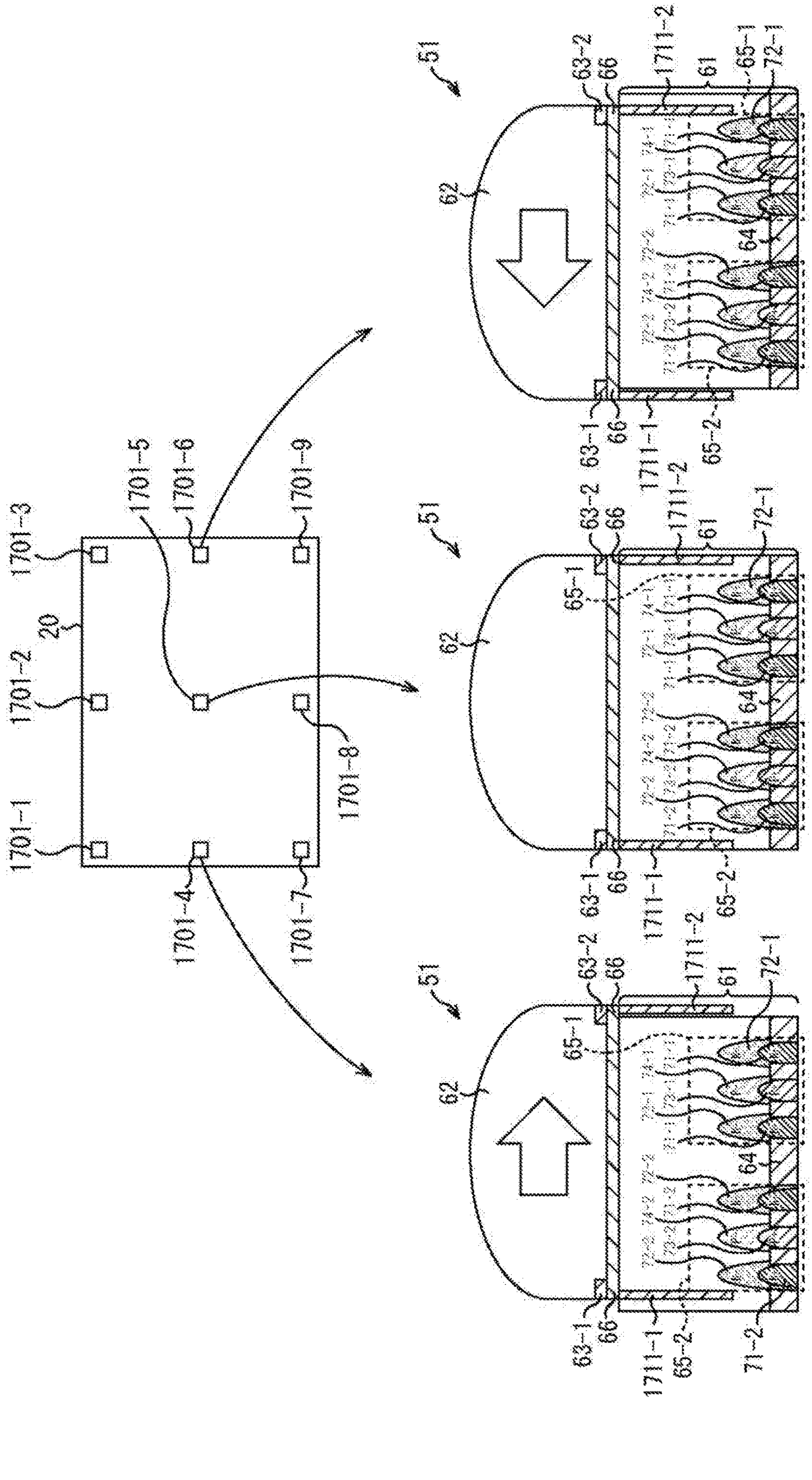
FIG. 80 is a view illustrating the first method for pupil correction.

Furthermore, in the case where, on the pixel 51, DTIs 1711-1 and 1711-2 having a trench (groove) formed therein to a predetermined depth in the substrate depthwise direction from the rear face side that is the on-chip lens 62 side of the substrate 61 are formed at a pixel boundary portion in order to prevent incidence of incident light to neighboring pixels as depicted in FIG. 80, in the pixels 51 at the positions 1701-1 to 1701-4 and 1701-6 to 1701-9 on the peripheral portion of the pixel array section 20, also the DTIs 1711-1 and 1711-2 are arranged in a displaced relationship to the plane center side of the pixel array section 20 in addition to the on-chip lens 62 and the inter-pixel shading films 63-1 and 63-2.

Figure 81:
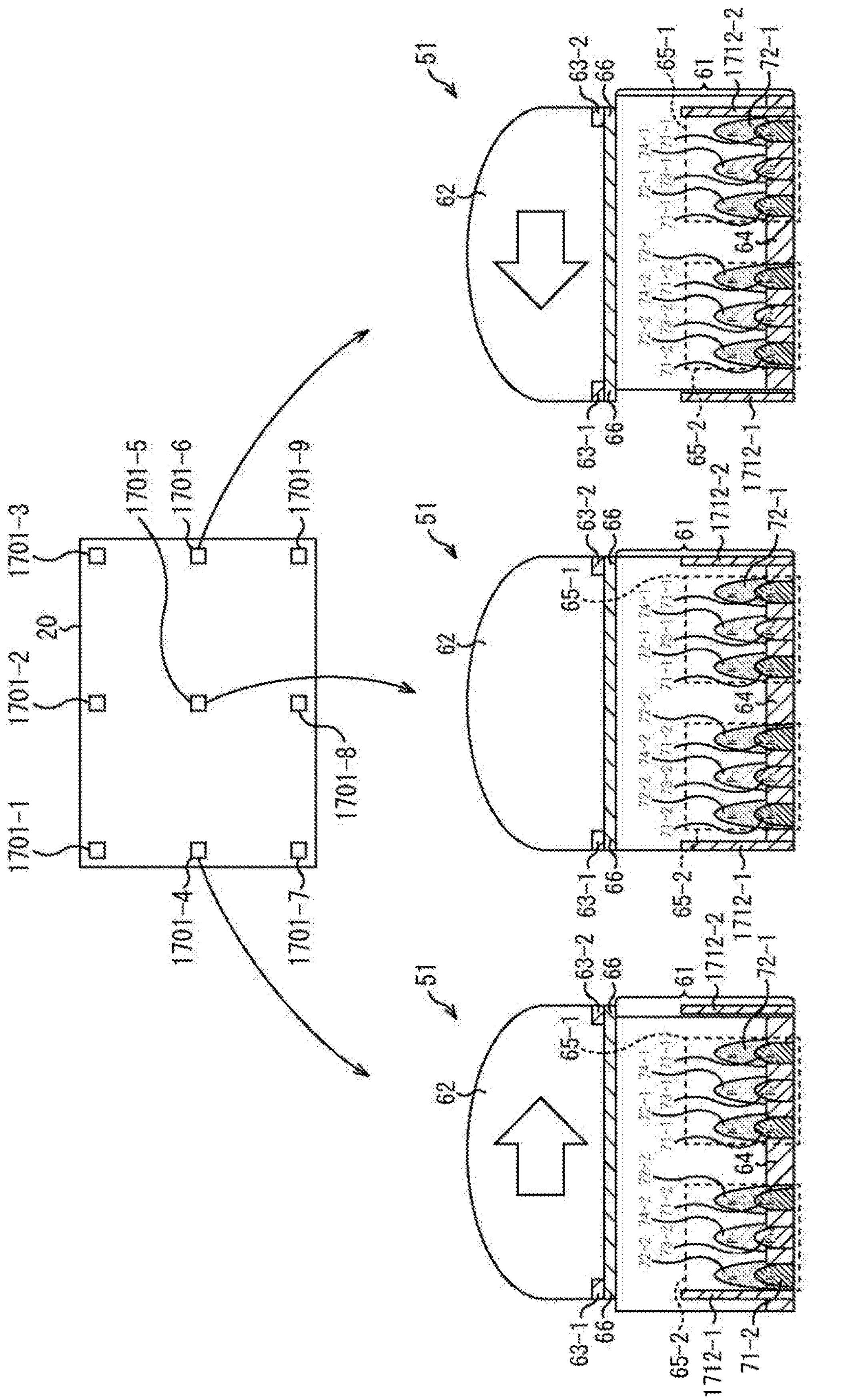
FIG. 81 is a view illustrating the first method for pupil correction.

Alternatively, in the case where, on the pixel 51, DTIs 1712-1 and 1712-2 having a trench (groove) formed therein to a predetermined depth in the substrate depthwise direction from the front face side that is the multilayer wiring layer 811 side of the substrate 61 are formed at a pixel boundary portion in order to prevent incidence of incident light to neighboring pixels as depicted in FIG. 81, in the pixels 51 at the positions 1701-1 to 1701-4 and 1701-6 to 1701-9 on the peripheral portion of the pixel array section 20, also the DTIs 1712-1 and 1712-2 are arranged in a displaced relationship to the plane center side of the pixel array section 20 in addition to the on-chip lens 62 and the inter-pixel shading films 63-1 and 63-2.

Note that it is also possible to apply a configuration that, as a pixel separation portion for separating the substrates 61 of neighboring pixels from each other to prevent incidence of incident light to neighboring pixels, through separation portions that extend through the substrates 61 to separate neighboring pixels from each other are provided in place of the DTIs 1711-1 and 1711-2, and 1712-1 and 1712-2. Also, in this case, in the pixels 51 at the positions 1701-1 to 1701-4 and 1701-6 to 1701-9 on the peripheral portion of the pixel array section 20, the through separation portions are arranged in a displaced relationship to the plane center side of the pixel array section 20.

Although it is possible to adjust a chief ray to the center in each pixel by displacing the on-chip lens 62 to the plane center side of the pixel array section 20 together with the inter-pixel shading film 63 and so forth as depicted in FIGS. 79 to 81, in the light reception device 1 that is a CAPD center, since modulation is performed by applying a voltage between two signal extraction portions 65 (taps) such that current flows, the optimum incident position differs among different pixels. Therefore, for the light reception device 1, different from optical pupil correction that is performed in an image sensor, an optimum pupil correction technology in distance measurement is required.

A difference between pupil correction performed by the light reception device 1 that is a CAPD sensor and pupil correction performed by an image sensor is described with reference to FIG. 82.

Figure 82:
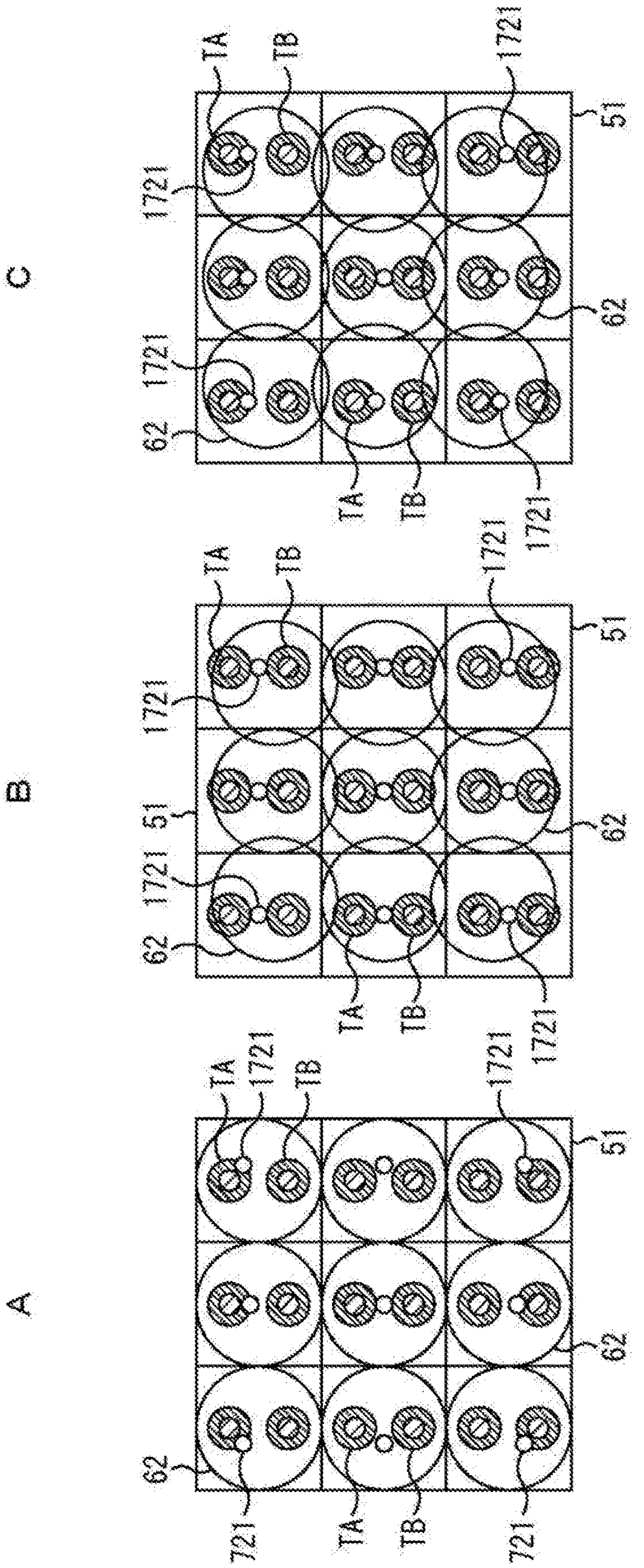
FIG. 82 is a view illustrating the first method for pupil correction.

Note that, in A to C of FIG. 82, nine pixels 51 of 3×3 indicate pixels 51 corresponding to the positions 1701-1 to 1701-9 of the pixel array section 20 of FIGS. 79 to 81.

A of FIG. 82 indicates a position of an on-chip lens 62 and a position 1721 of a chief ray on the substrate front face side in the case where pupil correction is not performed.

In the case where pupil correction is not performed, in the pixel 51 at any of the positions 1701-1 to 1701-9 in the pixel array section 20, the on-chip lens 62 is arranged such that the center thereof coincides with the centers of the two taps in the pixel, more specifically, with the centers of the first tap TA (signal extraction portion 65-1) and the second tap TB (signal extraction portion 65-2). In this case, the position 1721 of a chief ray on the substrate front face side differs among the positions 1701-1 to 1701-9 in the pixel array section 20 as indicated in A of FIG. 82.

In pupil correction performed in an image sensor, the on-chip lens 62 is arranged such that the position 1721 of a chief ray coincides with the centers of the first tap TA and the second tap TB in the pixel 51 at any of the positions 1701-1 to 1701-9 in the pixel array section 20 as indicated in B of FIG. 82. More particularly, the on-chip lens 62 is arranged so as to be displaced to the plane center side of the pixel array section 20 as depicted in FIGS. 79 to 81.

In contrast, in pupil correction performed in the light reception device 1, as depicted in C of FIG. 82, the on-chip lens 62 is arranged to the first tap TA side from the position of the on-chip lens 62 at which the position 1721 of a chief ray is the center positions of the first tap TA and the second tap TB depicted in B of FIG. 82. The displacement amount of the position 1721 of a chief ray between B of FIG. 82 and C of FIG. 82 increases toward the outer peripheral portion from the center position of the pixel array section 20.

Figure 83:
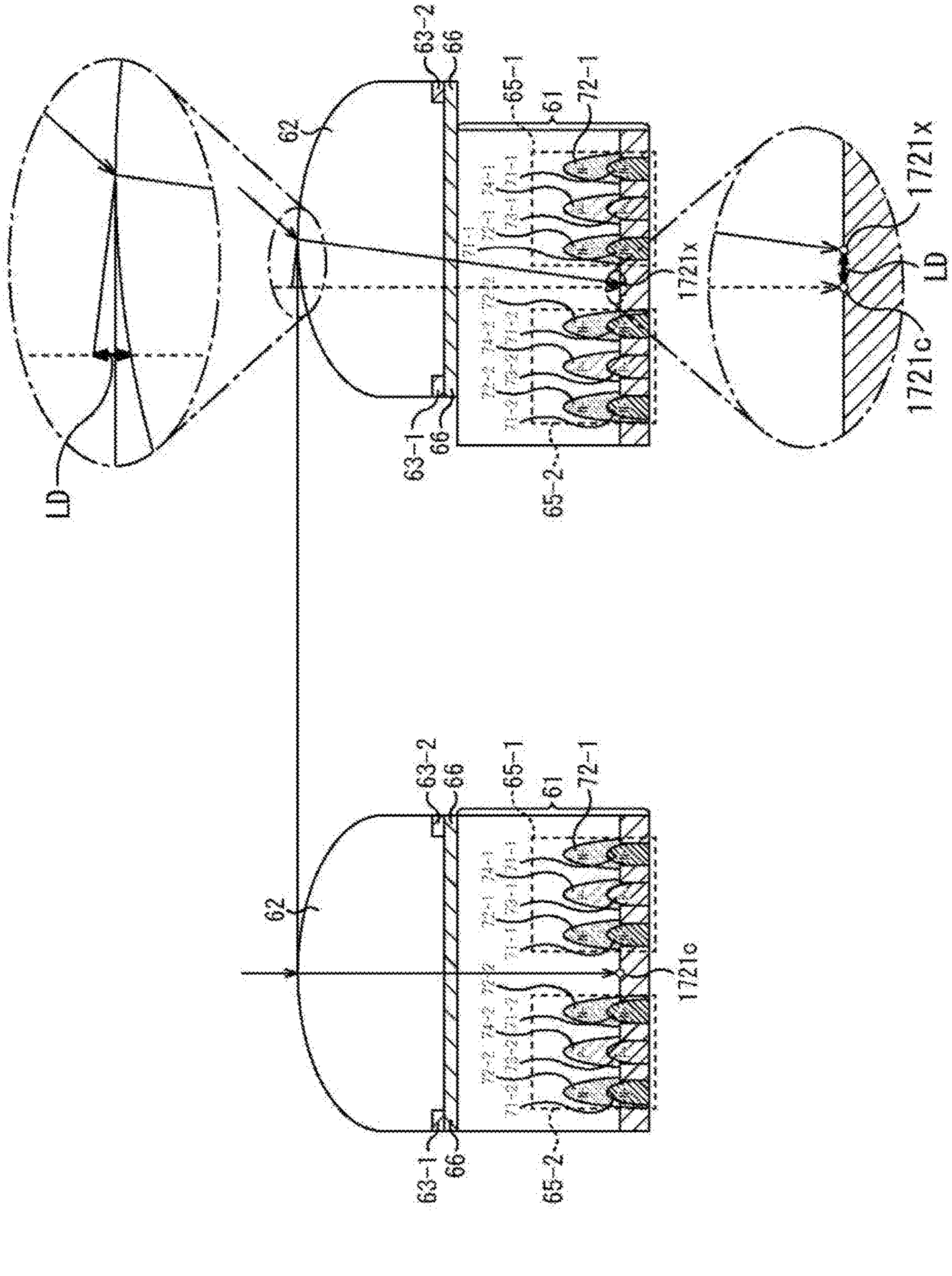
FIG. 83 is a view illustrating a displacement amount of an on-chip lens in the first method for pupil correction.

FIG. 83 is a view illustrating the displacement of the on-chip lens 62 when the position 1721 of a chief ray is displaced to the first tap TA side.

For example, the displacement amount LD between the position $1721_c$ of a chief lay at the position 1701-5 of the central portion of the pixel array section 20 and the position $1721_x$ of a chief ray at the position 1701-4 in the peripheral portion of the pixel array section 20 is equal to the optical path difference LD for pupil correction for the position 1701-4 in the peripheral portion of the pixel array section 20.

In other words, shifting to the first tap TA side is performed from the center positions of the first tap TA (signal extraction portion 65-1) and the second tap TB (signal extraction portion 65-2) such that the optical path length of a chief ray becomes coincident among the pixels of the pixel array section 20.

Here, the reason why the shifting to the first tap TA side is that it is presupposed to adopt a method of calculating, determining a light reception timing as 4 Phase and using only an output value of the first tap TA, a phase displacement (Phase) corresponding to delay time ΔT according to the distance to an object.

Figure 84:
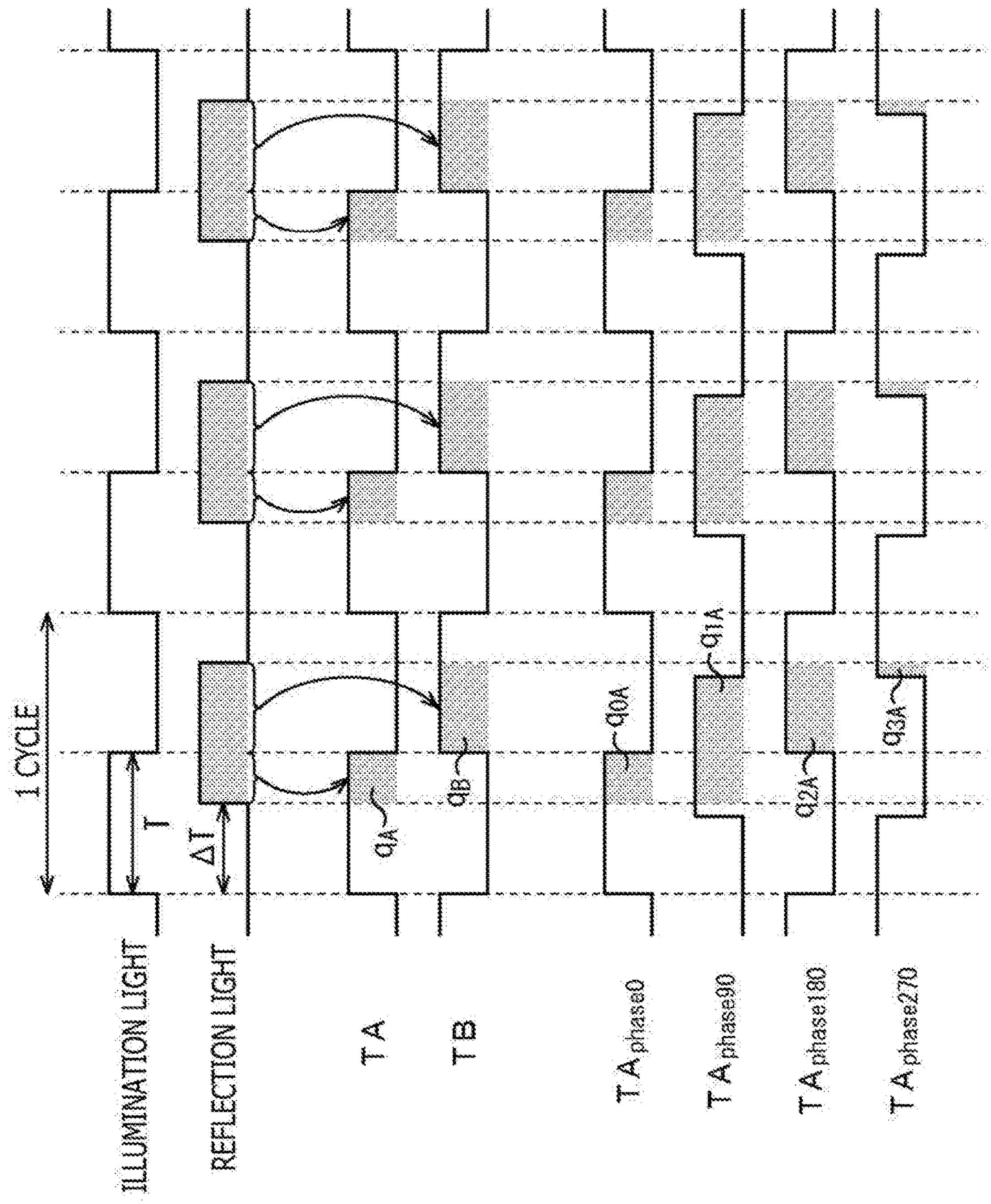
FIG. 84 is a view illustrating a 2 Phase method and a 4 phase method.

FIG. 84 is a timing chart illustrating a detection method by 2 Phase (2 Phase method) and a detection method by 4 Phase (4 Phase method) in a ToF sensor that utilizes an indirect ToF method.

From a predetermined light source, illumination light modulated so as to repeat on/off of illumination in illumination time T (one cycle=2 T), and reflection light is received by the light reception device 1 after a delay by delay time ΔT according to the distance to the object.

In the 2 Phase method, the light reception device 1 receives light at timings displaced by 180 degrees in phase at the first tap TA and the second tap TB. The phase displacement amount θ corresponding to the delay time ΔT can be detected by a distribution ratio of a signal value $q_A$ of the received light by the first tap TA and a signal value $q_B$ of the received light by the second tap TB.

In contrast, in the 4 Phase method, illumination light is received at four timings of a phase same as that of the illumination light (more specifically, Phase0), another face displaced by 90 degrees (Phase90), a further phase displaced by 180 degrees (Phase180) and a still further phase displaced by 270 degrees (Phase270). According to this, the signal value $TA_{phase180}$ detected by the phase displaced by 180 degrees is equal to the signal value $q_B$ of the light received by the second tap TB in the 2 Phase method. Therefore, if 4 phase is used for detection, then the phase displacement amount θ corresponding to the delay time ΔT can be detected only from a signal value at only one of the first tap TA and the second tap TB. A tap that detects the phase displacement amount θ in the 4 Phase method is referred to as phase displacement detection tap.

Here, in the case where the first tap TA from between the first tap TA and the second tap TB is determined as the phase displacement detection tap for detecting the phase displacement amount θ, in pupil correction, shifting to the first tap TA side is performed such that the optical path length of a chief ray substantially coincides among the pixels of the pixel array section 20.

If the signal values detected at Phase0, Phase90, Phase180 and Phase270 of the first tap TA by the 4 Phase method are represented by $q_{0A}$, $q_{1A}$, $q_{2A}$ and $q_{3A}$, respectively, then the phase displacement amount $\theta_A$ detected by the first tap TA is calculated by the following expression (2).

[Math. 1]

$$\theta_A = \tan^{-1}\frac{q_{1A} - q_{3A}}{q_{0A} - q_{2A}} \tag{2}$$

Meanwhile, $Cmod_A$ of the 4 Phase method in the case where the first tap TA is used for detection is calculated by the following expression (3).

[Math. 2]

$$Cmod_A = \text{Max}\left(\frac{q_{0A} - q_{2A}}{q_{0A} + q_{2A}}, \frac{q_{1A} - q_{3A}}{q_{1A} + q_{3A}}\right) \tag{3}$$

As indicated by the expression (3), $Cmod_A$ in the 4 Phase method is a higher one of values of $(q_{0A}-q_{2A})/(q_{0A}+Q_{2A})$ and $(q_{1A}-Q_{3A})/(q_{1A}+Q_{3A})$.

As above, the light reception device 1 performs pupil correction such that the positions of the on-chip lens 62 and the inter-pixel shading film 63 are changed such that the optical path length of a chief ray becomes substantially coincident among the pixels in the plane of the pixel array section 20. More specifically, the light reception device 1 performs pupil correction such that the phase displacement amounts θA at the first tap TA that is a phase displacement detection tap of each pixel in the plane of the pixel array section 20 become substantially coincident with each other. As a consequence, the in-plane dependency of the chip can be eliminated and the distance measurement accuracy can be improved. Here, the term substantially coincident or substantially same described hereinabove represents not only full coincidence or full equality but also equality within a predetermined range within which it is possible to regard the phase displacement amounts are same. The first method for pupil correction can be applied to any embodiment described in the present specification.

<Second Method for Pupil Correction>

Now, a second method for pupil correction by the light reception device 1 is described.

Although the first method for pupil correction described above is preferable where it is determined that the phase displacement (Phase) is calculated using a signal of the first tap TA from between the first tap TA and the second tap TB, it is sometime indeterminable which one of the taps is to be used. In such a case as just described, pupil correction can be performed by the following second method.

In the second method for pupil correction, the on-chip lens 62 and the inter-pixel shading film 63 are arranged such that the positions thereof are displaced to the plane center side such that the DC contrast DCA of the first tap TA and the DC contrast DCB of the second tap TB are substantially equal among the pixels in the plane of the pixel array section 20. In the case where also a DTI 1711 including the on-chip lens 62 side of the substrate 61 and a DTI 1712 including the front face side are formed, they are arranged such that the positions of them are displaced similarly as in the first method.

The DC contrast DCA of the first tap TA and the DC contrast DCB of the second tap TB are calculated by the following expressions (4) and (5).

[Math. 3]

$$DC_A = \frac{A_H - B_L}{A_H - B_L} \tag{4}$$

$$DC_B = \frac{B_H - A_L}{B_H + A_L} \tag{5}$$

In the expression (4), $A_H$ represents a signal value detected by the first tap TA to which a positive voltage is applied while continuous light that is continuously illuminated without intermittent is illuminated directly upon the light reception device 1, and $B_L$ represents a signal value detected by the second tap TB to which zero or a negative voltage is applied. In the expression (5), $B_H$ represents a signal value detected by the second tap TB to which a positive voltage is applied while continuous light that is continuously illuminated without intermittent is illuminated directly upon the light reception device 1, and $A_L$ represents a signal value detected by the first tap TA to which zero or a negative voltage is applied.

It is desirable that the DC contrast DCA of the first tap TA and the DC contrast DCB of the second tap TB are equal to each other and besides the DC contrast DCA of the first tap TA and the DC contrast DCB of the second tap TB substantially coincide at any position in the plane of the pixel array section 20. In the case where the DC contrast DCA of the first tap TA and the DC contrast DCB of the second tap TB are different depending upon the position in the plane of the pixel array section 20, the on-chip lens 62, inter-pixel shading film 63 and so forth are arranged such that the positions of them are displaced to the plane center side such that the displacement amount of the DC contrast DCA between the first taps TA at the central portion and the peripheral portion of the pixel array section 20 and the displacement amount of the DC contrast DCB between the second taps TB between the central portion and the peripheral portion of the pixel array section 20 substantially coincide with each other.

As above, the light reception device 1 performs pupil correction such that the positions of the on-chip lens 62 and the inter-pixel shading film 63 are changed such that the DC contrast DCA of the first tap TA and the DC contrast DCB of the second tap TB substantially coincide among the pixels in the plane of the pixel array section 20. As a consequence, the in-plane dependency of the chip can be eliminated and the distance measurement accuracy can be improved. Here, the term substantially coincident or substantially same described hereinabove represents not only full coincidence or full equality but also equality within a predetermined range within which it is possible to regard the phase displacement amounts are same. The second method for pupil correction can be applied to any embodiment described in the present specification.

Note that the light reception timings of the first tap TA and the second tap TB depicted in FIG. 84 are controlled by the voltage MIX0 and the voltage MIX1 supplied from the tap driving section 21 through the voltage supply line 30. Since the voltage supply line 30 is wired in the vertical direction of the pixel array section 20 commonly to one pixel column, a delay by RC components occurs more as the distance from the tap driving section 21 increases.

Figure 85:
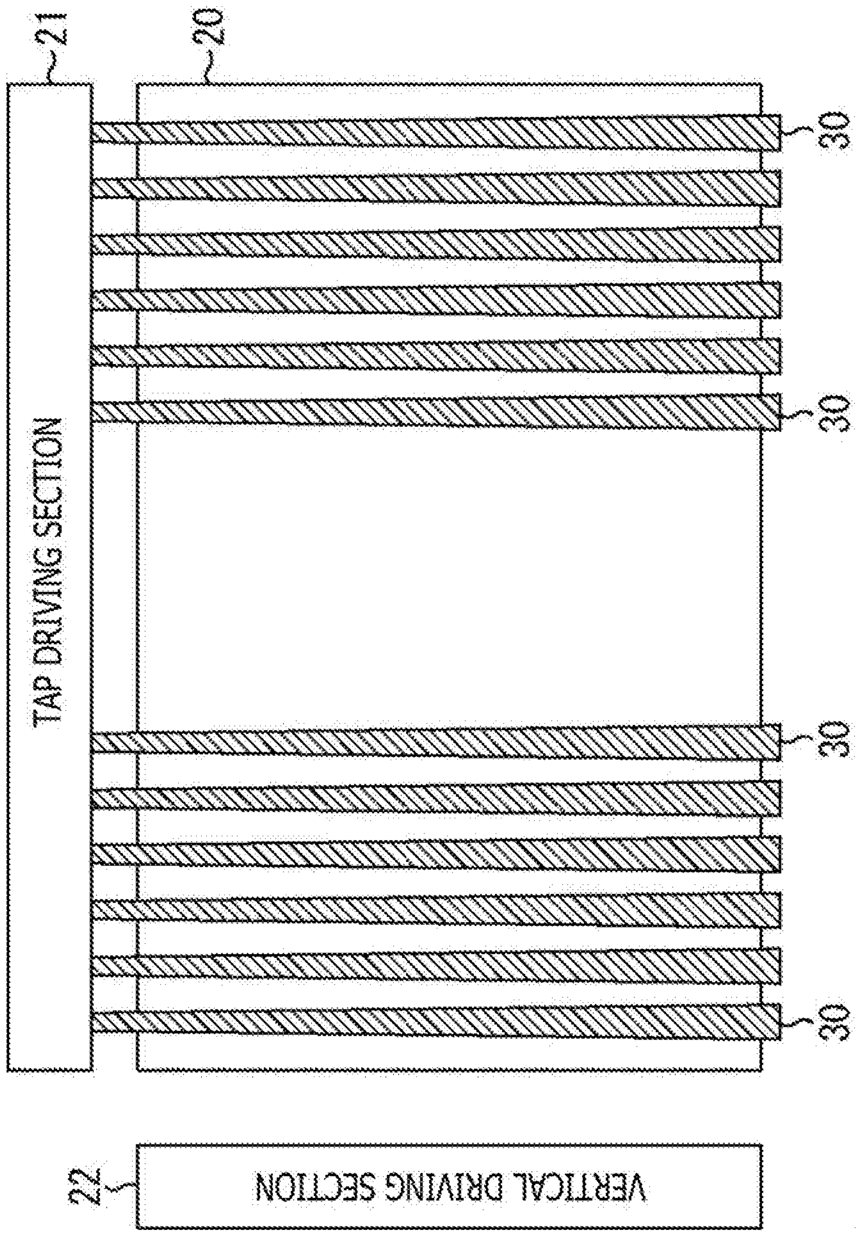
FIG. 85 is a view illustrating an example of wiring of a voltage supply line.

Therefore, the phase displacement (Phase) or the DC contrast DC can be corrected such that it becomes substantially uniform in the plane of the pixel array section 20 by changing the resistance or capacitance of the voltage supply line 30 in response to the distance from the tap driving section 21 to substantially uniformize the driving capacities of the pixels 51 as depicted in FIG. 85. More specifically, the voltage supply line 30 is arranged such that the line width thereof increases in response to the distance from the tap driving section 21.

Twentieth Embodiment

Twentieth to twenty-second embodiments described below are directed to examples of a configuration of a light reception device that can acquire auxiliary information other than distance measurement information determined from a distribution ratio of signals of the first tap TA and the second tap TB.

First, an example of a configuration of the light reception device 1 that can acquire phase difference information as auxiliary information other than distance measurement information determined from a distribution ratio of signals of the first tap TA and the second tap TB.

<First Example of Configuration of Twentieth Embodiment>

Figure 86:
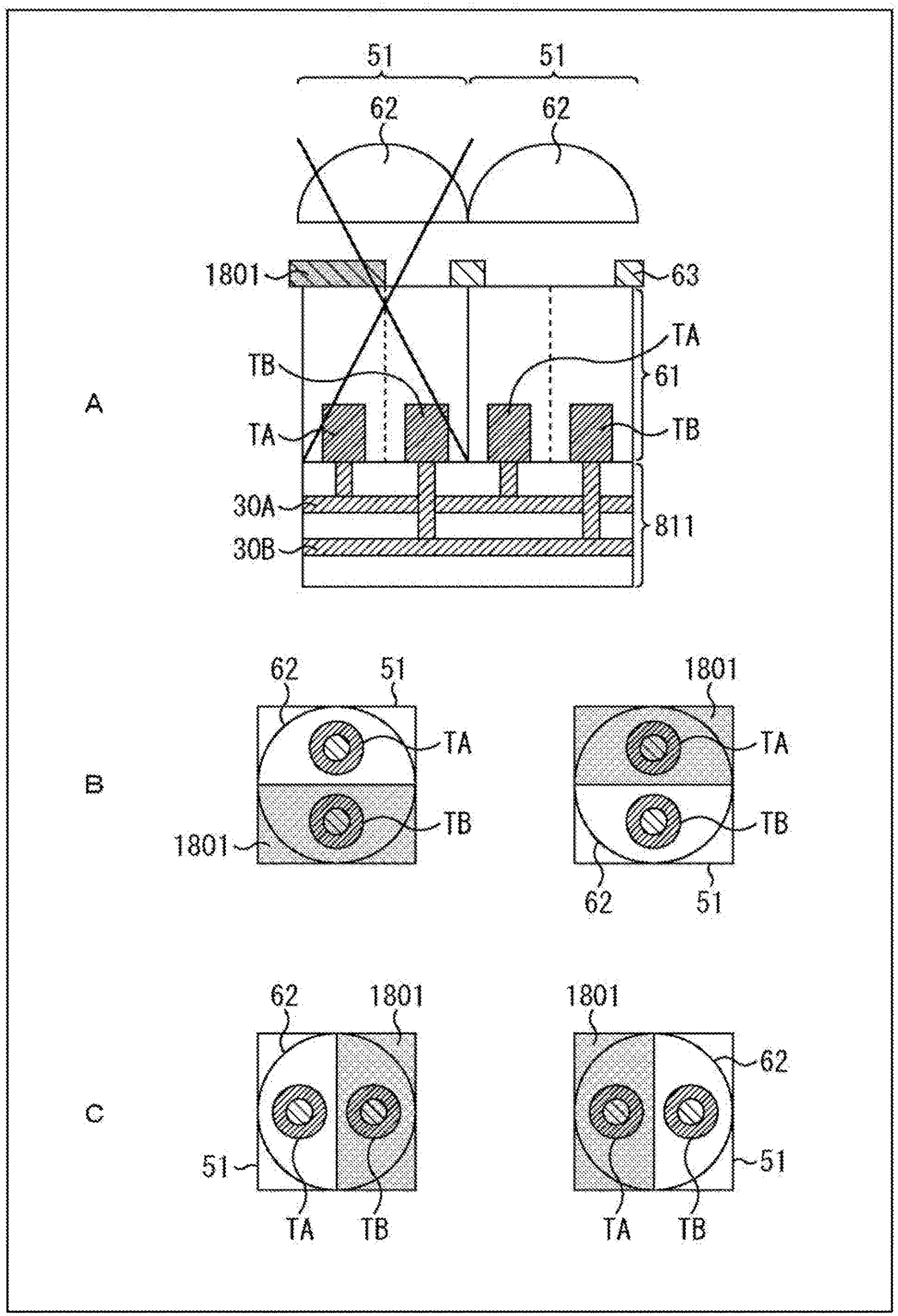
FIG. 86 is a sectional view and a plan view of a pixel according to a first example of a configuration of a twentieth embodiment.

A of FIG. 86 is a sectional view of a pixel according to a first configuration example of the twentieth embodiment, and B and C of FIG. 86 are plan views of the pixel according to the first example of a configuration of the twentieth embodiment.

In the sectional view of A of FIG. 86, portions corresponding to those of the other embodiments described hereinabove are denoted by like referenced characters, and description of them is suitably omitted.

In FIG. 86, a phase difference shading film 1801 for phase difference detection is newly provided on pixels 51 at part of an upper face that is a face of the substrate 61 on the on-chip lens 62 side. The phase difference shading film 1801 shades one side half of a pixel region on the first tap TA side or the second tap TB side as indicated, for example, in B and C of FIG. 86. B of FIG. 86 depicts examples of a pixel 51 in which the first tap TA and the second tap TB are arrayed in the upward and the downward directions (vertical direction), and C of FIG. 86 depicts examples of a pixel 51 in which the first tap TA and the second tap TB are arrayed in the leftward and the rightward directions (horizontal direction).

Figure 87:
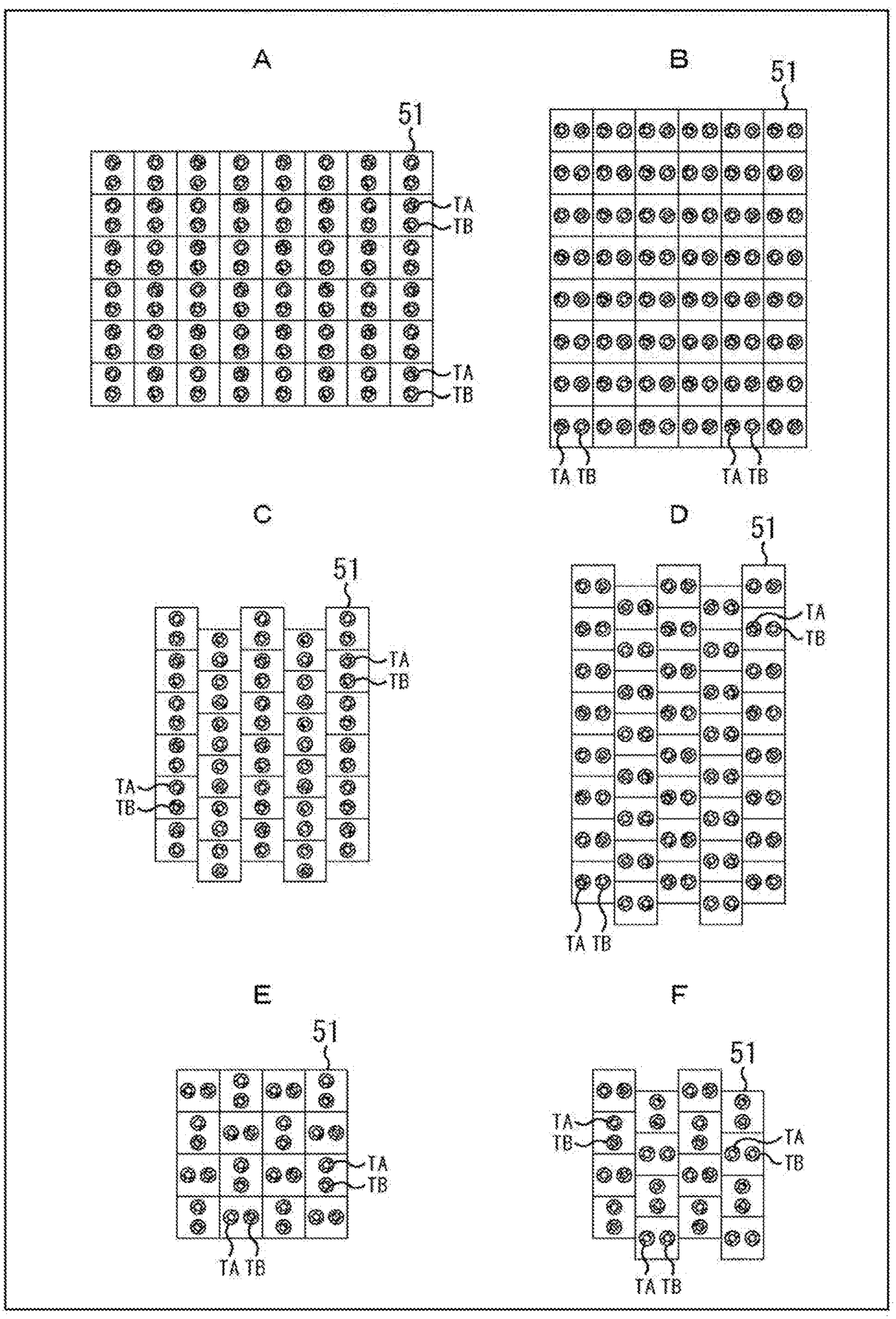
FIG. 87 is a view depicting an example of arrangement of first and second taps.

The pixel 51 according to the first example of configuration of the twentieth embodiment can have such an array as indicated by any of A to F of FIG. 87 in the pixel array section 20.

A of FIG. 87 depicts an example of an array of pixels 51 in which the pixels 51 in which the first tap TA and the second tap TB are lined up in the upward and the downward directions are arrayed in a matrix.

B of FIG. 87 depicts an example of an array of pixels 51 in which the pixels 51 in which the first tap TA and the second tap TB are lined up in the rightward and leftward direction are arrayed in a matrix.

C of FIG. 87 depicts an example of an array of pixels 51 in which the pixels 51 in which the first tap TA and the second tap TB are lined up in the upward and the downward directions are arrayed in a matrix and besides pixel positions in neighboring columns are displaced by one half pixel in the upward and the downward directions.

D of FIG. 87 depicts an example of an array of pixels 51 in which the pixels 51 in which the first tap TA and the second tap TB are lined up in the leftward and the rightward directions are arrayed in a matrix and besides pixel positions in neighboring columns are displaced by one half pixel in the upward and the downward directions.

E of FIG. 87 depicts an example of an array of pixels 51 in which the pixels 51 in which the first tap TA and the second tap TB are lined up in the upward and the downward directions and pixels 51 in which the first tap TA and the second tap TB are lined up in the leftward and the rightward directions are arrayed alternately in the row direction and the column direction.

F of FIG. 87 depicts an example of an array of pixels 51 in which the pixels 51 in which the first tap TA and the second tap TB are lined up in the upward and the downward directions and the pixels 51 in which the first tap TA and the second tap TB are lined up in the leftward and the rightward directions are arrayed alternately in the row direction and the column direction and besides the pixel positions in neighboring columns are displaced by one half pixel in the upward and the downward directions.

The pixels 51 in FIG. 86 are arranged in one of the arrays of A to F of FIG. 87, and in the pixel array section 20, a pixel 51 that is shaded at one side half thereof on the first tap TA side and a pixel that is shaded at one side half thereof on the second tap TB side are arranged at neighboring positions as indicated by B or C of FIG. 86. Furthermore, a plurality of sets of pixels 51 each including a pixel 51 that is shaded at one side half thereof on the first tap TA side and a pixel 51 that is shaded at one side half thereof on the second tap TB side are arranged in the pixel array section 20.

Although the first example of a configuration of the twentieth embodiment is configured similarly, for example, to the first embodiment depicted in FIG. 2 or the fourteenth or fifteenth embodiment described hereinabove with reference to FIG. 36 except that the phase difference shading film 1801 is provided for part of the pixels 51, the configuration of the other part is depicted in a simplified form in FIG. 86.

The configuration other than that of the phase difference shading film 1801 of FIG. 86 is described briefly. The pixel 51 has a substrate 61 including a P type semiconductor layer and an on-chip lens 62 formed on the substrate 61. An inter-pixel shading film 63 and a phase difference shading film 1801 are formed between the on-chip lens 62 and the substrate 61. In the pixel 51 in which the phase difference shading film 1801 is formed, the inter-pixel shading film 63 neighboring with the phase difference shading film 1801 is formed continuously (integrally) with the phase difference shading film 1801. Though not depicted, also such a fixed charge film 66 as depicted in FIG. 2 is formed on the lower face of the inter-pixel shading film 63 and the phase difference shading film 1801.

On the face on the opposite side to the light incident face side of the substrate 61 on which the on-chip lens 62 is formed, a first tap TA and a second tap TB are formed. The first tap TA is correspond to the signal extraction portion 65-1 described hereinabove, and the second tap TB is correspond to the signal extraction portion 65-2. To the first tap TA, a predetermined voltage MIX0 is supplied from the tap driving section 21 (FIG. 1) through the voltage supply line 30A formed in the multilayer wiring layer 811, and to the second tap TB, a predetermined voltage MIX1 is supplied through the voltage supply line 30B.

FIG. 88 is a table in which driving modes when the tap driving section 21 drives the first tap TA and the second tap TB in the first example of a configuration of the twentieth embodiment are summarized.

The pixel 51 that has the phase difference shading film 1801 can detect a phase difference by the five driving methods of a mode 1 to a mode 5 depicted in FIG. 88.

The mode 1 is a driving mode similar to that for the other pixels 51 that do not include the phase difference shading film 1801. In the mode 1, the tap driving section 21 applies, during a predetermined light reception period, a positive electrode (for example, 1.5 V) to the first tap TA to be made an active tap and applies the voltage of 0 V to the second tap TB to be made an inactive tap. During a next light reception period, the tap driving section 21 applies a positive voltage (for example, 1.5 V) to the second tap TB to be made an active tap and applies the voltage of 0 V to the first tap TA to be made an inactive tap. To the transistors Tr (FIG. 37) such as the transfer transistor 721, reset transistor 723 and so forth formed in the pixel boundary region of the substrate 61 in the multilayer wiring layer 811, 0 V (VSS potential) is applied.

In the mode 1, a phase difference can be detected from a signal when the second tap TB is made an active tap in the pixel 51 that is shaded at one side half thereof on the first tap TA side and a signal when the first tap TA is made an active tap in the pixel 51 that is shaded at one side half on the second tap TB side.

In the mode 2, the tap driving section 21 applies a positive voltage (for example, 1.5 V) to both the first tap TA and the second tap TB. To the transistors Tr formed in the pixel boundary region of the substrate 61 of the multilayer wiring layer 811, 0 V (VSS potential) is applied.

In the mode 2, since a signal can be detected equally by both the first tap TA and the second tap TB, a phase difference can be detected from a signal of the pixel 51 that is shaded at one side half thereof on the first tap TA side and a signal of the pixel 51 that is shaded at one side half thereof on the second tap TB side.

The mode 3 is driving in which the application voltages to the first tap TA and the second tap TB in driving of the mode 2 are weighted in response to an image height in the pixel array section 20. More particularly, as the image height (distance from the optical center) in the pixel array section 20 increases, an increased potential is provided between the first tap TA and the second tap TB. Furthermore, as the image height in the pixel array section 20 increases, driving is performed such that the application voltage on the tap side that is on the inner side (central portion side) of the pixel array section 20 increases. As a consequence, pupil correction can be performed depending upon the potential difference between the voltages to be applied to the taps.

The mode 4 is a mode in which, in driving of the mode 2, not 0 V (VSS potential) but a negative bias (for example, −1.5 V) is applied to the pixel transistors Tr formed in the pixel boundary region of the substrate 61. By applying a negative bias to the pixel transistors Tr formed in the pixel boundary region, an electric field from the pixel transistors Tr to the first tap TA and the second tap TB can be strengthened, and electrons of signal charge can be pulled easily into the taps.

The mode 5 is a mode in which, in driving of the mode 3, not 0 V (VSS potential) but a negative bias (for example, −1.5 V) is applied to the pixel transistors Tr formed in the pixel boundary region of the substrate 61. By this, an electric field from the pixel transistors Tr to the first tap TA and the second tap TB can be strengthened, and electrons of signal charge can be pulled easily into the taps.

In any of the five driving methods of the mode 1 to the mode 5 described above, since a phase difference (displacement in image) occurs between the pixel 51 that is shaded at one side half thereof on the first tap TA side and the pixel 51 that is shaded at one side half thereof on the second tap TB side, the phase difference can be detected.

With the first example of a configuration of the twentieth embodiment configured in such a manner as described, the light reception device 1 includes, among some pixels 51 of the pixel array section 20 in which a plurality of pixels 51 including a first tap TA and a second tap TB are arrayed, pixels 51 that are shaded at one side half thereof on the first tap TA side by the phase difference shading film 1801 and pixels 51 that are shaded at one side half thereof on the second tap TB side by the phase difference shading film 1801. As a consequence, phase difference information can be acquired as auxiliary information other than distance measurement information determined from a distribution ratio of a signal to the first tap TA and the second tap TB. From the detected phase difference information, it is possible to determine the focal position and increase the accuracy in the depthwise direction.

<Second Example of Configuration of Twentieth Embodiment>

Figure 89:
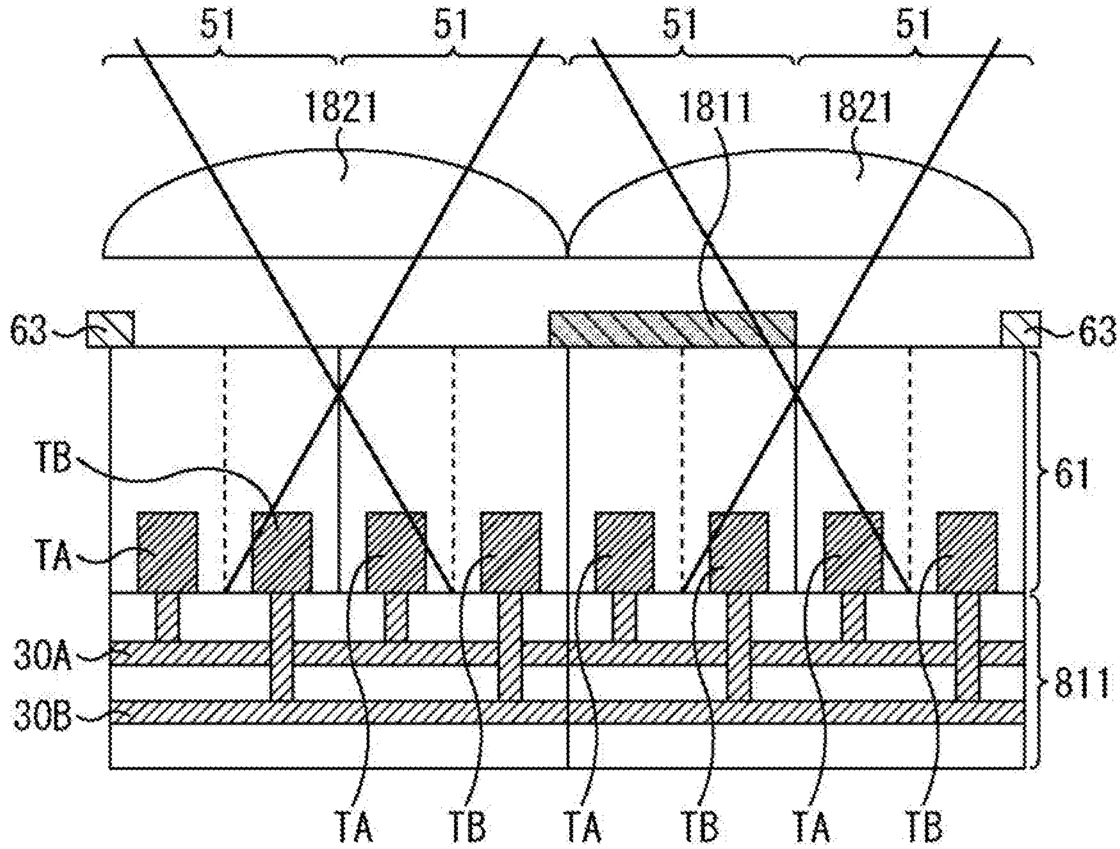
FIG. 89 is a plan view and a sectional view of a pixel according to a second example of a configuration of the twentieth embodiment.

FIG. 89 depicts a sectional view of a pixel according to a second example of a configuration of the twentieth embodiment.

In the sectional view of FIG. 89, portions corresponding to those of the first example of a configuration of the twentieth embodiment described above are denoted by like referenced characters, and description of them is suitably omitted.

Although, in the first example of a configuration depicted in FIG. 86, an on-chip lens 62 is formed in a unit of one pixel, in the second example of a configuration of FIG. 89, one on-chip lens 1821 is formed for a plurality of pixels 51. On part of the pixels on the upper face that is the on-chip lens 1821 side of the substrate 61, a phase difference shading film 1811 for phase difference detection is provided newly. The phase difference shading film 1811 is formed on predetermined pixels 51 from among the plurality of pixels 51 that share the same on-chip lens 1821. Similarly as in the first example of a configuration, the inter-pixel shading film 63 neighboring with the phase difference shading film 1811 is configured continuously to (integrally with) the phase difference shading film 1811.

Figure 90:
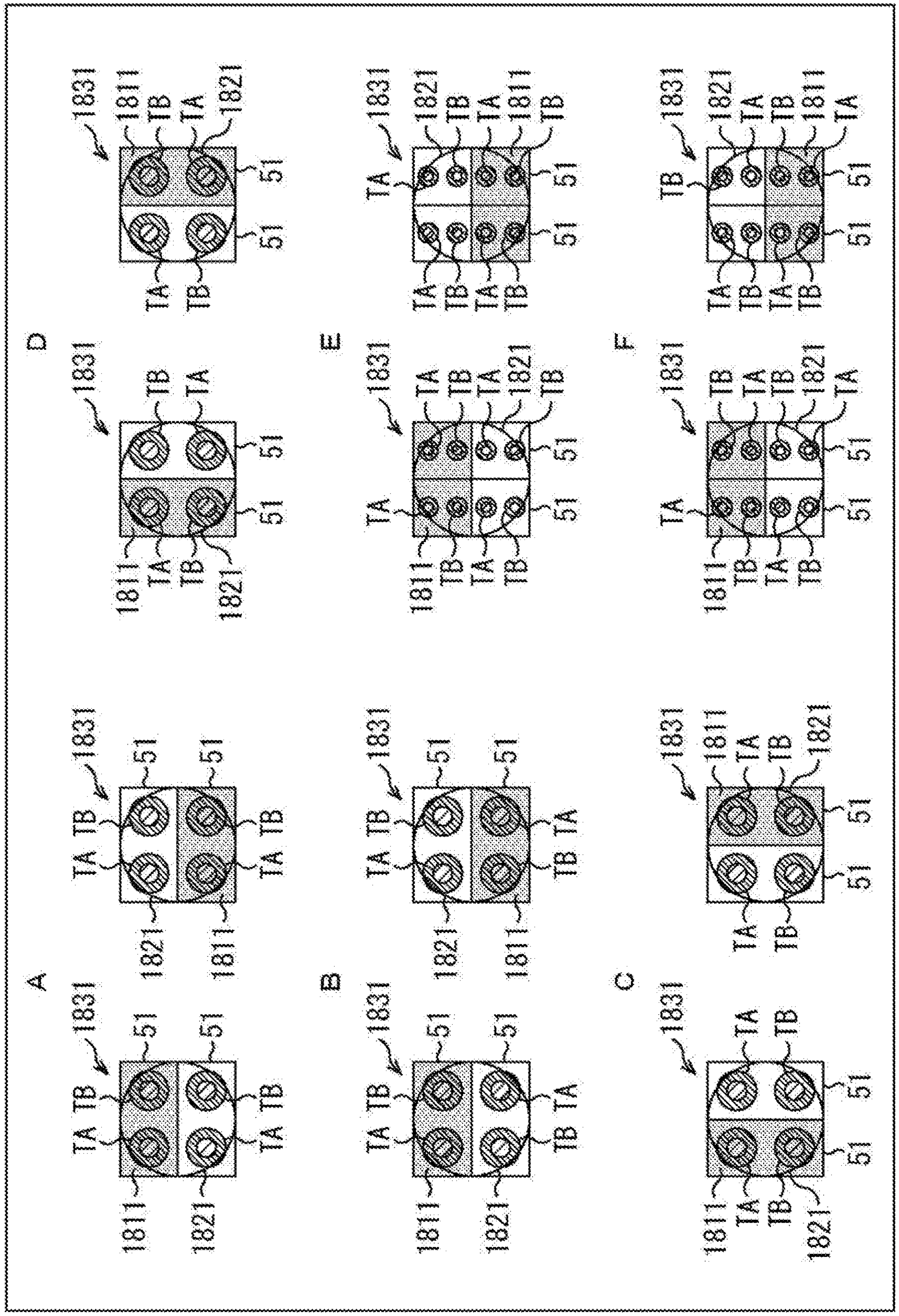
FIG. 90 is a view depicting an example of arrangement of a phase difference shading film and an on-chip lens.

A to F of FIG. 90 are plan views depicting arrangement of a phase difference shading film 1811 and an on-chip lens 1821 that can be taken by the second example of a configuration of the twentieth embodiment.

A of FIG. 90 depicts a first example of arrangement of a phase difference shading film 1811 and an on-chip lens 1821.

A pixel set 1831 depicted in A of FIG. 90 is configured from two pixels 51 arrayed in the upward and the downward directions (vertical direction), and one on-chip lens 1821 is arranged for the two pixels 51 arrayed in the upward and the downward directions. Furthermore, the arrangement of the first tap TA and the second tap TB is same between the two pixels 51 that share one on-chip lens 1821. Thus, a phase difference is detected using the two pixels 51, in which the phase difference shading film 1811 is not depicted, of the two sets of pixel sets 1831 in which the formation positions of the phase difference shading films 1811 are symmetrical.

B of FIG. 90 depicts a second example of arrangement of a phase difference shading film 1811 and an on-chip lens 1821.

The pixel set 1831 depicted in A of FIG. 90 is configured from two pixels 51 arrayed in the upward and the downward directions (vertical direction), and one on-chip lens 1821 is arranged for two pixels 51 arrayed in the upward and downward direction. Furthermore, the arrangement of the first tap TA and the second tap TB is reverse between two pixels 51 that share one on-chip lens 1821. Thus, a phase difference is detected using the two pixels 51 in which the phase difference shading film 1811 is not formed in the two pixel sets 1831 between which the formation positions of the phase difference shading films 1811 are symmetrical.

C of FIG. 90 depicts a third example of arrangement of a phase difference shading film 1811 and an on-chip lens 1821.

A pixel set 1831 depicted in C of FIG. 90 is configured from two pixels 51 arrayed in the leftward and the rightward directions (horizontal direction), and one on-chip lens 1821 is arranged for two pixels 51 arrayed in the leftward and the rightward directions. Furthermore, arrangement of the first tap TA and the second tap TB is same between two pixels 51 that share one on-chip lens 1821. Thus, a phase difference is detected using two pixels 51, on which the phase difference shading film 1811 is not formed, of two pixel sets 1831 between which the formation positions of the phase difference shading films 1811 are symmetrical.

D of FIG. 90 depicts a fourth example of arrangement of a phase difference shading film 1811 and an on-chip lens 1821.

A pixel set 1831 depicted in D of FIG. 90 is configured from two pixels 51 arrayed in the leftward and the rightward directions (horizontal direction), and one on-chip lens 1821 is arranged for two pixels 51 arrayed in the leftward and the rightward directions. Furthermore, arrangement of the first tap TA and the second tap TB is reverse between two pixels 51 that share one on-chip lens 1821. Thus, a phase difference is detected using two pixels 51, on which the phase difference shading film 1811 is not formed, of two sets of pixel sets 1831 between which the formation positions of the phase difference shading films 1811 are symmetrical.

E of FIG. 90 depicts a fifth example of arrangement of a phase difference shading film 1811 and an on-chip lens 1821.

A pixel set 1831 depicted in E of FIG. 90 is configured from four pixels 51 arrayed in 2×2, and one on-chip lens 1821 is arranged for four pixels 51. Furthermore, arrangement of the first tap TA and the second tap TB is same among four pixels 51 that share one on-chip lens 1821. Thus, a phase difference is detected using four pixels 51, on which the phase difference shading film 1811 is not formed, of two pixel sets 1831 between which the formation positions of the phase difference shading films 1811 are symmetrical.

F of FIG. 90 depicts a sixth example of arrangement of a phase difference shading film 1811 and an on-chip lens 1821.

A pixel set 1831 depicted in F of FIG. 90 is configured from four pixels 51 arrayed in 2×2, and one on-chip lens 1821 is arranged for four pixels 51. Furthermore, arrangement of the first tap TA and the second tap TB is reverse between left and right pixels from among the four pixels 51 that share one on-chip lens 1821. Thus, a phase difference is detected using four pixels 51, on which the phase difference shading film 1811 is not formed, of two pixel sets 1831 between which the formation positions of the phase difference shading films 1811 are symmetrical.

As described above, as the arrangement in the case where one on-chip lens 1821 is formed for a plurality of pixels 51, arrangement in which one on-chip lens 1821 is formed for two pixels and arrangement in which one on-chip lens 1821 is formed for four pixels are available, and both of them can be adopted. The phase difference shading film 1811 shades a plurality of pixels that are one side half under one on-chip lens 1821.

As the driving mode in the second example of a configuration, the five driving methods of the mode 1 to mode 5 described hereinabove with reference to FIG. 88 are available.

Therefore, with the second example of a configuration of the twentieth embodiment, the light reception device 1 includes, in some pixels 51 of a pixel array section 20 in which a plurality of pixels 51 including a first tap TA and a second tap TB are arrayed, two pixel sets 1831 between which the formation positions of phase difference shading films 1811 are symmetrical. As a consequence, phase difference information can be acquired as auxiliary information other than distance measurement information determined from a distribution ratio of a signal to the first tap TA and the second tap TB. From the detected phase difference information, it is possible to determine the focal position and increase the accuracy in the depthwise direction.

Note that, as the plurality of pixels 51 that configure the pixel array section 20, the pixels 51 of the first example of a configuration of the twentieth embodiment and the pixels 51 of the second example of a configuration of the twentieth embodiment may exist in a mixed manner.

<Modification That Does Not Include Phase Difference Shading Film>

The first example of a configuration and the second example of a configuration of the twentieth embodiment described above are directed to a configuration in which a phase difference shading film 1801 or 1811 is formed between an on-chip lens 62 and a substrate 61.

However, even from a pixel 51 that does not include the phase difference shading film 1801 or 1811, phase information can be acquired if driving of the mode 2 to mode 5 in which positive voltages are applied simultaneously to both the first tap TA and the second tap TB from among the five driving methods of the mode 1 to mode 5 is used. For example, by driving a pixel 51 on one side half from among a plurality of pixels under one on-chip lens 1821 by the mode 2 to mode 5, phase difference information can be acquired. Even with a configuration in which one on-chip lens 62 is arranged for one pixel, phase information can be acquired by driving by the mode 2 to mode 5.

Therefore, phase difference information may be acquired by performing driving by the mode 2 to mode 5 for a pixel 51 that does not include the phase difference shading film 1801 or 1811. Even in this case, from the detected position information, it is possible to determine a focal position and increase the accuracy in the depthwise direction.

Note that, in the case where it is desired to acquire phase difference information using driving of the mode 1 from a pixel 51 that does not include the phase difference shading film 1801 or 1811, phase difference information can be acquired if continuous light that is continuously illuminated without intermittent is used as illumination light to be illuminated from a light source.

Twenty-First Embodiment

Now, an example of a configuration of the light reception device 1 capable of acquiring polarization degree information as auxiliary information other than distance measurement information determined from a distribution ratio of a signal between the first tap TA and the second tap TB is described.

Figure 91:
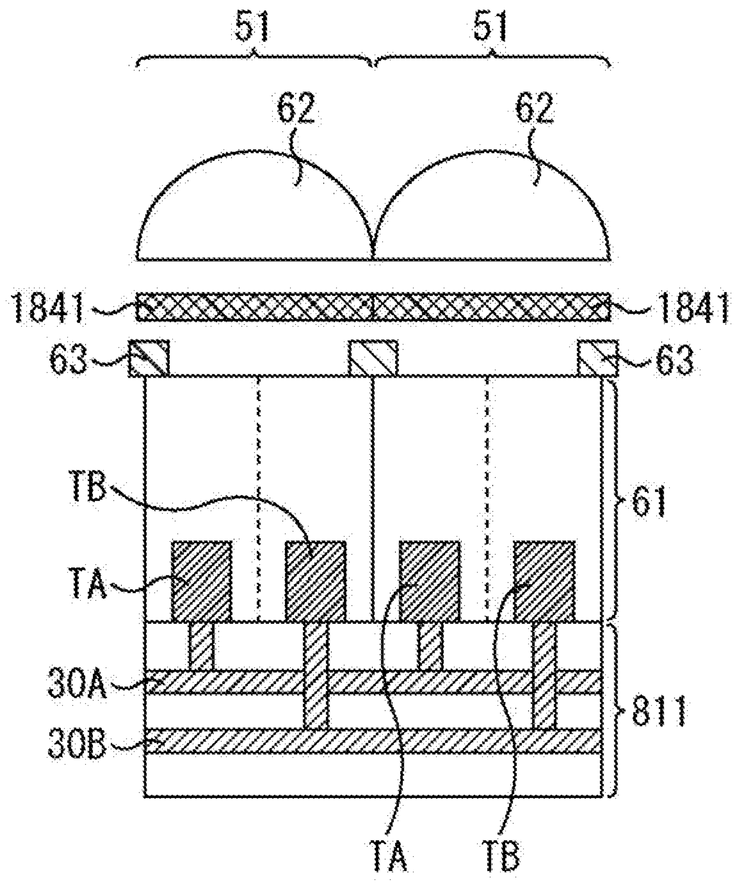
FIG. 91 is a sectional view of a pixel according to a twenty-first embodiment.

FIG. 91 depicts a sectional view of a pixel according to the twenty-first embodiment.

In FIG. 91, portions corresponding to those in the twentieth embodiment described above are denoted by like reference signs and description of them is omitted suitably.

In the twenty-first embodiment of FIG. 91, a polarizer filter 1841 is formed between the on-chip lens 62 and the substrate 61. A pixel 51 according to the twenty-first embodiment is configured similarly, for example, to that of the first embodiment depicted in FIG. 2 or that of the fourteenth or fifteenth embodiment described with reference to FIG. 36 except that the polarizer filter 1841 is provided.

Figure 92:
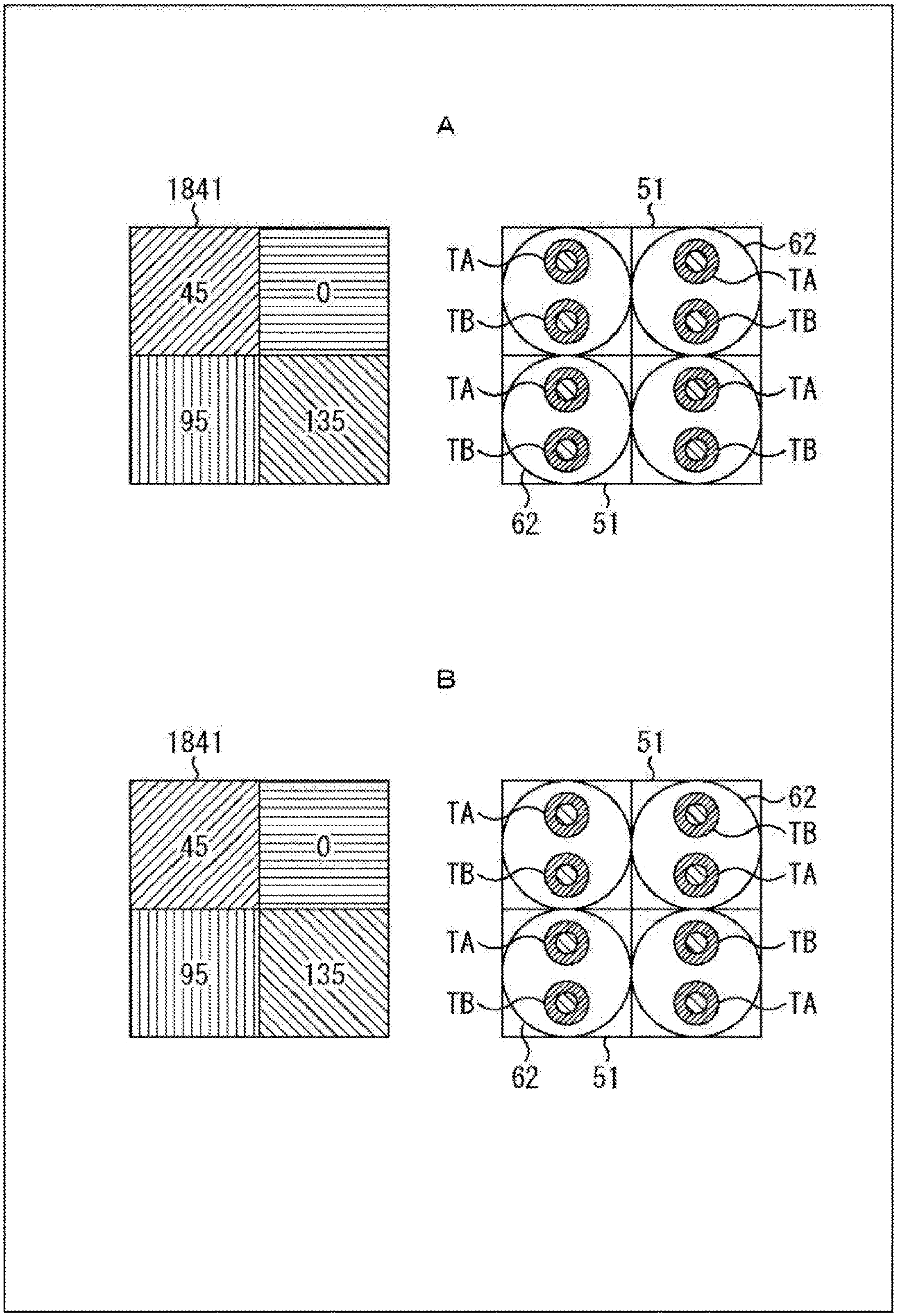
FIG. 92 is a plan view of a pixel according to the twenty-first embodiment.

The polarizer filter 1841, on-chip lens 62, first tap TA and second tap TB are arranged in the arrangement of A or B of FIG. 92.

A of FIG. 92 is a plan view depicting a first example of arrangement of the polarizer filter 1841, on-chip lens 62, first tap TA and second tap TB in the twenty-first embodiment.

As depicted in A of FIG. 92, the polarizer filter 1841 has one of polarization directions of zero degrees, 45 degrees, 135 degrees and 135 degrees, and four kinds of polarizer filters 1841 having polarization directions that are different by 45 degrees from each other are formed in a unit of four pixels of 2×2 in predetermined pixels 51 in the pixel array section 20.

The on-chip lens 62 is provided in a unit of a pixel, and a positional relationship of the first tap TA and the second tap TB is similar in all pixels.

B of FIG. 92 is a plan view depicting a second example of arrangement of the polarizer filter 1841, on-chip lens 62, first tap TA and second tap TB in the twenty-first embodiment.

As depicted in B of FIG. 92, the polarizer filter 1841 has one of polarization directions of zero degrees, 45 degrees, 135 degrees and 135 degrees, and four kinds of polarizer filters 1841 having polarization directions that are different by 45 degrees from each other are formed a unit of four pixels of 2×2 in predetermined pixels 51 in the pixel array section 20.

The on-chip lens 62 is provided in a unit of a pixel, and the positional relationship of the first tap TA and the second tap TB is reverse between pixels neighboring with each other in a transverse direction. More specifically, pixel rows between which arrangement of the first tap TA and the second tap TB is reverse are arranged alternately in the transverse direction.

As a driving method for the pixel 51 including the polarizer filter 1841, five kinds of driving methods from the mode 1 to the mode 5 described hereinabove with reference to FIG. 88 in connection with the twentieth embodiment are available.

In the twenty-first embodiment, some plural pixels from among the plurality of pixels 51 arrayed in the pixel array section 20 individually include such a polarizer filter 1841 as depicted in FIGS. 91 and 92.

By driving the pixel 51 including the polarizer filter 1841 by one of the mode 1 to mode 5, polarization degree information can be acquired. From the acquired polarization degree information, information relating to a surface state (recess or protrusion) of an object face that is an imaging object and a relative distance difference can be acquired, and a reflection direction can be calculated and distance measurement information to a transparent object such as glass and an object ahead of the transparent object can be acquired.

Furthermore, by setting a plurality of kinds of frequencies for illumination light to be illuminated from a light source such that the polarization direction is different among different frequencies, parallel distance measurement of multiple frequencies can be performed. For example, four kinds of illumination light of 20 MHz, 40 MHz, 60 MHz and 100 MHz are illuminated at the same time and the polarization directions are set to zero degrees, 45 degrees, 135 degrees and 135 degrees in accordance with the polarization directions of the polarizer filters 1841. As a result, reflection light of the four kinds of illumination light can be received at the same time to acquire distance measurement information.

Note that all pixels 51 of the pixel array section 20 of the light reception device 1 may be pixels 51 individually including the polarizer filter 1841.

<Twenty-Second Embodiment>

Now, an example of a configuration of the light reception device 1 capable of acquiring sensitivity information for each wavelength of RGB as auxiliary information other than distance measurement information determined from a distribution ratio of a signal between the first tap TA and the second tap TB is described.

Figure 93:
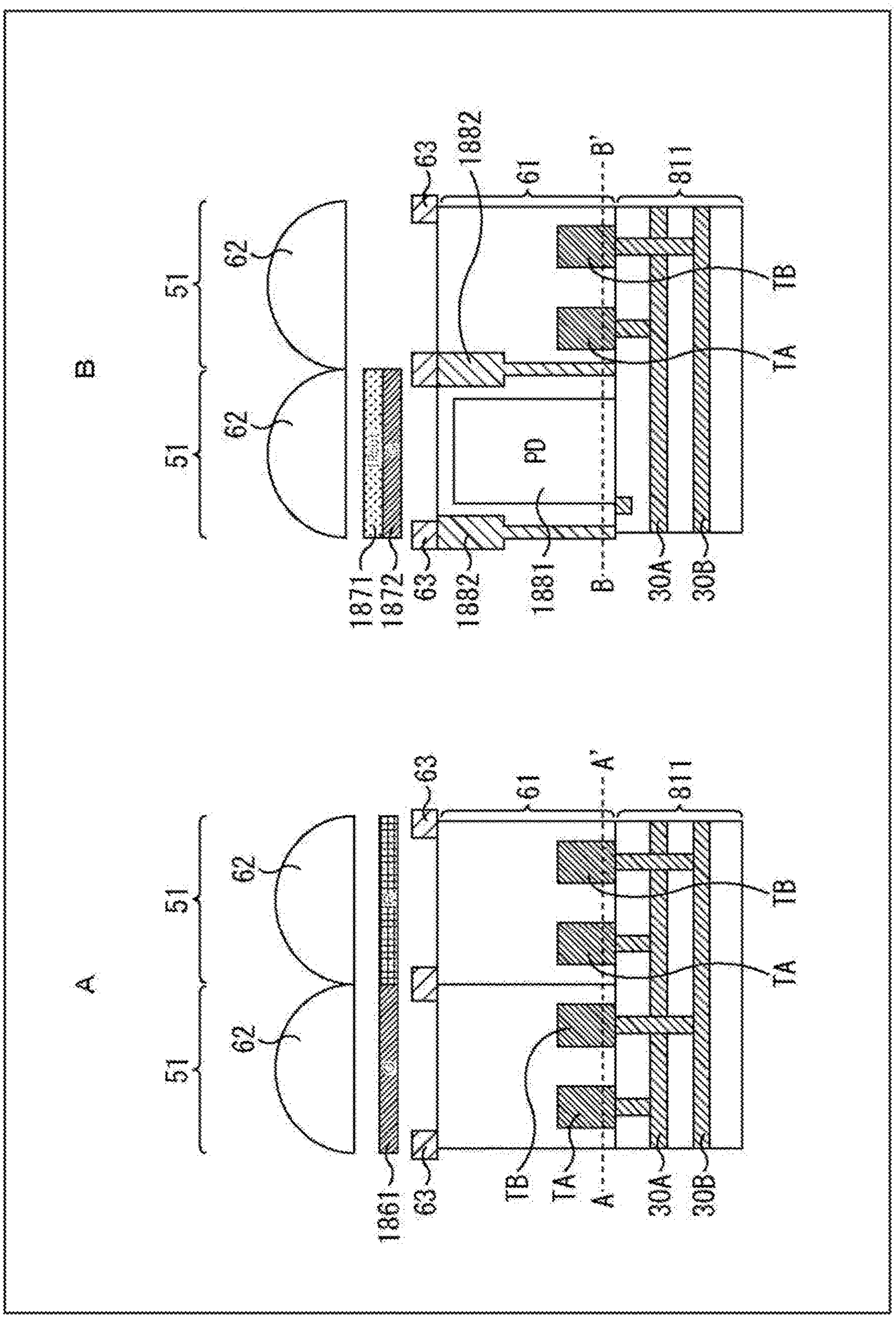
FIG. 93 is a sectional view of a pixel according to a twenty-second embodiment.

FIG. 93 is a sectional view depicting a pixel according to the twenty-second embodiment.

In the twenty-second embodiment, the light reception device 1 includes at least one pixel 51 from between those of A and B of FIG. 93 as some pixels 51 of the pixel array section 20.

In A and B of FIG. 93, portions corresponding to those in the twentieth embodiment described above are denoted by like reference signs and description of them is omitted suitably.

In the pixel 51 depicted in A of FIG. 93, a color filter 1861 that transmits one of the wavelengths of R (Red), G (Green) and B (Blue) is formed between the on-chip lens 62 and the substrate 61. The pixel 51 depicted in A of FIG. 93 is configured similarly, for example, to that of the first embodiment depicted in FIG. 2 or that of the fourteenth or fifteenth embodiment described hereinabove with reference to FIG. 36 except that the color filter 1861 is provided.

On the other hand, in B of FIG. 93, a pixel 51 in which an IR cut filter 1871 for cutting infrared light and a color filter 1872 are formed by stacking and another pixel 51 in which the IR cut filter 1871 and the color filter 1872 are not formed are arranged in a neighboring relationship between the on-chip lens 62 and the substrate 61. Furthermore, not the first tap TA and second tap TB but a photodiode 1881 is formed on the substrate 61 of the pixel 51 in which the IR cut filter 1871 and the color filter 1872 are formed. Furthermore, at a pixel boundary portion of the pixel 51 in which the photodiode 1881 is formed, a pixel separation portion 1882 for separating the neighboring pixel and the substrate 61 from each other is formed. The pixel separation portion 1882 is formed by covering, with an insulating film, an outer periphery of a metal material such as, for example, tungsten (W), aluminum (Al) or copper (Cu) and a conductive material such as polysilicon. Movement of electrons between neighboring pixels is limited by the pixel separation portion 1882. The pixel 51 including the photodiode 1881 is driven separately through a control wire different from that for the pixel 51 including the first tap TA and the second tap TB. The configuration the other part is similar, for example, to that of the first embodiment depicted in FIG. 2 or that of the fourteenth embodiment depicted in FIG. 36.

Figure 94:
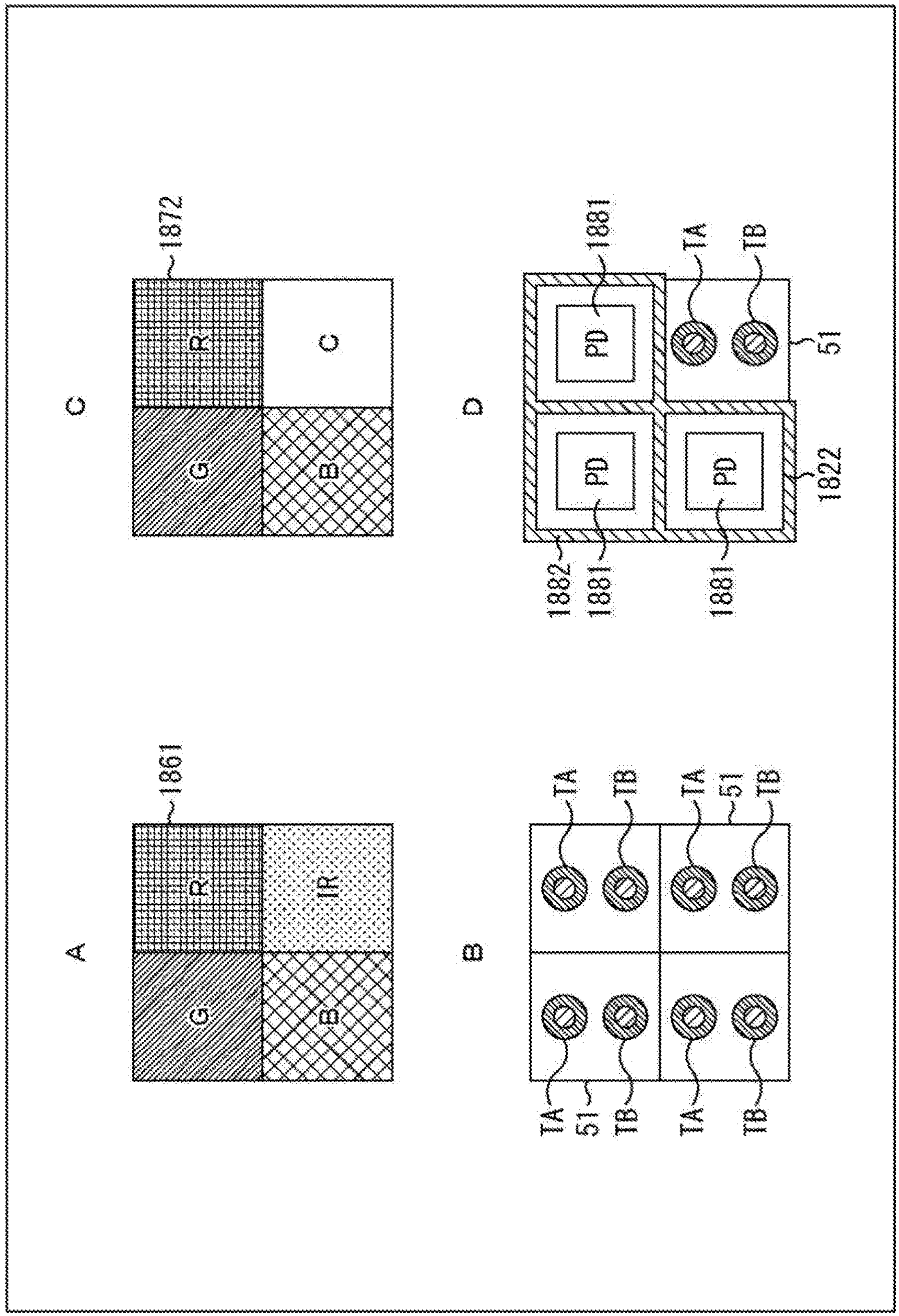
FIG. 94 is a plan view of a pixel according to the twenty-second embodiment.

A of FIG. 94 is a plan view depicting arrangement of the color filter 1861 in a four-pixel region in which the pixels 51 depicted in A of FIG. 93 are arrayed by 2×2.

The color filter 1861 is configured such that, for the four-pixel region of 2×2, four kinds of filters including a filter for transmitting G, another filter for transmitting R, a further filter for transmitting B and a still further filter for transmitting IR are arrayed by 2×2.

B of FIG. 94 is a plan view taken along line A-A' of A of FIG. 93 in regard to the four-pixel region in which the pixels 51 depicted in A of FIG. 93 are arrayed by 2×2.

In the pixel 51 depicted in A of FIG. 93, the first tap TA and the second tap TB are arranged in a unit of a pixel.

C of FIG. 94 is a plan view depicting arrangement of a color filter 1872 in the four-pixel region in which the pixels 51 depicted in B of FIG. 93 are arrayed by 2×2.

The color filter 1872 is configured such that four kinds of filters including a filter for transmitting G, another filter for transmitting R, a further filter for transmitting B and air (no filter) are arrayed by 2×2. Note that a clear filter for transmitting all wavelengths (R, G, B and IR) may be arranged in place of the air.

In the color filter 187, the IR cut filter 1871 is arranged in an upper layer of the filter for transmitting G, the filter for transmitting R and the filter for transmitting B as depicted in B of FIG. 93.

D of FIG. 94 is a plan view taken along line B-B' of B of FIG. 93 in regard to the four-pixel region in which the pixels 51 depicted in B of FIG. 93 are arrayed by 2×2.

In the substrate 61 portion in the four-pixel region of 2×2, a photodiode 1881 is formed in the pixel 51 that has a filter for transmitting G, R or B while the first tap TA and the second tap TB are formed in the pixel 51 that has air (no filter). Furthermore, in a pixel boundary portion of the pixel 51 in which the photodiode 1881 is formed, a pixel separation portion 1882 for separating the neighboring pixel and the substrate 61 from each other is formed.

As described above, the pixel 51 depicted in A of FIG. 93 has a combination of the color filter 1861 depicted in A of FIG. 94 and the photoelectric conversion region depicted in B of FIG. 94, and the pixel 51 depicted in B of FIG. 93 has a combination of the color filter 1872 depicted in C of FIG. 94 and the photoelectric conversion region depicted in D of FIG. 94.

However, the combinations of the color filters of A and C of FIG. 94 and the photoelectric conversion regions of B and D of FIG. 94 may be exchanged for each other. More specifically, as the configuration of the pixel 51 in the twenty-second embodiment, a configuration in which the color filter 1861 depicted in A of FIG. 94 and the photoelectric conversion region depicted in D of FIG. 94 are combined or another configuration in which the color filter 1872 depicted in C of FIG. 94 and the photoelectric conversion region depicted in B of FIG. 94 are combined may be applied.

Five kinds of driving methods of the mode 1 to the mode 5 described hereinabove with reference to FIG. 88 are available for driving of the pixel 51 including the first tap TA and the second tap TB.

Driving of the pixel 51 including the photodiode 1881 is performed by a driving method similar to that for a pixel of a normal image sensor separately from driving of the pixel 51 including the first tap TA and the second tap TB.

With the twenty-second embodiment, the light reception device 1 can include, as part of the pixel array section 20 in which a plurality of pixels 51 individually including the first tap TA and the second tap TB are arrayed, the pixel 51 including such a color filter 1861 as depicted in A of FIG. 93 on the light incident face side of the substrate 61 on which the first tap TA and the second tap TB are formed. As a consequence, a signal can be acquired for each of the wavelengths of G, R, B and IR and an object identification performance can be enhanced.

Furthermore, with the twenty-second embodiment, the light reception device 1 can include, as part of the pixel array section 20 in which a plurality of pixels 51 individually including the first tap TA and the second tap TB are arrayed, such a pixel 51 as depicted in B of FIG. 93 including the photodiode 1881 in the substrate 61 in place of the first tap TA and second tap TB and including the color filter 1872 on the light inputting face side. As a consequence, a G signal, an R signal and a B signal similar to those of the image sensor can be acquired and the object identification performance can be enhanced.

Furthermore, both of the pixel 51 depicted in A of FIG. 93 and including the first tap TA, second tap TB and color filter 1861 and the pixel 51 depicted in B of FIG. 93 and including the photodiode 1881 and the color filter 1872 may be formed in the pixel array section 20.

Furthermore, all of the pixels 51 of the pixel array section 20 of the light reception device 1 may be configured from at least one of the pixel according to the combination of A and B of FIG. 94, the pixel according to the combination of C and D of FIG. 94, the pixel according to the combination of A and D of FIG. 94 and the pixel according to the combination by C and B of FIG. 94.

<Example of Configuration of Distance Measurement Module>

Figure 95:
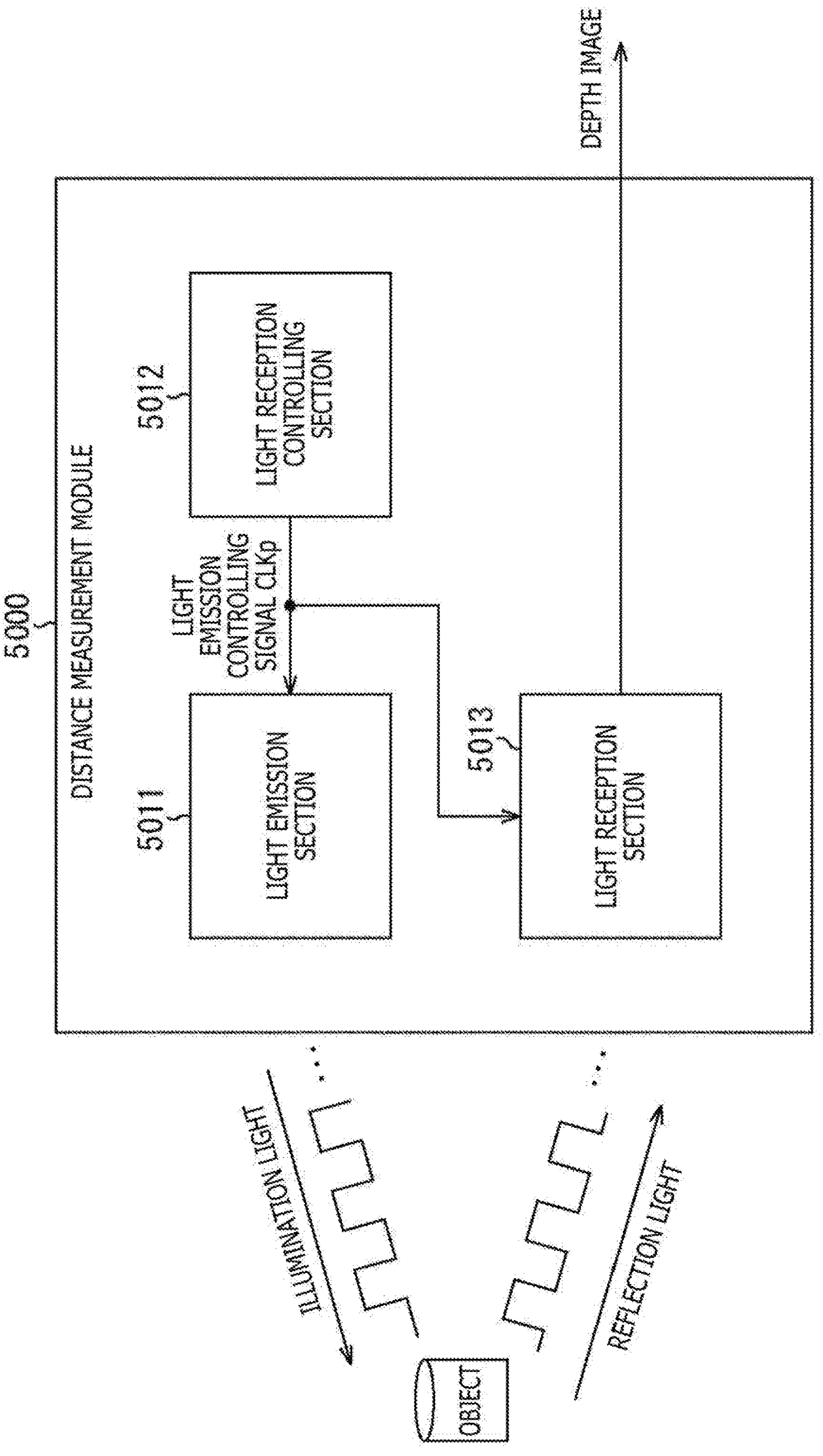
FIG. 95 is a block diagram depicting an example of a configuration of a distance measurement module.

FIG. 95 is a block diagram depicting an example of a configuration of a distance measurement module that outputs distance measurement information using the light reception device 1 of FIG. 1.

The distance measurement module 5000 includes a light emission section 5011, a light emission controlling section 5012 and a light reception section 5013.

The light emission section 5011 has a light source for emitting light having a predetermined wavelength and emits and illuminates illumination light whose brightness varies periodically on an object. For example, the light emission section 5011 has, as a light source, a light emitting diode for emitting infrared light having a wavelength ranging from 780 to 1000 nm, and generates illumination light in synchronism with a light emission controlling signal CLKp of a rectangular wave supplied from the light emission controlling section 5012.

Note that the waveform of the light emission controlling signal CLKp is not limited to a rectangular wave if it is a synchronizing signal. For example, the waveform of the light emission controlling signal CLKp may be a sine wave.

The light emission controlling section 5012 supplies the light emission controlling signal CLKp to the light emission section 5011 and the light reception section 5013 to control the illumination timing of illumination light. The frequency of the light emission controlling signal CLKp is, for example, 20 megahertz (MHz). Note that the frequency of the light emission controlling signal CLKp is not limited to 20 megahertz (MHZ) but may be 5 megahertz (MHz) or the like.

The light reception section 5013 receives reflection light reflected from an object, calculates distance information for each pixel in response to a result of the light reception and generates and outputs a depth image that represents the distance to the object with a gradation value for each pixel.

The light reception section 5013 is configured using the light reception device 1 described hereinabove, and the light reception device 1 as the light reception section 5013 calculates distance information for each pixel from a signal strength calculated by the charge detection section (N+ semiconductor region 71) of each of the signal extraction portions 65-1 and 65-2 of each pixel 51 of the pixel array section 20, for example, on the basis of the light emission controlling signal CLKp.

As described above, the light reception device 1 of FIG. 1 can be incorporated as the light reception section 5013 of the distance measurement module 5000 that determines and outputs distance information to an imaging object by the indirect ToF method. By adopting, as the light reception section 5013 of the distance measurement module 5000, the light reception device 1 of any of the embodiments described hereinabove, particularly a light reception device that is formed as of the back-illuminated type and has an improved pixel sensitivity, the distance measurement characteristic of the distance measurement module 5000 can be improved.

<Example of Application to Moving Body>

The technology according to the present disclosure (present technology) can be applied to various products. For example, the technology according to the present disclosure may be implemented as an apparatus that is incorporated in a moving body of any type such as an automobile, an electric car, a hybrid electric car, a motorcycle, a bicycle, a personal mobility, an airplane, a drone, a ship and a robot.

Figure 96:
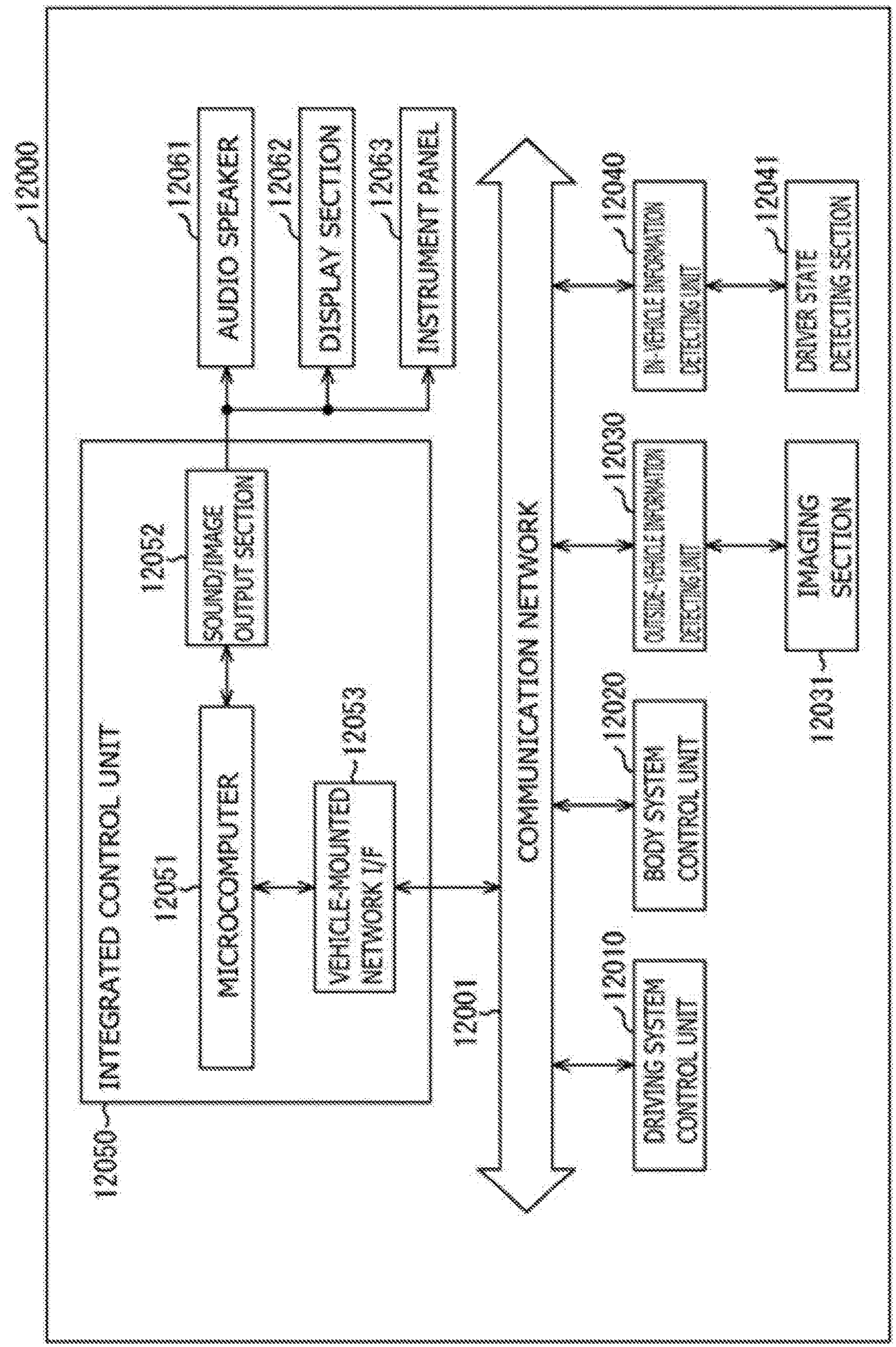
FIG. 96 is a block diagram depicting an example of schematic configuration of a vehicle control system.

FIG. 96 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 96, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 96, an audio speaker 12061, a display section 12062, and an instrument panel 12063 are illustrated as the output device. The display section 12062 may, for example, include at least one of an on-board display and a head-up display.

Figure 97:
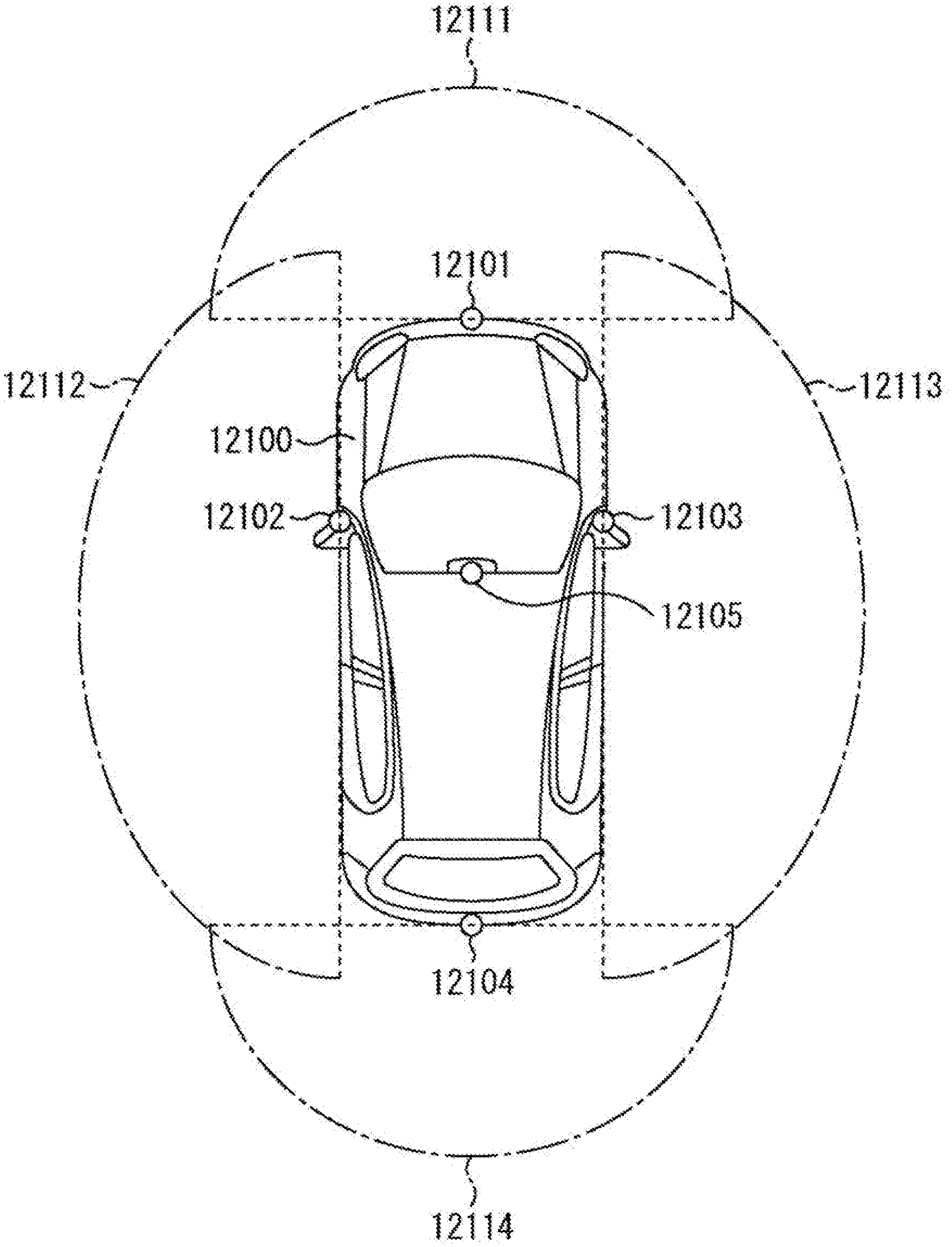
FIG. 97 is a diagram of assistance in explaining an example of installation positions of an outside-vehicle information detecting section and an imaging section.

FIG. 97 is a diagram depicting an example of the installation position of the imaging section 12031.

In FIG. 97, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 97 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle controlling system to which the technology according to the present disclosure is applied has been described. The technology according to the present disclosure can be applied to the image pickup section 12031 among the components described hereinabove. More specifically, such a characteristic as sensitivity can be improved, for example, by applying the light reception device 1 depicted in FIG. 1 to the image pickup section 12031.

The embodiment of the present technology is not restricted to the embodiments described above but can be changed in various manners without departing from the scope of the present technology.

For example, it is naturally possible to suitably combine two or more ones of the embodiments described hereinabove. More specifically, it is possible to appropriately select, in response to which one of characteristics of a pixel such as the sensitivity is to be prioritized, the number or arrangement position of a signal extraction portion in the pixel, the shape of the signal extraction portion or whether or not a shared structure for the signal extraction portion is to be applied, presence or absence of an on-chip lens, presence or absence of an inter-pixel shading portion, presence or absence of a separation region, the thickness of the on-chip lens or a substrate, the type of the substrate or film design, presence or absence of a bias to the light incident face, presence or absence of a reflection member and so forth.

Furthermore, although the embodiments described hereinabove are directed to an example in which an electron is used as a signal carrier, alternatively a hole generated by photoelectric conversion may be used as a signal carrier. In such a case as just described, it is sufficient if the charge detection section for detecting a signal carrier is configured from a P+ semiconductor region and the voltage application section for generating an electric field in the substrate is configured from an N+ semiconductor such that a hole as a signal carrier is detected by the charge detection section provided in the signal extraction portion.

According to the present technology, by configuring a CAPD sensor as a light reception device of the back-illuminated type, the distance measurement characteristic can be improved.

Note that, although the embodiments described hereinabove are directed to a driving method that applies a voltage directly to the P+ semiconductor region 73 formed in the substrate 61 and moves charge generated by photoelectric conversion by an electric field generated by the voltage application, the present technology is not limited to this driving method but can be applied also to other driving methods. For example, a driving method may be applied which distributes charge, which is generated by photoelectric conversion by applying predetermined voltages to the gates of the first and second transfer transistors formed in the substrate 61 using the first and second transfer transistors and the first and second floating diffusion regions, such that the charge is accumulated into the first floating diffusion region through the first transfer transistor and into the second floating diffusion region through the second transfer transistor. In this case, the first and second transfer transistors formed in the substrate 61 function as the first and second voltage application sections to the gates of which predetermined voltages are applied, and the first and second floating diffusion regions formed in the substrate 61 function as the first and second charge detection sections for detecting charge generated by photoelectric conversion.

More specifically, in the driving system in which a voltage is applied directly to the P+ semiconductor region 73 formed in the substrate 61 such that charge generated by photoelectric conversion is moved by an electric field generated by the voltage application, the two P+ semiconductor regions 73 serving as the first and second voltage application portions are control nodes to which predetermined voltages are applied, and the two N+ semiconductor regions 71 serving as the first and second charge detection sections are detection nodes for detecting charge. In the driving method in which predetermined voltages are applied to the gates of the first and second transfer transistors formed in the substrate 61 and charge generated by photoelectric conversion is distributed to and accumulated into the first floating diffusion region and the second floating diffusion region, the gates of the first and second transfer transistors are control nodes to which predetermined voltages are applied, and the first and second floating diffusion regions formed in the substrate 61 are detection nodes for detecting charge.

Furthermore, the advantageous effects described in the present specification are exemplary to the last and are not restrictive, and some other advantageous effects may be available.

Note that the present technology can take also such configurations as described below.

(1)

A light reception device, including:

an on-chip lens;

a wiring layer; and a semiconductor layer arranged between the on-chip lens and the wiring layer, in which the semiconductor layer includes a first tap having a first voltage application portion to which a first voltage is applied and a first charge detection portion arranged around the first voltage application portion, and a second tap having a second voltage application portion to which a second voltage different from the first voltage is applied and a second charge detection portion arranged around the second voltage application portion, and the on-chip lens is configured such that a position thereof differs depending upon an in-plane position of a pixel array section, so that an optical path length or a DC contrast of a chief ray from an object is uniform at in-plane pixels of the pixel array section.

(2)

The light reception device according to (1) above, in which the wiring layer includes at least one layer that includes a reflection member, and the reflection member is provided so as to overlap with the first charge detection portion or the second charge detection portion as viewed in plan.

(3)

The light reception device according to (1) or (2) above, in which the wiring layer includes at least one layer that includes a shading member, and the shading member is provided so as to overlap with the first charge detection portion or the second charge detection portion as viewed in plan.

(4)

The light reception device according to any one of (1) to (3) above, in which an inter-pixel shading film is also configured such that a position thereof differs depending upon in-plane positions of the pixel array section together with the on-chip lens.

(5)

The light reception device according to any one of (1) to (4) above, further including:

a pixel separation portion provided at a pixel boundary portion and configured to separate neighboring pixels at least partially in a depthwise direction of the semiconductor layer.

(6)

The light reception device according to (5) above, in which the pixel separation portion includes a DTI that separates the neighboring pixels from a rear face side or a front face side to a predetermined depth of the semiconductor layer.

(7)

The light reception device according to (5) above, further including:

the pixel separation portion includes a through separation portion extending through the semiconductor layer to separate the neighboring pixel.

(8)

The light reception device according to any one of (1) to (7) above, in which the on-chip lens is configured such that the position thereof differs depending upon the in-plane position of the pixel array section, so that a phase displacement amount θ of a phase displacement detection tap that is one of the first tap or the second tap of each pixel is equal within a predetermined range.

(9)

The light reception device according to any one of (1) to (7) above, in which the on-chip lens is configured such that the position thereof differs depending upon the in-plane position of pixel array section, so that the DC contrast of the first tap and the DC contrast of the second tap are equal within a predetermined range.

(10)

The light reception device according to any one of (1) to (7) or (9) above, in which the on-chip lens is configured such that the position thereof differs depending upon the in-plane position of the pixel array section, so that a displacement amount of the DC contrast of the first tap at a central portion and an outer peripheral portion of the pixel array section and a displacement amount of the DC contrast of the second tap at a central portion and an outer peripheral portion of the pixel array section are equal within a predetermined range.

(11)

The light reception device according to any one of (1) to (10) above, further including:

a driving section configured to supply the first voltage or the second voltage to the first voltage application portion or the second voltage application portion; and a voltage supply line configured to transmit the first voltage or the second voltage from the driving section to the first voltage application portion or the second voltage application portion, in which the voltage supply line has a line width that varies depending upon a distance from the driving section.

(12)

The light reception device according to (11) above, in which the voltage supply line is formed such that the line width thereof increases as the distance from the driving section increases.

(13)

The light reception device according to any one of (1) to (12) above, in which:

the first and second voltage application portions are configured from first and second P-type semiconductor regions formed on the semiconductor layer.

(14)

The light reception device according to any one of (1) to (13) above, in which the first and second voltage application portions are configured from first and second transfer transistors formed from the semiconductor layer, respectively.

(15)

A distance measurement module, including:

a light reception device including an on-chip lens, a wiring layer, and a semiconductor layer arranged between the on-chip lens and the wiring layer, in which the semiconductor layer includes a first tap having a first voltage application portion to which a first voltage is applied and a first charge detection portion arranged around the first voltage application portion, and a second tap having a second voltage application portion to which a second voltage different from the first voltage is applied and a second charge detection portion arranged around the second voltage application portion, and in the light reception device, the on-chip lens is configured such that the position thereof differs depending upon an in-plane position of the pixel array section such that an optical path length or a DC contrast of a chief ray from an object is uniform at in-plane pixels of the pixel array section;

a light source configured to illuminate illumination light having a brightness that varies periodically; and a light emission controlling section configured to control an illumination timing of the illumination light.

REFERENCE SIGNS LIST

1 Light reception device, 20 Pixel array section, 21 Tap driving section, 22 Vertical driving section, 29 Vertical signal line, 30 Voltage supply line, 51 Pixel, 51X Shaded pixel, 61 Substrate, 62 On-chip lens, 63 Inter-pixel shading film, 64 Oxide film, 65, 65-1, 65-2 Signal extraction portions, 66 Fixed charge film, 71-1, 71-2, 71 N+ semiconductor regions, 73-1, 73-2, 73 P+ semiconductor regions, 441-1, 441-2, 441 Separation regions, 471-1, 471-2, 471 Separation regions, 631 Reflection member, 721 Transfer transistor, 722 FD, 723 Reset transistor, 724 Amplification transistor, 725 Selection transistor, 727 Additional capacitor, 728 Switching transistor, 741 Voltage supply line, 811 Multilayer wiring layer, 812 Interlayer insulating film, 813 Power supply line, 814 Voltage application wire, 815 Reflection member, 816 Voltage application wire, 817 Control line, M1 to M5 metal layer, 1021 P well region, 1022 P-type semiconductor region, 1031 P well region, 1032, 1033 Oxide films, 1051 Effective pixel region, 1052 Ineffective pixel region, 1061 N-type diffusion layer, 1071 Pixel separation portion, 1101 Charge discharging region, 1102 OPB region, 1121 Aperture pixel region, 1122 Shaded pixel region, 1123 N-type region, 1131 N-type diffusion layer, 1201, 1121 Substrates, 1231 Pixel array region, 1232 Area controlling circuit, 1251 MIX joining portion, 1252 DET joining portion, 1253 Voltage supply line, 1261 Peripheral portion, 1311 Electrode portion, 1311A embedded portion, 1311B Protruding portion, 1312 N+ semiconductor region, 1313 Insulating film, 1314 Hole concentration enhancement layer, 1401, 1401A to 1401D Power supply lines, 1411, 1411A to 1411E VSS wires, 1421 gap, 1511 Vertical wire, 1512 Horizontal wire, 1513 Wire, 1521 First wiring layer, 1522 Second wiring layer, 1523 Third wiring layer, 1542, 1543 Peripheral portions, 1801, 1811 Phase difference shading films, 1821 On-chip lens, 1841 Polarizer filter, 1861 Color filter, 1871 IR cut filter, 1872 Color filter, 1881 Photodiode, 1882 Pixel separation portion, 5000 Distance measurement module, 5011 Light emission section, 5012 Light emission controlling section, 5013 Light reception section

What is claimed is:

1. A light reception device, comprising:

an on-chip lens;

a wiring layer; and a semiconductor layer arranged between the on-chip lens and the wiring layer, wherein the semiconductor layer includes:

a first tap having a first voltage application portion to which a first voltage is applied and a first charge detection portion arranged around the first voltage application portion; and a second tap having a second voltage application portion to which a second voltage different from the first voltage is applied and a second charge detection portion arranged around the second voltage application portion, wherein the on-chip lens is configured such that a position thereof differs depending upon an in-plane position of a pixel array section, so that an optical path length or a DC contrast of a chief ray from an object is uniform at in-plane pixels of the pixel array section, and wherein the first and second voltage application portions are configured from first and second transfer transistors formed from the semiconductor layer, respectively.

2. The light reception device according to claim 1, wherein the wiring layer includes at least one layer that includes a reflection member, and the reflection member is provided so as to overlap with the first charge detection portion or the second charge detection portion as viewed in plan.

3. The light reception device according to claim 1, wherein the wiring layer includes at least one layer that includes a shading member, and the shading member is provided so as to overlap with the first charge detection portion or the second charge detection portion as viewed in plan.

4. The light reception device according to claim 1, wherein an inter-pixel shading film is also configured such that a position thereof differs depending upon in-plane positions of the pixel array section together with the on-chip lens.

5. The light reception device according to claim 1, further comprising:

a pixel separation portion provided at a pixel boundary portion and configured to separate neighboring pixels at least partially in a depthwise direction of the semiconductor layer.

6. The light reception device according to claim 5, wherein the pixel separation portion includes a DTI that separates the neighboring pixels from a rear face side or a front face side to a predetermined depth of the semiconductor layer.

7. The light reception device according to claim 5, wherein the pixel separation portion includes a through separation portion extending through the semiconductor layer to separate the neighboring pixel.

8. The light reception device according to claim 1, wherein the on-chip lens is configured such that the position thereof differs depending upon the in-plane position of the pixel array section, so that a phase displacement amount θ of a phase displacement detection tap that is one of the first tap or the second tap of each pixel is equal within a predetermined range.

9. The light reception device according to claim 1, wherein the on-chip lens is configured such that the position thereof differs depending upon the in-plane position of pixel array section, so that the DC contrast of the first tap and the DC contrast of the second tap are equal within a predetermined range.

10. The light reception device according to claim 1, wherein the on-chip lens is configured such that the position thereof differs depending upon the in-plane position of the pixel array section, so that a displacement amount of the DC contrast of the first tap at a central portion and an outer peripheral portion of the pixel array section and a displacement amount of the DC contrast of the second tap at a central portion and an outer peripheral portion of the pixel array section are equal within a predetermined range.

11. The light reception device according to claim 1, wherein the first and second voltage application portions are configured from first and second P-type semiconductor regions formed on the semiconductor layer.

12. A light reception device, comprising:

an on-chip lens;

a wiring layer; and a semiconductor layer arranged between the on-chip lens and the wiring layer, wherein the semiconductor layer includes:

a first tap having a first voltage application portion to which a first voltage is applied and a first charge detection portion arranged around the first voltage application portion; and a second tap having a second voltage application portion to which a second voltage different from the first voltage is applied and a second charge detection portion arranged around the second voltage application portion, wherein the on-chip lens is configured such that a position thereof differs depending upon an in-plane position of a pixel array section, so that an optical path length or a DC contrast of a chief ray from an object is uniform at in-plane pixels of the pixel array section;

a driving section configured to supply the first voltage or the second voltage to the first voltage application portion or the second voltage application portion; and a voltage supply line configured to transmit the first voltage or the second voltage from the driving section to the first voltage application portion or the second voltage application portion, wherein the voltage supply line has a line width that varies depending upon a distance from the driving section.

13. The light reception device according to claim 12, wherein the voltage supply line is formed such that the line width thereof increases as the distance from the driving section increases.

14. The light reception device according to claim 12, wherein the first and second voltage application portions are configured from first and second transfer transistors formed from the semiconductor layer, respectively.

15. The light reception device according to claim 12, wherein the wiring layer includes at least one layer that includes a reflection member, and the reflection member is provided so as to overlap with the first charge detection portion or the second charge detection portion as viewed in plan.

16. The light reception device according to claim 12, wherein the wiring layer includes at least one layer that includes a shading member, and the shading member is provided so as to overlap with the first charge detection portion or the second charge detection portion as viewed in plan.

17. The light reception device according to claim 12, wherein an inter-pixel shading film is also configured such that a position thereof differs depending upon in-plane positions of the pixel array section together with the on-chip lens.

18. The light reception device according to claim 12, further comprising:

a pixel separation portion provided at a pixel boundary portion and configured to separate neighboring pixels at least partially in a depthwise direction of the semiconductor layer.

19. The light reception device according to claim 18, wherein the pixel separation portion includes a DTI that separates the neighboring pixels from a rear face side or a front face side to a predetermined depth of the semiconductor layer.

20. A distance measurement module, comprising:

a light reception device, including:

an on-chip lens;

a wiring layer; and a semiconductor layer arranged between the on-chip lens and the wiring layer, wherein the semiconductor layer includes:

a first tap having a first voltage application portion to which a first voltage is applied and a first charge detection portion arranged around the first voltage application portion; and a second tap having a second voltage application portion to which a second voltage different from the first voltage is applied and a second charge detection portion arranged around the second voltage application portion, wherein the first and second voltage application portions are configured from first and second transfer transistors formed from the semiconductor layer, respectively, and wherein, in the light reception device, the on-chip lens is configured such that the position thereof differs depending upon an in-plane position of the pixel array section such that an optical path length or a DC contrast of a chief ray from an object is uniform at in-plane pixels of the pixel array section;

a light source configured to illuminate illumination light having a brightness that varies periodically; and a light emission controlling section configured to control an illumination timing of the illumination light.

* * * * *